(12) United States Patent
Kramer

(10) Patent No.: US 6,765,724 B1
(45) Date of Patent: Jul. 20, 2004

(54) DIFFRACTION GRATING-BASED WAVELENGTH SELECTION UNIT HAVING IMPROVED POLARIZATION DEPENDENT PERFORMANCE

(75) Inventor: Charles J. Kramer, Webster, NY (US)

(73) Assignee: Holotek, LLC, Henrietta, NY (US)

(*) Notice: Subject to any disclaimer, the term of this patent is extended or adjusted under 35 U.S.C. 154(b) by 117 days.

(21) Appl. No.: 10/056,571

(22) Filed: Jan. 25, 2002

Related U.S. Application Data

(63) Continuation-in-part of application No. 09/839,544, filed on Apr. 20, 2001, now Pat. No. 6,630,286, and a continuation-in-part of application No. 09/780,769, filed on Feb. 9, 2001, now Pat. No. 6,583,934, and a continuation-in-part of application No. 09/761,509, filed on Jan. 16, 2001, now Pat. No. 6,560,020.

(51) Int. Cl.$^7$ ............................ G02B 27/44; G02B 5/18
(52) U.S. Cl. ..................... 359/566; 356/328; 398/87
(58) Field of Search ................. 359/566, 569, 359/130; 356/327, 328, 334; 369/103, 112; 398/87

(56) References Cited

U.S. PATENT DOCUMENTS

| | | | | |
|---|---|---|---|---|
| 5,056,881 A | * | 10/1991 | Bowen et al. | 359/19 |
| 5,883,741 A | * | 3/1999 | Ono et al. | 359/495 |
| 5,917,625 A | | 6/1999 | Ogusu et al. | |
| 6,487,016 B1 | * | 11/2002 | Shiono et al. | 359/566 |
| 6,556,320 B1 | * | 4/2003 | Cao | 398/65 |

\* cited by examiner

*Primary Examiner*—Mark A. Robinson
*Assistant Examiner*—Alessandro Amari
(74) *Attorney, Agent, or Firm*—Howard J. Greenwald

(57) ABSTRACT

An optical wavelength selection device containing an optical beam source, a device for collimating the optical beam to produce a collimated optical beam, a diffraction grating assembly for diffracting the collimated optical beam to produce a collimated optical diffracted beam, a device for modifying the polarization state of the collimated optical beam, and a lens assembly for focusing the collimated optical diffracted beam. The device for modifying the polarization state of the collimated optical beam is located within the diffraction grating assembly in one embodiment and before the diffraction grating assembly in another embodiment.

6 Claims, 70 Drawing Sheets

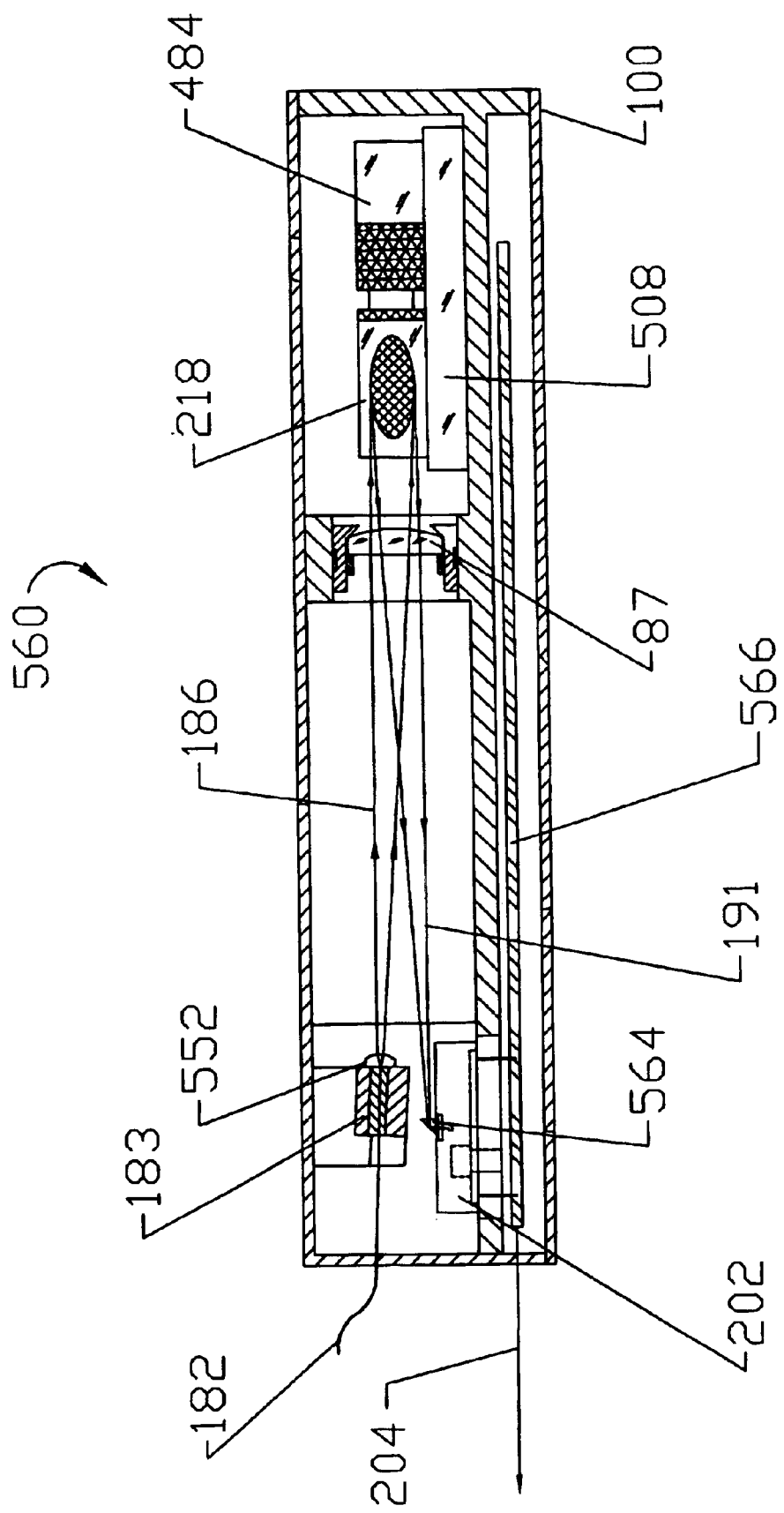

US 6,765,724 B1

DIFFRACTION GRATING-BASED WAVELENGTH SELECTION UNIT HAVING IMPROVED POLARIZATION DEPENDENT PERFORMANCE

CROSS-REFERENCE TO RELATED PATENT APPLICATION

This application is a continuation-in-part of applicant's applications Ser. No. 09/839,544 (filed Apr. 20, 2001) now U.S. Pat. No. 6,630,286, and Ser. No. 09/780,769 (filed Feb. 9, 2001) now U.S. Pat. No. 6,583,934, and Ser. No. 09/761,509 (filed on Jan. 16, 2001) now U.S. Pat. No. 6,560,020.

FIELD OF THE INVENTION

A diffraction grating-based wavelength selection unit.

BACKGROUND OF THE INVENTION

U.S. Pat. No. 5,917,625 discloses, in FIG. 28, a multiplexing/demultiplexing device which utilizes a transmission type diffraction grating 140 disposed in front of a reflection mirror 115. The entire disclosure of this United States patent is hereby incorporated by reference into this specification.

A device similar to that disclosed in U.S. Pat. No. 5,917,625 is claimed in U.S. patent application Ser. No. 09/193,289. This United States patent application is discussed in Columns 1 and 2 of U.S. Pat. No. 6,108,471, the disclosure of which is also hereby incorporated by reference into this specification.

The U.S. Ser. No. 09/193,289 patent application claims an optical multiplexing and demultiplexing device comprising a fiber mounting assembly for securing a plurality of optical fibers, collimating and focusing lens, a transmissive grating including a diffractive element formed from a photosensitive medium, and a mirror for receiving at least one beam coming from at least one of the plurality of optical fibers via the lens and the grating and for reflecting one or more of the beams back through the grating and the lens to at least one of the optical fibers. The photosensitive medium disclosed in U.S. Ser. No. 09/193,289 is dichromate gelatin (DCG).

DCG transmissive gratings are transmission volume phase gratings and, thus, the diffracting grating layer in these grating elements tends to have a thickness which is significantly larger than the corresponding layer in surface-relief grating elements. Thus, such gratings tend to change their optical properties with changes in temperature more than that achieved with surface-relief gratings fabricated on low thermal expansion substrate materials. Furthermore, because of their thickness, DCG gratings tend to be more sensitive to angular alignment issues than are surface-relief gratings; and, because of such alignment issues, the DCG gratings are not readily usable for broad spectrum wavelength beam applications that require equal diffraction efficiency for all of the spectral components of the beam. For fiber-optic telecommunication systems having wavelength channel signals over the spectrum range of from 1280 to 1620 nanometers, the DCG grating-based devices tend not to be as useful for this system application as surface-relief grating-based devices.

Surface-relief reflection grating elements are well known to those skilled in the art, and their diffracting grating layer is substantially thinner than that incorporated in DCG grating elements; consequently, they do not suffer from many of the disadvantages of DCG gratings. The properties of surface-relief reflection grating elements are disclosed in Christopher Palmer's "Diffraction Grating Handbook," Fourth Edition (Richardson Grating Laboratory, Rochester, N.Y. 14605). Reference also may be had, e.g., to a paper by E. G. Loewen et al. entitled "Grating efficiency theory as it applies to blazed and holographic gratings," (Applied Optics, Volume 16, page 2711, October, 1977).

While surface-relief transmission grating elements are not as well known or used as surface-relief reflection grating elements, they are commercially available from Holotek LLC of Henrietta, N.Y. Surface-relief transmission grating elements have the same advantages relative to DCG gratings that surface-relief reflection grating elements have; and they provide even more advantages than surface-relief reflection grating elements when used in fiber-optic communication devices. In particular, they can provide higher wavelength dispersion power while still achieving essentially equal diffraction efficiency values for S and P polarized optical components. However, when the grating surfaces of prior art surface-relief transmission grating elements are subjected to a temperature of 85 degrees centigrade at a relative humidity of 85 percent for two hours or less, the grating surfaces are generally degraded until the grating structure disappears. This test is often referred to as the "Bellcore High Temperature High Humidity Storage Test for Fiber Optic Devices."

It is an object of this invention to provide a surface-relief transmission grating with improved durability when subjected to the Bellcore High Temperature High Humidity Storage test conditions.

It is another object of this invention to have such improved surface-relief transmission gratings have greater than 70 percent diffraction efficiency values for S and P polarized optical components while achieving essentially equal diffraction efficiency values for these polarization components, that is, the S and P polarizations have diffraction efficiency values within about 5 percent of each other.

It is yet another object of this invention to have such improved surface-relief transmission grating use a low thermal expansion substrate material and, thereby achieve a change in grating line spacing that is in an accept range when the grating is used over the 70 degree centigrade temperature range specified for fiber-optic communication devices.

It is yet another object of this invention to have such improved surface-relief transmission grating surface be encapsulated and, thereby protect the grating surface from being damaged due to handling and cleaning of the grating element, as well as, from contaminants, liquids or solvent vapors that could damage the grating surface.

It is yet another object of this invention to provide devices incorporating such improved surface-relief transmission grating.

It is yet another object of this invention to provide grating-based devices having higher wavelength dispersion power while providing essentially equal radiometric throughput efficiency values for S and P polarized optical components (that is, the S and P polarizations have device radiometric throughput efficiency values equal to within about 5 percent of each other), thereby achieving a polarization dependent loss (PDL) value of within about 0.2 decibels (dB).

SUMMARY OF THE INVENTION

In accordance with this invention, there is provided an optical wavelength selection device comprised of a source of light, means for collimating said light to produce a collimated beam, means for diffracting said collimated beam comprised of a diffraction grating assembly and, disposed within said diffraction grating assembly, means for modifying the polarization state of said collimated beam, and means for focusing said collimated diffracted beam.

BRIEF DESCRIPTION OF THE DRAWINGS

The claimed invention will be described by reference to the specification, and to the following drawings in which like numerals refer to like elements, wherein:

FIGS. 30–33 are schematics of other dual pass grating-based wavelength section unit utilizing the transmission grating element of FIG. 1;

FIGS. 46A, 46B, 47A, 47B, 48, are schematics of monitor devices utilizing the transmission grating assembly of FIG. 38A;

DESCRIPTION OF THE PREFERRED EMBODIMENTS

Figure 1:
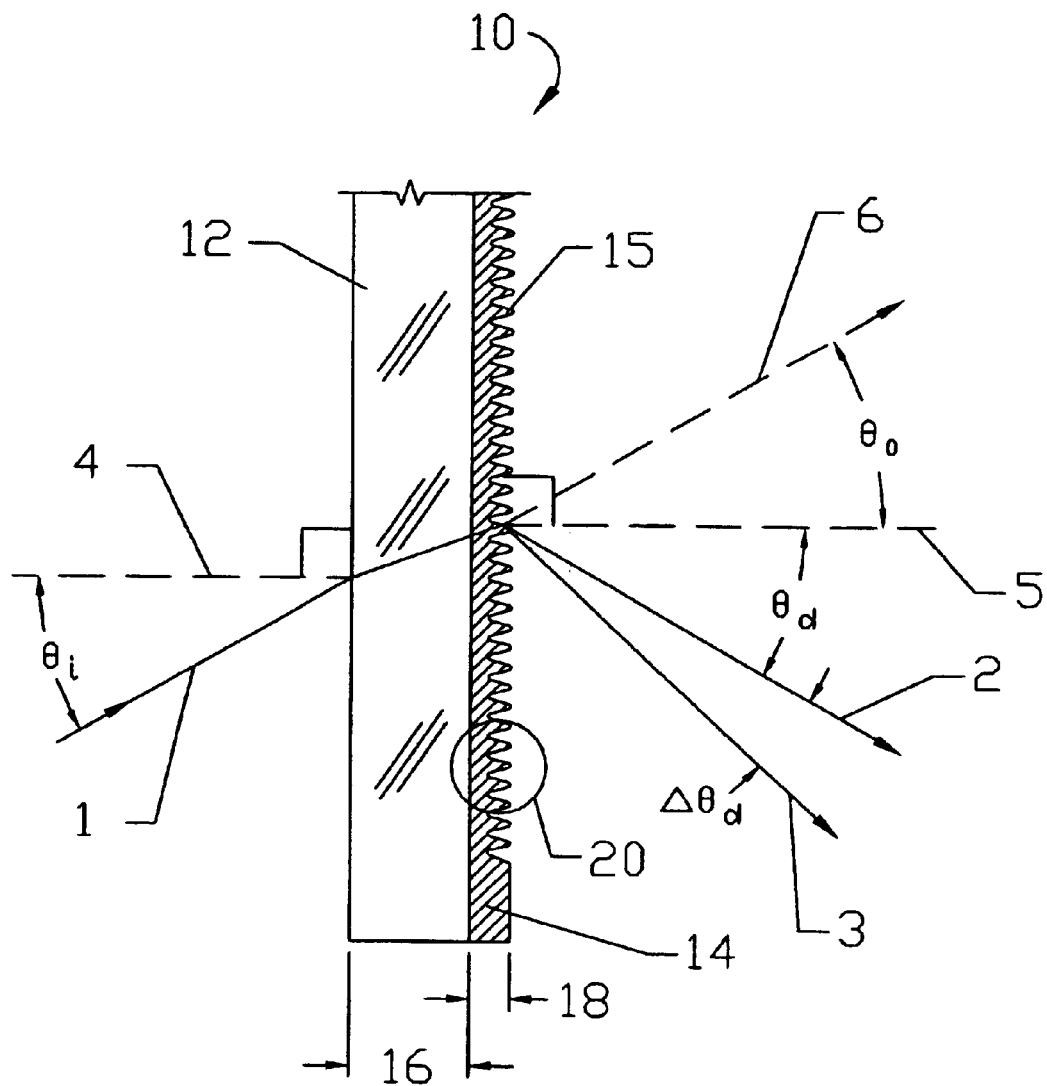
FIG. 1 is a partial sectional view of one preferred transmission grating element of the invention.

FIG. 1 is a sectional side view of a preferred sinusoidal surface-relief transmission diffraction grating element 10 comprised of a substrate 12 and a grating forming layer 14 containing surface-relief diffraction grating 15. This FIG. 1 illustrates the angular relationship between the incident optical beam 1 and the diffracted optical beams 2,3 relative to the normals 4,5 to the grating surface for this grating element 10. In the embodiment illustrated in FIG. 1, the incident beam 1 is comprised of $\lambda_1$ and $\lambda_2$ wavelength components and makes an angle of $\theta_i$ with the normal 4 to the substrate surface. After propagating through the substrate 12 and grating forming layer 14, the beam 1 is incident on the surface-relief grating 15. A portion of the incident beam 1 intensity is undiffracted and exits the grating as the zeroth order beam 6 at an angle $\theta_0$ relative to the grating normal 5, while the remaining beam intensities for each of the wavelength components of beam 1 are diffracted into first order $\lambda_1$ wavelength beam 2 and first order $\lambda_2$ wavelength beam 3 having angles $\theta_d$ and $\theta_d+\Delta\theta_d$, respectively, with regard to the grating normal 5 for the case where $\lambda_2 > \lambda_1$. Because, in the embodiment depicted in FIG. 1, the grating forming layer 14 is parallel to the substrate surface on which it resides and the substrate 12 has parallel surfaces, one does not have to include the index of refraction of either the substrate or grating forming layer into the grating equation used to calculate the angular relationship between incident and diffracted beams for the grating element 10. Under the parallel plate conditions depicted in FIG. 1, $\theta_i$ can be used as the incident angle in the grating equation and, therefore, the undiffracted zeroth order beam makes an angle of $\theta_0=\theta_i$ with regard to the normal 6 to the grating surface.

The surface-relief diffraction grating illustrated in FIG. 1 is a surface-relief transmission diffraction grating, i.e., a transparent diffraction grating that serves to transmit light. Surface-relief diffraction gratings are well known and are referred to in, e.g., U.S. Pat. Nos. 6,157,042 (metal surface-relief diffraction grating with a gallium arsenide substrate), 6,108,135, 5,569,904, 5,539,206, 5,363,226 (surface-relief reflection diffraction grating), 5,162,929, 5,089,903, 4,842,633, 4,206,295, 4,204,881, 4,289,371, 4,130,347, 4,057,326, and the like. The entire disclosure of each of these United States patents is hereby incorporated by reference into this specification.

Referring again to FIG. 1, and in the preferred embodiment depicted therein, it will be seen that the substrate 12 is a transmissive material, i.e., a material with a transmittance (the ratio of the radiant power transmitted by an object to the incident radiant power) of at least about 70 percent for the wavelength spectrum to be used with the grating element. In fiber-optic telecommunication devices, such wavelength spectrum is generally from about 1280 to about 1620 nanometers.

The substrate 12 preferably is of high optical quality, i.e., it introduces less than 0.25 wave of either spherical or cylindrical wavefront power into the transmitted beam; the term wavefront power is discussed in U.S. Pat. Nos. 5,457,708, 5,264,857, 5,113,706, 5,075,695, and 4,920,348, the entire disclosures of which are hereby incorporated by reference into this specification. As will be apparent to those skilled in the art, this means that the preferred substrate 12 has flat surfaces that, in one embodiment, are preferably substantially parallel to each other, being parallel within about 1 arc minute of each other.

The substrate 12 is preferably optically homogeneous, i.e., all components of volume in the substrate 12 are substantially the same in composition and optical properties. Optically homogeneous materials are disclosed in, e.g., U.S. Pat. Nos. 6,120,839, 6,103,860, 6,084,086, 6,080,833, 6,019,472, 5,970,746, 5,914,760, 5,841,572, 5,808,784, 5,754,290, and the like; the entire disclosure of each of these United States patents is hereby incorporated by reference into this specification.

The substrate 12 depicted in FIG. 1 consists of material which has a coefficient of thermal expansion of from about $2\times10_{-5}$ to $-1\times10_{-6}$ per degree centigrade. It is preferred that the coefficient of thermal expansion be about $6\times10_{-7}$ to about $-6\times10^{-7}$ per degree centigrade.

One may use a variety of transmissive materials known to those skilled in the art. Thus, by way of illustration and not limitation, one may use optical glass, plastics, glass-ceramic, crystalline materials, and the like. Suitable materials include, e.g., "CLEARCERAM-Z" (a glass-ceramic material made by the Ohara Incorporated of Japan), ULE (a ultra-low expansion glass sold by the Corning Company of Corning, N.Y.), fused silica, BK7 optical glass, plexiglass, crystalline quartz, silicon, etc. ULE glass is made by doping fused silica with titanium and, thus, has essentially the same optical properties as fused silica. ULE glass is referred to in, e.g., U.S. Pat. Nos. 6,048,652, 6,005,995, 5,970,082, 5,965,879, 5,831,780, 5,829,445, 5,755,850, 5,408,362, 5,358,776, 5,356,662, and the like; the entire disclosure of each of these United States patents is hereby incorporated by reference into this specification.

The substrate 12 preferably has a refractive index of from about 1.4 to about 4.0. In one embodiment, the refractive index of substrate 12 is from about 1.43 to about 1.7.

Referring again to FIG. 1, and in the preferred embodiment depicted therein, the thickness 16 of substrate 12 is generally from about 0.5 millimeters to about 100 millimeters and, preferably, from about 2 to about 20 millimeters. The thickness 18 of the grating forming layer 14 generally ranges from about 1 micron to about 5 microns. The ratio of thickness 16 to thickness 18 is generally at least about 500/1 and, more preferably, at least about 1,000/1.

Figure 2:
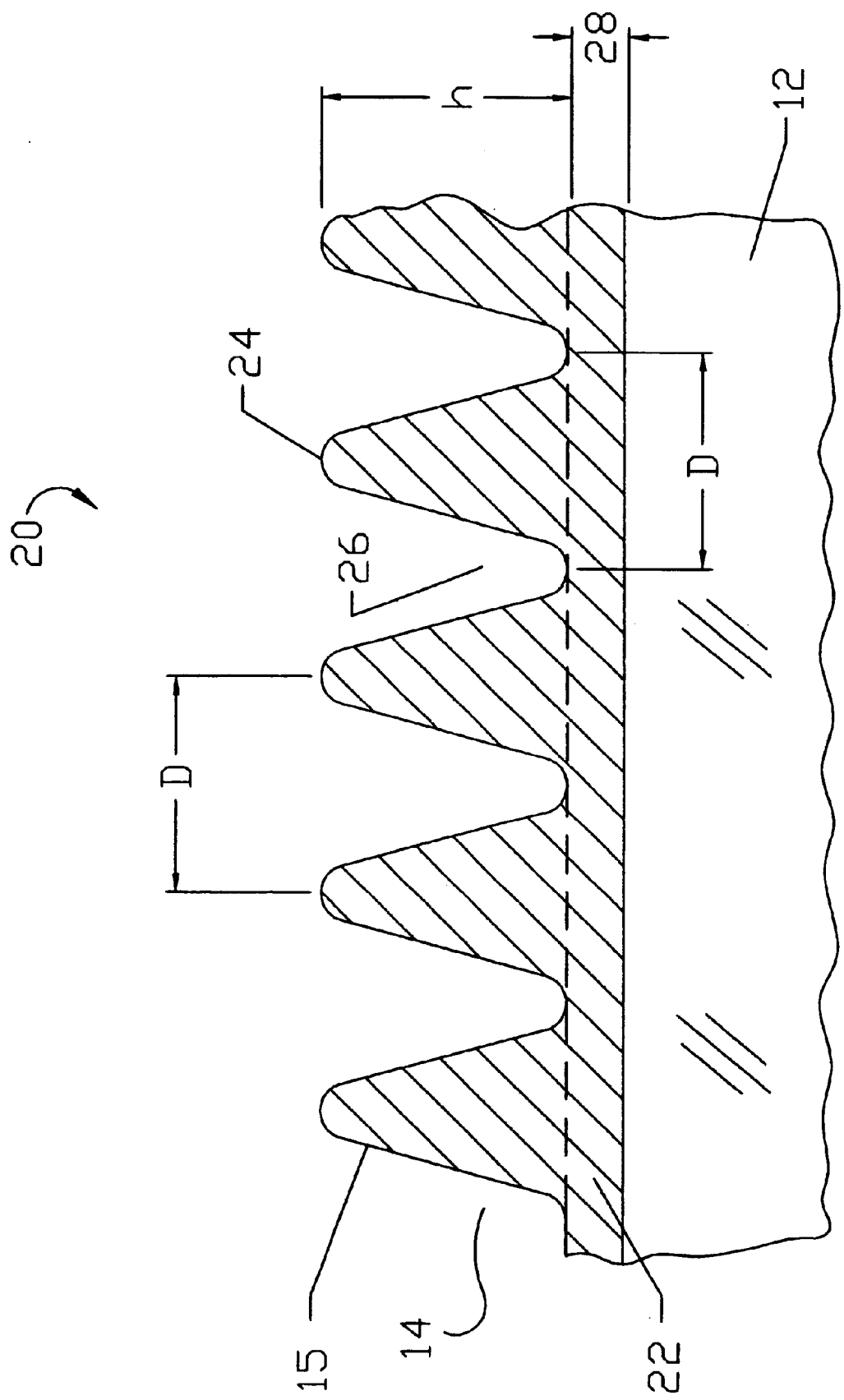
FIG. 2 is an enlarged view of a portion of the transmission grating element of FIG. 1.

FIG. 2 is an exploded partial sectional view of area 20 of FIG. 1, depicting the surface-relief diffraction grating 15 in greater detail. As will be seen from FIG. 2, in the preferred embodiment depicted the diffraction grating 15 is comprised of a base 22 integrally connected to upstanding periodically spaced grating lines 24. The periodically spaced grating grooves 26 are disposed between adjacent grating lines 24.

In one embodiment, the surface-relief grating 15 is formed in the grating forming layer 14 by a photographic process, such as holography. In another other embodiment, the surface-relief grating 15 is formed in the grating forming layer 14 by replication means. In another embodiment, the surface-relief grating 15 is etched into the substrate 12 material using either chemical or ion beam milling techniques. Normally a grating formed in a photoresist material by photographic means serves as the mask for these etching techniques. Fabrication of surface-relief diffraction gratings by holographic, replication, and ion and chemical etching techniques are described in the Erwin G. Loewen et al. book entitled "Diffraction Gratings and Applications" (Marcel Dekker, Inc., New York, 1997).

In one preferred embodiment, the grating forming layer 14 consists essentially of material with an index of refraction of from about 1.4 to about 1.8 and, more preferably, from about 1.43 to about 1.55.

In the embodiment depicted in FIG. 2, the grating 15 has a substantially sinusoidal shape. In another embodiment, not shown, grating 15 has a substantially rectangular shape (see, e.g., page 180 of said Loewen book). In another embodiment, the gratings 15 may have a substantially triangular shape (see, e.g., page 180 of said Loewen book).

Sinusoidal diffraction gratings are disclosed in U.S. Pat. Nos. 6,026,053, 5,757,544, 5,755,501, 5,742,262, 5,737,042, 5,696,628, 5,341,213, 4,842,969, 4,729,640, 4,062,628, and 3,961,836; the entire disclosure of each of these United States patents is hereby incorporated by reference into this specification.

In one embodiment, the grating is formed from a photoresist material which, after being heat-treated, becomes a substantially dry solid material. It is preferred to use a positive photoresist material. Positive photoresist materials are well known to those skilled in the art and are disclosed, e.g., in U.S. Pat. Nos. 6,094,410, 6,094,305, 6,051,348, 6,027,595, 6,005,838, 5,991,078, 5,965,323, 5,936,254, 5,910,864, 5,907,436, 5,838,853, and the like; the disclosure of each of these United States patents is hereby incorporated by reference into this specification.

In one preferred embodiment, the positive photoresist material used is Shipley S1813 or Shipley S1822 Photo Resist (manufactured by The Shipley Company of 455 Forest Street, Marlboro, Mass.). This positive photoresist material is comprised of from 71 to 76 parts of electronic grade propylene glycol monomethyl ether acetate, from about 10 to about 20 parts of mixed cresol novolak resin, from about 0.01 to about 1 parts of fluoroaliphatic polymer esters, from about 1 to about 10 parts of diazo photoactive compound, and from about 0.01 to about 0.99 parts of cresol.

The Shipley S1813 Photo Resist is believed to belong to a class of diazonaphthoquinone (DNQ)-novolak positive photoresists; see, e.g., pages 431–511 of James R. Sheats et al.'s "Microlithography Science and Technology (Marcel Dekker, Inc., New York, 1998) and, in particular, an article commencing at page 429 of this book by Takumi Ueno on "Chemistry of Photoresist Materials." As is disclosed on pages 433–434 of the Sheats et al. book, the properties of positive photoresist vary with " . . . the characteristics of the novolak resins, such as the isomeric structure of cresol, the position of the methylene bond, the molecular weight, and the molecular weight distribution" (at page 433).

Novolak resins are thermoplastic phenol/formaldehyde condensation products formed by the condensation of cresol with formaldehyde. Depending upon the cresol used, one may obtain the methylene bond in the meta position (by using 3-methylphenol), and/or the ortho position (by using 2-methylphenol), and/or the para position (by using 4-methylphenol).

Shipley does not disclose for its "MICROPOSIT S1800 SERIES PHOTO RESISTS" any information relating to " . . . the characteristics of the novolak resins, such as the isomeric structure of cresol, the position of the methylene bond, the molecular weight, and the molecular weight distribution."

Referring again to FIG. 2, and in the preferred embodiment depicted therein, it will be seen that grating forming layer 14 is comprised of a base layer 22 which, preferably, is at least about 0.25 microns thick, as well as the actual surface-relief grating 15.

The surface-relief grating 15 depicted in FIG. 2 is preferably periodic, that is substantially the same shape is repeated. In the preferred embodiment depicted in FIG. 2, the grating has a groove frequency ("G") of from about 400 to about 1,250 grating lines per linear millimeter. In one embodiment, there are from about 500 to about 900 grating lines per linear millimeter.

The distance between adjacent grating line 24 peaks (or valleys) is referred to as the grating line spacing D and is shown in FIG. 2. D is the reciprocal of G, the groove frequency and, thus, ranges from about 0.80 to about 2.5 microns and, preferably, from about 1.11 to about 2.0 microns.

The peak height of the lines 24, "h," as shown in FIG. 2, is the maximum distance from the trough to the peak of the grating lines 24. In general h ranges in height from about 0.5 microns to about 5 microns.

The ratio of h to D, which is also referred to as the grating aspect ratio, and in the preferred transmission grating embodiment depicted in FIG. 2, has a value of about 0.6 to about 2.0. In another embodiment, in which a surface-relief reflection grating is used, the h/D ratio is preferably from about 0.3 to about 0.4 for the reflection grating element.

Referring again to FIG. 1, in this preferred embodiment depicted therein, the grating 15 is a plane diffraction grating having parallel, equidistantly spaced grating lines which reside on a flat surface. When one looks down onto the grating surface of the grating element 10, he will see a multiplicity of parallel grating groove lines spaced equidistantly from each other. As is known to those skilled in the art, one of the properties of a plane diffraction grating, as described above, is that it does not introduce optical power into the diffracted beam, i.e., a collimated incident beam is diffracted as a collimated beam.

The grating 15 is believed to be substantially more durable, when tested by a specified test, than are comparable prior art photoresist surface-relief diffraction gratings. The test used to evaluate the durability of grating 15 is set forth in Bellcore publication GR-1221-CORE, issue 2, January, 1999, entitled "Generic Reliability Assurance Requirements for Passive Optical Components." At page 6-4 of this publication, a "High Temperature Storage Test (Damp Heat)" is described. This test requires that the item tested, when subjected to a temperature of 85 degrees centigrade and a relative humidity of 85 percent, have less than 0.5 decibel optical insertion loss variation after being tested for at least 500 hours if contained in a hermetically sealed enclosure or 2,000 hours if not contained in a hermetically sealed enclosure. The functionality of the item under test is periodically evaluated. A change of 0.1 decibel in optical insertion loss corresponds to a change of 2.27 percent in the optical performance of the item while a 0.5 decibel change corresponds to a 10.875 percent change in the optical performance of the item.

The preferred diffraction grating element 10 of this invention meets the aforementioned Bellcore test requirements for at least about 2,000 hours for non-hermetically sealed conditions. By comparison, a prior art photoresist surface-relief transmission diffraction grating element identical in every manner but the means in which the preferred photoresist grating element 10 is post-processed fails the aforementioned Bellcore test completely in less than about 2 hours, that is, the grating surface structure completely disappears in less than 2 hours at these test conditions.

The production of a diffraction grating assembly from photoresist is well known to those in the art. See, e.g., U.S. Pat. No. 4,289,371. The entire disclosure of this United States patent is hereby incorporated by reference into this specification.

Figure 3:
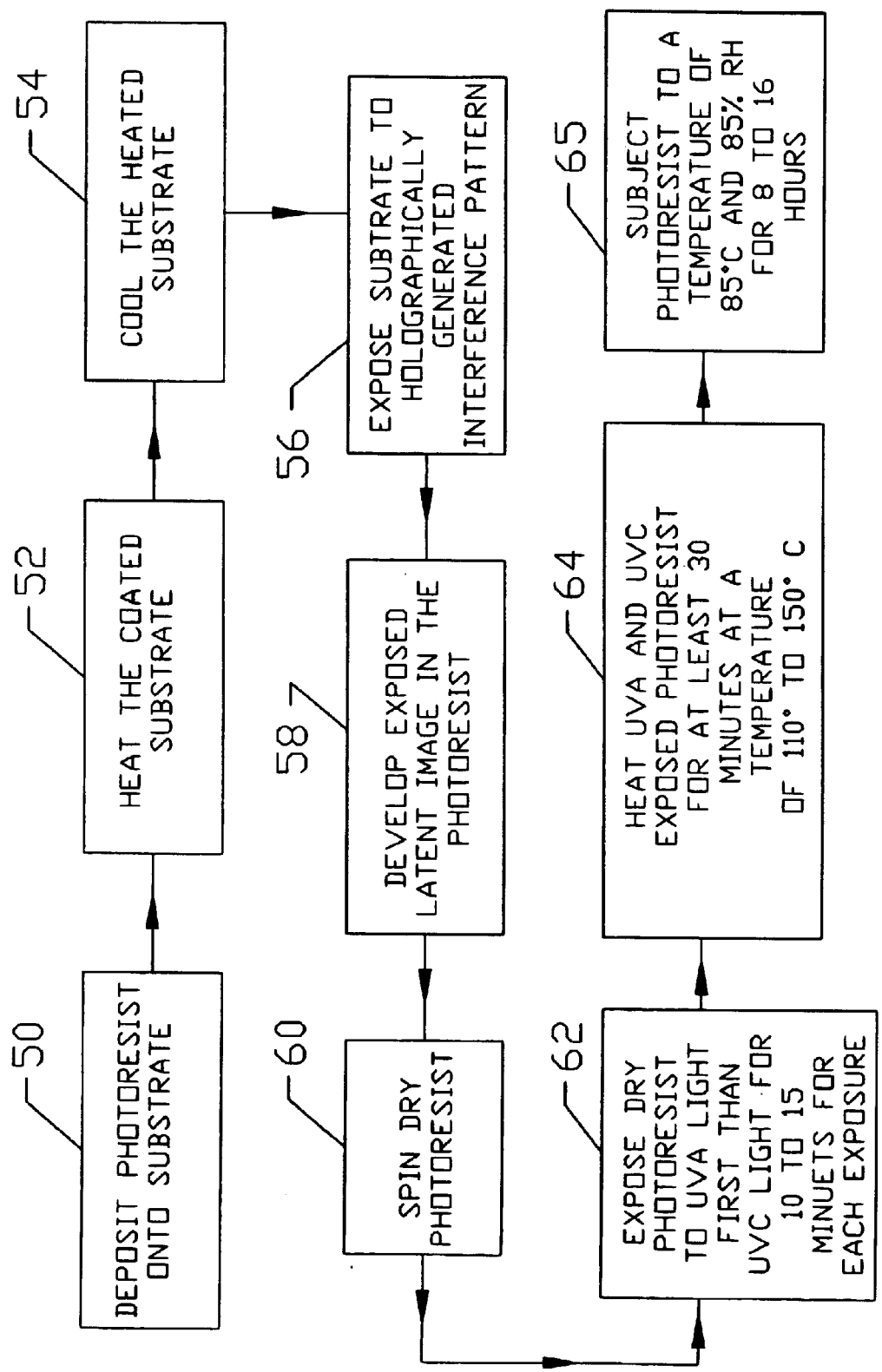
FIG. 3 is a flow diagram illustrating one preferred process for preparing the transmission grating element of FIG. 1.

One preferred process for preparing the grating element 10 of this invention is disclosed in FIG. 3. Referring to FIG. 3, and in the preferred process described therein, in step 50 photoresist is applied to the top surface of a substrate. The substrate preferably is either rectangular or circular in shape and, most preferably, is made from the fused silica glass material described elsewhere in this specification. In one preferred embodiment, the substrate is about 3.5 millimeters thick.

The preferred photoresist material, which is also described elsewhere in this specification, is spread over the top surface of the substrate to a uniform thickness, preferably by a spin coating method in which the substrate is rotated at a speed of from about 2,000 to about 4,000 revolutions per minute and the photoresist is spread and dried by centrifugal force. In one embodiment, the photoresist is applied to a thickness of about 3 microns.

Thereafter, in step 52 of the process, the coated substrate is heated to vaporize any remaining solvent in the coating. It is preferred to place the substrate onto a hot plate preheated to a temperature of about 110 degrees centigrade and to so heat the coated substrate for a period of from about 2 to about 10 minutes.

Thereafter, in step 54, the substrate is removed from the hot plate and allowed to cool under ambient conditions for at least about 5 hours.

Thereafter, in step 56, the substrate is exposed to a holographically generated optical interference pattern. Such optical interference pattern is preferably produced by two interfering collimated laser beams which are derived from the same helium cadmium laser operating at a wavelength of 442 nanometers. The angle subtended by the interfering beams determines the period of the interference pattern and, thus, the period of the final diffraction grating. Reference may be had to an article by Fujio Iwata et al. entitled "Characteristics of Photoresist Hologram and its Replica," Applied Optics, Volume 13, number 6, pages 1327 et seq. (June, 1974). Reference also may be had to a paper by H. Werlech et al. on "Fabrication of high efficiency surface-relief holograms" which was published in the Journal of Imaging Technology, 10(3):105 (1984). Reference may also be had to many different United States Patents which disclose surface-relief holograms, including, e.g., U.S. Pat. Nos. 6,160,668, 6,157,474, 6,067,214, 6,049,434, 6,017,657, 5,986,838, 5,948,199, 5,917,562, 5,896,483, 5,889,612, 5,961,990, 5,856,048, 5,838,466, 5,790,242, 5,786,910, 5,757,523, 5,757,521, 5,756,981, 5,748,828, 5,742,411, 5,712,731, 5,691,831, 5,691,830, and the like; the entire disclosure of each of these United States Patent is hereby incorporated by reference into this specification.

Thereafter, in step 58, the exposed latent image in the photoresist layer is developed by submerging the exposed photoresist in developer. A similar process for preparing, exposing and developing photoresist coated substrates is disclosed on the world wide web at http://www.ece.gatech.edu/research/labs/vc/processes/photoLith.html.

One may use conventional developing solutions such as, e.g., one or more of the photoresist developers disclosed in U.S. Pat. Nos. 6,087,655, 6,067,154, 5,881,083, 5,805,755, 5,607,800, 5,521,030, 5,113,286, 4,826,291, 4,804,241, 4,725,137, 4,617,252, 4,589,972, 4,566,889, 4,505,223, 4,469,544, 4,236,098, 4,204,866, 4,157,220, 3,945,825, 3,944,420, and the like. The entire disclosure of each of these United States Patent is hereby incorporated by reference into this specification.

In one embodiment, the photoresist developer used is Shipley's "Microposit 303A Developer." This Shipley developer is believed to be a sodium hydroxide solution at a pH of about 14.

After the photoresist has been exposed to the developer, it is rinsed with filtered deionized water and spun dry in step 60 at a speed of about 500 revolutions per minute for about 1 minute until the grating surface appears dry.

The grating is then inspected, using a laser beam, to determine its diffraction efficiency. This diffraction efficiency information may be used to adjust either the exposure time and/or development time so that the process conditions for subsequently produced gratings may be adjusted and controlled.

The steps 50 through 60 describe one set of conditions for making a photoresist surface-relief diffraction grating element. A description of some of the technology involved in these steps 50 to 60 is set forth at pages 515 to 565 of the aforementioned James R. Sheats et al. book in an article by Bruce R. Smith entitled "Resist Processing."

The steps 62 et seq. describe critical post-exposure/development steps for insuring that the ultimate grating produced has improved durability properties, as measured by the aforementioned Bellcore test. Prior to discussing the steps 62 et seq., which produce the desired durable grating, applicant will discuss the post-processing treatment suggested by the prior art.

At page 562 to 563 of the aforementioned James R Sheats et al. book, it is disclosed that: "Novolac resins generally suffer from thermal distortion . . . . To enhance the thermal properties of DNQ/novolac resins, the UV crosslinking poperties of novolac can be utilized. Although the efficiency is quite low, novolac resin can be made to crosslink at UVC wavelengths. This is facilitated at high temperatures . . . . By elevating the temperature of the "UVC"cure"process, oxidation of the bulk of the resist feature can be accomplished."

In accordance with the suggestion made in the Janes R. Sheats et al. book, applicant conducted an experiment in which the grating was post-processed by subjecting the grating to a high temperature (in excess of 100 degrees centigrade) while simultaneously subjecting the grating to ultraviolet light in the spectrum range of from about 200 to about 320 nanometers. As a result of these experimental conditions, the treated photoresist material became unacceptably dark.

In the preferred process of this invention, when the photoresist is sequentially subjected to the ultraviolet light exposure and thereafter subjected to high temperature, not only is a durable grating produced, not only does the treated photoresist material not become dark, but the treated photoresist material becomes clearer and optically more desirable.

In step 62 of the process, the photoresist surface of the developed diffraction grating is at ambient room temperature and pressure conditions directly exposed first to a lamp producing ultraviolet light in the spectrum range of from about 315 to about 400 nanometers (which is often referred to as UVA radiation) and then directly exposed to a lamp producing ultraviolet light in the spectrum range of from about 200 to about 280 nanometers (which is often referred to as UVC radiation). For example, one may use one or more of the lamps disclosed in U.S. Pat. Nos. 4,389,482, 4,344,008, 4,312,934, 4,299,911, and 4,049,457, the entire disclosure of each of which is hereby incorporated by reference into this specification.

Unlike prior processes, there is no intermediate material, except air, positioned between the UVA and UVC light sources and the photoresist. The distance between the UVA and UVC lamps and the unprotected photoresist surface is generally from about 5 to about 8 inches One may use, e.g., conventional plant grow lamps for the UVA light source and germicicidal lamps for the UVC light source such as, e.g., Germicidal Lamp FG15T8. The photoresist surface is exposed to UVA light source for about 10 minutes and to the WVC light source for about 10 to 15 minutes. If the photoresist layer thickness is less than about 1.5 microns one can also achieve good results by omitting the WVA exposure in step 62.

The Germicidal Lamp FG15T8 is 18 inches long, operates at 0.3 amperes and 56 volts, has a nominal lamp wattage of 15 watts, provides 3.5 watts of ultraviolet radiation at 253.7 nanometers, and has an average life of 8,000 hours.

Figure 9:
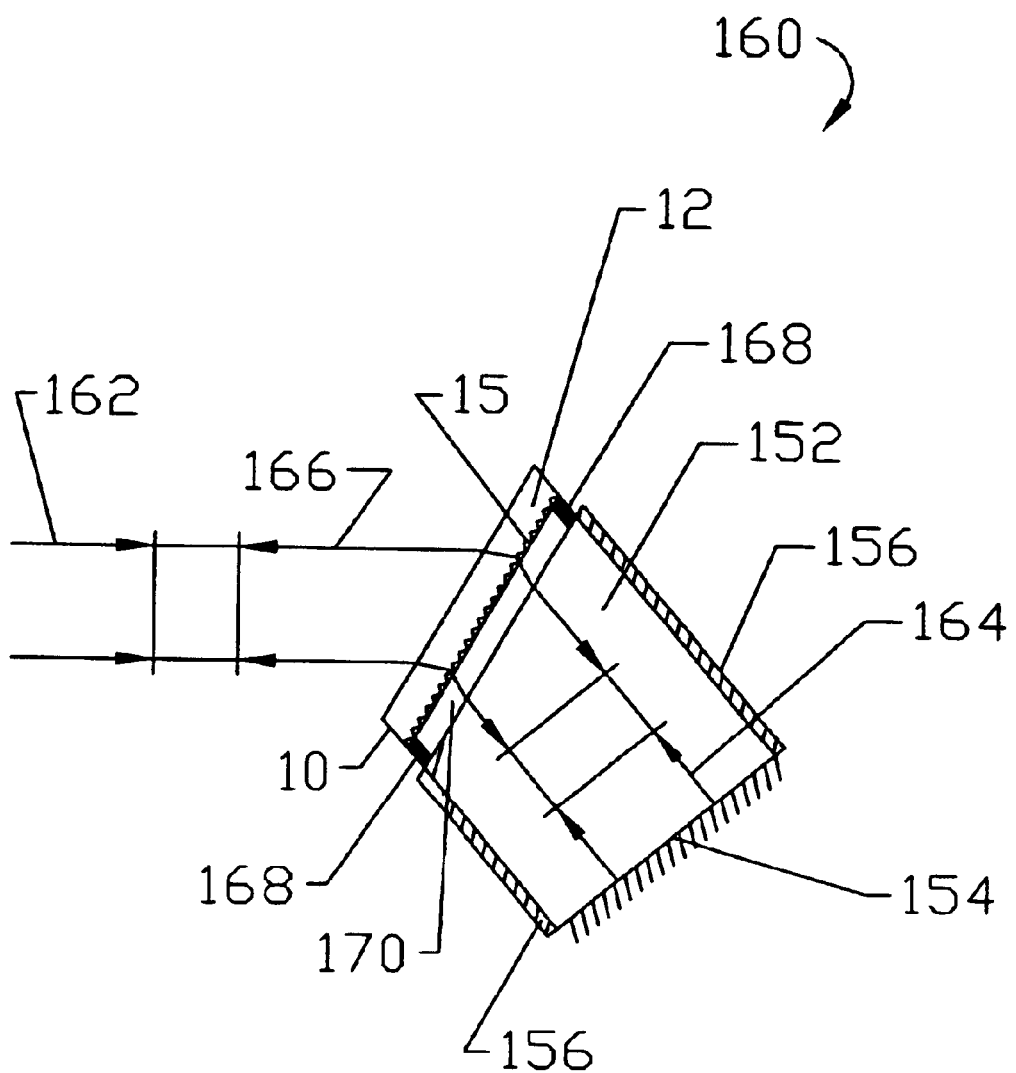
FIG. 9 is a schematic of yet another dual pass grating-based wavelength section unit utilizing the transmission grating element of FIG. 1.

Exposure of the photoresist grating forming layer to the UVA and UVC light sources at ambient room temperature and pressure conditions bleaches the photoresist layer and thereby changes the color of the photoresist layer from a yellow color to a substantially optically clear color having only a slight tint of observable color tint. The photoresist layer stays substantially optically clear not only after being heated in step 64 of the process but also after being tested for about 1,000 hours at the previously described Bellcore test conditions, whether the grating surface is uncovered or encapsulated as illustrated in FIG. 9 of this specification. It is noticed that an uncovered grating develops a very light yellow tint color after about 1,700 hours of testing at the Bellcore test conditions. This yellow tint color does not appear to affect the diffraction efficiency performance of the grating when tested at a laser wavelength of 633 nanometers.

Shipley, in their technical marketing data sheets for the Shipley S1813 Photo Resist product, presents data that shows that exposure of this photoresist to light sources having a wavelength spectrum from about 350 to 450 nanometers changes the optical absorption of the resist, particularly for optical wavelengths of less than about 500 nanometers. Applicant has observed that photoresist surface-relief transmission gratings exposed to light only in the 350 to 450 nanometer spectrum range become substantially optically clear but fail in less than about 2 hours when tested at the aforementioned Bellcore test conditions. It also has been observed that gratings exposed only to light in the 350 to 450 nanometer spectrum range fail within about 30 minutes when placed in a dry heat (<10 percent relative humidity) oven having a temperature greater than about 110 degrees centigrade. It also has been observed that gratings exposed only to light in the 350 to 450 nanometer spectrum range develop a yellow color over time if the grating surface is not encapsulated as illustrated in FIG. 9 of this specification, even when the uncovered grating elements are left at ambient room temperature and humidity conditions. It also has been observed that gratings exposed to the UVC light source but not undergoing the bake step 64 of the preferred process appear to pass the aforementioned Bellcore test but turn a yellow color only after about 160 hours of test time at the aforementioned Bellcore test conditions.

In step 64 of the process, the WVA and UVC exposed photoresist surface is then heat treated by being heated in a relatively dry oven to a temperature of from about 110 to about 150 degrees centigrade, preferably for at least about 30 minutes. It is preferred that the photoresist surface be placed into a preheated oven at the desired temperature of from about 110 to about 150 degrees centigrade. Good results are obtained by using a hot plate having a temperature of between 110 to 120 degrees centigrade in place of the dry oven bake in step 64.

For non-hermetically sealed surface-relief transmission grating elements having a grating forming photoresist layer thickness of less than about 1.5 microns that undergo steps 62 and 64 of the process presented in FIG. 3, the grating elements after being tested at the aforementioned Bellcore test conditions of 85 degrees centigrade and 85 percent relative humidity for at least 2,000 hours have optical performance as measured by their diffraction efficiency values for light of 633 nanometers and S optical polarization that is within 6 percent of the optical performance they had prior to being tested at the Bellcore test conditions. Therefore, grating elements having a grating forming photoresist layer thickness of less than about 1.5 microns undergoing steps 62 and 64 of the process pass the aforementioned Bellcore test conditions since this Bellcore test deems that an item passes these test conditions if its optical performance does not change by more than 0.5 decibels (10.87 percent) after being tested for 2,000 hours at these test conditions.

It has been observed that non-hermetically sealed surface-relief transmission grating elements having a grating forming photoresist layer thickness of about 2.0 to 3.0 microns that undergo steps 62 and 64 of the process presented in FIG. 3 will not pass the aforementioned Bellcore test conditions since usually the P polarization diffraction efficiency of the grating element reduces in value by between about 0.5 to 2.0 decibels and sometimes the S polarization diffraction efficiency will change by about 0.5 to 1.0 decibel after the element is initially exposed to the 85 degree centigrade and 85 percent relative humidity test conditions for about 8 to 16 hours. After this initial reduction in diffraction efficiency, it is observed that the diffraction efficiency of the grating element appears to stabilize and remain fairly constant within about ±0.15 decibels when the element is tested at the aforementioned Bellcore test conditions for more than 500 hours. Therefore, step 65, which entails preconditioning the grating element by subjecting it to a temperature of 85 degrees centigrade (° C.) and a relative humidity (RH) of 85 percent for about 8 to 16 hours, is included in FIG. 3 to ensure that all surface-relief transmission grating elements having a grating forming photoresist layer thickness of about 1.0 to 3.0 microns pass the aforementioned Bellcore test conditions.

It has also been observed that grating elements undergoing steps 50 to 64 of FIG. 3 appear to pass the aforementioned Bellcore test conditions when rinsed in water and dried after step 64 of FIG. 3.

It should be noted that the grating fabrication processing steps 50 through 65 of FIG. 3 can be utilized to produce both surface-relief transmission gratings and surface-relief reflection gratings. Surface relief transmission gratings fabricated with these processing steps are exposed and developed so that the finished grating has a grating aspect ratio in the range of about 0.6 to about 2.0, while surface-relief reflection gratings fabricated with these processing steps are exposed and developed so that the finished grating has a grating aspect ratio in the range of about 0.3 to about 0.4. After step 65 of the process, the grating surface of a reflection grating is preferably coated with a reflecting metal film, such as gold or aluminum. The reflective metal film is usually applied to the grating surface using either evaporation or electronic beam sputtering techniques that are performed in a vacuum chamber.

The finished diffraction grating has certain unique properties. It has the durability property and substantially optically clear color property that are described elsewhere in this specification. It also preferably has a diffraction efficiency of greater than 70 percent for optical wavelengths in the 1280 to 1620 nanometer spectrum region that fiber-optic communication systems use. It also preferably has essentially equal diffraction efficiency values for S and P polarized optical components, that is, the S and P polarizations have diffraction efficiency values within about 5 percent of each other.

Figure 4:
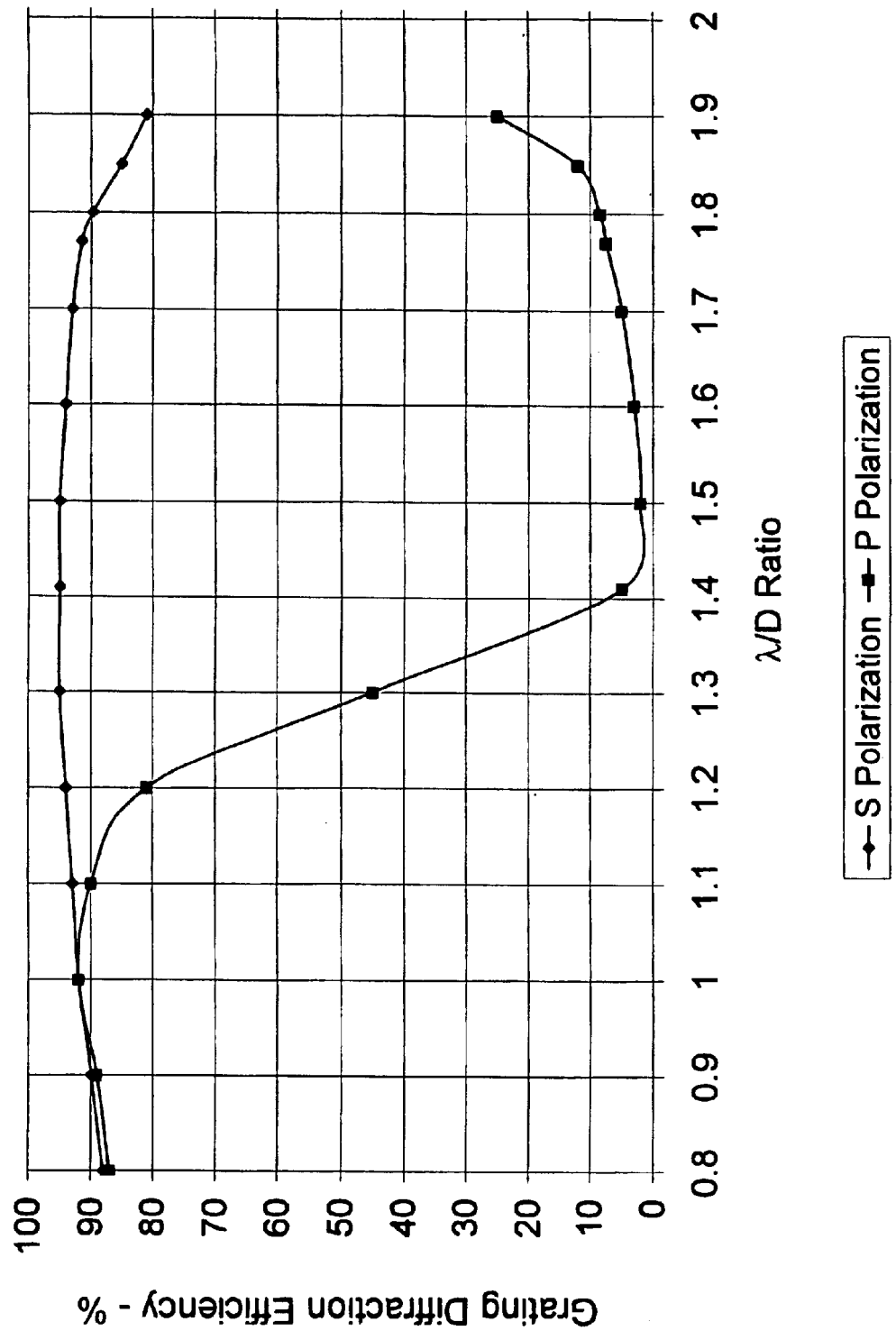
FIG. 4 is a graph illustrating the effect of varying the ratio of certain grating characteristics upon grating diffraction efficiency of the transmission grating element of FIG. 1.

FIG. 4 presents measured first order diffraction efficiency data for a sinusoidal surface-relief transmission grating formed in photoresist. This data is presented as a function of λ/D which is the ratio of the optical wavelength, λ, of the beam diffracted by the grating divided by the grating line spacing, D, and for the Littrow diffraction condition, that is $\theta_i = \theta_d$. FIG. 4 presents data only for the λ/D ratio range of 0.8 to 2.0 since this is the range that would be used to fabricate surface-relief gratings used in telecommunication devices.

The definition used to calculate the grating diffraction efficiency data values in FIG. 4, and used in this specification in reference to grating diffraction efficiency, is that the diffraction efficiency of a grating element is the ratio of the intensity of the diffracted order beam divided by the intensity of the beam incident to the grating diffracting surface for either the S or P polarized optical component of the beam. This definition of grating diffraction efficiency is based on a diffracted order beam intensity that excludes optical insertion losses in the grating element due to reflection losses at the substrate non-grating surface or by optical absorption within the substrate material. These substrate related optical insertion losses are excluded from the calculation of the grating diffraction efficiency value because they can be minimized by using antireflection coatings on the non-grating substrate surfaces and/or by using substrate materials having low optical absorption for the wavelength spectrum used with the grating element.

The measured data points are shown on the graph in FIG. 4 as solid diamonds for S polarization and as solid squares for P polarization, while the drawn curves represent the best fix to this data. In this specification, when discussing the performance of a transmission diffraction grating, we will use the American polarization convention, that is, S polarized light has its electric field parallel to the grating lines (TE polarization) while P polarized light has its electric field perpendicular to the grating lines (TM polarization). To achieve the high diffraction efficiency values presented in FIG. 4, the surface-relief transmission grating must have a deep groove profile shape, that is, the grating aspect ratio must be between about 1.3 and 2.0.

Examination of FIG. 4 reveals that essentially equal diffraction efficiency values for both S and P polarization optical components can be achieved with a transmission sinusoidal surface-relief grating having a $\lambda/D$ range of about 0.8 to approximately 1.15. Also, as the FIG. 4 data shows, surface-relief transmission gratings can achieve diffraction efficiency values of greater than 85 percent for both S and P polarizations for the 0.8 to 1.15 $\lambda/D$ ratio range and do not exhibit the anomalies in diffraction efficiency performance as a function of $\lambda/D$ ratio that are observed with reflecting surface-relief gratings. The high diffraction efficiency and lack of anomalies observed with surface-relief transmission gratings occur because they do not contain metal and, therefore, do not have in the visible or near infrared spectrum region complex absorption properties that are characteristic of metal coated surface-relief reflection gratings.

Based on the FIG. 4 data, surface-relief transmission grating elements having a $\lambda/D$ range of about 0.8 to approximately 1.15 are well-suited for building multiplexer/demultiplexer (Mux/Demux), optical channel monitor (OCM), wavelength channel add/drop and wavelength channel variable attenuator devices used in a wavelength-division multiplexing ("WDM") fiber-optic telecommunication system since all of these devices should have a polarization dependent loss (PDL) value of less than or equal to about 0.2 decibels (dB) and most of these devices should have high radiometric throughput efficiency. Radiometric throughput efficiency for an element, component, device or a system is defined as the ratio of the intensity of the optical beam exiting the element, component, device or system divided by the intensity of the optical beam incident to the component, device, or system and is usually measured for each optical polarization component. The diffraction efficiency of the grating element or elements used in grating-based fiber-optic devices is a key parameter but not usually the most significant parameter in determining the radiometric throughput efficiency of these devices. The diffraction efficiency of grating elements used for building optical channel monitor devices is not an important parameter since the incident beam intensity to these devices is normally attenuated by 10 to 100 times because of the high sensitivity of the photodetector array unit used in these devices.

The polarization dependent noise level of a fiber-optic communication system is increased when it incorporates a device having a PDL value greater than about 0.2 dB, corresponding to the device having greater than about 5 percent difference between its radiometric throughput efficiency values for S and P polarized optical components. This increase in polarization dependent noise level occurs because the optical beams propagating in fiber-optic communication systems have no defined polarization direction and continually change polarization direction as a function of time.

Because the polarization dependent noise level of a device used in a fiber-optic communication system is determined by the difference between its radiometric throughput efficiency values for S and P polarized optical components, the preferred grating-based device embodiments in this specification are preferably operated to have radiometric throughput efficiency values for S and P polarizations that are equal to within about 5 percent of each other and, thereby achieve a PDL value equal to or less than about 0.2 dB. This is accomplished in some of the preferred grating-based device embodiments by using surface-relief diffraction grating elements that have essentially equal diffraction efficiency values for S and P optical polarizations, while other embodiments in this specification incorporate other optical elements in the device to compensate for the PDL value of the grating element used in the device. While not specifically stated for each of the preferred grating-based device embodiments in this specification, the other optical components used in these devices, such as prisms, lenses, mirror reflecting surfaces, non-grating transmitting surfaces, etc., incorporate thin film optical coatings that not only improve the radiometric efficiency performance of the component, and therefore the device, but also ensure that these components have radiometric throughput efficiency values for S and P optical polarization components that are equal to within about 5 percent of each other if the grating element used in the device has a diffraction efficiency difference of up to about 15 percent between the S and P polarized optical components, its radiometric throughput inefficiency difference for S and P polarizations can be compensated for by incorporating thin film coated optical components into the device that have the opposite radiometric throughput inefficiency difference with regard to the S and P polarization components. Some of the preferred device embodiments incorporate a polarization controlling optical element or elements that enable the device to achieve a PDL value of less than or equal to 0.2 dB, even though the device incorporates a grating element or elements that have greater than 10 to 1 difference in the diffraction efficiency values for S and P polarization components.

To summarize the preceding statements, the preferred grating-based device embodiments in this specification are configured so that the optical components of the device function as an optically integrated assembly so that the device achieves radiometric throughput efficiency values for S and P polarized optical components that are equal to within about 5 percent of each other, thereby achieving a PDL value equal to or less than about 0.2 dB.

Based on the stated goal to have PDL values for fiber-optic devices be less than or equal to about 0.2 dB, diffraction grating elements used in these devices would ideally have a PDL value of less than 0.2 dB, and preferably less than 0.1 dB. While there is no standard definition for calculating the PDL value for a diffraction grating-based element, component or device, it can be shown that these PDL values can be calculated as:

$$PDL = 10 LOG(PE/SE), \quad (1)$$

where the results are given in dB, and SE and PE are, respectively, the radiometric throughput efficiency values of the element, component or device for the S and P polarization components. The PDL value for a grating element varies as a function of the following parameters: the λ/D ratio of the grating element, the angles that the incident and diffracted beams make with the normal to the grating surface, and the diffraction order in which the grating element is operated. Most people would take the absolute value of Equation (1) before reporting the PDL value, but that eliminates slope information about the PDL value. This PDL slope information can be used to improve the PDL performance of a device relative to the PDL value of the grating element used in the device. This improvement of PDL device performance is accomplished by using other optical elements in the device to compensate for the PDL value of the grating element.

For example, one might use either reflective or antireflective (AR) coatings on the other optical components in a device to improve the PDL value of the device relative to the PDL value of the grating element used in the device. In theory one could use this proposed PDL compensation technique to construct devices having PDL values of about 0.1 dB that incorporate grating elements having PDL values equal to or greater than about 0.6 dB. Potential disadvantages associated with this proposed PDL compensation technique include: a) the device must incorporate optical elements whose optical coatings lend themselves to improvement of the PDL performance of the device; and b) the reflective or antireflective coatings will have to be adjusted relative to the PDL value of the grating element used in the device which could increase device manufacturing costs if there are significant variations in the PDL values of the grating elements used in manufacturing the devices. This proposed PDL compensation technique and other methods for improving the PDL performance of devices relative to the PDL value of the grating elements used in the devices will be discussed further in this specification.

Figure 5:
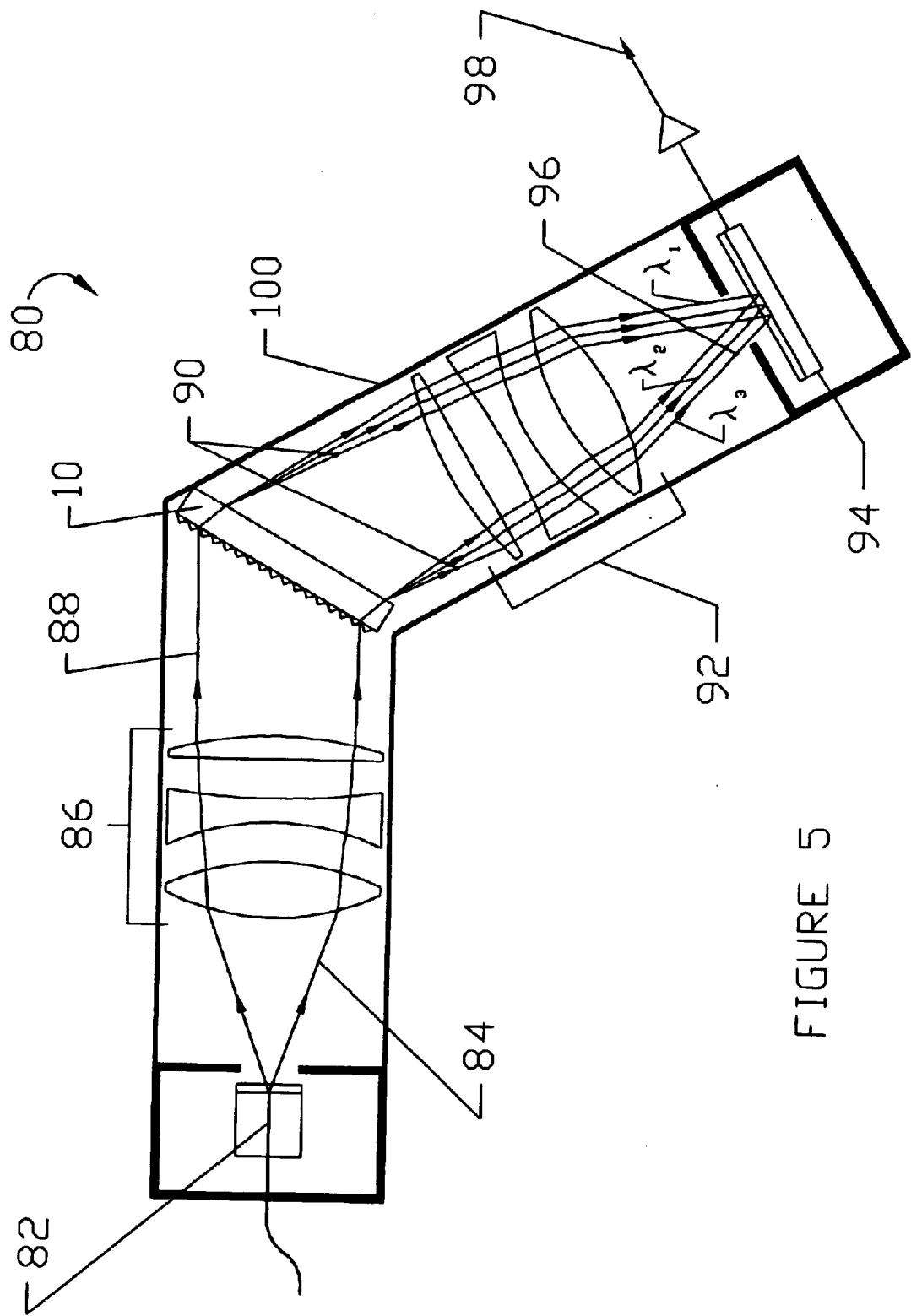
FIG. 5 is a schematic illustrating a spectrophotometer which utilizes the transmission grating element of FIG. 1.

FIG. 5 schematically illustrates a preferred embodiment in which the surface-relief transmission grating element 10 is incorporated into a spectrophotometer based optical channel monitor (OCM) device 80 used as part of an on-line wavelength channel monitoring system capable of obtaining information about the optical power, wavelength and optical-signal-to-noise ratio of each wavelength signal channel in a WDM fiber-optic communication system.

As depicted in FIG. 5, input optical wavelength channel signal information is delivered to OCM device 80 by transmission fiber 82. Input transmission fibers are well known to those skilled in the art and are disclosed, e.g., in U.S. Pat. Nos. 6,151,145, 5,798,855, 5,790,285, 5,745,613, 5,532,864, 5,452,124, 5,377,035, and the like. The entire disclosure of each of each of these United States patents is hereby incorporated by reference into this specification.

The input transmission fiber 82 to the OCM device 80 contains $\lambda_1$, $\lambda_2$, and $\lambda_3$ wavelength channel signals which exit from the end of the fiber as a diverging optical ray bundle 84. The collimating lens assembly 86 receives the ray bundle 84 diverging from the end of the input fiber 82 and converts it into a collimated beam 88 that is incident on the transmission grating element 10. After being diffracted by element 10 the incident beam 88 is separated into $\lambda_1$, $\lambda_2$, and $\lambda_3$ wavelength channel beams 90 which propagate at slight angles with respect to each other in the plane which is perpendicular to the diffraction grating lines of element 10, which FIG. 5 resides in. The focusing lens assembly 92 receives the angularly separated collimated $\lambda_1$, $\lambda_2$, and $\lambda_3$ wavelength beams 90 from the grating element 10 and focuses these beams onto the surface of the photodetector linear array element 94.

The spatially separated focused wavelength channel beams 96 are incident on different photosensitive elements (not shown) in the photodetector array 94 and, thereby, generate an independent electrical signal 98 for each wavelength channel beam. The amplitude of each electrical signal 98 is proportional to the average light intensity of the wavelength channel beam incident on the photodetector element generating that signal. While only three wavelength channel beams are shown being used with the OCM device 80 of FIG. 5, it is evident that device 80 can be used with many more wavelength channel beams. An InGaAs (indium gallium arsenide) photodetector array will normally be incorporated into OCM devices used for communication systems operating in the 1280 to 1620 nanometers spectrum region. Commercial InGaAs photodetector arrays are available with 128, 256, and 512 photodetector elements having either 25 or 50 micron spacing between element centers. InGaAs photodetector fibers are well known to those skilled in the art and are disclosed, e.g., in U.S. Pat. Nos. 5,838,470, 5,714,773, 5,428,635, 5,386,128, 5,055,894, 4,879,250, and the like. The entire disclosure of each of these United States patents is hereby incorporated by reference into this specification.

In the OCM device 80 of FIG. 5 the optical components are enclosed within a housing 100, which protects the optical components from contaminants. It is preferred that the housing 100 be comprised of components which do not adversely affect the performance of the optical components over the 70 degree operating temperature range specified for fiber-optic devices.

The spatial separation between the focused wavelength channel beams 96 at the surface of the photodetector array 94 of device 80 is proportional to the diffracted angular separation between wavelength channel beams 90. The angle through which each wavelength beam is diffracted by the grating element 10 can be calculated using the grating equation:

$$\sin\theta_i + \sin\theta_d = \frac{m\lambda}{D}, \quad (2)$$

where $\theta_i$ and $\theta_d$ are, respectively, the angles that the incident and diffracted beams make with respect to the grating surface normal, λ is the optical wavelength of the incident and diffracted beam, D is the grating line groove spacing, and m is the diffraction order (or spectral order) which is an integer (m=0,±1,±2 . . . ). For the devices shown in this specification it will be assumed that we are using the first diffracted order beams, that is, m=1. The diffracted angular separation, $d\theta_d$, between the wavelength beams 90 is calculated by differentiating Equation (2) with respect to dλ, which gives:

$$\frac{d\theta_d}{d\lambda} = \frac{m}{D\cos\theta_d}, \quad (3)$$

The ratio $d\theta_d/d\lambda$ is the wavelength dispersion power of the diffraction grating element 10. This ratio for grating-based telecommunication devices is usually stated in terms of degrees per nanometer (deg/nm). The spatial separation, W, between the focused wavelength channel beams 96 at the surface of the photodetector array 94 of device 80 is given by:

$$W = f\tan(Ed\theta_d) \approx \frac{mfEd\lambda}{D\cos\theta_d}, \quad (4)$$

where f is the focal length of the focusing lens assembly 92 used in device 80 and E is a magnification factor that accounts for changes in the wavelength dispersion power of the device due to optical elements in the device other than the grating element. A beam expanding and linearizing prism element is sometimes included in a grating-based device used in a WDM fiber-optic system to enable the device to essentially achieve an equal spacing between the spatially separated wavelength channel beam spots at the focal plane of the device. The inclusion of this beam expanding/linearizing prism element in the device normally increases the wavelength dispersion power of the device and, therefore, the prism element would have an E magnification factor value of greater than 1. For devices of interest, $\tan(E\ d\theta_d)$ is accurately approximated by using the first term in its Taylor series, as indicated in Equation (4).

Examination of Equation (4) reveals that as the spacing between wavelength channels, $d\lambda$, decreases in a WDM fiber-optic system from 3.2 to 1.6 to 0.8 to 0.4 nanometers, corresponding to a frequency decrease in channel spacing from 400 to 200 to 100 to 50 GigaHertz, the spatial separation between the wavelength beams 96 at the surface of the photodetector array 94 proportionally decreases. Because the spacing between the photosensitive elements of the photodetector array 94 are essentially fixed at 25 or 50 micrometers, the focal length of the collimating/focusing lens assembly 92 must be increased and/or the wavelength dispersion power of the device must be increased. Increasing the focal length of the focusing lens assembly 92 of the device 80 has a number of undesirable associated results. These undesirable results include: the scaling of lens aberrations with focal length, which increases the focused spot sizes of the wavelength beams at the focal plane of the device; device performance stability becomes more sensitive with regard to both mechanical and thermal induced changes; and the size of the device increases, which is opposite to the trend for fiber-optic communication devices.

The wavelength dispersion power of a grating-based device can be increased by using either one or a combination of the following methods: 1) by using a grating element in the device an having a finer grating line spacing, corresponding to a higher $\lambda/D$ ratio for the grating element; 2) by using a larger diffraction angle from the grating element in the device; 3) by operating the grating element in the device in a higher diffraction order; or 4) by incorporating in the device an optical element that magnifies the wavelength dispersion power of the grating element in the device, that is, an optical element having an E magnification factor that is larger than 1. Increasing the $\lambda/D$ ratio of the grating element 10 used in the device usually has the undesirable result of grating element 10 having significantly different diffraction efficiency values for the S and P polarized components of the diffracted optical beam, which increases the PDL value of the device unless compensated for. Having the diffraction angle of the grating element 10 be significantly larger than the incident beam angle, that is greater than about 15 degrees different from the Littrow diffraction condition, and/or operating the grating element 10 in a diffraction order higher than the first order can also increase the PDL value of grating element and the device incorporating it unless compensated for. Incorporating an optical component in the device that magnifies the wavelength dispersion power of the grating element 10 can normally be used to increase the wavelength dispersion power of the device without increasing the PDL value of the device.

Based on the diffraction efficiency data in FIG. 4, one can estimate the wavelength dispersion power and PDL performance that can be achieved for the OCM device 80 in FIG. 5 incorporating grating element 10. For example, the FIG. 4 data shows that a transmission sinusoidal surface-relief grating element having a $\lambda/D$ ratio of about 1.15 will still achieve a PDL value in the range of about 0.2 dB. If this grating element is operated at the Littrow diffraction condition, that is $\theta_i=\theta_d=35.1$ degrees, the grating element and device 80 incorporating it achieve a wavelength dispersion power of about 0.052 deg/nm for a wavelength of 1550 nm. One can increase the wavelength dispersion power of this grating element and device 80 incorporating it to about 0.06 deg/nm by operating the grating element so that $\theta_i=26.3$ degrees and $\theta_d=45$ degrees. While the data in FIG. 4 is for grating elements operated at the Littrow condition, experience indicates that similar diffraction efficiency performance is achieved when the grating element is operated slightly off the Littrow condition, such as the 10 degrees in the preceding example. The diffraction order is m=1 for this example since grating elements having a $\lambda/D$ ratio of 1.0 or larger can only function in the first diffracted order.

The required focal length of the focusing lens assembly 92 used in the FIG. 5 OCM device 80 can be calculated with Equation (4). For these calculations it will be assumed th at the 1.15 $\lambda/D$ grating element 10 analyzed in the preceding paragraph is incorporated in device 80 and that the adjacent spatially separated focused wavelength channel beams 96 in device 80 are incident on adjacent photosensitive elements in the photodetector array 94 and that these elements have a 50 micron spacing between element centers. When grating element 10 is operated at the Littrow condition, the focusing lens assembly 92 used in device 80 must have a focal length of about 69 millimeters when used with a WDM fiber-optic system having 0.8 nanometers (100 GigaHertz) spacing between adjacent wavelength channels. One could reduce the focal length for this WDM system requirement down to approximately 60 millimeters by operating grating element 10 so that $\theta_i=26.3$ degrees and $\theta_d=45$ degrees.

For the condition assumed in the preceding example, that the adjacent spatially separated focused wavelength channel beams 96 in device 80 are incident on adjacent photosensitive elements in the photodetector array 94, device 80 would have relatively poor wavelength resolution capability and would be limited to measuring only the power of each wavelength channel beam in the WDM fiber-optic system. By having the adjacent spatially separated focused wavelength channel beams 96 in device 80 be incident on photosensitive elements in the photodetector array 94 that are separated by between 3 to 12 photosensitive elements, one can increase the wavelength resolution power of device 80, thereby enabling it to provide information about the optical power, wavelength and optical-signal-to-noise ratio of each wavelength signal channel beam in a WDM fiber-optic system. Device 80 would have to incorporate a focusing lens assembly 92 that has a has a focal length of between about 120 millimeters to about 400 millimeters when it incorporates a grating element 10 having a 1.15 $\lambda/D$ ratio and is designed to separate adjacent wavelength channel beams 96 by 3 to 6 photosensitive elements in a 256 element array 94 having 50 micron spacing between adjacent elements.

Figure 6:
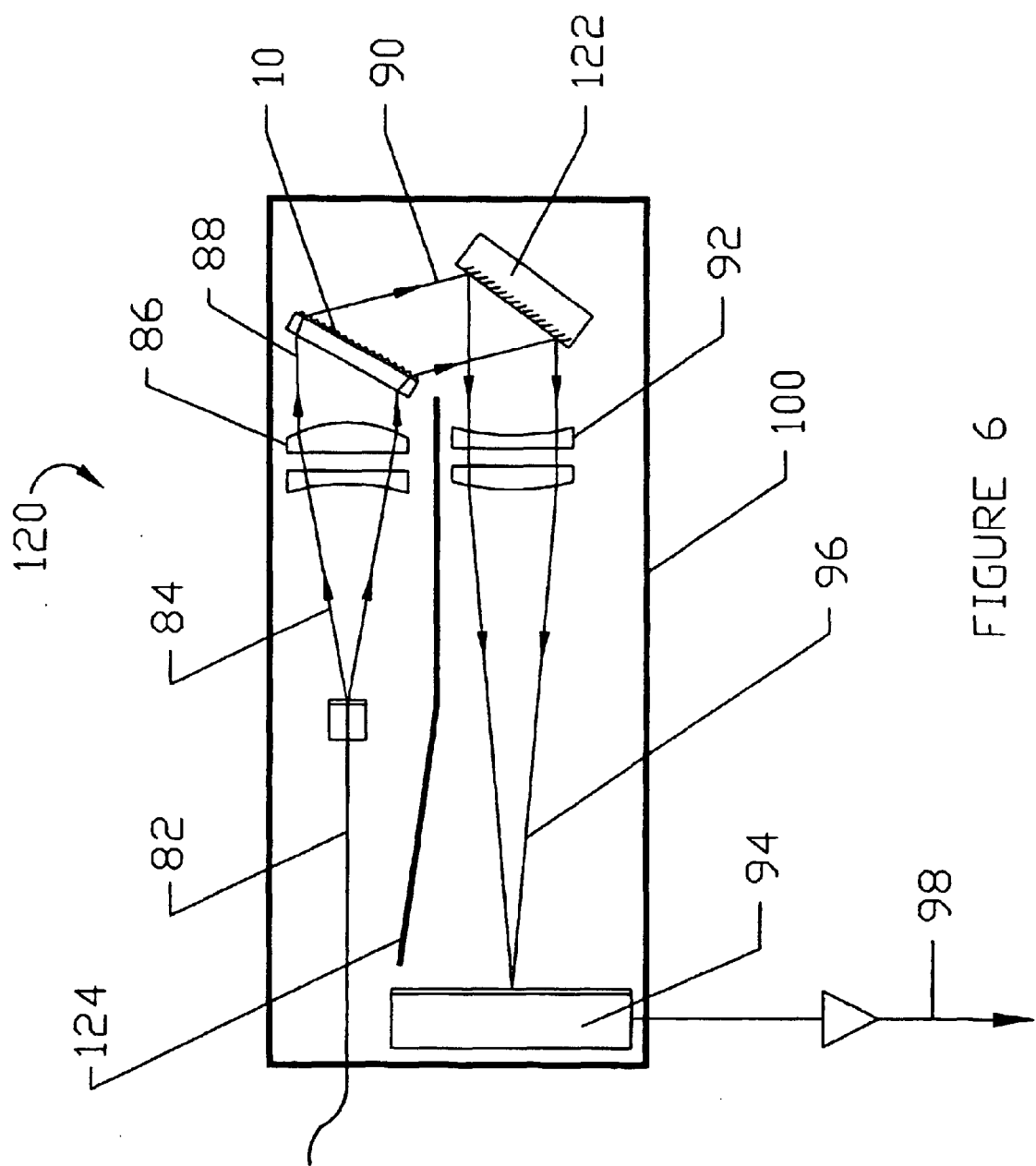
FIG. 6 is a schematic of a spectrophotometer which utilizes the transmission grating element of FIG. 1.

One may physically shorten the FIG. 5 OCM device 80 by positioning a beam fold mirror element after the transmission grating element 10 in device 80 such that the mirror reflects the diffracted beams essentially parallel to the input beam path 88, as depicted in FIG. 6. The OCM device 120 in FIG. 6 functions exactly as described for the OCM device 80 in FIG. 5. In addition to incorporating beam fold mirror element 122, the device 120 has been modified relative to the device 80 in FIG. 5 in several ways. Only a single wavelength beam 90 is depicted in device 120. The focal length of the focusing lens assembly 92 in device 120 is significantly longer than the focal length for the collimating lens assembly 86 used in this device. The collimating and focusing lens assemblies in device 120 are depicted as air spaced doublets as compared with the air spaced triplet lens assemblies depicted in device 80 of FIG. 5. The transmission grating element 10 in device 120 is depicted as functioning with $\theta_i$=28 degrees and $\theta_d$=45 degrees, while the transmission grating element 10 in device 80 of FIG. 5 is depicted as functioning with $\theta_i$=$\theta_d$=30 degrees. Device 120 incorporates an internal light baffle element to shield the photodetector linear array element 94 from any back-scattered light originating in the input beam path prior to and including the grating element 10. The size of the photodetector linear array element 94 in FIG. 6 is depicted considerably larger than the corresponding element in FIG. 5 to more accurately reflect the dimensions of current commercially available InGaAs linear array elements.

Because the collimating and focusing lens functions in the FIGS. 5 and 6 OCM devices are separate, one can optimize the lenses used for these imaging functions and thereby potentially improve upon the performance/cost ratio of the device. While the collimating and focusing lens assemblies in FIGS. 5 and 6 are depicted as composed of either three or two conventional air spaced singlet lens elements, one could use fewer or more conventional air spaced spherical lens elements, and/or conventional cemented spherical lens elements, and/or lens elements having aspheric surfaces and/or gradient index based lens elements, such as a SELFOC lens (sold by NSG America, Inc. of Somerset, N.J.) for these lens assemblies. One could also use a combination of lens and mirror elements, or just mirror elements, to construct the collimating and focusing lens assemblies depicted in FIGS. 5 and 6. The collimating lens assemblies used in the FIGS. 5 and 6 devices can have a simpler lens assembly configuration than used for the focusing lens assemblies in these devices since the collimating lens function only on axis.

Appropriate lens assembly combinations will be apparent to those skilled in the art, as described in the following patents. Typical collimating lens assemblies are disclosed in U.S. Pat. Nos. 6,279,464, 6,169,630, 6,137,933, 6,028,706, 6,011,885, 6,011,884, 6,008,920, 4,852,079, 4,405,199, and the like. Focusing lens assemblies are disclosed, e.g., in U.S. Pat. Nos. 6,167,174, 6,097,860, 6,097,025, 6,094,261, 6,075,592, 5,999,672, 5,793,912, 5,450,510, 5,450,223, 5,440,669, 5,026,131, 4,479,697, and the like. The entire disclosure of each of these United States Patents is hereby incorporated by reference into this specification.

The focusing lens assembly 92 in device 120 of FIG. 6 is depicted as having a focal length that is in the range of 2 to 3 times longer than the focal length used for the collimating lens assembly 86 used in this device. This 2 to 3 difference in focal lengths between these lens assemblies can be used because the InGaAs photodetector linear arrays 94 used in the OCM devices 80/120 have an element cell size in the range of 25 to 50 microns, while the input fibers 82 used in these devices have a core diameter in the range of 8 to 9 microns. Because of the 3 to 1 or greater ratio between input fiber core diameter and photosensitive element cell size for the FIGS. 5 and 6 monitoring devices, one can use a collimating lens assembly in these devices having a focal length which is only approximately one-third of the focal length used for the focusing lens assembly incorporated in these devices and thereby optimize the numerical aperture (NA) imaging performance for each lens assembly, which should improve the performance/cost ratio of the device.

While the inclusion of the beam fold mirror element 122 in device 120 of FIG. 6 reduces the physical size of the OCM device relative to the embodiment illustrated in FIG. 5, it does not change the wavelength dispersion properties of the device relative to that achieved with the FIG. 5 device. The beam fold mirror element 122 can be configured so that it not only reduces the size of the device but also effectively doubles the wavelength dispersion power of the transmission grating element 10 used in the device.

Figure 7:
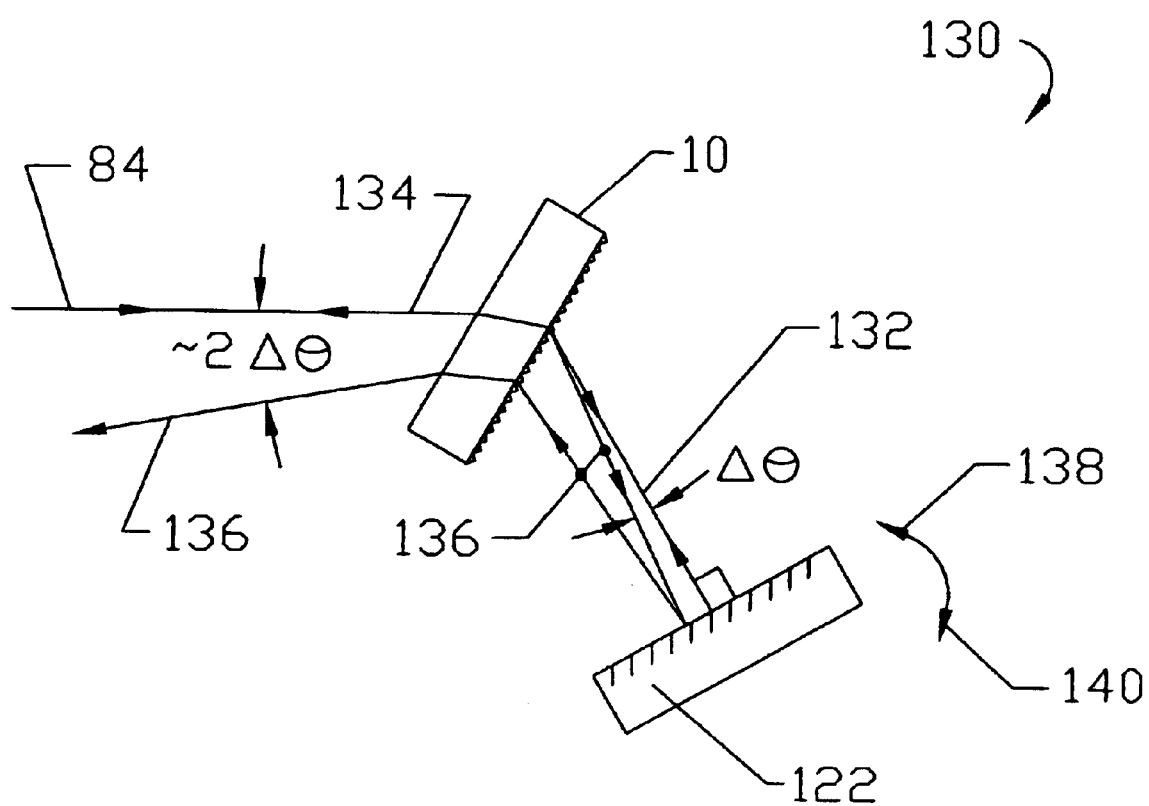
FIG. 7 is a schematic of a dual pass grating-based wavelength selection unit which utilizes the transmission grating element of FIG. 1.

FIG. 7 schematically illustrates how a beam fold mirror element 122 can be utilized so that the incident beam 84 makes a dual pass through the surface-relief transmission grating element 10 and thereby doubles the wavelength dispersion power of the grating element 10. The incident beam 84 to the transmission grating element 10 in device 130 of FIG. 7 contains $\lambda_1$ and $\lambda_2$ wavelength components. After the incident beam is diffracted by the grating element 10, these optical wavelength components are angularly separated by $\Delta\theta$. The mirror element 122 in device 130 is angularly orientated so that the $\lambda_1$ wavelength beam 132 is retro-reflected back on itself. Because the grating element 10 functions in a reversible manner, the grating element 10 rediffracts the retro-reflected $\lambda_1$ wavelength 132 beam back along the direction of the incident beam 84 as beam 134. The dual pass transmission grating arrangement of device 130 mimics a reflection grating element operating at the Littrow condition for the $\lambda_1$ wavelength beam, since this beam is retrodiffacted back on itself. After reflecting from the mirror element 122, the $\lambda_2$ wavelength beam 136 in device 130 propagates back to the grating element 10 where, due to its angle of incidence, the $\lambda_2$ wavelength beam 136 is rediffracted from the grating element 10 with an angle equal to approximately $2\Delta\theta$ relative to the propagating direction of the retro-diffracted $\lambda_1$ wavelength beam 134.

The angular separation, $d\theta_{ds}$, between beams 134 and 136 for the dual pass grating arrangement in FIG. 7 is calculated by differentiating Equation (2) with respect to $d\theta_i$, which gives:

$$d\theta_{ds}=-[\cos\theta_i/\cos\theta_d]d\theta_i=2[\cos\theta_i/\cos\theta_d]d\theta_d, \quad (5)$$

where for the grating/mirror arrangement in FIG. 7, $d\theta_i=-2\,d\theta_d$, since the angle between the $\lambda_2$ beam 136 incident on the mirror element 122 and the $\lambda_2$ beam 136 reflected from mirror element 122 is $2\Delta\theta$. Equation (3) is used to calculate the value for $d\theta_d$. For the dual pass grating arrangement depicted in FIG. 7, $\theta_i\approx\theta_d$ and, therefore, $d\theta_{ds}\approx2\,d\theta_d=2\Delta\theta$.

The grating element 10 and mirror element 122 combination in device 130 of FIG. 7 enables this dual pass grating configuration to achieve a wavelength dispersion power of about 0.064 deg/nm to about 0.097 eg/nm for a wavelength of 1550 nanometers when the grating element 10 in this configuration has, respectively, a $\lambda/D$ ratio of about 0.8 to about 1.1 and is operated in the first order Littrow diffraction condition. Device 130 can achieve this wavelength dispersion power while still achieving essentially equal diffraction efficiency values for S and P polarized optical components and, thereby have a PDL value equal to or less than 0.2 dB. The relatively high wavelength dispersion power and PDL performance provided by these dual pass transmission grating-based devices provide advantages when these devices are used in WDM fiber-optic communication systems. By comparison, a transmission grating element 10 operated in a single pass mode in the first order Littrow diffraction condition needs a BID ratio of about 1.32 to about 1.60, respectively, to achieve a wavelength dispersion power of about 0.064 deg/nm to about 0.097 deg/nm for a wavelength of 1550 nanometers. As shown by the diffraction efficiency data FIG. 4, transmission sinusoidal surface-relief grating elements having a $\lambda/D$ ratio of about 1.32 to about 1.6 have greater than 90 percent diffraction efficiency for S polarization and less 40 percent diffraction efficiency for P polarization and, therefore, have poor PDL performance unless used with polarization controlling optical elements.

The grating/mirror combination in device 130 of FIG. 7 achieves the effective doubling of the wavelength dispersion power of grating element 10 by cascading the grating dispersion power of grating element 10, similar to the narrowing of the spectrum band-pass width of an interference wavelength selection filter device by the cascading of filter elements. This cascading of the grating dispersion power does not effect the wavelength filter function of the grating-based devices incorporating this cascaded grating arrangement, since the wavelength filter function of these grating-based devices is determined by the physical dimensions of the output array structures used in those devices. The only significant negative associated with using this cascaded grating arrangement is a decrease in device throughput radiometric efficiency associated with the optical power loss due to the beam being diffracted twice by the grating element. It is estimated that greater than 75 percent radiometric throughput efficiency can be achieved for both S and P polarized beam components propagating twice through a surface-relief transmission grating element having a $\lambda/D$ ratio value in the range of 0.8 to 1.2 for optical wavelengths in the 1280 to 1620 nanometers spectrum range.

Referring again to FIG. 7, one can change the wavelength of the beam 134 retro-diffracted back on itself, and thus change the wavelength tuning parameters of the device 130, by rotating the mirror element 122 in the direction of arrow 138 and/or arrow 140 by conventional means. This wavelength tuning property is well known and is used in conventional dual-pass mirror-reflection grating-based spectrophotometers, as discussed in an article by Ghislain Levesque in the June, 2000 issue of Photonics Spectra (see FIG. 5 on page 110).

Figure 8:
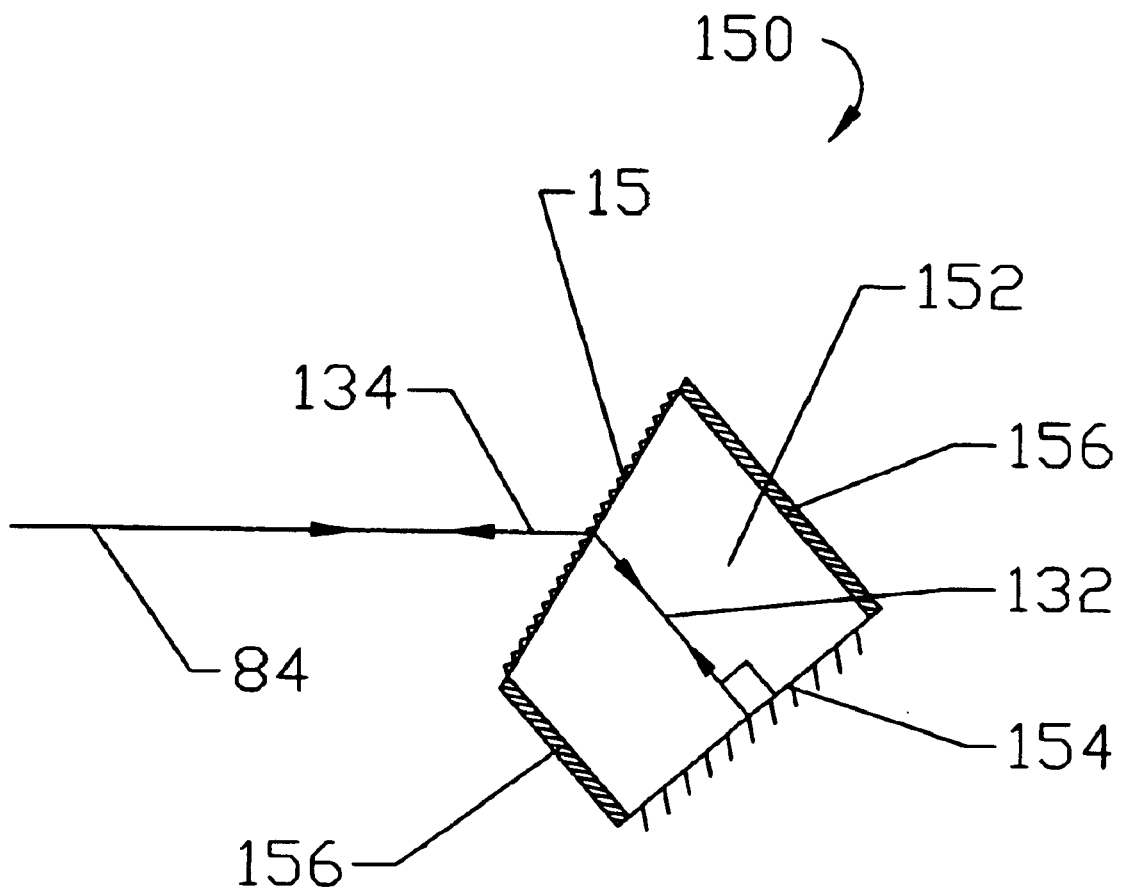
FIG. 8 is a schematic of another dual pass grating-based wavelength selection unit utilizing the transmission grating of FIG. 1.

The dual pass transmission grating arrangement in FIG. 7 is accomplished by using separately a grating element 10 and mirror element 122. By comparison, and as illustrated in FIG. 8, a dual pass transmission grating device 150 can be fabricated using a single transmission glass block element 152 that incorporates a surface-relief transmission grating 15 and a reflecting mirror surface 154. The device 150 functions as described for the device 130 in FIG. 7. As depicted in FIG. 8, a single wavelength beam 84 is incident on the dual pass grating device 150 at the Littrow diffraction condition for the dual pass arrangement depicted in device 150 and is retro-diffracted back along the incident beam path 84 as beam 134. As depicted in FIG. 8, the non-optical transmitting and reflecting surfaces of the glass block 152 have been coated with an optical absorption coating 156 that is designed to absorb the nondiffracted zeroth order beam energy and other scattered light which may occur within the glass block element 152. Optical absorption coatings are well known to those skilled in the art and are disclosed, e.g., in U.S. Pat. Nos. 6,075,635, 5,893,364, 5,633,494, and the like. The entire disclosure of each of these United States Patents is hereby incorporated by reference into this specification.

FIG. 9 schematically illustrates how the dual pass transmission grating device 150 of FIG. 8 can be fabricated using a surface-relief transmission grating element 10 that is attached to the input optical transmitting surface of glass block element 152 incorporating reflecting mirror surface 154. The device 160 in FIG. 9 functions as described for the device 130 in FIG. 7. As depicted in FIG. 9 a single collimated wavelength beam 162 is incident on the dual pass grating device 160 at the Littrow diffraction condition for the dual pass arrangement depicted in device 160 and is retro-diffracted back along the incident beam path 162 as beam 166.

As depicted in FIG. 9, the device 160 is fabricated so that the grating surface 15 of the grating element 10 is encapsulated between the substrate 12 of grating element 10 and the input optical transmitting surface to the glass block element 152. A sealing element 168, such as epoxy, is used in device 160 to encapsulate the air gap layer 170 that exists between the surface-relief transmission grating surface 15 and the input optical transmitting surface of the glass block element 152. The main function of the sealing element 168 is to prevent contaminants, liquids or solvent vapors that could damage the grating surface from entering the air gap layer 170. The encapsulated grating surface configuration of device 160 also protects the grating surface from being damaged due to handling and cleaning of the grating element. The input optical transmitting surfaces of both the grating substrate 12 and the glass block 152 are antireflection coated to minimize optical reflection losses at these surfaces. As depicted in FIG. 9, the non-optical transmitting and reflecting surfaces of the glass block 152 have been coated with an optical absorption coating 156 that is designed to absorb the nondiffracted zeroth order beam energy and other scattered light which may occur within the glass block element 152. It is evident that the glass block elements depicted in FIGS. 8 and 9 can be made longer or shorter than what is depicted in these figures.

As is illustrated by the Examples set forth in this specification, devices made in accordance with FIG. 9 will pass the Bellcore high humidity/high temperature tests if certain specified adhesives are used.

Figure 10A:
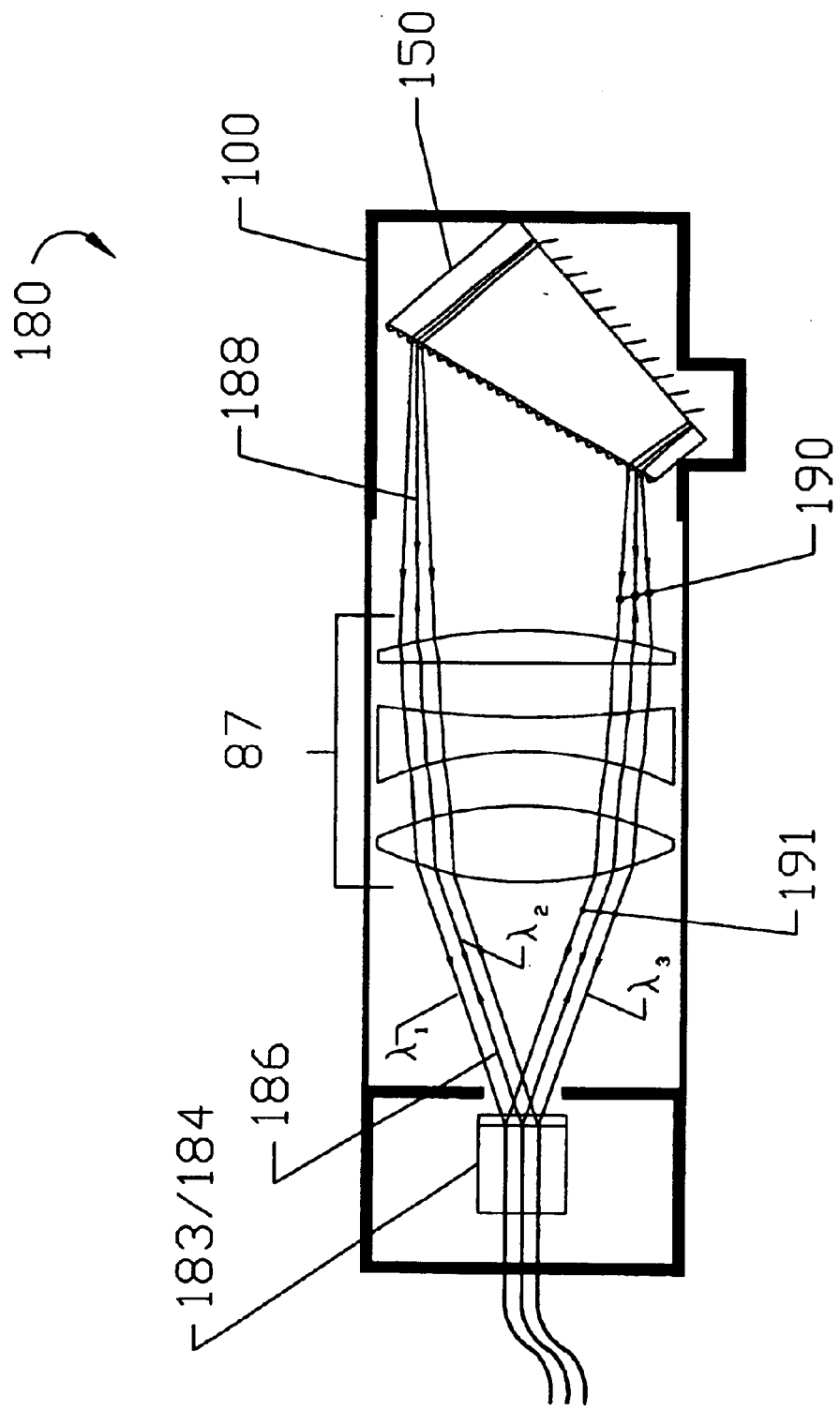
FIGS. 10A and 10B are side and top views, respectively, of a transmission grating-based demultiplexer fiber-optic unit.
Figure 10B:
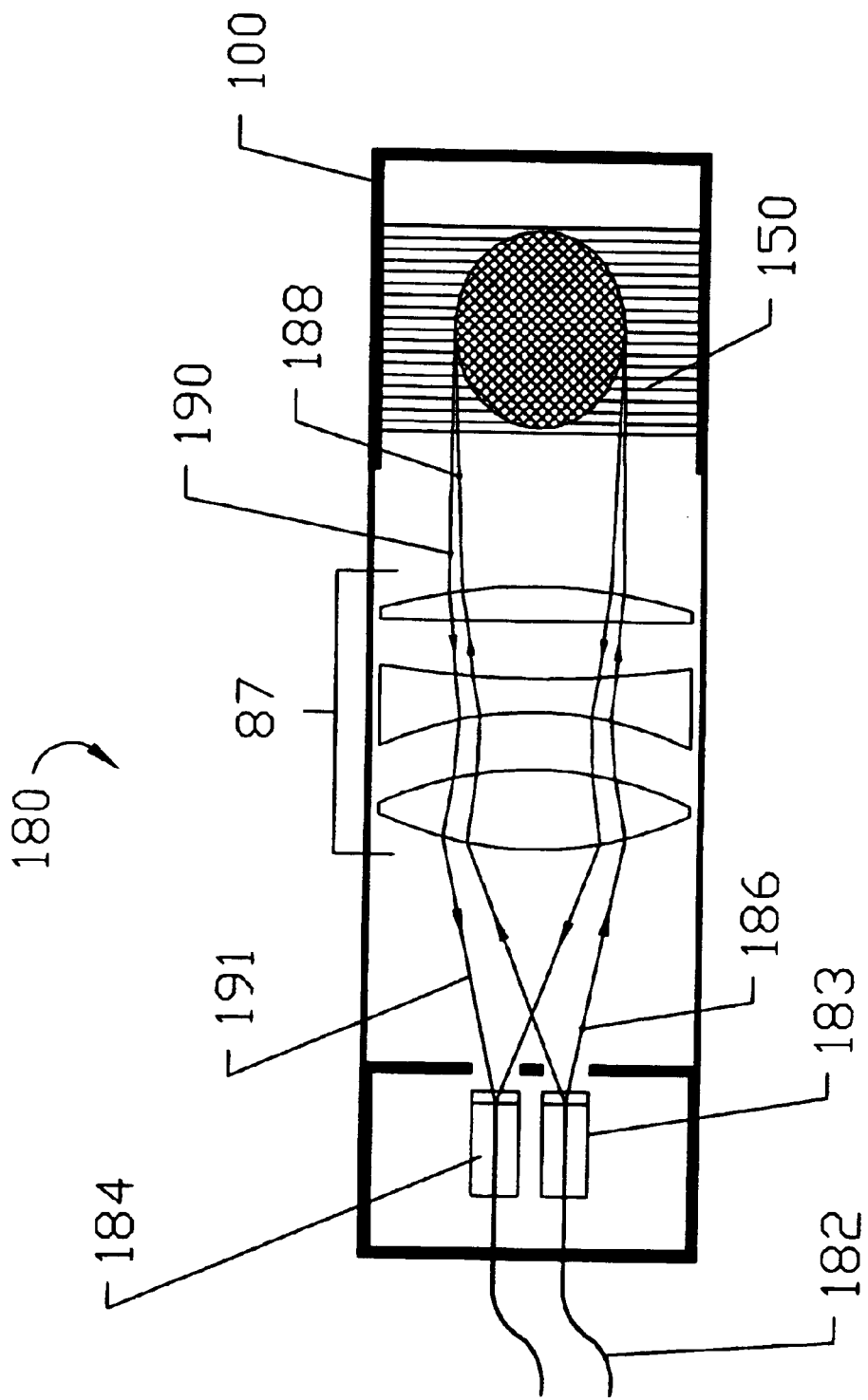
Figure 10C:
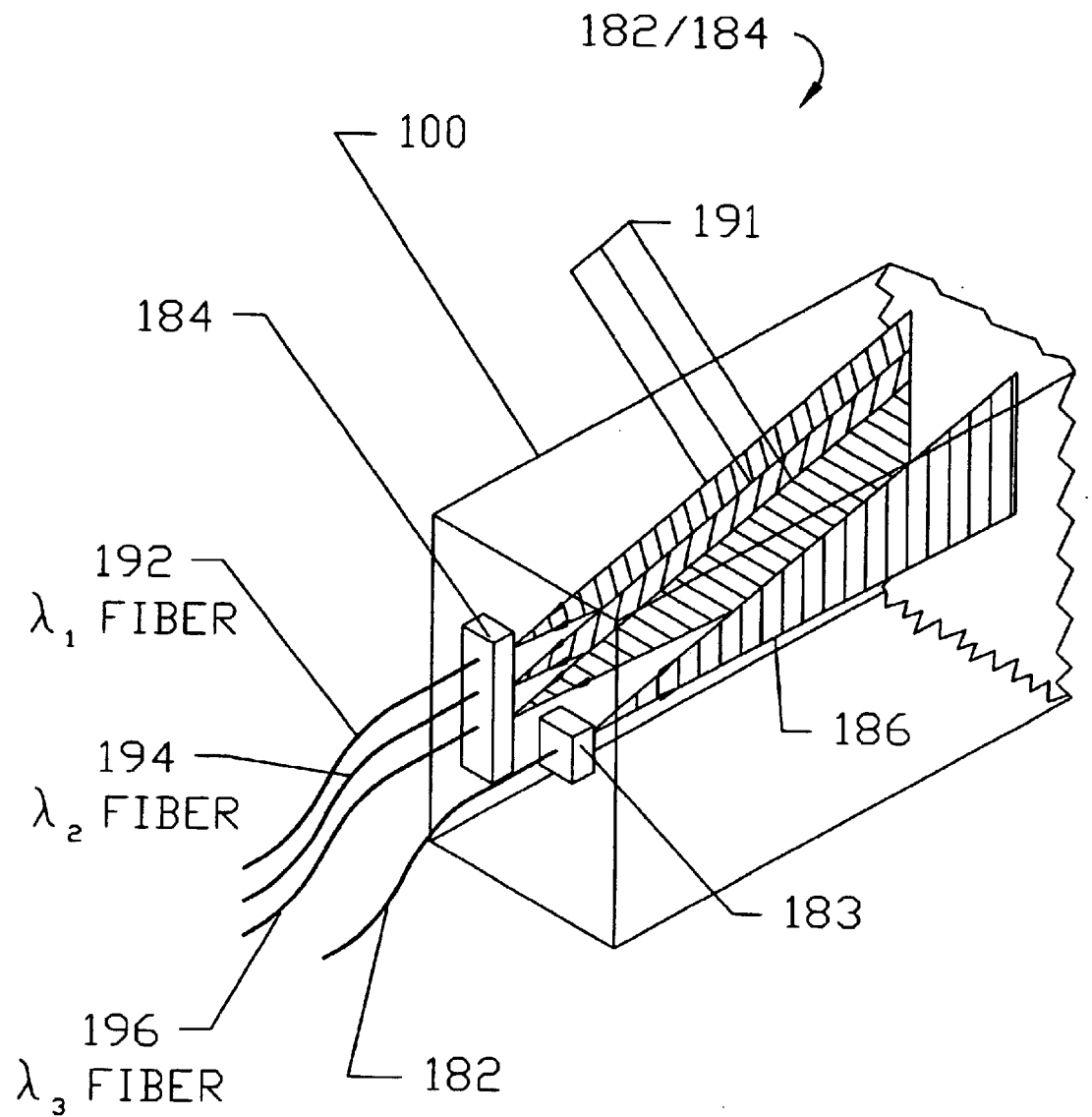
FIG. 10C is a schematic view of the fiber-optic input/output array used in the demultiplexer of FIGS. 10A and 10B.

Schematic top, side and isometric views in FIGS. 10A, 10B and 10C, respectively, illustrate how the dual pass grating element 150 of FIG. 8 can be incorporated into demultiplexer (Demux) device 180 used in fiber-optic WDM systems. The input transmission fiber 182 to the Demux device 180 contains $\lambda_1$, $\lambda_2$, and $\lambda_3$ wavelength channel signals which, when exiting from the end of the fiber 182, form a diverging optical ray bundle 186 having a cone angle determined by the numerical aperture (NA) of the input fiber 182. The end of the fiber 182 is supported and positioned by holder 183 at the focal plane of the collimating/focusing lens assembly 87. The collimating/focusing lens assembly 87 receives the ray bundle 186 diverging from the end of the input fiber 182 and converts it into a collimated beam 188 which is incident on the dual pass grating element 150. As depicted in FIG. 10A, the incident beam, after being diffracted by the dual pass grating element 150, is separated into $\lambda_1$, $\lambda_2$, and $\lambda_3$ beams 190 which propagate at slight angles with respect to each other in the plane perpendicular to the diffraction grating lines, which FIG. 10A resides in. In the plane parallel to the grating lines, which FIG. 10B resides in, the dual pass grating element 150 functions like a mirror in that the incident beam 188 and the different diffracted wavelength beams 190 have essentially the same angle with respect to the normal to the grating surface 15 in this plane.

As depicted in FIGS. 10A and 10B, the collimating/focusing lens assembly 87 receives the collimated diffracted $\lambda_1$, $\lambda_2$, and $\lambda_3$ wavelength beams 190 from the dual pass grating element 150 and focuses these beams onto the surface of the output fiber array 184. As indicated in FIG. 10A, and more clearly in FIG. 10C, the output fiber array 184 consists of individual fibers 192, 194, and 196 arranged in a row structure, the orientation of that row being parallel to the plane that is perpendicular to the grating lines. In the plane of the row the fibers are essentially evenly spaced by a distance W that is equal to the product of the focal length of the collimating/focusing lens assembly 87 and the diffracted angular separation between wavelength beams 190, as calculated using Equation (4). It should be noted that, when using Equation (4) to calculate the W value for the dual pass diffraction grating-based device illustrated in FIGS. 10A, 10B, and 10C, one must account for the dual pass nature of the device, that is, one must use $d\theta_{ds}$ in place of $d\theta_d$ in Equation (4). The output fiber array 184 is spatially positioned so that each of the spatially separated focused wavelength channel beams 191 is incident on its corresponding output fiber in the array 184. Essentially all of the light incident on the core are of an output fiber in the array 184 is coupled into the fiber and transmitted to a separate photodetector device (not shown) that provides an electrical data signal corresponding to the information transmitted on that wavelength channel.

In the preferred embodiment depicted in FIGS. 10A, 10B and 10C, the optical components are enclosed within a housing 100, which protects the optical components from contaminants. It is preferred that the housing 100 be comprised of components which do not adversely affect the performance of the optical components over the 70 degree operating temperature range specified for fiber-optic devices.

The Demux device depicted in FIGS. 10A, 10B and 10C functions in a reversible manner, that is, the device can be used to optically combine different wavelength channels onto a single output fiber, thereby functioning as a multiplexer (Mux) device. While the preceding discussion of the Mux/Demux operating principles of the grating-based device illustrated in FIGS. 10A, 10B, and 10C is limited to three wavelength channels, it is evident that this device can be used with many more wavelength channels. The only component in the device that need be changed when the number of wavelength channels is changed is the number of fibers contained in the fiber-optic array holder 184. The grating-based device illustrated in FIGS. 10A, 10B and 10C can be used to simultaneously Mux and Demux wavelength channels and thereby be used to construct a bi-directional fiber-optic network system which provides dramatic cost savings in local and metro area networks not incorporating in-line optical amplifiers. One method for achieving this bi-directional operation is by having adjacent wavelength channels be transmitted in opposite directions. This adjacent counter-propagating wavelength channel arrangement minimizes cross-talk between both co-propagating and counter-propagating wavelength channels and still enables the input/output fiber-optic array holder to be constructed with essentially equal spacing between fibers.

Figure 11A:
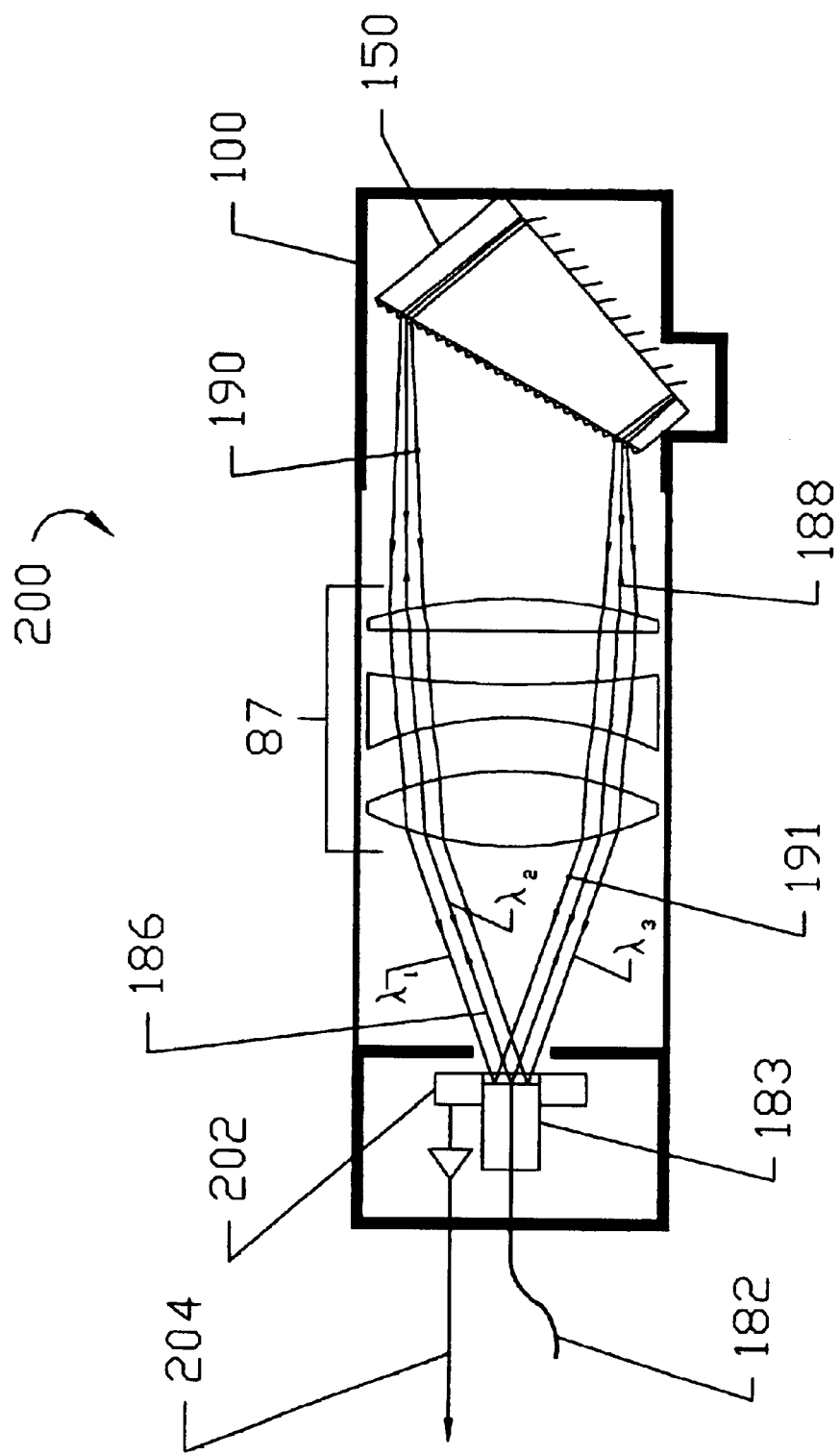
FIGS. 11A and 11B are side and top views, respectively, of a transmission grating-based fiber-optic spectrophotometer unit.
Figure 11B:
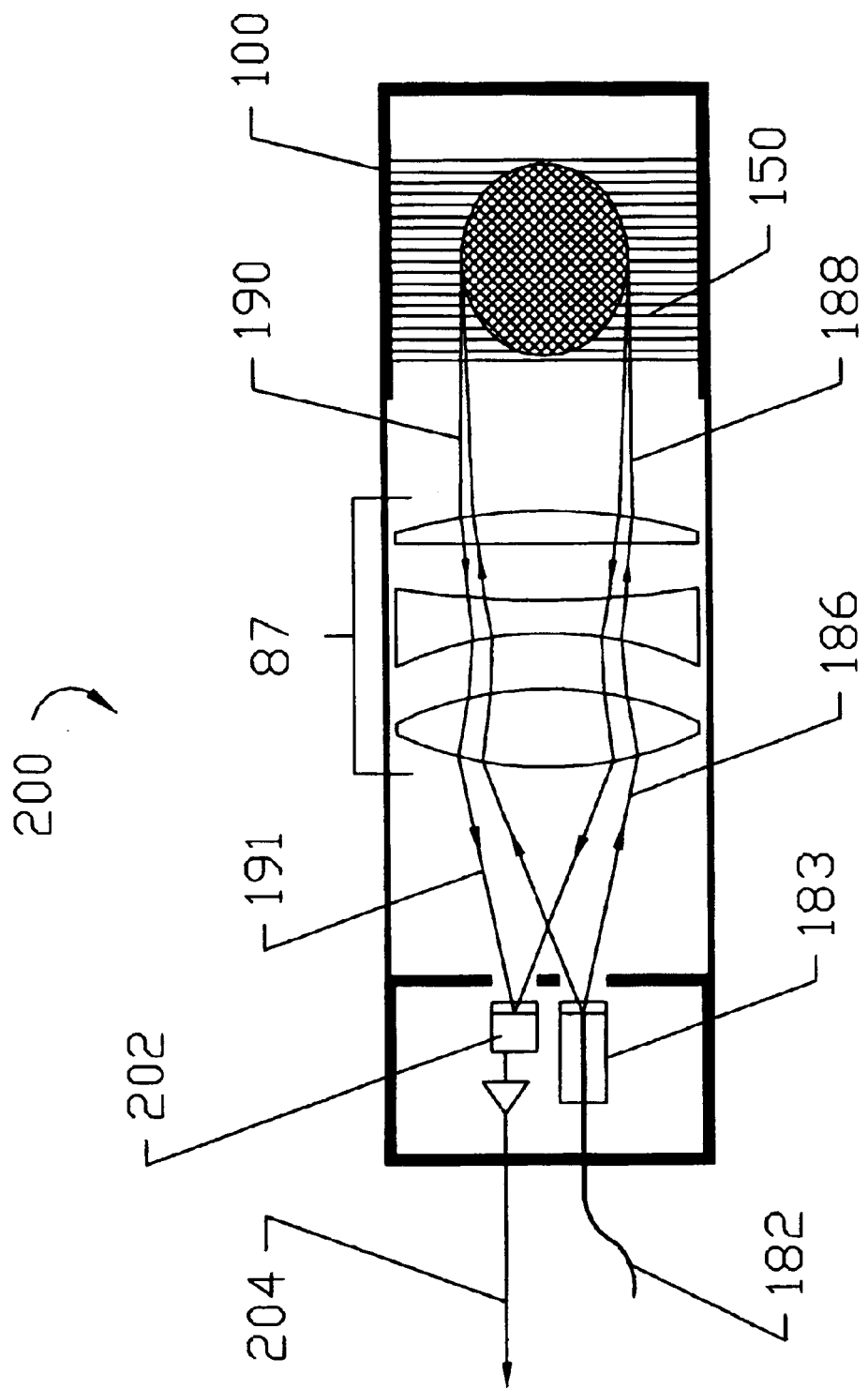
Figure 11C:
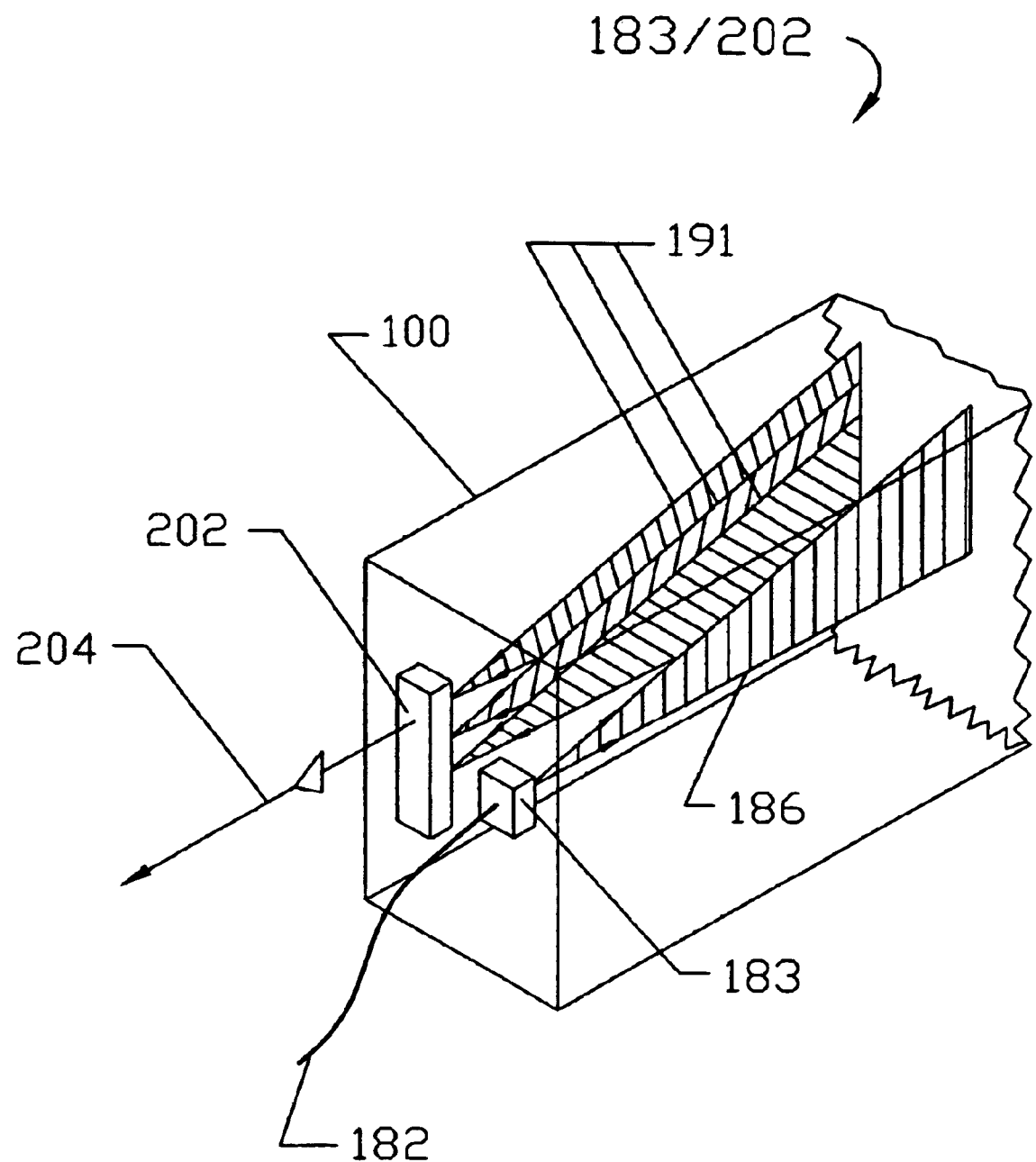
FIG. 11C is a schematic view of the fiber-optic input/output array used in the spectrophotometer of FIGS. 11A and 11B.

Schematic top, side and isometric views are, respectively, presented in FIGS. 11A, 11B and 11C of an on-line optical channel monitor device 200 that utilizes dual pass grating element 150 of FIG. 8. Comparison of the device of FIGS. 10A, 10B and 10C with the device of FIGS. 11A, 11B and 11C reveals that the only significant difference between the Demux device 180 and the spectrophotometric based OCM device 200 is that the output fiber array 184 of the Demux device 180 is replaced in the OCM device 200 by a photodetector linear array 202 that is positioned at the focal plane of the collimating/focusing lens assembly 87. The OCM device 200 functions exactly as described for the Demux device 180 with the exception that, in the OCM device 200, the spatially separated focused wavelength channel beams 191 are incident on different photosensitive elements in the photodetector array 202 and, thereby, generate an independent electrical signal 204 for each wavelength channel. The amplitude of each electrical signal is proportional to the average light intensity of the wavelength channel beam incident on the photodetector element generating that signal. While only three wavelength channels are shown being used with the OCM device 200 illustrated in FIGS. 11A, 11B and 11C, it is evident that this device can be used with many more wavelength channels. An InGaAs photodetector array will normally be incorporated into monitoring devices used for communication systems operating in the 1280 to 1620 nanometer spectrum region. Commercial InGaAs photodetector arrays are available with 128, 256, and 512 photodetector elements having either 25 or 50 micron spacing between element centers.

Comparison of the wavelength monitoring device depicted in FIGS. 11A, 11B, and 11C with the corresponding devices depicted in FIGS. 5 and 6 shows that, by using a dual pass transmission grating arrangement versus a single pass grating arrangement, one has spatially and functionally combined the collimating and focusing lens assemblies, significantly decreased the spatial separation between the input and output image planes of the device, and decreased the size of the device. It should be noted that current commercially available InGaAs photodetector arrays used in these devices have overall package sizes in the range of 63 millimeters by 25 millimeters, which is significantly larger than what is depicted in FIGS. 11A, 11B and 11C when compared to the other components depicted in these figures. Because of the relatively large size of current InGaAs photodetector arrays, there has to be a significantly greater distance between the array unit and input fiber element in FIG. 11B, which increases the requirements on the performance of the collimating/focusing lens assembly used in this device. One can reduce the separation distance between the array unit and input fiber element in FIG. 11B by orientating the array unit so that the surface of the photosensitive element in the array unit 202 is parallel to the plane in which FIG. 11A resides. For this array unit orientation, either a prism reflector or a beam fold mirror element is required to direct the retro-diffracted beam 191 on the photosensitive elements in the array unit 202, as will be illustrated in other OCM device embodiments in this specification.

Figure 12:
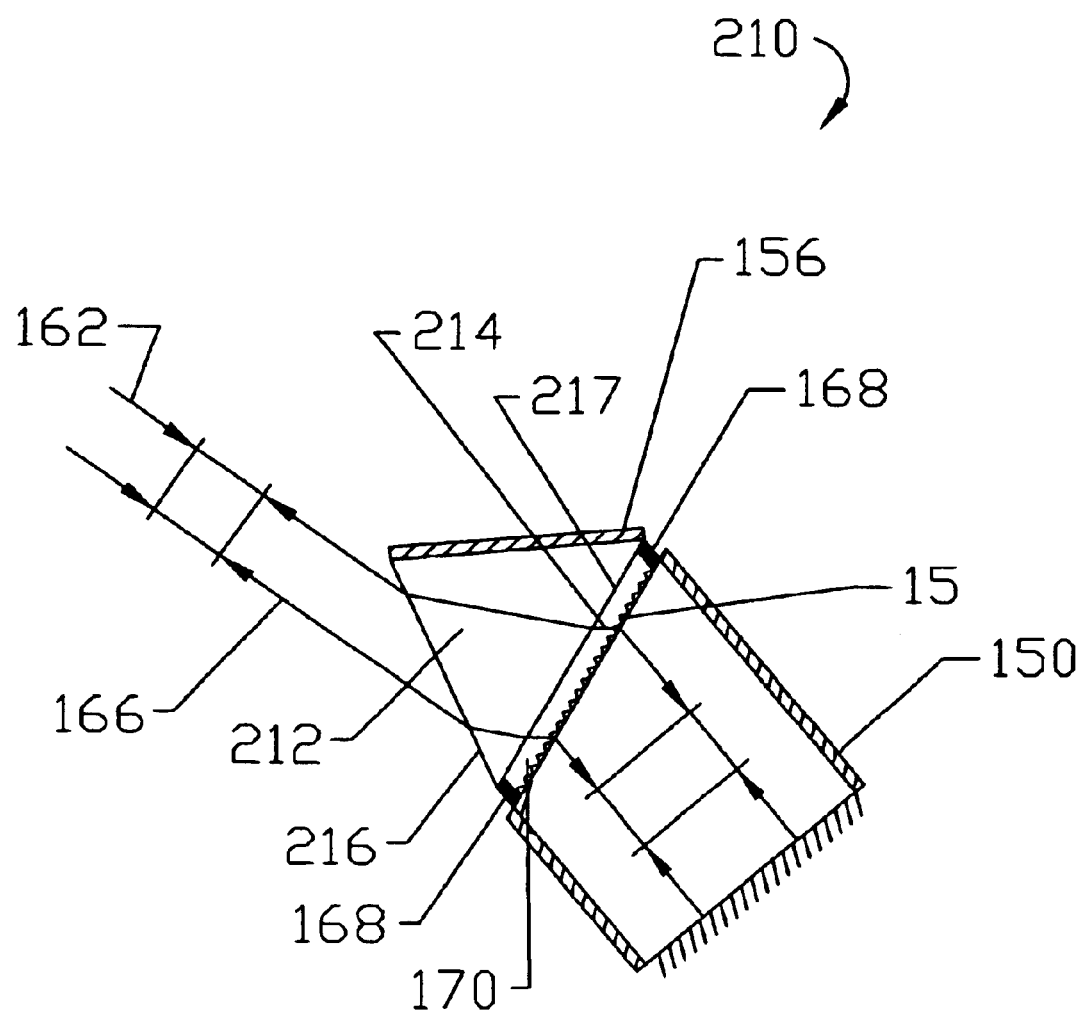
FIG. 12 is a schematic view of a dual pass grating-based wavelength section unit that utilizes the transmission grating of FIG. 1.

One can further increase the wavelength dispersion power of the dual pass grating arrangements of FIGS. 7, 8 and 9 by incorporating a beam expanding and prism element into these devices as illustrated in FIG. 12. Comparison of FIG. 12 with FIG. 8 reveals that the devices in these figures are similar except that device 210 of FIG. 12 incorporates beam expanding prism element 212 that is positioned in the optical beam path that is incident to and exits from the dual pass grating component ISO. With regard to the dual pass grating diffraction properties, the device 210 functions as described for the devices illustrated in FIGS. 7, 8 and 9. As depicted in FIG. 12, a single collimated wavelength beam 162 is incident on the device 210 at the Littrow diffraction condition for the device 210 arrangement and is retro-diffracted back along the incident beam 162 as beam 166.

Referring to FIG. 12, it will be seen that the prism element 212 expands the size of the incident beam 162 prior to that beam being incident on the grating surface 15; and, since prism element 212 functions in a reversible manner, it reduces the size of the retro-diffracted beam 166 that exits prism element 212 by the same amount that the incident beam 162 was expanded by the prism. Therefore, as depicted in FIG. 12, the retro-diffracted beam 166 exiting prism element 212 has the same size that the incident beam 162 had prior to the prism element. The increase in the wavelength dispersion power of device 210, relative to that achieved with the 14 devices of FIGS. 7, 8 and 9, is determined by how much the prism element 212 reduces the size of the retro-diffracted beam 166 exiting from the prism element 212 relative to the size of the retro-diffracted beam 214 incident to prism element 212. It can be shown that the E magnification factor by which the prism element 212 increases the wavelength dispersion power of device 210 is given by:

$$E = B_1/B_2, \quad (6)$$

where $B_1$ and $B_2$ are, respectively, the size of the retro-diffracted beam 214 incident to prism element 212, and the size of the retro-diffracted beam 166 exiting prism element 212. For the arrangement depicted in FIG. 12, the major change in the size of retro-diffracted beam 214 occurs as a result of the beam being refracted at surface 216 of prism element 212 and, therefore, for this arrangement $E \approx \cos\theta_1/\cos\theta_2$ where $\theta_1$ and $\theta_2$ are, respectively, the incident and refracted beam angles that the retro-diffracted beam makes with respect to the normal to the surface 216 of prism element 212. In the preferred 210 device embodiment, the E magnification factor for the prism element 212 is in the range of about 1.3 to 2.5. The angular separation between the wavelength channel beams exiting the device 210 is given by the product $E\, d\theta_{ds}$, where the value of $d\theta_{ds}$ is calculated using Equation (5).

With the device 210 of FIG. 12, one can achieve a wavelength dispersion power of about 0.128 deg/am to about 0.194 deg/nm for a wavelength of 1550 nanometers when device 210 incorporates a prism element 212 having an E magnification factor equal to 2 and a grating 15 having, respectively, a λ/D ratio of about 0.8 to about 1.1 that is operated in the first order Littrow diffraction condition. Device 210 can achieve this wavelength dispersion power while still achieving essentially equal diffraction efficiency values for S and P polarized optical components and thereby have a PDL value equal to or less than 0.2 dB. By comparison, a transmission grating element 10 operated in a single pass mode in the first order Littrow diffraction condition needs a λ/D ratio of about 1.73 to about 1.87, respectively, to achieve a wavelength dispersion power of about 0.128 deg/nm to about 0.194 deg/nm for a wavelength of 1550 nanometers. As shown by the diffraction efficiency data in FIG. 4, transmission sinusoidal surface-relief grating elements having a λ/D ratio of about 1.73 to about 1.87 have greater than 80 percent diffraction efficiency for S polarization and less 20 percent diffraction efficiency for P polarization and, therefore, have poor PDL performance unless used with polarization controlling optical elements.

One can achieve high radiometric throughput efficiency for the prism element 212 in device 210 for both S and P optical polarization by applying antireflection coatings to the optical transmitting surfaces of the prism. As depicted in FIG. 12, the non-optical transmitting and reflecting surfaces of glass block 152 and prism element 212 have been coated with an optical absorption coating 156 that is designed to absorb the nondiffracted zeroth order beam energy and other scattered and reflected light which may occur within elements 152 and 212. As was the case for the device embodiment illustrated in FIG. 9, the air gap space 170 separating the optical transmitting surface 217 of prism element 212 and the grating surface 15 of dual pass grating component 150 is encapsulated using sealing element 168. The main function of the sealing element 168 is to prevent contaminants, liquids or solvent vapors that could damage the grating surface from entering the air gap layer 170. The encapsulated grating surface configuration of device 210 also protects the grating surface from being damaged due to handling and cleaning of the grating element.

Associated with the beam size reducing property of prism element 122 of device 210 is the additional benefit with regard to the linearizing function of the prism element that enables grating-based fiber-optic devices incorporating this type of beam expanding and linearizing prism element to essentially achieve an equal spacing between the spatially separated focused wavelength channel signal beams at the focal plane of the device, which is at the surface of the photosensitive element in the photodetector array unit in an OCM device or at the surface of the output fiber-optic array in a Demux device. Grating-based fiber-optic devices not incorporating this type of beam expanding and linearizing prism element can have significant differences in the spacing between the spatially separated focused wavelength channel signal beams at the focal plane of the device as a result of the following conditions.

The wavelength channels of a WDM fiber-optic system are separated by a fixed frequency spacing, such as 200, 100 or 50 GigaHertz, but have a wavelength spacing between adjacent wavelength channels that varies slightly as a function of the frequency (wavelength) of the wavelength channel. For example, the wavelength spacing between adjacent wavelength channels of a WDM fiber-optic system having a 100 GigaHertz frequency spacing between channels is approximately 0.86, 0.80 and 0.78 nanometers, respectively, for wavelength channels having wavelengths in the range of 1611, 1552, and 1530 nanometers. This slight variation in wavelength spacing between the adjacent wavelength channels in a WDM fiber-optic system produces a corresponding non-equal spacing variation in the spatial separation between the focused wavelength channel beams incident on the photodetector arrays in the OCM devices depicted in FIGS. 5, 6, 11A, 11B and 11C and in the spatial separation between the focused wavelength channel beams incident on the fiber-optic output array in the Demux device depicted in FIGS. 10A, 10B and 10C. Another factor that contributes slightly to the non-equal spacing of the spatially separated focused wavelength channel beams in these wavelength selection devices is the $1/\cos\theta_d$ term in Equation (3), which is used for calculating the angular separation between the diffracted wavelength beams in these devices. The prism element 122 of device 210 can be designed so that it linearizes the diffracted angular spacing between the wavelength channel beams exiting from the prism element 122 and, thereby, enables Demux and wavelength monitoring devices that incorporate device 210 to utilize a linear spacing between adjacent channels in their output arrays.

Given its relatively high radiometric throughput efficiency, its high wavelength dispersion power, its good PDL performance, and its linearizing properties, the device 210 of FIG. 12 provides significant advantages for use in WDM fiber-optic communication systems having 100, 50 or 25 GigaHertz spacing between wavelength channels. Beam expanding prism elements are used to increase the wavelength dispersion resolution of grating-based wavelength tunable dye laser systems, as shown in an article by F. J.

Duarte, "Newton, Prisms, and the "Opticks" of Tunable Lasers," Optics and Photonics News, May 2000.

Figure 13:
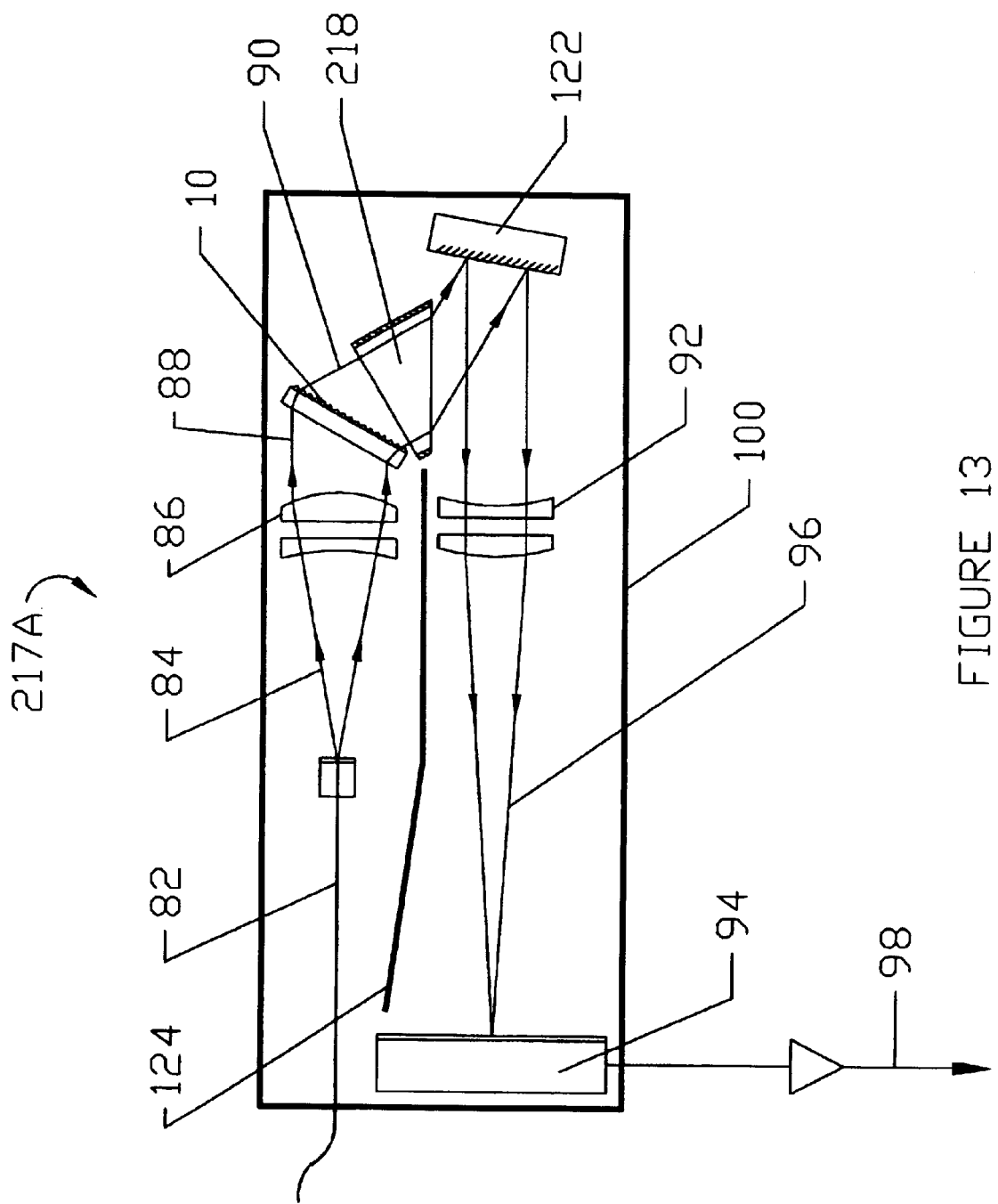
FIGS. 13 and 14 each present a schematic of a spectrophotometer which utilizes the transmission grating of FIG. 1.

Schematically illustrated in FIG. 13 is OCM device 217A that is essentially identical to the spectrophotometer device 120 of FIG. 6 with the expectation that the device 217A incorporates a beam expanding and linearizing prism element 218 that functions similarly to the prism element 122 of device 210 in FIG. 12. The prism element 218 differs somewhat from the prism element 122 in that the angles of the prism have been changed so that the diffracted beam from grating element 10 is substantially perpendicular to the input surface of prism element 218. Due to this prism angle change, the prism element 218 is not attached to the grating element 10, as was the case for the prism element 212 of device 210. As depicted in FIG. 13, prism element 218 has the same beam size reducing property as described for prism element 212 of device 210, which increases the wavelength dispersion power of device 217A and provides the benefit with regard to linearizing the spacing of the spatially separated focused wavelength channel signal beams at the photodetector array 94 of device 217A As also depicted in FIG. 13, the non-optical transmitting surfaces of prism element 218 have been coated with an optical absorption coating that is designed to absorb any non-diffracted zeroth order beam energy that might enter the prism and other scattered and reflected light that may occur within prism element 218.

As depicted in FIG. 13, the prism element 218 reduces the size of the beam exiting prism element 218 by about 1.65 times compared to the beam propagating within the prism element. The angular separation between the wavelength channel beams exiting prism element 218 is approximately $1.65 \, d\theta_d$, where $d\theta_d$ is the diffracted angular separation between wavelength beams exiting the grating element 10 as calculated by Equation (3). Prism element 218 increases the wavelength dispersion power of device 217A by approximately 1.65 times that achieved by device 120 of FIG. 6. Therefore, device 217A can achieve the same spatial separation between focused wavelength channel beams at the photodetector array 94 that device 120 achieves, but can achieve this separation using a focusing lens assembly 92 that has a focal length that is approximately 1.65 times shorter than the corresponding focal length used in device 120.

As previously noted, prism element 218 provides additional benefit with regard to linearizing the spacing of the spatially separated focused wavelength channel beams at the photodetector array 94. Analysis has shown that when the spectrophotometer device 120 of FIG. 6 is used to monitor the signal of a WDM fiber-optic system having a 100 GigaHertz frequency spacing between wavelength channels, the spatial separations between the focused wavelength channel beams at the photodetector array 94 in device 120 are non-equally spaced and, therefore, do not match the 25 or 50 micron equally spaced intervals between the photosensitive elements of commercial available InGaAs photodetector linear arrays.

To illustrate the non-equal spacing error in the spatially separated focused wavelength channel beams in device 120, it is assumed that the spatial separated focused channel beams in device 120 are incident on adjacent photosensitive elements in the photodetector array 94 and that these elements have a 50 micron spacing between element centers, that the device 120 incorporates a surface-relief transmission grating element 10 having a $\lambda/D$ ratio of 1.0 for an optical wavelength of 1550 nanometers, that $\theta_i = \theta_d = 30$ degrees for a wavelength of 1550 nanometers, and that the focusing lens assembly 92 in this device has a focal length of approximately 84 millimeters. When this device 120 configuration is used to monitor a WDM fiber-optic system beam having 100 different wavelength channel signals each spaced by 100 GigaHertz and having a wavelength spectrum from about 1530 to 1612 nanometers, calculations indicate that the non-equal spacing error between the adjacent focused wavelength channel beams at the photodetector array 94 accumulates and results in a total spacing error of approximately 49 microns between the shortest and longest focused wavelength channel signal beams. That is, if the photodetector array 94 in device 120 is positioned so that the shortest wavelength channel signal beam is incident on the center of the first photosensitive element of the photodetector array 94, the longest wavelength channel signal beam will land approximately 49 microns from the center of the hundredth photosensitive element of the photodetector array 94, with progressively shorter wavelength channel signal beams having progressively smaller positional errors with respect to the photosensitive element on which they are supposed to be incident on in the photodetector array 94. This 49-micron positional error can cause problems with regard to the operation of the OCM device.

Calculations show that when OCM device 217A of FIG. 13 is used to monitor a WDM an fiber-optic system beam having 100 different wavelength channel signals, each spaced by 100 GigaHertz and having a wavelength spectrum from about 1530 to 1612 nanometers, the spatially separated focused wavelength channel signal beams at the photodetector array 94 have substantially the same 50 micron spacing between all the wavelength channel signal beams, with about a total 1 micron spacing error between the shortest and longest wavelength channel signal beams, when the following configuration conditions are assumed for device 217A. Device 217A incorporates a surface-relief transmission grating having a $\lambda/D$ ratio of 1.0 with $\theta_i = \theta_d = 30$ degrees for an optical wavelength of 1550 nanometers, the prism element 218 has an index of refraction of approximately 1.51 with $\theta_1$ being approximately 35 degrees and $\theta_2$ being approximately 60 degrees which corresponds to a beam size reduction by prism element 218 of approximately 1.65 times, and that the focusing lens assembly 92 has a focal length of approximately 50 millimeters. The maximum total error spacing of approximately 1 micron between the shortest and longest wavelength channel signal beams at the photodetector array 94 for this device configuration is very acceptable since each photosensitive element in a photodetector array having a 50 micron spacing between photosensitive elements has a photosensitive area width along the array equal to the element spacing of 50 microns and, therefore, a positional error in the range of 1 to 2 microns still places the focused wavelength channel beam essentially in the middle of the photosensitive element.

Figure 14:
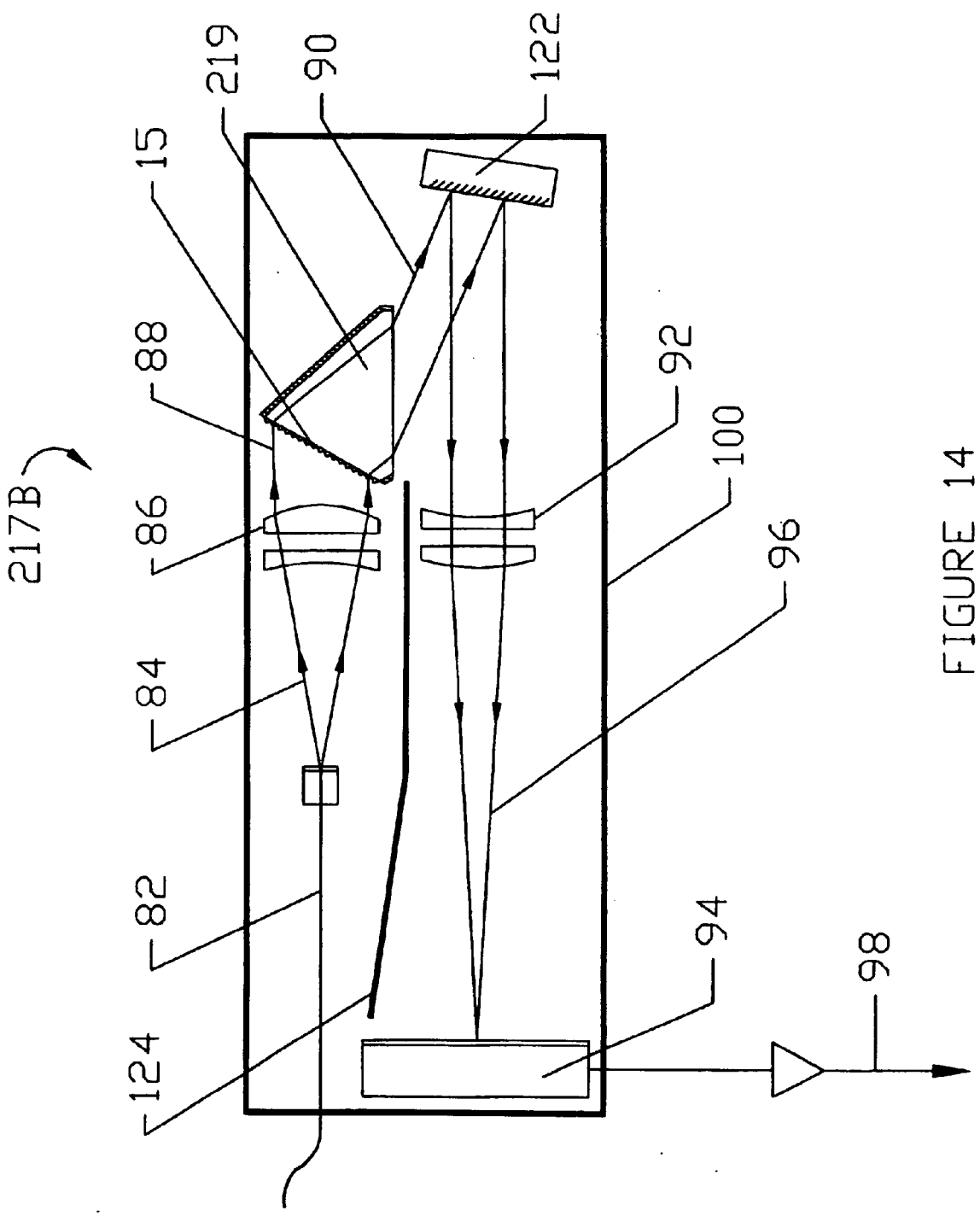

Schematically illustrated in FIG. 14 is OCM device 217B that is essentially identical to the spectrophotometer based OCM device 217A of FIG. 13 with the exception that the linearizing prism element 219 of device 217B now incorporates the transmission surface-relief grating 15. The prism element 219 performs the same functions as the combination of the grating element 10 and prism element 218 of device 217A and, therefore, device 217B functions as described for device 217A.

While there are advantages associated with combining the functions of the grating element 10 and prism element 218 of device 217A into the single prism element 219 of device 217B, the prism element 219 does not provide as good results as the separate grating and prism elements provide with regard to passively athermalizing the performance of the OCM device so that it meets operating specifications when used over the 70 degree centigrade temperature range specified for fiber-optic telecommunication applications without the need for active control. The reason why the separate grating element 10 and the separate prism element 218 provide better results than the dual functioning prism element 219 with regard to athermalizing device performance is that the grating element achieves the best athermalization performance when fabricated using a substrate material having a low thermal expansion coefficient, such as fused silica or ULE glass, while the linearizing prism element achieves the best athermalization performance when fabricated using a glass material having a low thermal coefficient of refraction (dn/dT), such as BK7, K5 and SFL 6 glasses. Unfortunately, low thermal expansion glasses, such as fused silica, ULE and Ohara Clearceram-Z, have a thermal coefficient of refraction that is approximately 10 times larger than that achieved with K5 glass and about 5 times larger than that achieved with BK7 glass. Optical glasses, such as BK7 and K5, have a thermal coefficient of thermal expansion that is approximately 10 times larger than that achieved with fused silica and about 50 to 100 times greater than that achieved with ULE or Ohara Clearceram-Z. Therefore, as the preceding discussion illustrates, better athermalization of device performance is achieved by using different glass materials for the grating and prism elements. The combined grating/prism element 219 could be fabricated by optically cementing a grating element 10 having a low thermal expansion material substrate 12 to a prism element made with either BK7 or K5 glass. If the grating/prism element 219 is fabricated using this approach, one must use an optical cement that minimizes thermal-induced stress associated with the optical bonding of materials having significantly different thermal expansion coefficients.

The doubling of the angular wavelength dispersion power of the transmission grating elements in FIGS. 7, 8, 9 and 12 was accomplished by reflecting the diffracted beam back through the grating element. One can achieve this doubling of grating dispersion power by cascading two separate transmission grating elements, that is, by physically arranging two surface-relief transmission grating elements so that a beam diffracted by the first grating element undergoes diffraction by the second grating element. One could further increase the wavelength dispersion power of transmission grating-based devices by cascading multiple grating elements. For example, one could achieve effectively four times the wavelength dispersion power of a grating element by physically cascading four individual transmission grating elements or by reflecting the diffracted beam back through two cascaded transmission grating elements. The only significant negatives associated with this multiple cascaded transmission grating technique is the radiometric efficiency loss associated with the multiple diffraction events and an increase of the PDL value of the device incorporating the multiple cascaded grating elements. In theory one could reduce the PDL value for physically cascaded grating elements by matching the grating elements so that the PDL value for one grating element is canceled by the PDL value of the following grating element or elements. Surface-relief grating-based devices utilizing physically cascaded grating elements are illustrated in FIGS. 15 through 24.

It should be noted that one of the potential advantages of the physically cascaded grating arrangements in FIGS. 15 through 24 relative to the dual pass grating arrangements in FIGS. 7 through 12 is that different $\lambda/D$ ratio values can be used for the individual grating elements used in the physically cascaded grating arrangements in FIGS. 15 through 23.

It should also be noted that the physically cascaded gratings in FIGS. 15 through 23 are arranged so that the wavelength dispersion power of the device incorporating the gratings is essentially equal to the sum of the wavelength dispersion power of the individual gratings used in the device. The gratings in these devices are arranged so that the beam diffracted from the first grating is incident on the second grating so that its angle of incidence is on the same relative side of the normal to the second grating surface that the incident beam makes relative to the normal of the first grating surface. That is, as illustrated in FIGS. 15 through 23, the beam is always incident on the right side of the normal to the grating surfaces as viewed in the beam propagating direction. The cascaded grating arrangements in FIGS. 15 through 23 are arranged so that the individual grating elements in these arrangements are operated relatively close to the Littrow direction condition.

Figure 15:
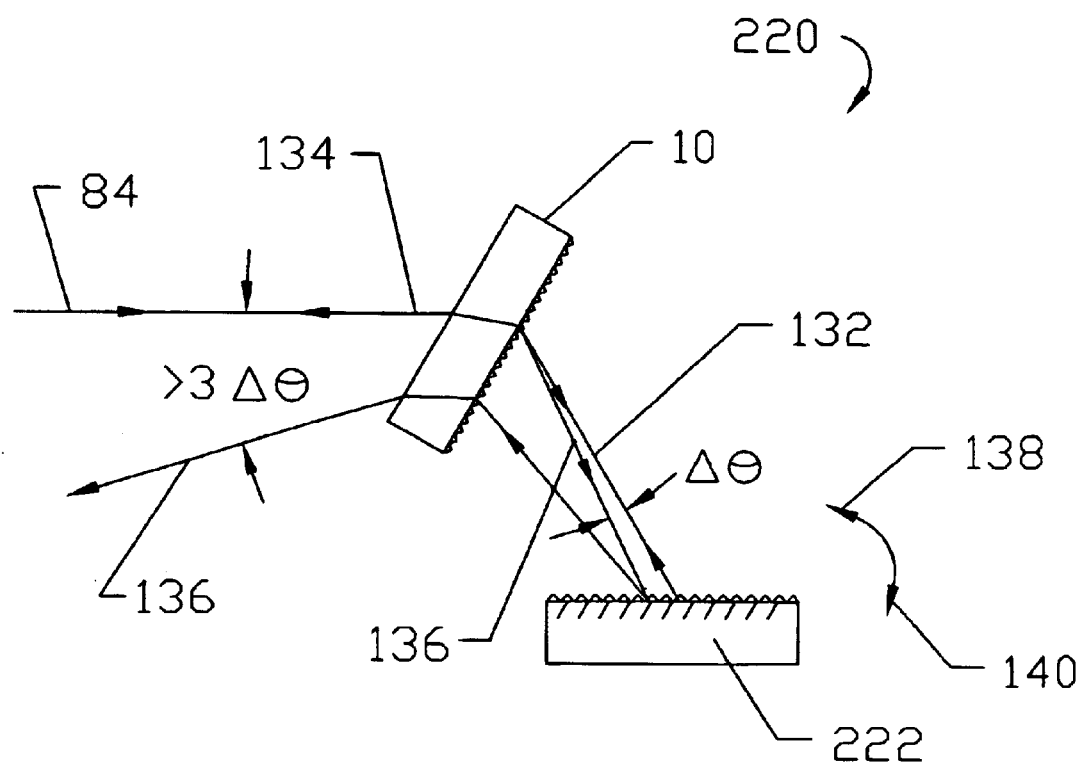
FIGS. 15, 16, 17, 18, 19, 20, 21, 22, 23 and 24 each present a schematic of a surface-relief grating-based device which utilizes physically cascaded grating elements.

FIG. 15 is a schematic of a dual pass cascaded grating-based wavelength selection device 220 which is similar to the device 130 depicted in FIG. 7 but differs therefrom in replacing the mirror element 122 in device 130 with a surface-relief reflection diffraction grating element 222 in device 220. As will be apparent, this modification significantly increases the wavelength dispersion power of the device 220 relative to that of device 130 of FIG. 7. The incident beam 84 to the transmission grating element 10 in device 220 contains $\lambda_1$ and $\lambda_2$ wavelength components. After the incident beam 84 is diffracted by the grating element 10, these optical wavelength components are angularly separated by $\Delta\theta$. The grating element 222 is angularly orientated so that the $\lambda_1$ wavelength beam 132 is retrodiffracted back on itself, that is, the grating element 222 operates at the Littrow condition, $\theta_i=\theta_d$, for the $\lambda_1$ wavelength beam 132. Because the grating element 10 functions in a reversible manner, the grating element 10 rediffracts the retrodiffracted $\lambda_1$ wavelength beam 132 back along the direction of the incident beam 84 as beam 134. This dual pass transmission multi-grating arrangement mimics a single reflection grating element operating at the Littrow condition for the $\lambda_1$ wavelength beam, since this beam is retrodiffracted back on itself. After diffracting from the grating element 222, the $\lambda_2$ wavelength beam 136 propagates back to the grating element 10 where, due to its angle of incidence, the $\lambda_2$ wavelength beam 136 is rediffracted from the grating element 10 with an angle equal to approximately $3\Delta\theta$ relative to the propagating direction of the retrodiffracted $\lambda_1$ wavelength beam 134 when the transmission grating element 10 and the reflection grating element 222 have approximately the same $\lambda/D$ ratio values.

As shown in Christopher Palmer's "Diffraction Grating Handbook," supra, essentially equal diffraction efficiency values for S and P polarized optical components can be achieved for sinusoidal surface-relief reflection gratings when their $\lambda/D$ ratio is in the range of about 0.7 to 0.85. This reference also shows that surface-relief reflection gratings having a triangular blazed grating line groove profile achieve essentially equal diffraction efficiency values for S and P polarized optical components when these gratings have $\lambda/D$ ratio values of between about 0.1 to 0.85. It is apparent from this reference that approximately 0.85 is the largest $\lambda/D$ ratio value that can be used with surface-relief reflection gratings and still achieve essentially equal diffraction efficiency values for S and P polarized optical components. Therefore, one may elect to use a surface-relief reflection grating element 222 in device 220 having a $\lambda/D$ value of about 0.8 in combination with a surface-relief transmission grating element 10 that has a $\lambda/D$ value of between 0.8 and 1.2 and, thereby increase the effective λ/D ratio value of device 220 while still achieving essentially equal diffraction efficiency values for S and P optical polarizations.

Using the dual pass multi-grating combination in device 220, a surface-relief grating-based device can be constructed having a relatively large wavelength dispersion power of about 0.097 deg/nm to about 0.146 deg/nm for a wavelength of 1550 nanometers, corresponding to an effective λ/D ratio of about 1.59 to about 1.78 for a single grating element operated at the Littrow condition. Device 220 achieves this relatively large wavelength dispersion power while achieving essentially equal diffraction efficiency values for S and P polarized optical components and thereby have a PDL value of equal to or less than 0.2 dB. The dual pass multi-grating combination device 220 achieves this relatively large wavelength dispersion power by cascading the grating wavelength dispersion power of the grating elements in the device, that is, the effective wavelength dispersion power of the device is the sum of the wavelength dispersion power of the individual grating elements that the beam is diffracted by. In FIG. 15 the beam undergoes three diffractions since the beam is passed twice through grating element 10. This cascading of the grating wavelength dispersion power does not effect the wavelength filter function of the grating-based devices incorporating this cascaded grating arrangement, since the wavelength filter function of these devices is determined by the physical dimensions of the output array structures used in those devices.

One can show that the angular separation, $d\theta_{ds}$, between the different wavelength channel beams that undergo diffraction by cascaded diffraction grating elements can accurately be approximated by using the sum of the angular separations that each grating element in the cascaded grating arrangement introduces into the beams, that is:

$$d\theta_{ds}=d\theta_{d1}+d\theta_{d2}+d\theta_{d3}+ \ldots +d\theta_{dn}, \quad (7)$$

where $d\theta_{d1}$, $d\theta_{d2}$, $d\theta_{d3}$, and $d\theta_{dn}$ are, respectively, the individual angular separations, as calculated by Equation (3), that the different wavelength beams experience as they are diffracted by the individual grating elements 1, 2, 3, and n of the cascaded grating arrangement having n cascaded grating elements. For example, the dual pass grating devices in FIGS. 7, 8 and 9 have 2 cascaded grating elements and, therefore, according to Equation (7) $d\theta_s=d\theta_{d1}+d\theta_{d2}=2d\theta_d$, as previously calculated with Equation (5). For the device 220 in FIG. 15, $d\theta_s=d\theta_{d1}+d\theta_{d2}+d\theta_{d3}=2d\theta_d+d\theta_{d2}$, where $d\theta_d$ is the angular separation for the transmission grating element 10 and $d\theta_{d2}$ is the angular separation for the reflection grating element 222.

Referring again to FIG. 15, one can change the wavelength of the beam 134 retrodiffracted back on itself and, thus change the wavelength tuning parameters of the device 220, by rotating the grating element 222 in the direction of arrow 138 and/or arrow 140 by conventional means, as was also described in regards to FIG. 7.

Figure 16:
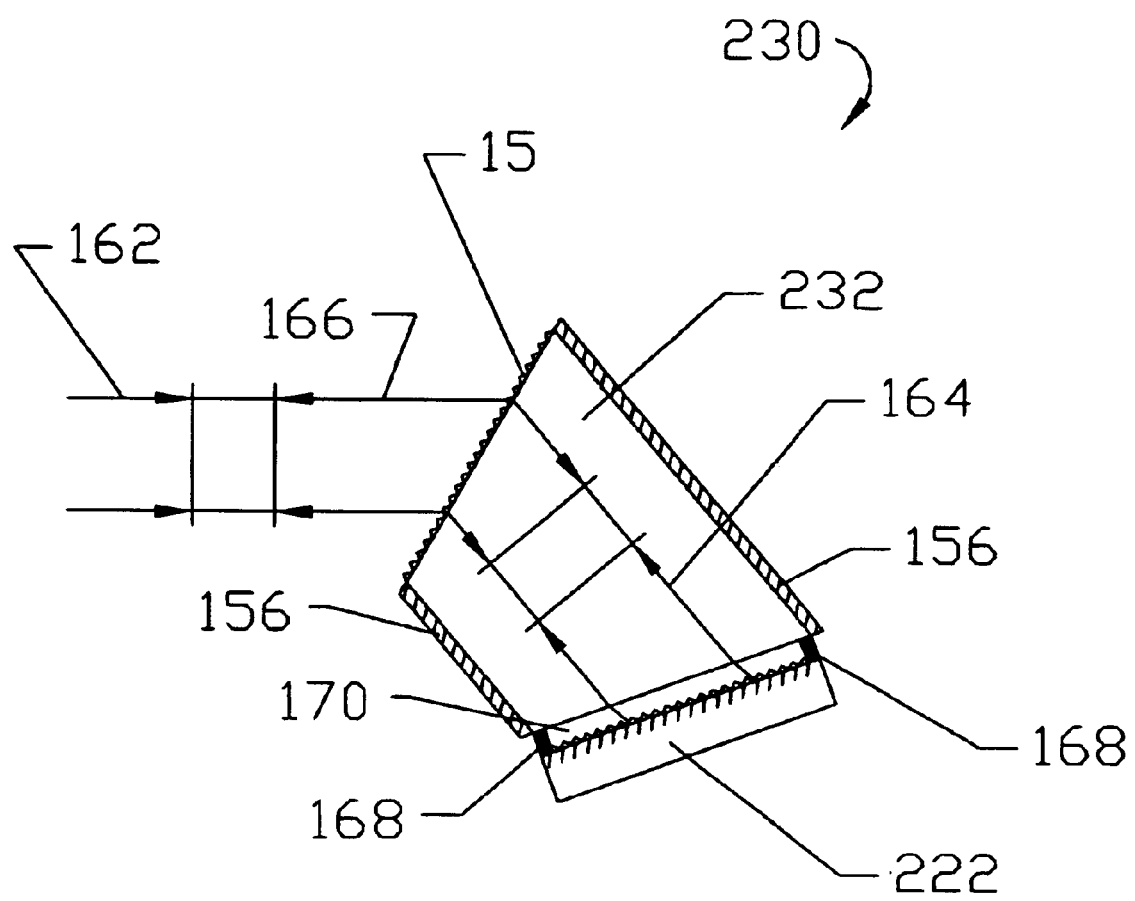

As illustrated in FIG. 16, one can configure the device 220 of FIG. 15 using a solid glass block element 232 that incorporates a surface-relief transmission grating 15 and a surface-relief reflection grating element 222 that is attached to the output optical transmitting surface of glass block 232. The dual pass multi-grating device 230 of FIG. 16 functions as described for the device 220 of FIG. 15. As depicted in FIG. 16, a single collimated wavelength beam 162 is incident on the dual pass multi-grating device 230 at the Littrow diffraction condition for the device 230 arrangement and is retrodiffracted back along the incident beam 162 as beam 166. A sealing element 168, such as epoxy, is used in device 230 to encapsulate the air gap layer 170 that exists between the surface-relief reflection grating surface of element 222 and the output optical transmitting surface of the glass block element 232. The main function of the sealing element 168 is to prevent contaminants, liquids or solvent vapors that could damage the grating surface from entering the air gap layer 170; not every sealing element will function well in this device. The output optical transmitting surface of the glass block 152 has to be antireflection coated to minimize optical reflection losses at that surface. As depicted in FIG. 16, the non-optical transmitting surfaces of the glass block 152 have been coated with an optical absorption coating 156 that is designed to absorb the nondiffracted zeroth order beam energy and other scattered light which may occur within the glass block element 152.

Figure 17:
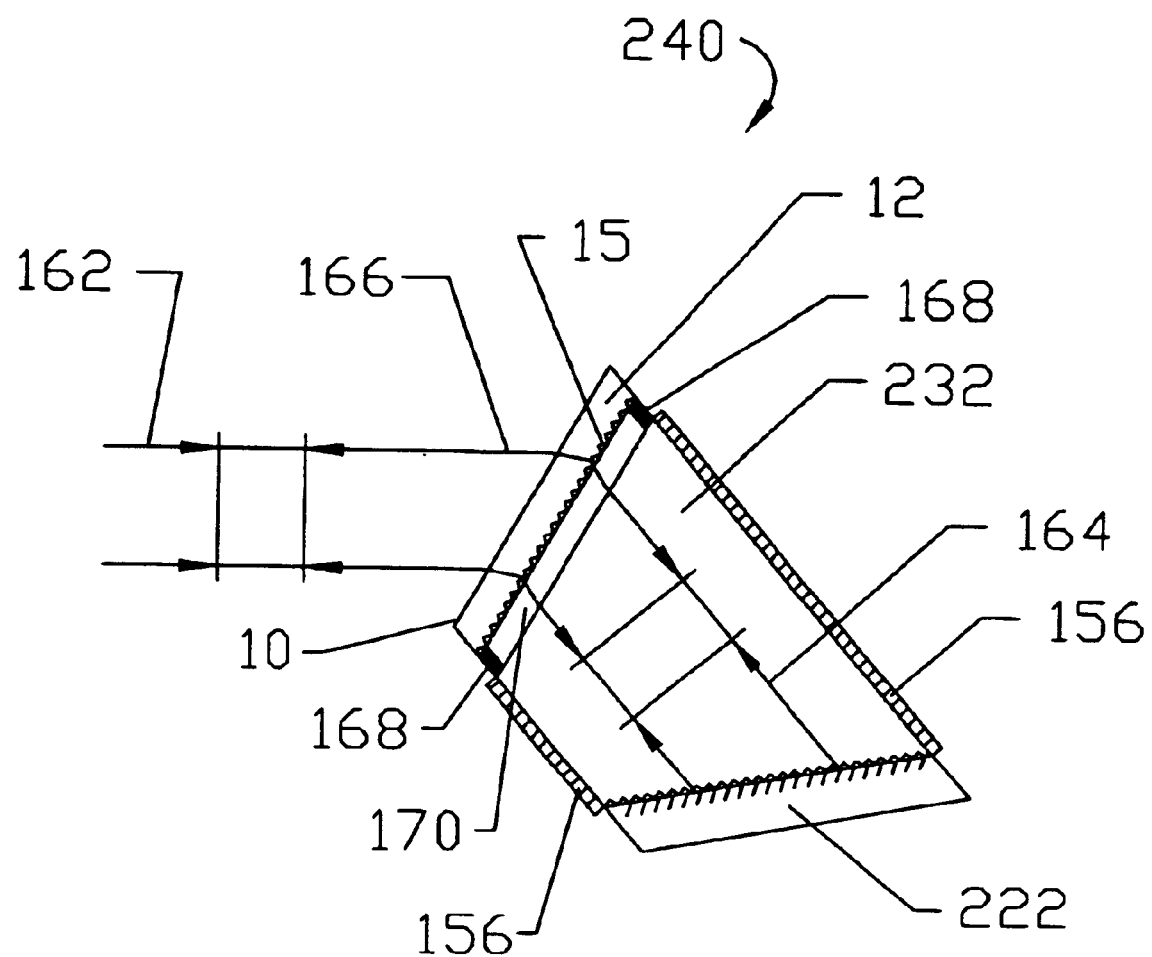

FIG. 17 is a schematic view of a dual pass multi-grating device 240 similar to the device 230 depicted in FIG. 16 but differing therefrom in that the transmission grating surface 15 in device 240 is encapsulated between the substrate 12 of grating element 10 and the input optical transmitting surface of glass block element 232 to which element 10 is attached, similar to manner shown in the device 160 of FIG. 9. Furthermore, the surface-relief reflection grating element 222 is directly attached (by, e.g., adhesive means, such as optical cement) to the glass block 232. The device 240 functions exactly as described for the device 230 of FIG. 16, except that the surface-relief reflecting grating surface of element 222 of device 240 is immersed in the optical cement used to optically bond element 222 to element 232. Under these immersed grating conditions, the effective λ/D of the grating element 222 is reduced by the index of refraction of the optical cement used to bond the grating element 222 to the glass block 232. One can compensate for the reduction in the λ/D of the grating element 222 as a result of being immersed in a media having an index of refraction larger than the 1.0 value for air by starting with a grating element 222 that has a higher λ/D value. Typically one starts with a λ/D value that is n times larger than the effective λ/D value that one wants to achieve for the immersed grating element, where n is the refractive index of the cement used to bond element 222 to element 232. Most optical cements have a refractive index in the range of about 1.45 to 1.6. For example, if one wants to have an immersed sinusoidal surface-relief reflection grating element 222 that has an effective λ/D value of about 0.8 and, thereby, achieve essentially equal diffraction efficiency values for S and P polarized optical components, one would start with a grating element having a λ/D value of about 1.2, assuming that the optical cement used to bond element 22 to element 232 in device 240 had an index of refraction of 1.50.

Figure 18:
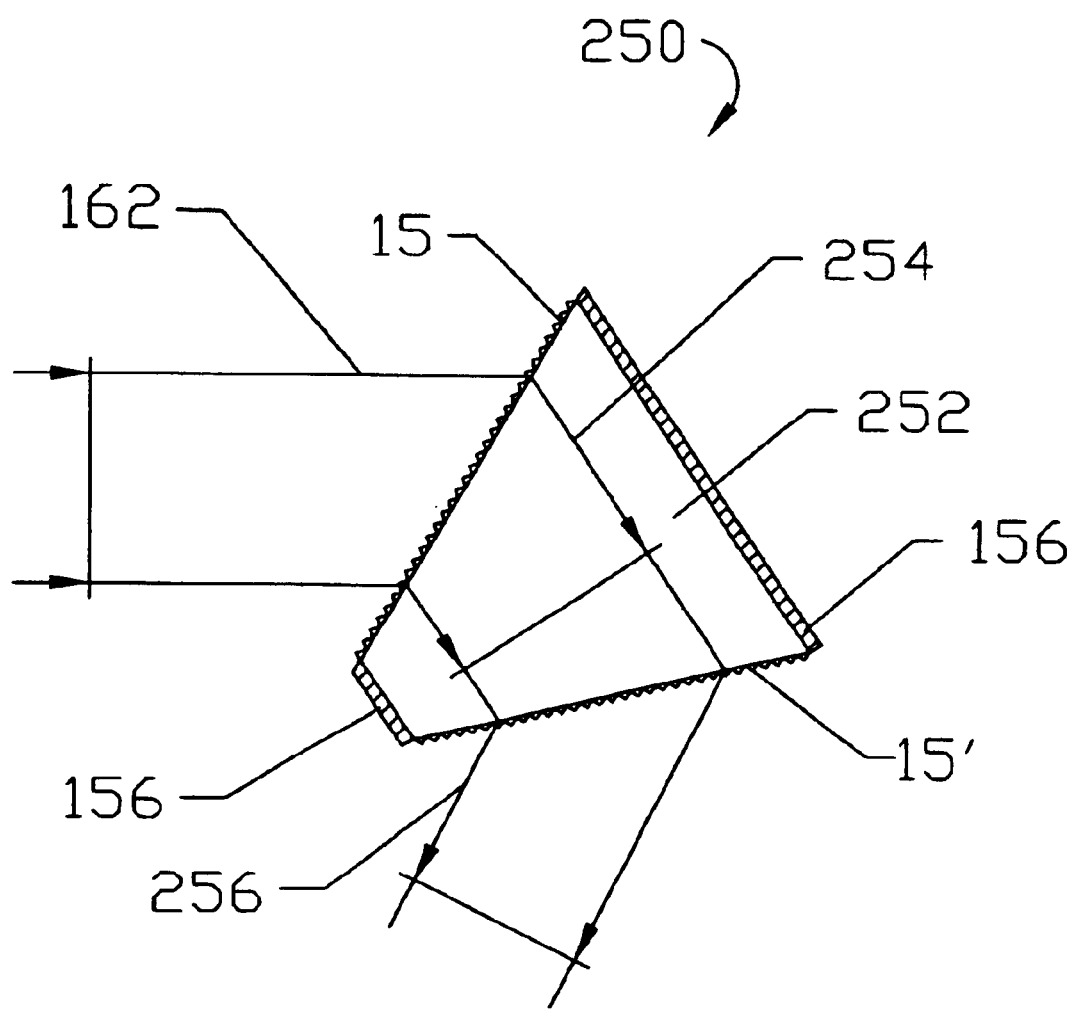

FIG. 18 illustrates how one can achieve the doubling of grating dispersion power by physically cascading two surface-relief transmission gratings 15 and 15', i.e., physically arranging two transmission grating elements so that a beam diffracted by the first grating undergoes diffraction by the second grating. As depicted in FIG. 18, the two gratings 15 and 15' are deposited onto the input and output optical transmitting surfaces of the glass block element 252. The single wavelength collimated incident beam 162 is diffracted by the first grating 15 as beam 254. The collimated diffracted beam 254 propagates in the glass block element 252 and is incident upon the second diffraction grating 15', which diffracts the beam 254 as collimated beam 256. The non-optical transmitting surfaces of the glass block 252 are coated with an optical absorption coating 156 that is designed to absorb the nondiffracted zeroth order beam energy and other scattered light that may occur within the glass block element 252.

The wavelength dispersion power of the dual cascaded transmission grating element 250 is essentially the sum of the wavelength dispersion powers of each of the gratings 15 and 15'. One can achieve essentially equal diffraction efficiency values for S and P polarized optical components for the element 250 by using surface-relief transmission gratings 15 and 15' that each have a λ/D ratio in the range of about 0.8 to 1.2, as shown by the data in FIG. 4. Using this λ/D value range for gratings 15 and 15', the element 250 can have a wavelength dispersion power of about 0.064 deg/nm to about 0.11 deg/nm for a wavelength of 1550 nanometers while essentially achieving equal diffraction efficiency values for the S and P optical polarization components and, thereby have a PDL value equal to or less than 0.2 dB. The angular separation between wavelength beams for element 260 is calculated with Equation (7) as $d\theta_{ds}=d\theta_{d1}+d\theta_{d2}$, where $d\theta_{d1}$ and $d\theta_{d2}$ are, respectively, the angular separation for gratings 15 and 15', as calculated by Equation (3).

Figure 19:
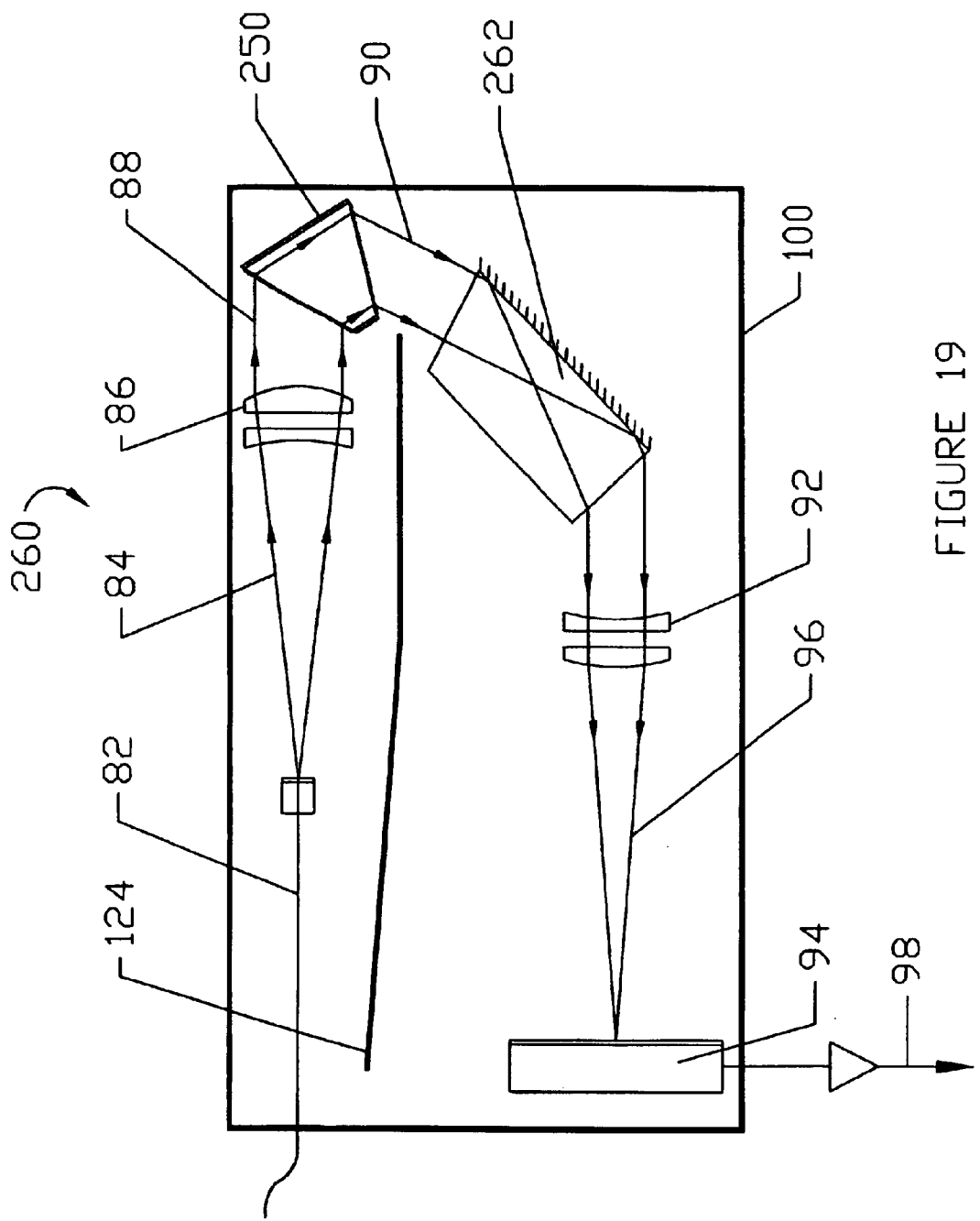

The spectrophotometer based OCM device 260 of FIG. 19 is essentially identical to the OCM device 217A of FIG. 13 with the exception that diffraction grating element 10 of device 217A is replaced in device 260 with the dual cascaded transmission grating element 250 of FIG. 18. Also, the linearizing prism element 218 and the beam fold mirror element 122 of device 217A have been combined into the single prism element 262 in device 260 that performs the dual functions of beam fold mirror and linearizing prism element. The dual functioning prism element 262 can achieve good athermalization performance since fabricating it with a glass material having a low thermal coefficient of refraction does not affect the beam folding mirror function of the element. Because the grating element 10 in FIG. 13 is replaced with element 250 in device 260, device 260 effectively has approximately twice the wavelength dispersion power as that achieved with device 217A. The higher wavelength dispersion power of the device 260 enables this device to utilize a shorter focal length for the focusing lens assembly 92 in the device and/or the device can be used in WDM fiber-optic communication systems having finer wavelength spacing between wavelength channel signals. The ability to work with WDM systems having finer spacing between their wavelength channel signals is becoming more important since the space between wavelength channels in fiber-optic communication systems is continuing to decrease.

Figure 20:
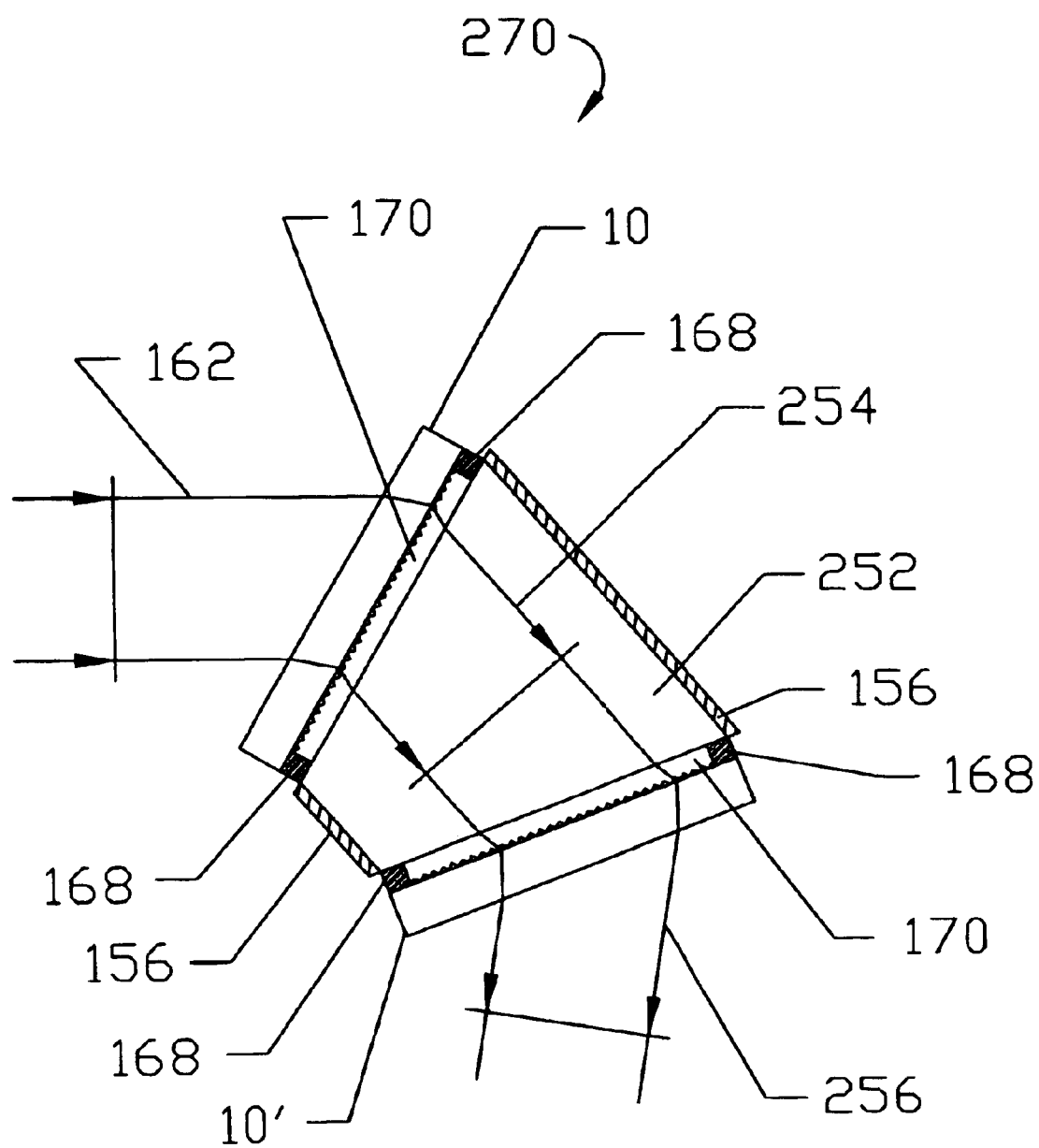

FIG. 20 illustrates a dual cascaded transmission grating device 270 which is similar to the device 250 of FIG. 18 but differs from that device by using surface-relief transmission grating elements 10 and 10' that are, respectively, attached to the input and output optical transmitting surfaces of glass block 252. The grating surfaces of elements 10 and 10' are encapsulated using sealing element 168 in substantial accordance with the method used to encapsulate the grating surface of element 10 in device 160 of FIG. 9. The device 270 functions as described for the device 250 of FIG. 18.

Figure 21:
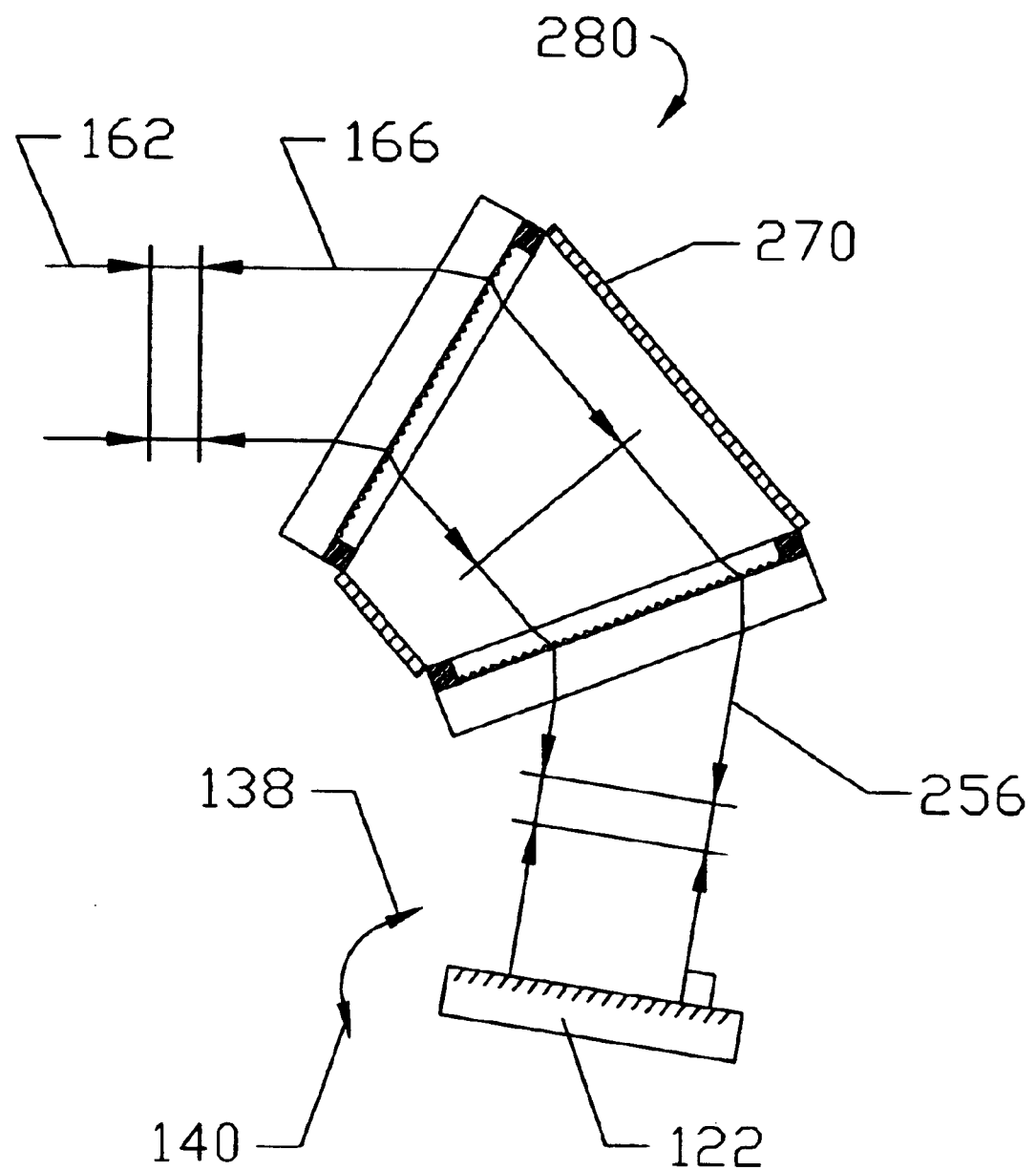

FIG. 21 illustrates a dual pass multi-grating device 280 that is similar to the device 130 of FIG. 7 but replaces the diffraction grating element 10 of device 130 with dual cascaded grating device 270 of FIG. 20. As depicted in FIG. 21, a single collimated wavelength beam 162 is incident on the device 280 at the Littrow diffraction condition for the device 280 arrangement and is retrodiffracted back along the incident beam 162 as beam 166. Device 280 functions essentially as described for device 130 of FIG. 7 with the exception that the wavelength dispersion power of the device 280 is substantially two times as great as that achieved with device 130 for the case where the grating elements 10 and 10' of device 280 have the same λ/D value as the grating element 10 in device 130. Device 280 can have wavelength dispersion power of about 0.129 deg/nm to about 0.222 deg/nm for a wavelength of 1550 nanometers and still achieve essentially equal diffraction efficiency values for S and P polarized optical components by using grating elements 10 and 10' that each have λ/D values in the range of about 0.8 to 1.2. The angular separation between wavelength beams for device 280 is calculated with Equation (7) as $d\theta_{ds}=2\,d\theta_{d1}+2\,d\theta_{d2}$, where $d\theta_{d1}$ and $d\theta_{d2}$ are, respectively, the angular separation for grating elements 10 and 10', as calculated by Equation (3).

Figure 22:
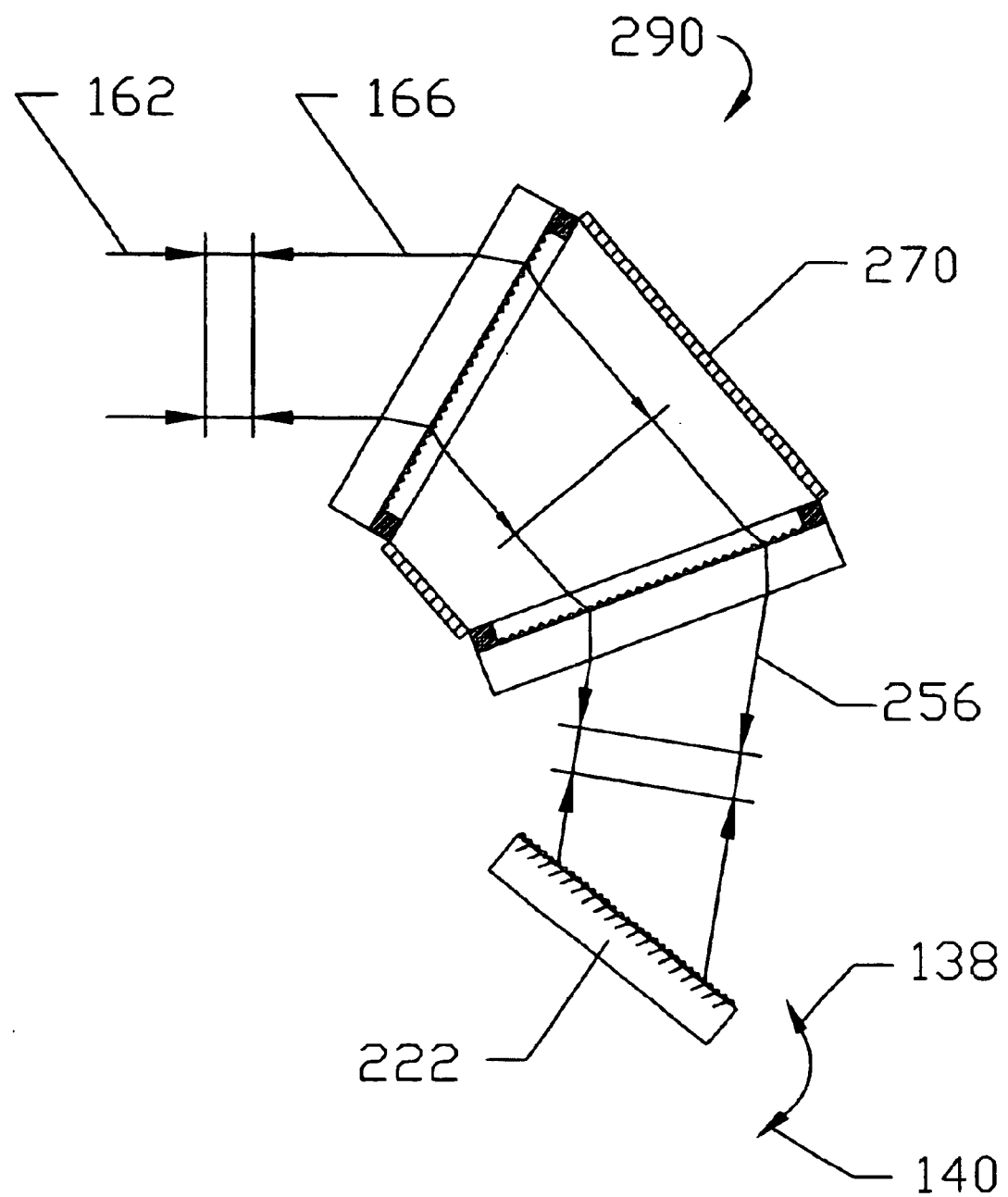

In FIG. 22 illustrates a dual pass multi-grating device 290 that is similar to the device 220 of FIG. 15 but replaces the diffraction grating element 10 of device 220 with dual cascaded grating device 270 of FIG. 20. As depicted in FIG. 22, a single collimated wavelength beam 162 is incident on the device 290 at the Littrow diffraction condition for the device 290 arrangement and is retrodiffracted back along the incident beam 162 and beam 166. Device 290 functions essentially as described for device 220 of FIG. 15 with the exception that the wavelength dispersion power of the device 220 is approximately 1.67 times greater than that achieved for the device 220 for the case where device 220 and device 290 use grating elements having essentially the same λ/D values. The device 290 can have a wavelength dispersion power of about 0.161 deg/nm to about 0.257 deg/nm for a wavelength of 1550 nanometers and still achieve essentially equal diffraction efficiency values for S and P polarized optical components when the surface-relief transmission grating elements used in the device each have λ/D values of about 0.8 to 1.2 and the surface-relief reflection grating element 222 has a λ/D value of about 0.8 to 0.85. The angular separation between wavelength beams for device 290 is calculated with Equation (7) as $d\theta_{ds}=2\,d\theta_{d1}+2\,d\theta_{d2}+d\theta_{d3}$, where $d\theta_{d1}$, $d\theta_{d2}$ and $d\theta_{d3}$ are, respectively, the angular separation for grating elements 10, 10' and 222, as calculated with Equation (3).

Figure 23:
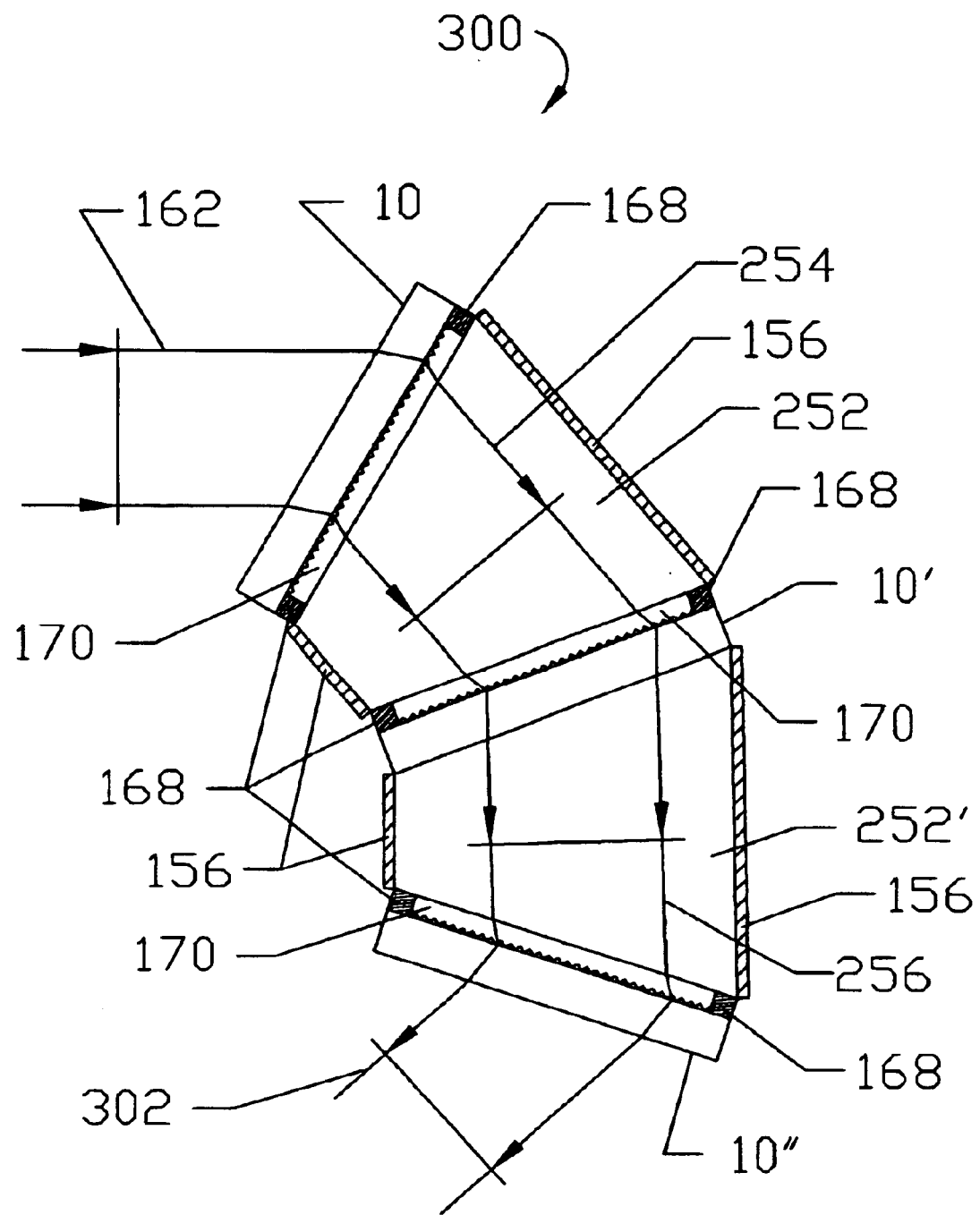

The transmission multi-grating device 300 depicted in FIG. 23 is similar to the device 270 in FIG. 20, with the exception that the wavelength dispersion power has been further increased by stacking a third diffraction grating element 10" to the grating elements 10 and 10' that are incorporated in device 270 of FIG. 20. Device 300 functions as described for the device 270 of FIG. 20 with the exception that, in device 300, the collimated beam 256 diffracted from grating element 10' propagates in the glass block 252' to grating element 10" where it is diffracted as collimated beam 302. The effective wavelength dispersion power for the device 300 is essentially equal to the sum of the wavelength dispersion power for the individual a grating elements 10, 10' and 10". Therefore, device 300 can be fabricated with an effective wavelength dispersion power of about 0.097 eg/nm to about 0.166 deg/nm for a wavelength of 1550 nanometers while still achieving essentially equal diffraction efficiency values for S and P polarized optical components by using surface-relief transmission grating elements for gratings 10, 10' and 10" that each have λ/D values in the range of about 0.8 to 1.2. The angular separation between wavelength beams for device 300 is calculated with Equation (7) as $d\theta_{ds}=d\theta_{d1}+d\theta_{d2}+d\theta_{d3}$, where $d\theta_{d1}$, $d\theta_{d2}$, and $d\theta_{d3}$ are, respectively, the angular separation for grating elements 10, 10' and 10", as calculated with Equation (3).

In device 300 the individual grating elements 10, 10' and 10" are attached to the corresponding optical transmitting surfaces of glass block elements 252 and 252' using sealing elements 168. Sealing elements 168 encapsulate the grating surfaces of elements 10, 10' and 10" in substantial accordance with the method used to encapsulate the grating surface of element 10 in device 160 of FIG. 9. As depicted in FIG. 23, grating element 10' is optically attached to glass block 252'. One could use optical cement to bond grating element 10' to glass block 252' or one could directly optically contact grating element 10' to glass block 252'.

As depicted in FIG. 23, the substrate material of grating element 10' and the glass block 252' have essentially the same index of refraction and, therefore, the beam 256 propagates from grating element 10' into glass block 252' as if the combination of elements 10' and 252' were fabricated from a single continuous glass block element for the case where these elements are either optically contacted together or bonded using an optical cement that has an index of refraction that is essentially equal to that of the refractive indices used for elements 10' and 252'. For the case where the grating element 10' and glass block element 252' have different indices of refraction and/or the optical cement used to bond elements 10' and 252' together has a different index of refraction relative to the indices of refraction for elements 10' and 252', the beam 256 propagates from grating element 10' into glass block element 252' but some of its intensity is lost due to the reflection loss that occurs at the interface boundary surface between materials that have different indices of refraction. These reflection losses are less than 0.5 percent per interface boundary surface when the indices of refraction for elements 10' and 252' and the optical cement used to bond them together are relatively close, that is, when the difference in these indices of refraction are less than approximately 0.2 for materials having an index of refraction in the range of about 1.40 to 1.70.

The optical bonding of grating element 10' to glass block element 252' in device 300 of FIG. 23, in effect, creates a surface-relief transmission grating surface on the input optical transmitting surface of block element 252'. While this technique for creating a grating surface on the optical transmitting surface of a glass block element is only illustrated in FIG. 23, it can be used to create the transmission grating surface 15 on the input optical transmitting surface of the glass blocks in FIGS. 8, 12, 14 and 16 and the grating surfaces 15 and 15' on the input and output optical transmitting surfaces of glass block 252 in FIG. 18. This method of creating a surface grating 15 on the input and/or output transmitting surfaces of a glass block by optically bonding a grating element 10 to the surface of the glass block element provides significant advantages with regard to manufacturing the grating surfaces 15 on the input optical transmitting surfaces of the non-parallel sided glass blocks in FIGS. 8, 12, 14 and 16 and the grating surfaces 15 and 15' on the input and output optical transmitting surfaces of the non-parallel sided glass block in FIG. 18.

It is much easier to create a surface-relief photoresist grating on a parallel plate substrate element than to create a surface-relief photoresist grating on a non-parallel shaped glass block element. Also, multiple surface-relief photoresist grating elements can be fabricated on a single large substrate element in the same manner that multiple integrated circuit elements are in fabricated on a single silicon wafer. A large substrate containing a large grating element can be cut up to yield smaller grating elements having a size suitable for the devices that they will be used with. These grating elements cut from the larger substrate element can be used as a stand alone element (as illustrated in FIGS. 5, 6, 7 and 15) attached to a glass block element with an air spacing layer between the grating surface and the optical transmitting surface of the glass block element (as illustrated in FIGS. 9, 16, 17, 20, 21 and 23) or optically bonded to a glass element as illustrated in FIG. 23; and, while not specifically illustrated, used to create the grating surface on the glass block elements incorporated in the devices illustrated in FIGS. 8, 10A, 10B, 11A, 11B, 12, 14, 16, and 17.

One can further increase the wavelength dispersion power of the transmission multi-grating device 300 of FIG. 23 by either adding another transmission grating element to the device, incorporating a beam fold mirror in the device that retroreflects the diffracted beam 302 back through the device, or by incorporating a reflecting grating element in the device that retrodiffracts the diffracted beam 302 back through the device. It is anticipated that the wavelength dispersion power of the devices shown in this specification are suitable for both present and future grating-based devices used in fiber-optic communication systems.

Figure 24:
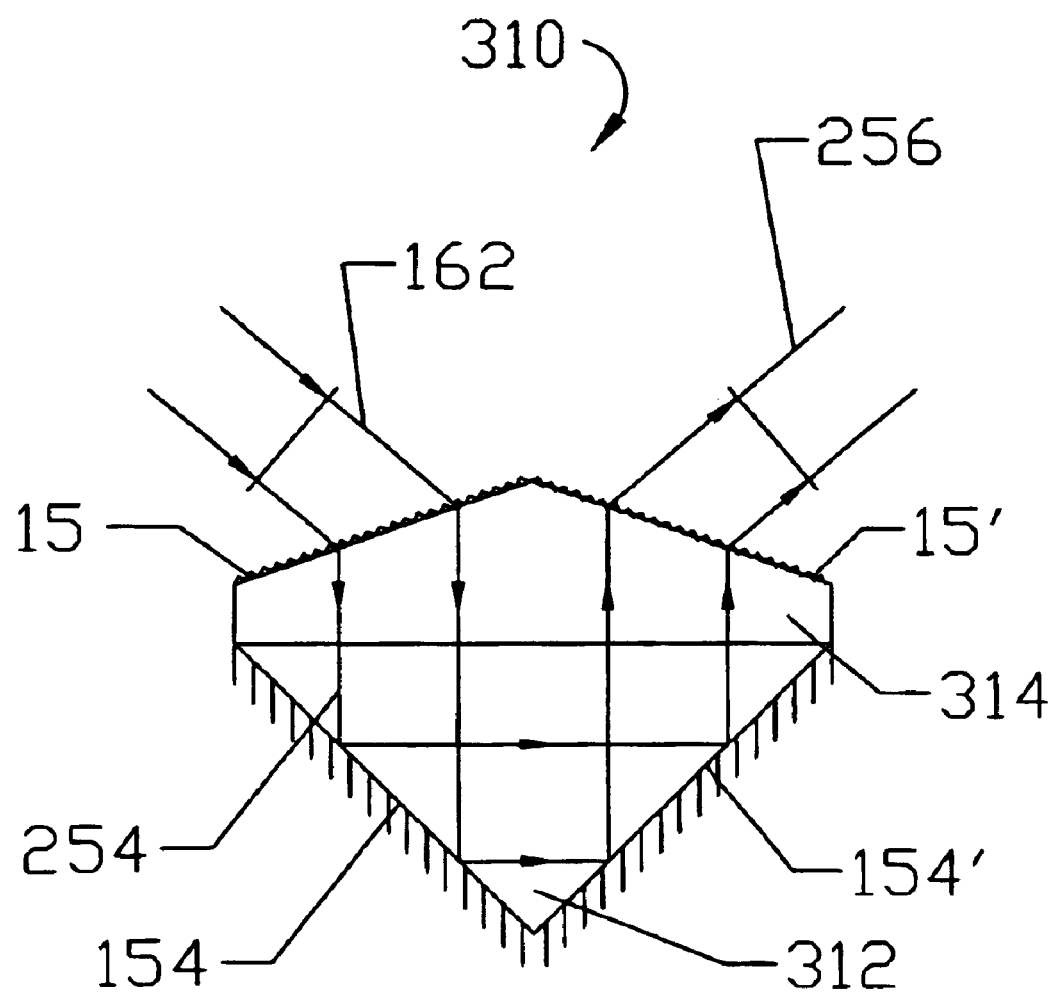

FIG. 24 illustrates a dual cascaded transmission grating device 310 which is similar to the device 250 of FIG. 18. Device 310 functions essentially as described for device 250 with the exception that the beam 254 diffracted from grating 15 undergoes two reflections within the glass block element in device 310 before being incident on grating 15', which diffracts it as beam 256. As depicted in FIG. 24, the glass block element of device 310 is composed of two glass block elements 312 and 314 that are optically bonded together. Glass block elements 312 and 314 are fabricated from the same type of glass material and are bonded together by being either directly optically contacted or by using an optical cement that has an index of refraction that is essentially equal to the refractive index of glass block elements 312 and 314 and, thereby forms essentially a single continuous glass block element. The block element 312 is a roof prism element having a 90-degree angle between its reflective mirror coated surfaces 154 and 154'. The block element 314 is a prism element having a base length that matches the length of the hypotenuse leg of block element 312 while the enclosed angle between the other two leg surfaces of element 314 is chosen to facilitate the diffraction angle conditions of device 310.

Device 310 is included in this specification to illustrate that beam folding mirror surfaces can be incorporated into the cascaded multi-grating devices presented in this specification and, thereby, change the angular propagation path that the beam undergoes with the device and the angular direction of the beam exiting the device relative to the incident beam direction. Comparison of device 310 in FIG. 24 with device 250 of FIG. 18 shows that the inclusion of beam folding mirror surfaces as implemented in the embodiment in FIG. 24 does not essentially affect the wavelength dispersion power of the device.

One of the most fundamental operations in a communication network is the selective switching (add/drop) of signals between different transmission paths of the network. A number of techniques have been demonstrated for building optically based add/drop wavelength multiplex (ADWM) devices that optically switch different wavelength channels between different fiber ports in a WDM fiber-optic communication system. U.S. Pat. No. 5,960,133 discloses methods for building ADWM devices that utilize reflection grating elements to perform the wavelength channel selection function in these devices. The entire disclosure of this United States Patent is hereby incorporated by reference into this specification.

Figure 25A:
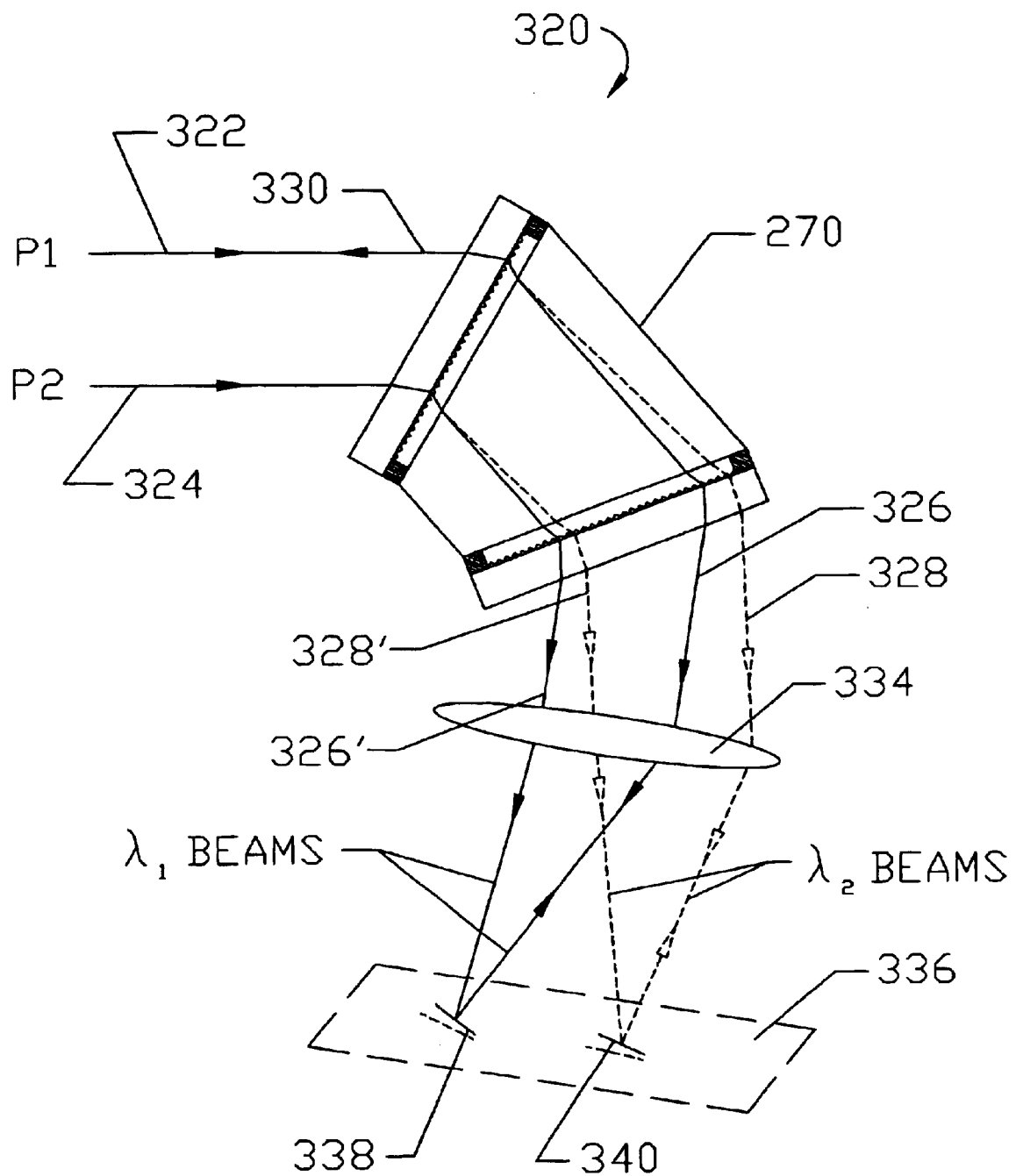
FIGS. 25A, 25B, and 26 illustrate wavelength-division add/drop multiplexer devices that incorporate the dual cascaded grating element of FIG. 20.
Figure 25B:
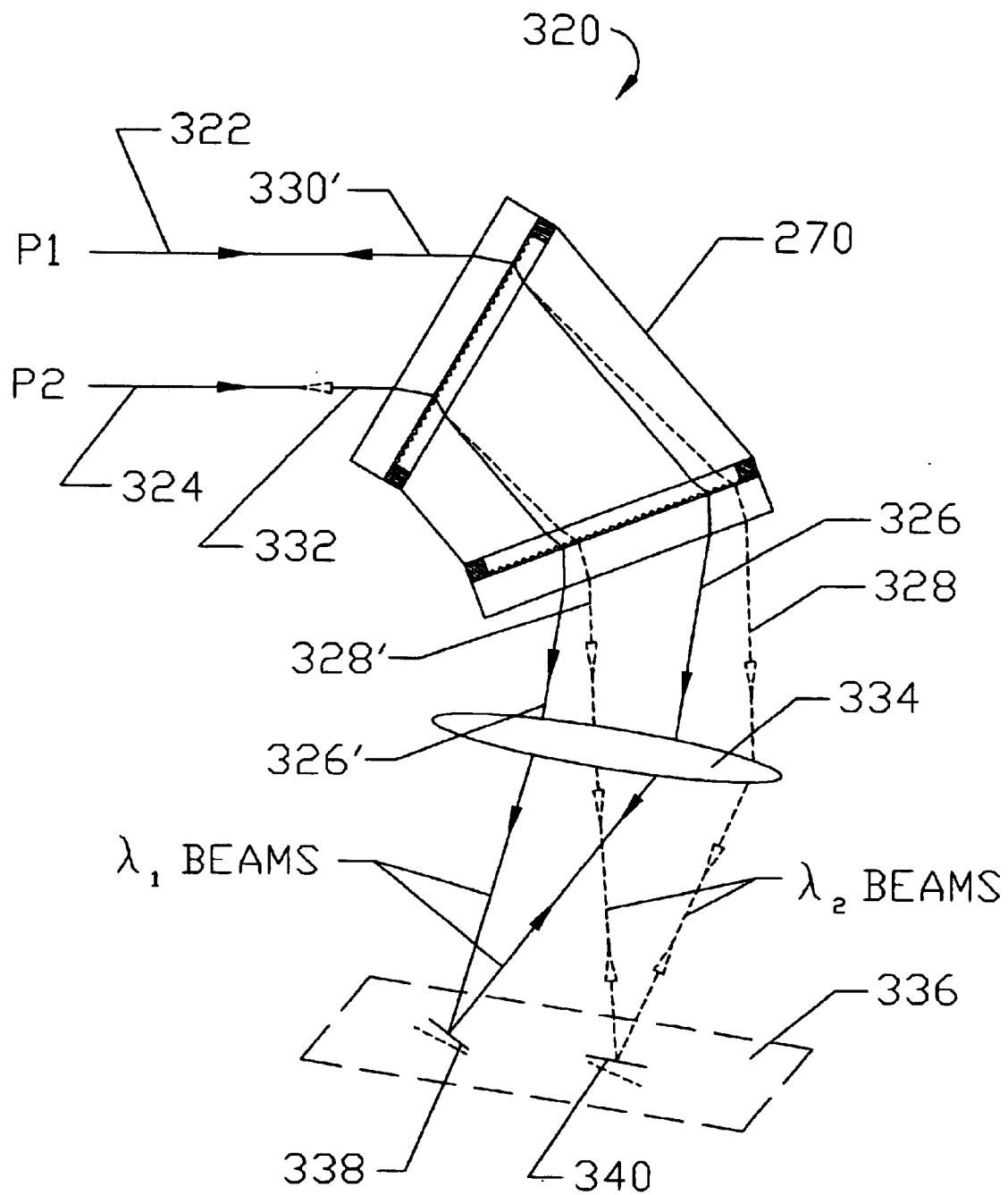

Schematically illustrated in FIGS. 25A and 25B is an ADWM device 320 that is similar to the device 19 in FIG.

2 of U.S. Pat. No. 5,960,133, but differs from that device in that device 320 uses dual cascaded transmission grating element 270 of FIG. 20 in place of the reflection grating element used in the FIG. 2 device 19 of U.S. Pat. No. 5,960,133. Because the elements used to fabricate the input and output ports and the micro electromechanical (EM) mirror switching elements of the ADWM devices disclosed in U.S. Pat. No. 5,960,133 are relatively large, these ADWM devices can benefit from the flexibility of element placement provided by replacing the reflection grating elements used in the ADWM devices of U.S. Pat. No. 5,960,133 with surface-relief transmission grating-based elements, in the same manner that the wavelength channel monitoring devices of FIGS. 5 and 6 benefit from the use of transmission grating element 10. These ADWM devices can also benefit from the increased wavelength dispersion power provided by the cascaded transmission grating arrangements presented in this specification, as illustrated by device 320 in FIGS. 25A and 25B.

With reference to FIG. 25A, ports P1 and P2 provide generally parallel but separate optical beams 322 and 324 that are incident to the dual cascaded grating element 270. Beams 322 and 324 contain $\lambda_1$ and $\lambda_2$ wavelength channel signals. After diffraction from element 270, the incident beams 322 and 324 are separated into their respective wavelength components. The $\lambda_1$ wavelength components of beams 322 and 324 are, respectively, 326 and 326' and are depicted in FIG. 25A as solid lines while the $\lambda_2$ wavelength components of beams 322 and 324 are, respectively, 328 and 328' and are depicted as dashed lines in FIG. 25A. As illustrated in FIG. 25A, the diffracted beams having different wavelengths are angularly separated while those of the same wavelength remain substantially parallel. A lens 334 focuses all of the beams from element 270 onto a micro-mirror array 336 comprising separately tiltable micro-mirror elements 338 and 340.

In the first position of the micro-mirror elements 338 and 340, illustrated in FIG. 25A by the solid lines, the mirror elements 338 and 340 reflect both wavelength beams received from port P1 directly back to port P1 as beam 330. That is, in this first position the mirrors are orientated perpendicular to the beams 326 and 328. For this first mirror position no wavelength signal channels are either added to or dropped from port P1 of the device 320. However, when mirror elements 338 and 340 are in the second position, illustrated by the dotted lines in FIG. 25A, the mirror elements 338 and 340 reflect wavelength beams received from port P1 to port P2. That is, in the second position the mirror element 338 is orientated perpendicular to the bisector of the beams 326 and 326' and the mirror element 340 is orientated perpendicular to the bisector of the beams 328 and 328'. In the second position, the mirror elements 338 and 340 also reflect wavelength beams received from port P2 to port P1. For this second mirror position both the $\lambda_1$ and $\lambda_2$ wavelength channel signals of beam 322 are dropped from port 1 and added to port 2 while both the $\lambda_1$ and $\lambda_2$ wavelength channel signals of beam 324 are dropped from port 2 and added to port 1.

FIG. 25B illustrates the case where mirror element 338 of device 320 is orientated in the first position while mirror element 340 is orientated in the second position. For the mirror orientation arrangement in FIG. 25B, the $\lambda_1$ wavelength beam from port 1 is reflected back to port 1 and comprises part of beam 330' while the $\lambda_2$ wavelength beam from port 1 is reflected to port 2 as beam 332 and the $\lambda_2$ wavelength beam from port 2 is reflected to port 1 and comprises part of beam 330'. For the mirror arrangement in FIG. 25B, the $\lambda_2$ wavelength channel signal of beam 322 is dropped from port 1 of device 320 and added to port 2 of the device while the $\lambda_2$ wavelength channel signal of beam 324 from port 2 is added to port 1 of the device. While only two wavelength channel signals and only two micro-mirror elements are depicted in device 320 of FIGS. 25A and 25B, it is evident that device 320 can be fabricated with a micro-mirror array 336 having a large number of micro-mirror elements and, thereby enable device 320 to be used to add/drop a large number of wavelength channel signals.

As stated in U.S. Pat. No. 5,690,133, the device 19 of FIG. 2 of that patent (that is similar to that of device 320 of FIGS. 25A and 25B) has many desirable characteristics but suffers from some problems. One such problem is that optical circulator devices have to be connected to the ports P1 and P2 to separate wavelength beam signals going in opposite directions. Optical circulator devices are expensive and add optical insertion loss to the ADWM device. A further problem with the device 320 is that it cannot simultaneously direct the $\lambda_1$ wavelength beam from port P1 to port P1 while directing the $\lambda_1$ wavelength beam from port P2 to port P2, or perform this same simultaneous switching function for the same wavelength for any of the other wavelength channel beams in the device.

FIG. 5 in U.S. Pat. No. 5,960,133 shows what is claimed as an improved micro-mirror based add/drop device relative to the device 19 of FIG. 2 of this patent. Schematically illustrated in FIG. 26 of this case is an ADWM device 350 that is similar to the FIG. 5 device in U.S. Pat. No. 5,960,133, but differs from that device in that device 350 uses dual cascaded transmission grating element 270 in place of the reflection grating element used in the FIG. 5 device of U.S. Pat. No. 5,960,133. The device 350 functions similar to that stated for device 320 of FIGS. 25A and 25B, with the exception that device 350 uses four parallel one way directional, input and output beam paths 352, 354, 356, and 358 arranged in a two-dimensional array. The four beams in this arrangement are the input beam 352, the output beam 354, the add beam 356, and the drop beam 358. The input and add beams 352 and 356 propagate oppositely from the output and drop beams 354 and 358.

As explained in U.S. Pat. No. 5,960,133, the incorporation of the four parallel beam paths 352, 354, 356, and 358 into device 270 enables this add/drop device to function without the need for optical circulator devices and enables the device 350 to simultaneously switch a $\lambda_1$ wavelength channel signal from the input beam path 352 to the drop beam path 358 while switching a $\lambda_1$ wavelength channel signal from the add beam path 356 to the output beam path 354.

Figure 26:
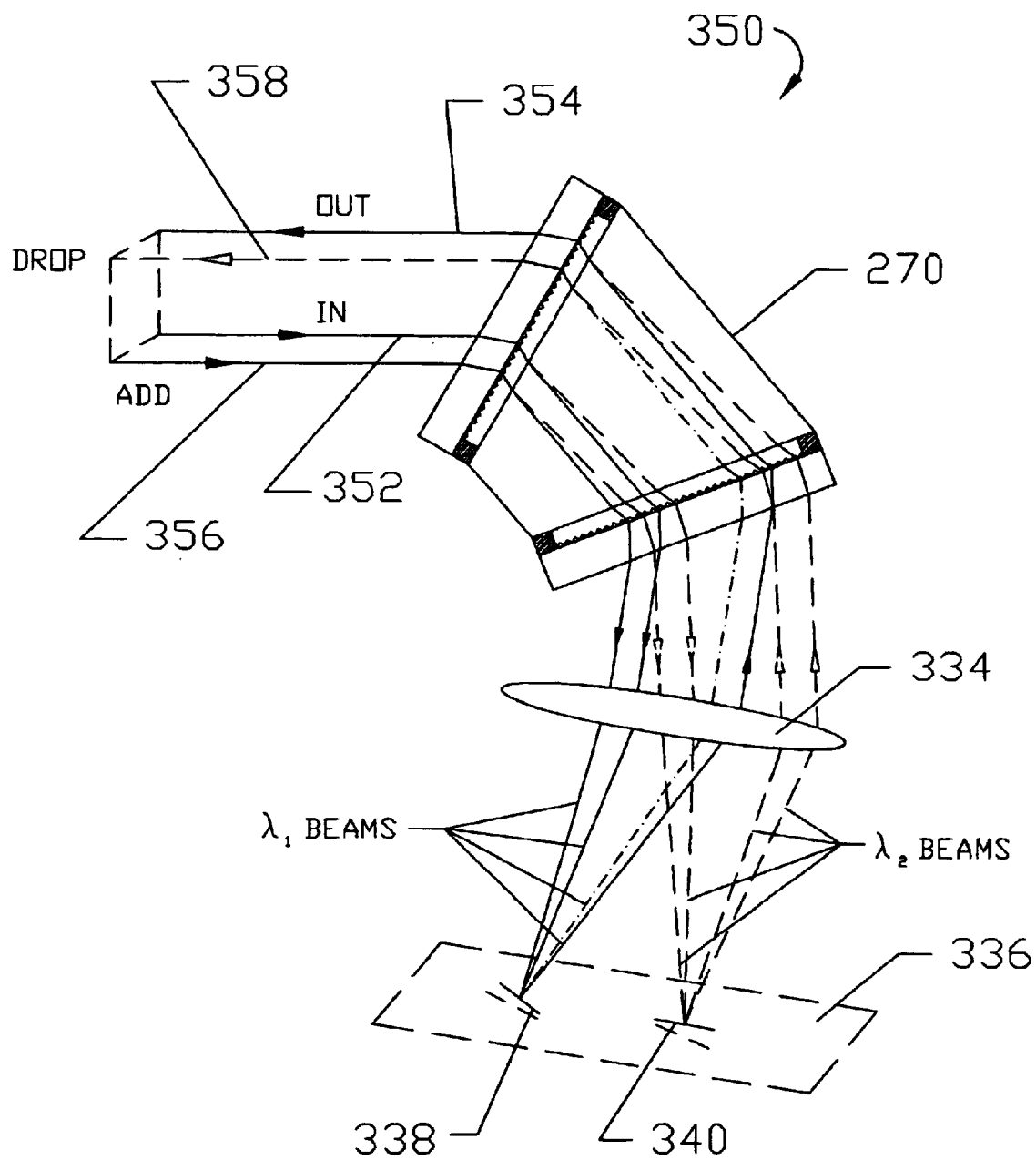

Replacement of the reflection grating elements in the FIG. 2 and FIG. 5 devices of U.S. Pat. No. 5,960,133 with a surface-relief transmission grating or a dual cascaded transmission grating element, as illustrated in FIGS. 25A, 25B and 26, does not change the basic add/drop functions of these devices but improves device layout configuration while providing increased wavelength dispersion power, which becomes increasingly important as the wavelength spacing in WDM fiber-optic systems decreases.

Figure 27A:
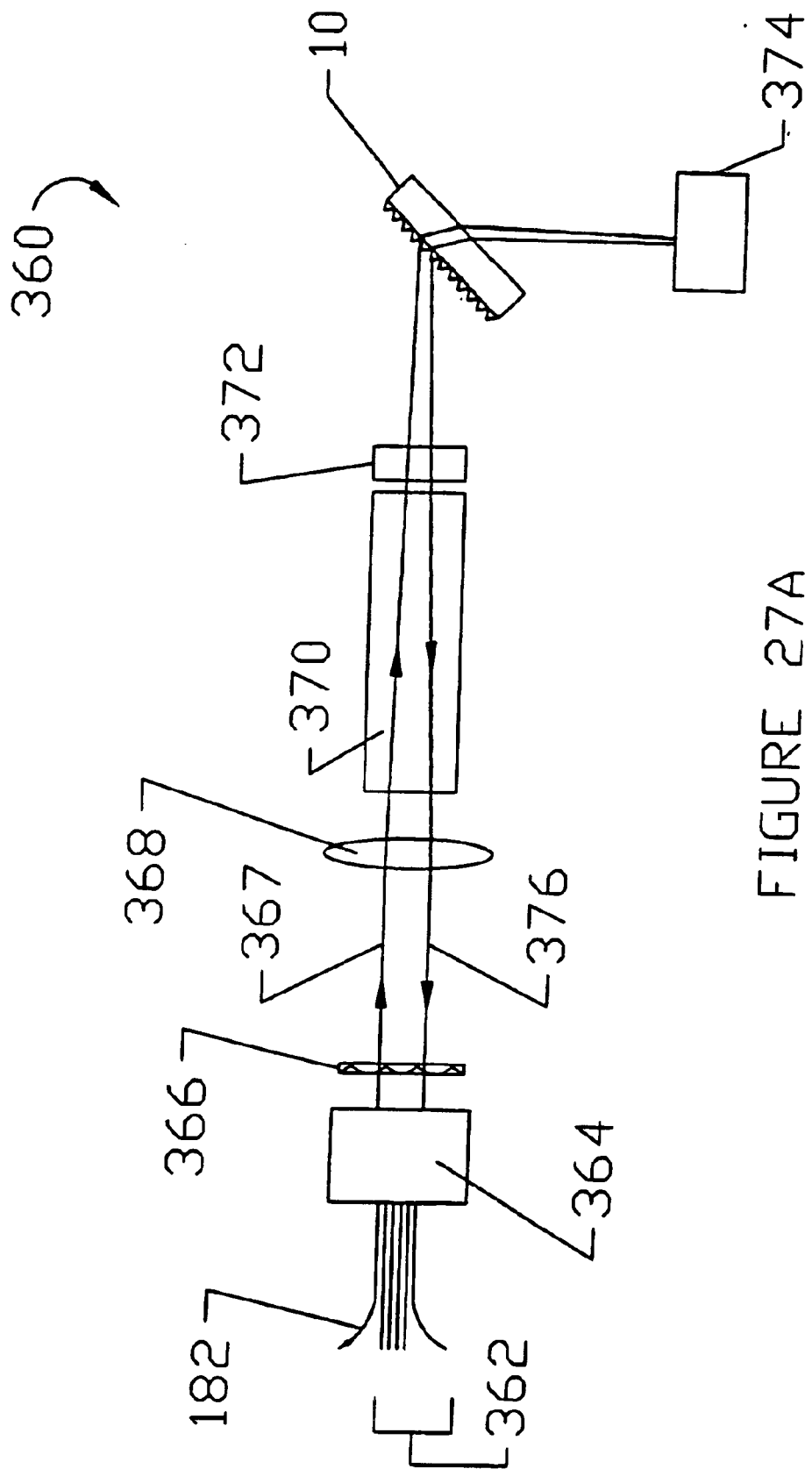
FIG. 27A is a schematic side view of a transmission grating-based demultiplexer fiber-optic unit.

A schematic side view is illustrated in FIG. 27A of a Mux/Demux device 360 that is similar to the device shown in FIG. 1 of a paper by S. Bourzeix, et al. entitled "Athermalized DWDM Multiplexer/Demultiplexer," (2000 National Fiber Optic Engineers Conference Technical Proceedings, Vol. 2, pages 317–320) but differs from that device in that device 360 uses surface-relief transmission grating element 10 in place of the surface-relief reflection grating element used in the FIG. 1 device of the Bourzeix, et al. paper. The use of transmission grating element 10 in device 360 facilitates the placement of the dihedral retroreflecting mirror element 374 in relation to the grating element 10 while enabling the grating to operate closer to the Littrow diffraction condition, relative to that achieved when a reflection grating element is incorporated into the device. Also, the use of transmission grating element 10 of FIG. 27A enables the dihedral mirror element 374 of this figure to be incorporated into a glass block element that includes the transmission grating, similar to the arrangement illustrated in FIGS. 8 and 9. It is much more difficult to incorporate the dihedral mirror element into a glass block element that includes the grating when a reflection grating is used in the device.

As depicted in FIG. 27A, input optical wavelength channel signal information is delivered to device 360 by transmission fiber 182. Input fiber 182 and output fibers 362 are held and spatially positioned relative to each other and the other optical components in device 360 by the fiber-optic array element 364. The optical beam emerging from the end of input fiber 182 is incident on a lens element (not shown) in the microlens array 366. Microlens array 366 reduces the divergence angle of the beam from input fiber 182 by about 1 degree, which increases the relative channel width of the device. Beam 367 from the microlens array 366 is collimated by lens 368. The collimated beam 367 from lens 368 propagates through the birefringent crystal element 370, through the halfwave retardation plate 372, to the grating element 10 where the beam is diffracted to the dihedral mirror element 374, the retroreflected beam from mirror element 374 propagates back to grating element 10 where it is rediffracted and propagates back through the halfwave retardation plate 372 and birefringent crystal element 370 to lens 368. The converging beam 376 from lens 368 is incident on microlens array 366, which focuses the angularly separated wavelength channel beams of beam 376 onto their corresponding output fibers 362 held in the fiber-optic array element 364.

Figure 27B:
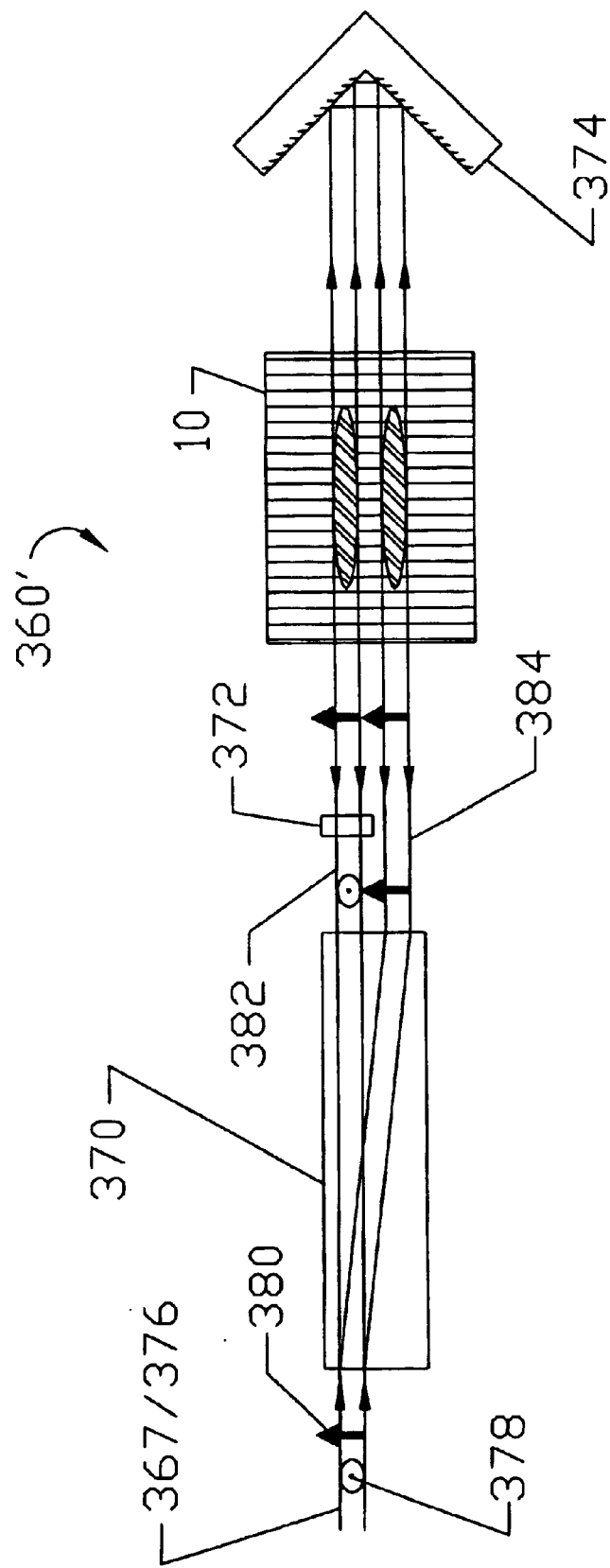
FIG. 27B is a schematic top view of some the optical components used in the demultiplexer device of FIG. 27A.

A schematic top view in FIG. 27B of a portion of the device 360 more clearly illustrates how the birefringent crystal element 370, halfwave retardation plate 372 and dihedral mirror element 374 collectively function together to control the polarization direction of the optical beam incident on grating element 10 and, thereby, enable the device 360 to achieve radiometric throughput efficiency values for S and P polarizations that are equal to within about 5 percent of each other. As depicted in FIG. 27A, the incident beam to grating element 10 and the diffracted beam from grating element 10 both make an angle of about 45 degrees with regard to the normal to the surfaces of element 10. Therefore, the grating element 10 in device 360 has a λ/D ratio value of approximately 1.4142, which according to the data in FIG. 4 results in the S polarized optical beam having about 95 percent diffraction efficiency while the P polarized beam has about 5 percent diffraction efficiency. For the configuration depicted in device 360, essentially only the S polarized optical component is diffracted from grating element 10 and, therefore, the other optical elements collectively function together to ensure that only a S polarized beam is incident on the grating element 10, thereby enabling device 360 to achieve a PDL value equal to or less than 0.2 dB.

With reference to FIG. 27B, the incident beam 367 to the birefringent crystal element 370 is composed of both S and P polarized optical components where the P component 378 is depicted as an ellipse with a dot at its center while the S component 380 is depicted as a bold arrow figure. Only the S and P polarization components to the left of element 370 in FIG. 27B are labeled with their respective numbers 380 and 378. When beam 367 propagates through the birefringent crystal element 370 its S and P polarized optical beam components propagate at an angle with respect to each other. As illustrated in FIG. 27B, the P polarized beam component of beam 367 propagates essentially straight through element 370 while the S polarized beam component of beam 367 is refracted at an angle relative to the P polarization beam direction as it propagates through element 370. The length of the birefringent crystal element 370 is chosen so that the P polarized beam path 382 exiting the element 370 is spatially separated from the S polarized beam path 384 exiting the element 370, as illustrated in FIG. 27B.

The beam paths 382 and 384 are parallel and spatially separated as they propagate through grating element 10 and dihedral mirror element 374. As illustrated in FIG. 27B, the dihedral mirror element 374 has a 90 degree angle between its reflecting mirror surfaces and functions as a retroreflecting mirror element that redirects the beam propagating from element 10 to element 374 along beam path 382 to propagate back to element 10 along beam path 384 while redirecting the beam that propagates from element 10 to element 374 along beam path 384 to propagate back to element 10 along beam path 382. Positioned in beam path 382, but not in beam path 384, is halfwave retardation plate 372 that converts the polarization direction of the oppositely propagating beams in beam path 382 from P polarization to S polarization for the beam propagating from element 370 to element 10 and from S polarization to P polarization for the beam propagating from element 10 to element 370. The birefringent crystal element 370 functions in a reversible manner and recombines the beams propagating in beam paths 382 and 384 that are incident to element 370 into a single beam 376 that propagates from element 370 to lens 368.

For the optical arrangement illustrated in FIG. 27B, the beams propagating in either direction of beam paths 382 or 384 that are incident on grating element 10 are S polarized and, therefore, have equal diffraction efficiency values which enables the device 360 to achieve radiometric throughput efficiency values for S and P polarized optical components that are equal to within about 5 percent of each other. The diffraction grating and dihedral mirror arrangement in device 360 function as a dual pass cascaded grating arrangement, as described for the dual pass grating device 130 of FIG. 7. The wavelength dispersion power of device 360 is equal to approximately twice the value of the wavelength dispersion power of grating element 10 used in the device. The angular separation between the different wavelength channel beams exiting element 370 of device 360 are calculated using Equation (5). As shown by data presented in FIG. 4, one can achieve greater than 80 percent diffraction efficiency for S polarization for surface-relief transmission gratings having λ/D ratio values of about 0.8 to approximately 1.90. Therefore, when device 360 incorporates a grating element 10 having a λ/D ratio in this range, it achieves a wavelength dispersion power of about 0.064 deg/nm to about 0.45 deg/nm for a wavelength of 1550 nanometers while having essentially equal radiometric throughput efficiency values for S and P polarized optical components, that is, having values within about 5 percent of each other.

While device 360 of FIG. 27 achieves large wavelength dispersion power and still achieves a PDL value equal to or less than 0.2 dB, it requires the incorporation of birefringent crystal element 370, a grating element 10 having a dimension parallel to the grating lines that is greater than twice the size of the incident beam 367, and that dihedral mirror element 374 be precisely aligned so that the beams reflected from it propagate back along the incident beam paths 382 and 384. The polarization controlling grating-based embodiments illustrated in FIG. 28 to FIG. 52 of this specification due not require birefringent crystal element 370 and incorporate a grating element or elements that have a dimension parallel to the grating lines that need be only slightly larger than the size of the beam incident to the grating element. Some of these embodiments due not require precision alignment between the separated retodiffracted polarization beam paths.

Figure 28:
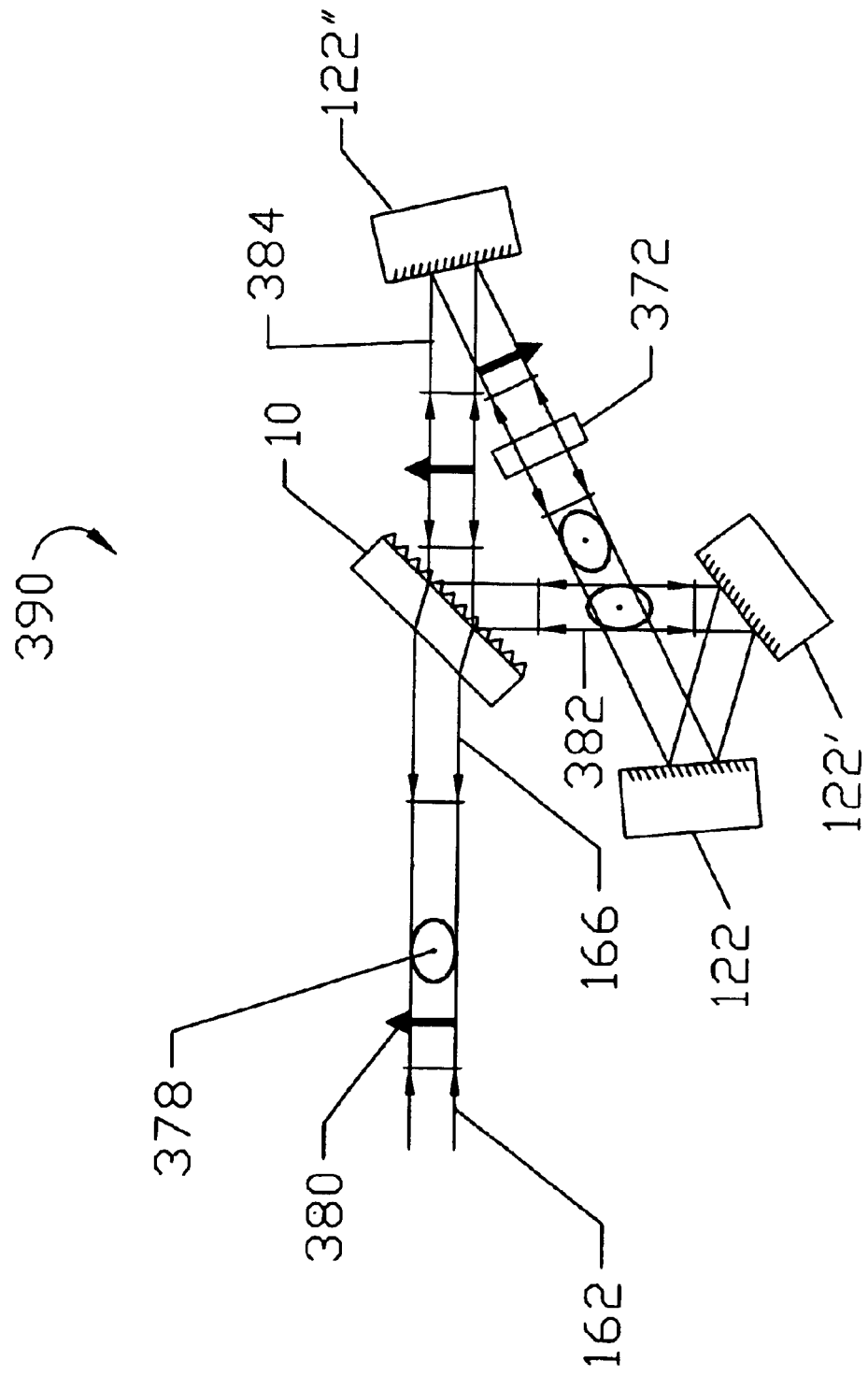
FIG. 28 is a schematic of yet another dual pass grating-based wavelength section unit utilizing the transmission grating element of FIG. 1.

A schematic side view is illustrated in FIG. 28 of a grating and mirror arrangement that enables the device 390 of this figure to achieve essentially equal radiometric throughput efficiency values for S and P optical polarization components while using a surface-relief transmission grating element 10 having a λ/D value of about 1.40 to about 1.7. As depicted in FIG. 28, the incident collimated beam 162 to device 390 is composed of both S and P polarized optical components where the S component 378 is depicted as an ellipse with a dot at its center while the P component 380 is depicted as a bold arrow. Only the S and P polarized components of the beam incident to or exiting device 390 are labeled with their respective numbers 378 and 380. Though it may appear that the polarization direction convention used in FIG. 28 is opposite to that used in FIG. 27B, they are the same since FIG. 28 provides a side view relative to grating element 10 while FIG. 27B provides a top view relative to grating element 10.

As depicted in FIG. 28, incident beam 162 and diffracted beam 382 both make an angle of about 45 degrees with respect to the normal of the surface of grating element 10, corresponding to grating element 10 of device 390 having a λ/D value of about 1.4142 and operating at the Littrow diffraction condition. If it is assumed that grating element 10 of device 390 has a grating aspect ratio in the range of 1.3 to 2.0, then according to the data in FIG. 4 the following diffraction conditions occur, which are depicted in FIG. 28. Grating element 10 diffracts about 95 percent of the S polarized beam component of the incident beam 162 while passing through undiffracted about 95 percent of the P polarized beam component of beam 162. For these diffraction conditions, grating element 10 performs the same function as the birefringent crystal element 370 of FIGS. 27A and 27B in that grating element 10 functions as a polarization beam splitter element. Combining the polarization beam splitter function into grating element 10 improves device cost and potentially device performance with regard to optical insertion loss and wavefront errors relative to the device 360 arrangement in FIGS. 27A and 27B. Also, grating element 10 in device 390 can have essentially half the width used for the grating element in device 360 in FIGS. 27A and 27B since the beam propagating through element 10 in device 390 are collinear versus the spatial separated arrangement in device 360.

Both the diffracted and undiffracted beams in device 390 make an angle of about 45 degrees to the normal to the grating surface of element 10. The S polarized diffracted beam propagates along beam path 382 of device 390 until beam fold mirror element 122' redirects it to beam fold mirror element 122 which redirects it to beam fold mirror element 122". The S polarized diffracted beam propagating from mirror element 122 to mirror element 122" passes through halfwave retardation plate 372 which converts the polarization state of this beam from S to P polarization. The P polarized diffracted beam is redirected by mirror element 122" to grating element 10 where essentially 100 percent of this P polarized beam component passes undiffracted through the grating element since the grating element functions in a reversible manner. This undiffracted beam propagates along the incident beam 162 path as the P polarized component of the retrodiffracted beam 166.

The P polarized undiffracted beam in device 390 propagates along beam path 384 until beam fold mirror element 122" redirects it to beam fold mirror element 122. The P polarized undiffracted beam propagating from mirror element 122" to mirror element 122 passes through halfwave retardation plate 372 which converts the polarization state of this beam from P to S polarization. The S polarized undiffracted beam is redirected by mirror element 122 to beam fold mirror element 122'. The S polarized undiffracted beam is redirected by mirror element 122' to grating element 10 where essentially 100 percent of this S polarized beam component is diffracted by the grating element since the grating element functions in a reversible manner. This diffracted beam propagates along the incident beam 162 path as the S polarized component of the retrodiffracted beam 166.

It should be noted that, while the S and P polarized components of the incident beam 162 pass twice through grating element 10 of device 390, each of these polarization components is only diffracted once by element 10 and, therefore, device 390 has a wavelength dispersion power just equal to the wavelength dispersion power of grating element 10. For the example depicted in FIG. 28, grating element 10 has a λ/D value of about 1.4142 and operates at the Littrow condition of $\theta_i=\theta_d=45$ degrees and, therefore, has a wavelength dispersion power of about 0.074 deg/nm for a wavelength of 1550 nanometers. As shown by the data in FIG. 4, the polarization beam splitter function depicted for grating element 10 in device 390 can be achieved for surface-relief transmission gratings having a λ/D value of about 1.4 to about 1.75 and, therefore, the effective λ/D value for device 390 can be from about 1.4 to approximately 1.75 while achieving essentially equal radiometric throughput efficiency values for the S and P polarization components and thereby have a PDL value of equal to or less than 0.2 dB.

As illustrated in FIG. 28, device 390 incorporates 3-beam fold mirror elements that have to be aligned so that the S and P polarized components of the retrodiffracted beam 166 propagate along a collinear beam path. It should be noted that the S and P polarized components of the retrodiffracted beam for different wavelength beams will only propagate along a collinear beam path when device 390 incorporates an odd number of beam fold mirror elements as depicted in FIG. 28. The device 390 cannot be constructed with only a single beam fold mirror element and, therefore, it must be constructed using 3, 5, 7, 9, . . . etc. beam fold mirror elements.

Figure 29:
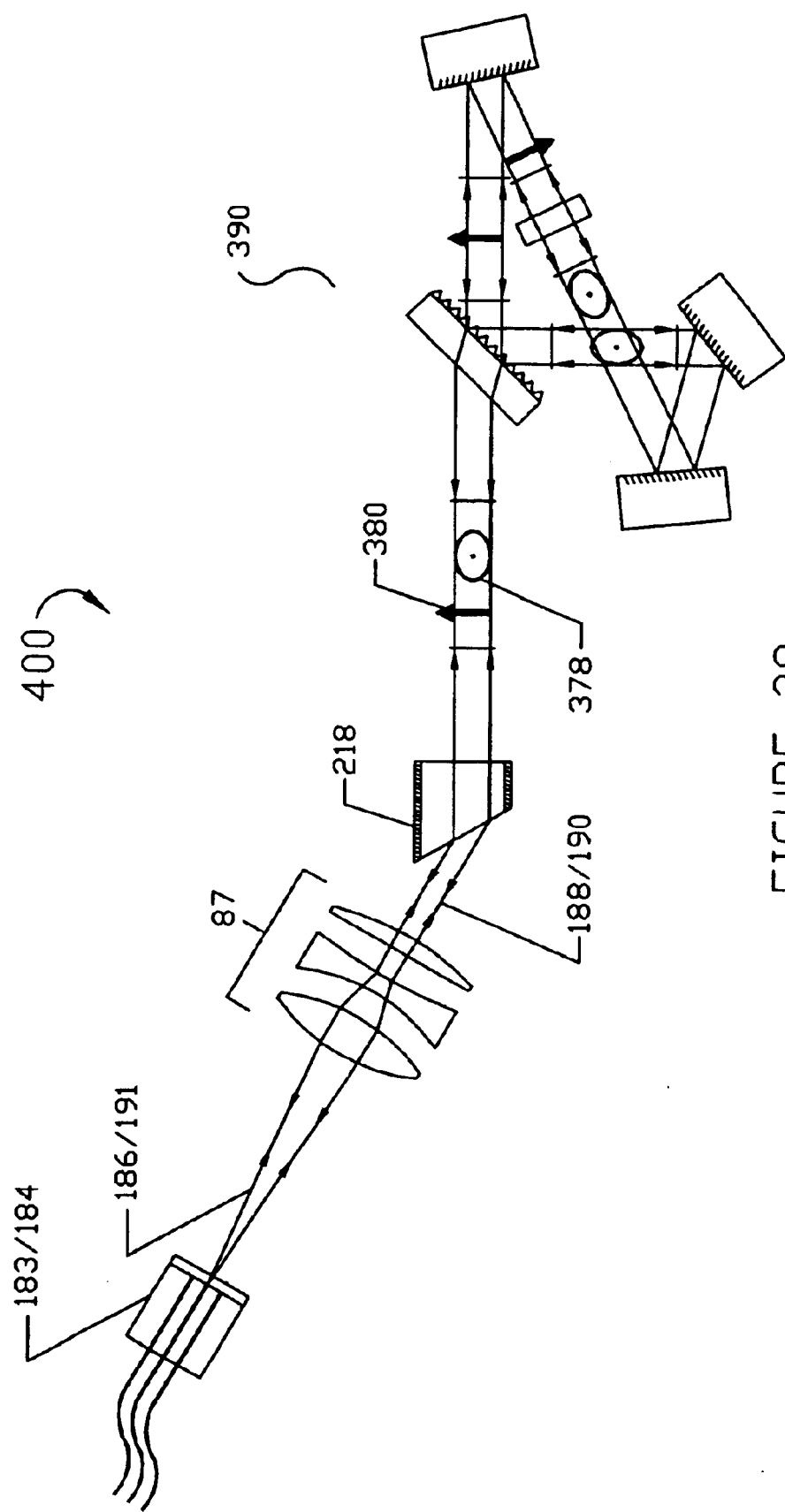
FIG. 29 is a schematic of a multiplexer device utilizing the transmission grating assembly of FIG. 28.

FIG. 29 schematically illustrates how grating-based component 390 of FIG. 28 can be incorporated into a Mux/Demux device 400 used in a fiber-optic WDM system. Device 400 functions as described for the Mux/Demux device 180 in FIGS. 10A, 10B, and 10C. Device 400 differs from device 180 in that device 400 incorporates grating-based component 390 in place of the grating-based component 150 used in device 180 and device 400 incorporates the beam expanding and linearizing prism element 218. As described for device 210 of FIG. 12, the beam expanding and linearizing prism element 218 increases the wavelength dispersion power of device 400 by the E magnification factor for this prism element and improves the linearity of the spacing of the spatially separated focused wavelength channel signal beams at the fiber-optic array element 184 in device 400.

Figure 30:
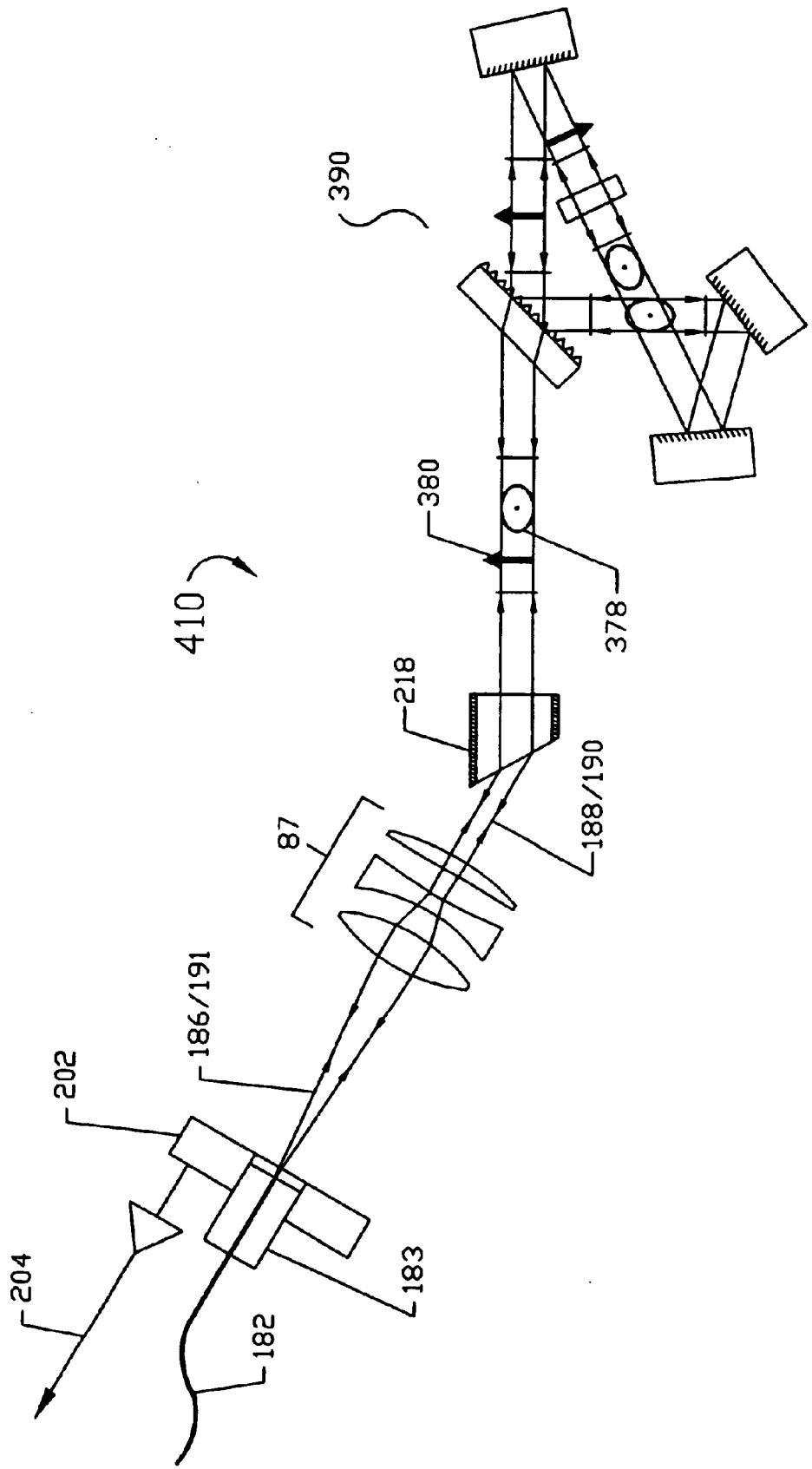
FIG. 30 is a schematic of a monitor device utilizing the transmission grating assembly of FIG. 28.

FIG. 30 schematically illustrates how grating-based component 390 of FIG. 28 can be incorporated into a spectrophotometer based OCM device 410 used in a fiber-optic WDM system. Device 410 functions as described for the OCM device 200 in FIGS. 11A, 11B, and 11C. Device 410 differs from device 200 in that device 410 incorporates grating-based component 390 in place of the grating-based component 150 used in device 200, and device 410 incorporates the beam expanding and linearizing prism element 218. As described for device 210 of FIG. 12, the beam expanding and linearizing prism element 218 increases the wavelength dispersion power of device 410 by the E magnification factor for this prism element and improves the linearity of the spacing of the spatially separated focused wavelength channel signal beams at the photodetector array element 202 in device 410.

Figure 31:
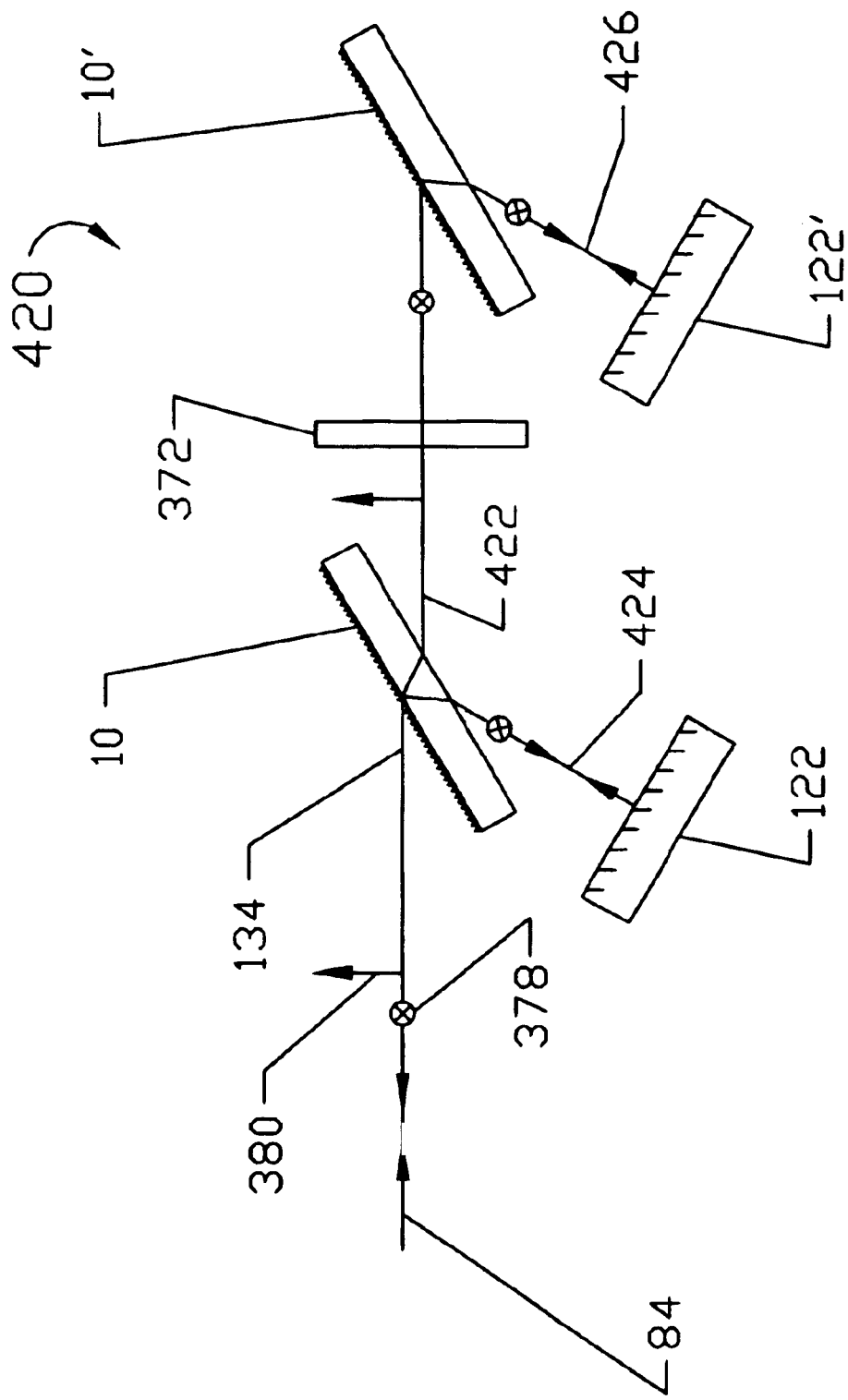

A schematic side view is illustrated in FIG. 31 of an optical arrangement that enables the device 420 of this figure to achieve essentially equal radiometric throughput efficiency values for S and P optical polarization components while using surface-relief transmission grating elements having a $\lambda/D$ value of about 1.40 to about 1.75. As depicted in FIG. 31, the incident beam 84 to device 420 is composed of both S and P polarized optical components, where the S component 378 is depicted as a circle with a x through its center while the P component 380 is depicted as a short arrow. Only the S and P polarized components of the beam incident to or exiting device 420 are labeled with their respective numbers 378 and 380. The polarization direction convention used in FIG. 31 is the same as used in FIG. 28.

As depicted in FIG. 31, incident beam 84 and diffracted beam 424 both make an angle of about 60 degrees with respect to the normal of the surface of grating element 10, corresponding to grating element 10 of device 420 having a $\lambda/D$ value of about 1.73 and operating at the Littrow diffraction condition. If it is assumed that grating element 10 of device 420 has a grating aspect ratio in the range of 1.3 to 2.0, then according to the data in FIG. 4, the following diffraction conditions occur, which are depicted in FIG. 31: grating element 10 functions like a polarizing beam splitter element when it has a $\lambda/D$ value of about 1.40 to approximately 1.75 in that it diffracts greater than 90 percent of the S polarized beam component of the incident beam 84 while passing through undiffracted greater than 95 percent of the P polarized beam component of beam 84. For these diffraction conditions, grating element 10 of device 420 functions exactly as described for the grating 10 element in device 390 of FIG. 28.

Device 420 differs from device 390 in that the diffracted S polarized beam 424 from grating element 10 in device 420 is incident on mirror element 122 which retroreflects beam 424 back to grating element 10 while the undiffract P polarized beam 422 from grating element 10 of device 420 propagates through halfwave retardation plate 372 before being incident on grating element 10'. Halfwave plate 372 converts the P polarized beam 422 from grating element 10 to the S polarized beam that is incident on grating element 10'. Grating element 10' has essentially the same $\lambda/D$ value, grating aspect ratio and incident and diffracted beam angle conditions as grating element 10 of this device and, therefore greater than 90 percent of the incident S polarized beam 422 incident to this grating element is diffracted as S polarized beam 426 that is incident on mirror element 122' which retroreflects beam 426 back to grating element 10'. Since grating elements 10 and 10' function in a reversible manner, greater than 90 of the S polarized retroreflected beams 424 and 426 are, respectively, diffracted by grating elements 10 and 10'. The retroreflected diffracted S polarized beam from grating element 10 propagates along the incident beam path 84 as the S polarized component of the retrodiffracted beam 134. The retroreflected diffracted S polarized beam from grating element 10' propagates along the incident beam path 422 and propagates through the halfwave plate 372 which converts this S polarized beam to a P polarized beam that is incident on grating element 10. Greater than 95 percent of this P polarized beam passes undiffracted through grating element 10 and propagates along the incident beam path 84 as the P polarized component of the retrodiffracted beam 134.

The dual pass grating mirror components in device 420, consisting of grating element 10 plus mirror element 122 and grating element 10' plus mirror element 122', function as described for the dual pass grating device 130 in FIG. 7. As was the case for the dual pass grating mirror arrangement in FIG. 7, the dual pass grating mirror arrangements in device 420 essentially double the wavelength dispersion power of the grating elements 10 and 10' used in device 420. When grating elements 10 and 10' have, respectively, diffraction efficiencies of 90 and 93 percent for S polarization and 95 percent transmission of P polarization, device 420 achieves diffraction values of approximately 81 and 78 percent for S and P polarization components, respectively, and thereby achieves a PDL value of less than 0.2 dB.

Figure 32:
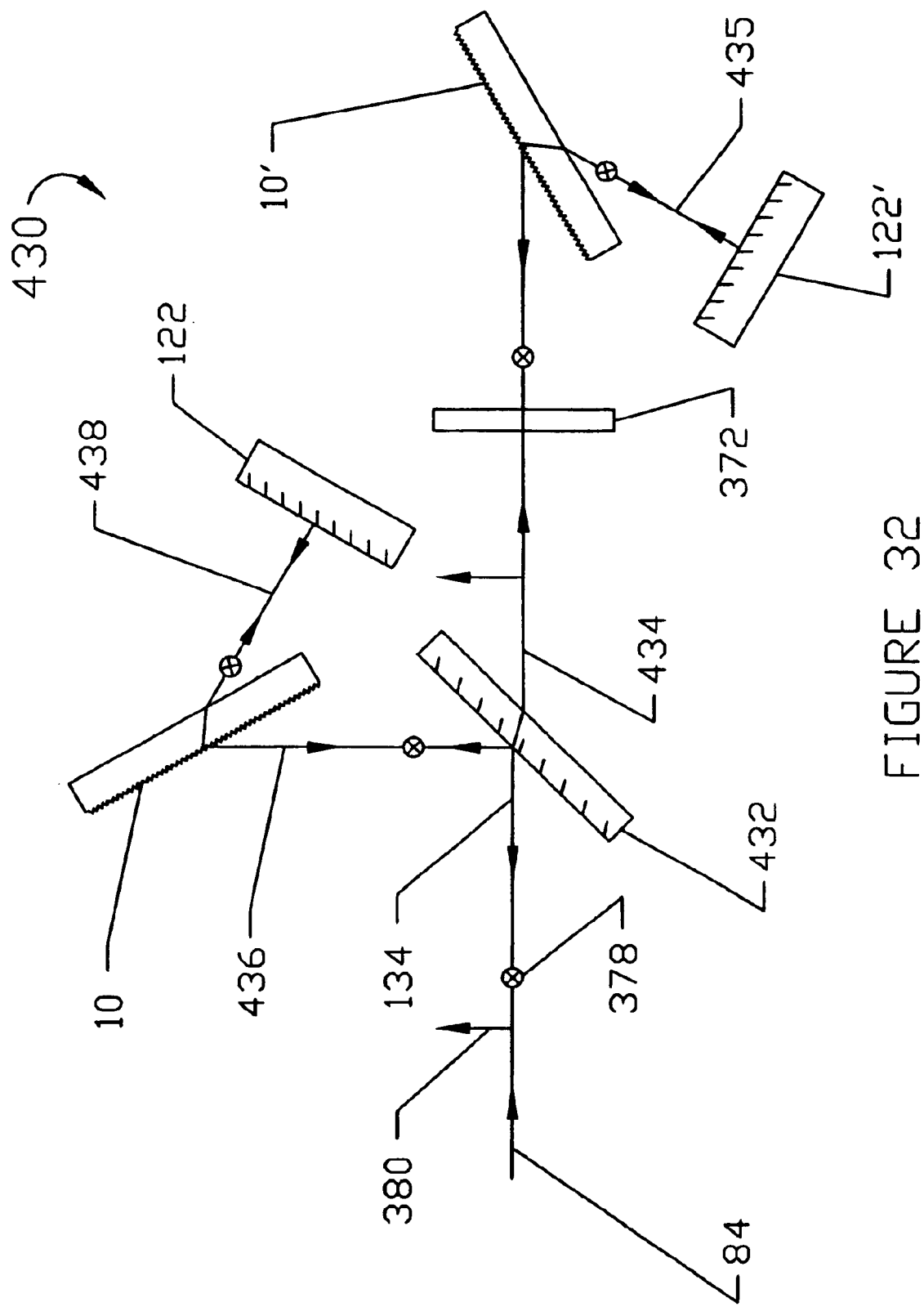

A schematic side view is illustrated in FIG. 32 of an optical arrangement that functions similarly to that described for device 420 of FIG. 31. The optical arrangement in device 430 of FIG. 32 enables this device to achieve essentially equal radiometric throughput efficiency values for S and P optical polarization components while using surface-relief transmission grating elements having a $\lambda/D$ value of about 1.40 to about 1.90. As depicted in FIG. 32, the incident beam 84 to device 430 is composed of both S and P polarized optical components, where the S component 378 is depicted as a circle with a x through its center while the P component 380 is depicted as a short arrow. Only the S and P polarized components of the beam incident to or exiting device 430 are labeled with their respective numbers 378 and 380. The polarization direction convention used in FIG. 32 is the same as used in FIG. 31.

The major difference between the optical arrangements in devices 420 and 430 is that device 430 uses polarizing beam splitter element 432 to separate the S and P polarization components of incident beam 84 and direct them to grating elements 10 and 10', respectively. Polarizing beam splitter elements, similar to element 432, are designed to reflect greater than 98 percent of the S polarization component of beam 84 and to transmit greater than 98 percent of the P polarization component of beam 84. As depicted in FIG. 32, incident beam 84 makes an angle of about 45 degrees to the normal of polarizing beam splitter element 432. Polarizing beam splitter element 432 reflects essentially 100 percent of the S polarization component of beam 84 toward grating element 10 as beam 436 and transmits essentially 100 percent of the P polarization component of beam 84 toward grating element 10' as beam 434.

As depicted in FIG. 32, the incident beams and the diffracted beams make an angle of about 60 degrees with respect to the normal to the surface of grating elements 10 and 10', corresponding to grating elements 10 and 10' of device 430 having a $\lambda/D$ value of about 1.73 and operating at the Littrow diffraction condition. If it is assumed that grating elements 10 and 10' of device 430 have a grating aspect ratio in the range of 1.3 to 2.0, then according to the data shown in FIG. 4, these grating elements diffract greater than 90 percent of S polarized light and transmit greater than 95 percent P polarized light.

The incident S polarized beam 436 is diffracted from grating element 10 as S polarized beam 438. Diffracted beam 438 is incident on mirror element 122 which retroreflects beam 438 back to grating element 10. The transmitted P polarized beam 434 from polarizing beam splitter element 432 propagates through halfwave retardation plate 372 before being incident on grating element 10'. Halfwave plate 372 converts the P polarized beam 434 from polarizing beam splitter element 432 to the S polarized beam that is incident on grating element 10'. The diffracted S polarized beam 435 from grating element 10' is incident on mirror element 122' which retroreflects beam 435 back to grating element 10'. Since grating elements 10 and 10' function in a reversible manner, greater than 90 percent of the S polarized retroreflected beams 438 and 435 are, respectively, diffracted by grating elements 10 and 10'. The retroreflected diffracted S polarized beam from grating element 10 propagates along the incident beam path 436. Since polarizing beam splitter element 432 functions in a reversible manner, it reflects essentially 100 percent of the retroreflected diffracted S polarized beam from grating element 10 along the incident beam path 84 as the S polarized component of the retrodiffracted beam 134. The retroreflected diffracted S polarized beam from grating element 10' propagates along the incident beam path 434 and propagates through the halfwave plate 372 which converts this S polarized beam to a P polarized beam. This P polarized beam is incident on polarizing beam splitter element 432, which transmits essentially 100 percent of beam along the incident beam path 84 as the P polarized component of the retrodiffracted beam 134.

The dual pass grating mirror components in device 430, consisting of grating element 10 plus mirror element 122 and grating element 10' plus mirror element 122', function as described for the dual pass grating device 130 in FIG. 7. As was the case for the dual pass grating mirror arrangement in FIG. 7, the dual pass grating mirror arrangements in device 430 essentially double the wavelength dispersion power of the grating elements 10 and 10' used in device 430. When grating elements 10 and 10' have essentially the same diffraction efficiency properties, device 430 achieves essentially equal diffraction values for S and P polarization components and thereby achieves a PDL value of equal to or less than 0.2 dB.

Based on the diffraction efficiency data presented in FIG. 4, if one uses grating elements 10 and 10' that have essentially equal diffraction efficiency properties, one should achieve better PDL performance with device 430 of FIG. 32 versus device 420 of FIG. 31, for devices incorporating grating elements having a λ/D value in the range of about 1.4 to 1.45 or in the range of about 1.60 to 1.9. As shown by the data in FIG. 4, grating elements having a λ/D value in these ranges have diffraction efficiency values for P polarized light that ranges from about 3 percent to about 25 percent. This level of diffraction efficiency for the P polarization component reduces the intensity of P polarized component of the retrodiffracted beam 134 in device 420 versus the intensity of S polarized component of retrodiffracted beam 134 in device 420. Device 430 avoids this problem by using polarization beam splitter element 432 to separate and recombine the S and P polarized components of the incident and retrodiffracted beams.

Figure 33:
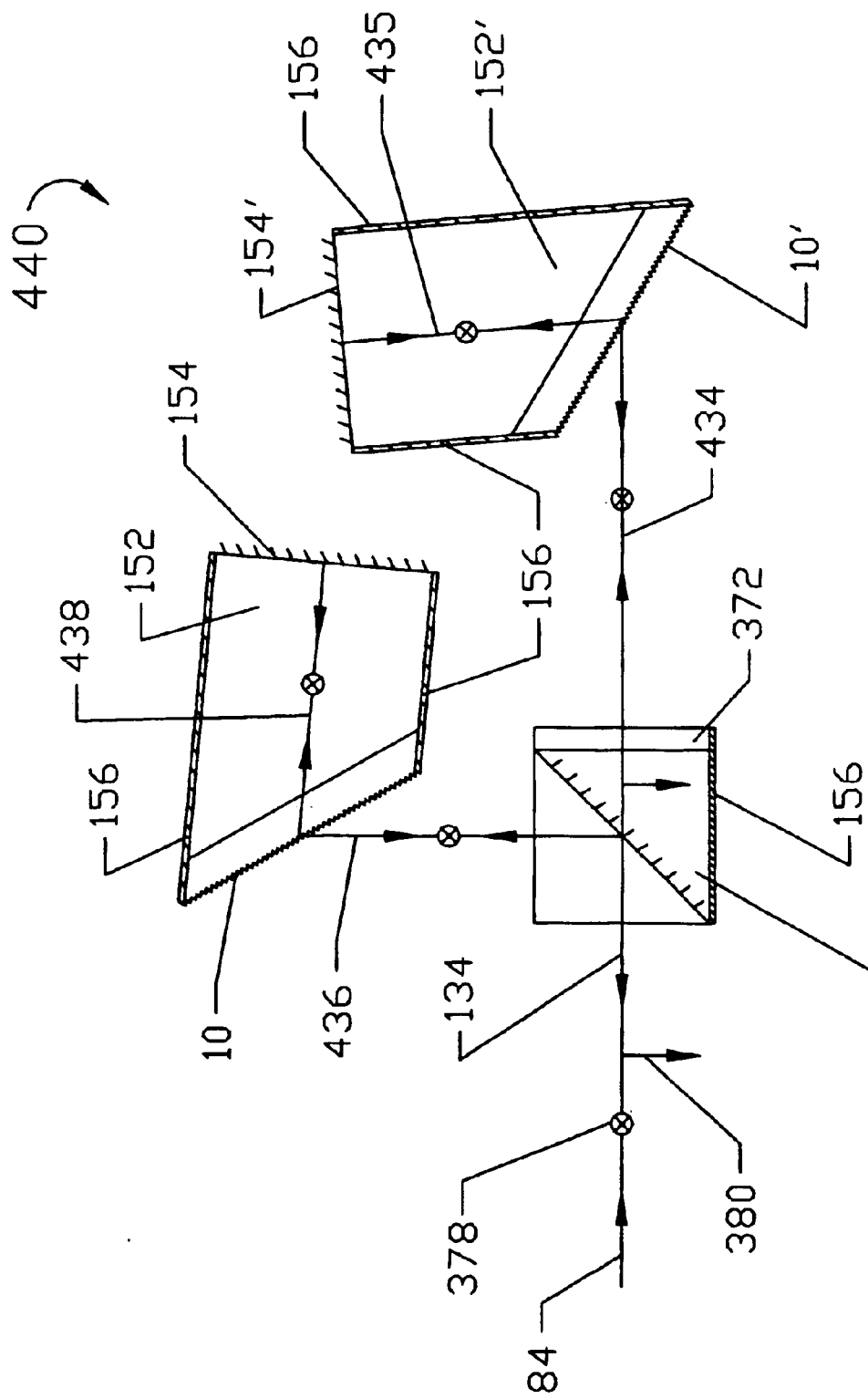

A schematic side view is illustrated in FIG. 33 of an optical arrangement that functions essentially as described for device 430 of FIG. 32. As was the case for device 430, the optical arrangement in device 440 of FIG. 33 enables this device to achieve essentially equal radiometric throughput efficiency values for S and P optical polarization components while using surface-relief transmission grating elements having a λ/D value of about 1.40 to about 1.90. The differences between devices 430 and 440 include the following: the polarization beam splitter element used to separate and recombine the S and P polarized components of the incident and retrodiffracted beams is plate element 432 in device 430 and is cube element 442 in device 440. The halfwave plate 372 in device 430 is a separate element, whereas in device 440 the halfwave plate 372 is optically cemented to the P polarization transmitting surface of the polarization beam splitter element 442. The dual pass grating mirror elements consisting of separate grating and mirror elements in device 430 are replaced in device 440 by integrated elements similar to the dual pass grating mirror device 150 illustrated in FIG. 8. The numbering of the elements comprising the integrated dual pass grating mirror component in device 440 is the same as used in device 150 of FIG. 8, and these integrated components function as described for the device 150 component. Except for the stated differences, devices 430 and 440 function exactly the same.

Figure 34:
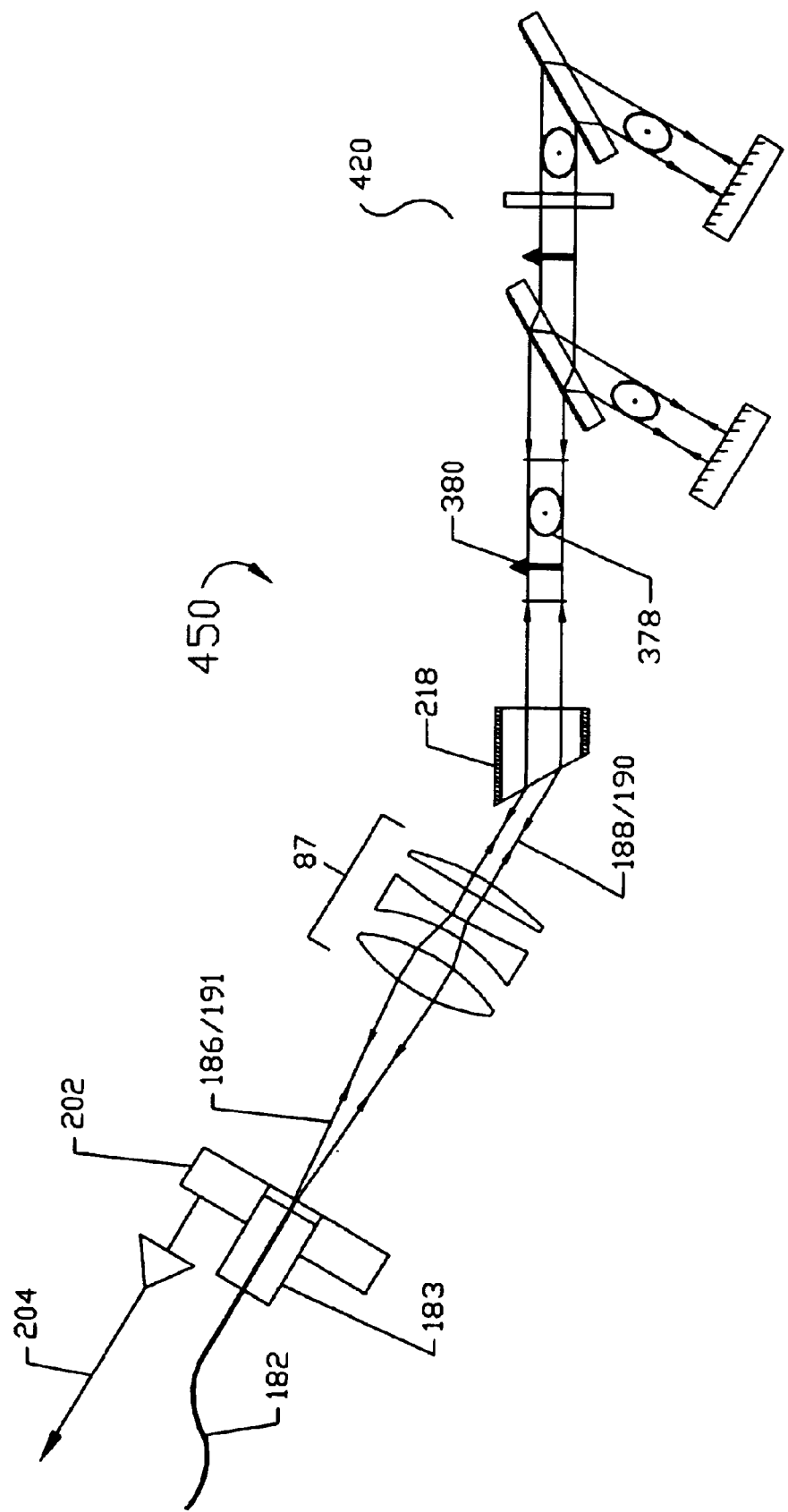
FIGS. 34 and 35 are schematics of a monitor device utilizing the transmission grating assembly of FIGS. 30–33.
Figure 35:
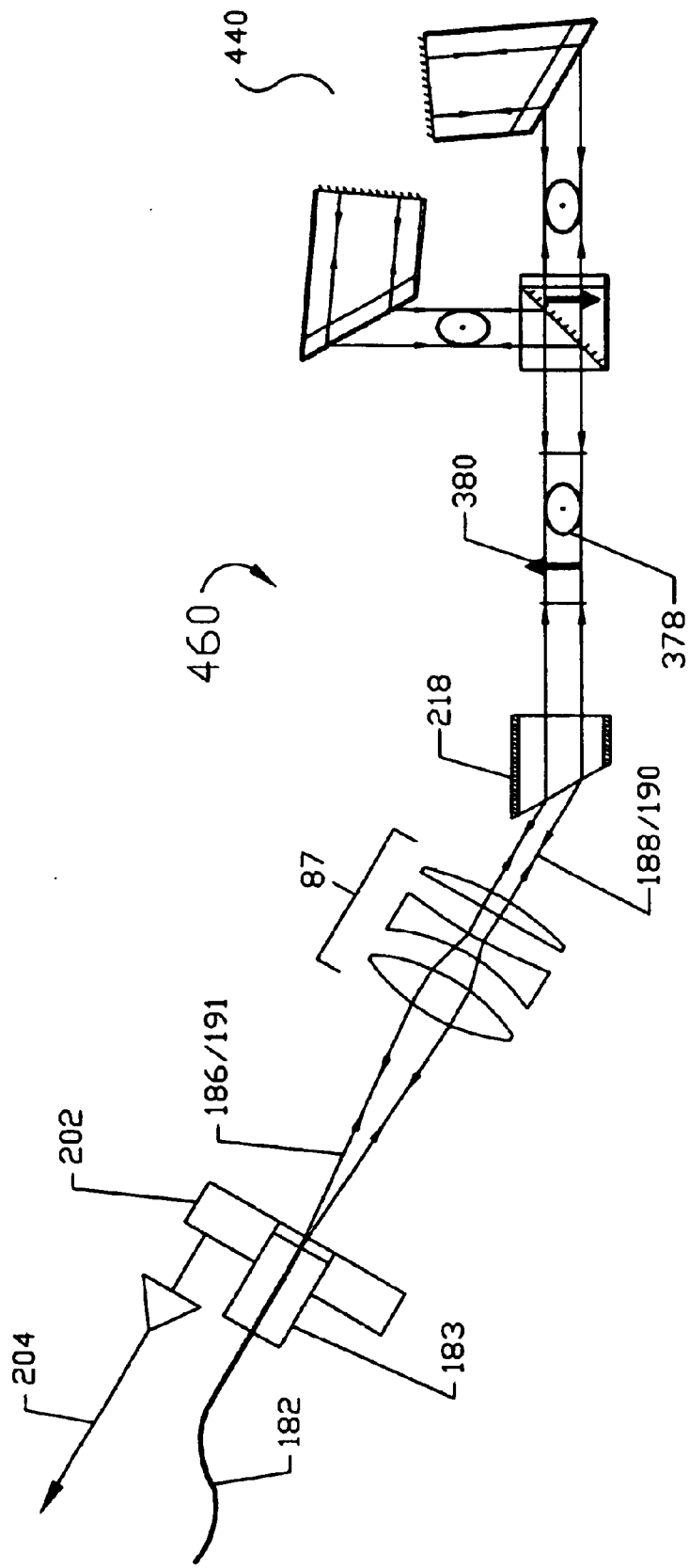

FIGS. 34 and 35 schematically illustrate how grating-based components 420 and 440 of FIGS. 31 and 33, respectively, can be incorporated into spectrophotometer based OCM devices 450 and 460 used in a fiber-optic WDM system. Devices 450 and 460 function as described for the OCM device 200 in FIGS. 11A, 11B, and 11C. Devices 450 and 460 differ from device 200 in that they incorporate grating-based components 420 and 440, respectively, in place of the grating-based component 150 used in device 200 and they incorporate the beam expanding and linearizing prism element 218. As described for device 210 of FIG. 12, the beam expanding and linearizing prism element 218 increases the wavelength dispersion power of devices 450 and 460 by the E magnification factor for this prism element and improves the linearity of the spacing of the spatially separated focused wavelength channel signal beams at the photodetector array element 202 in devices 450 and 460.

The polarization controlling grating-based embodiments illustrated in FIG. 27 to FIG. 35 achieved good PDL performance by separating the S and P polarization components of the incident beam and, therefore, required precision alignment between the separated retodifftracted polarization beam paths. The polarization controlling grating-based embodiments illustrated in FIG. 36 to FIG. 52 of this specification due not physically separate the polarization components of the beam and, therefore, do not required either precision alignment between the separated retodiffracted polarization beam paths or separate grating elements to diffract the separated polarization components. Unlike the polarization controlling grating-based embodiments illustrated in FIG. 27 to FIG. 35 of this specification, which can achieve good PDL performance and very high wavelength dispersion power by utilizing grating elements having λ/D values of between about 1.4 to about 1.9, the polarization controlling grating-based embodiments illustrated in FIGS. 36 to FIG. 52 of this specification achieve good PDL performance and acceptable diffraction efficiency performance when limit to use with grating elements having λ/D values of about 0.8 to about 1.35.

Figure 36:
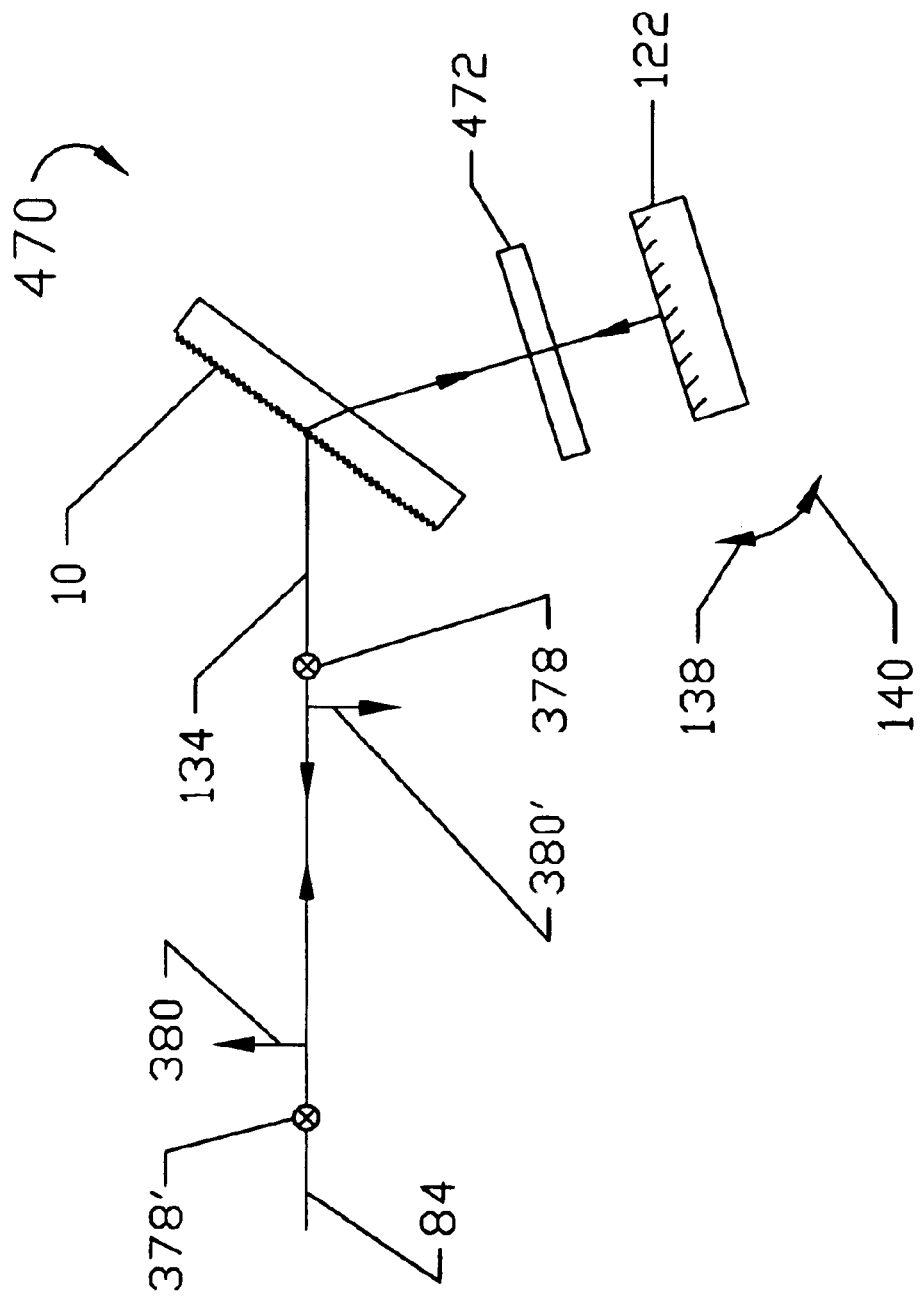
FIGS. 36, 37, 38A, 38B, 39, and 40 are schematics of other dual pass grating-based wavelength section unit utilizing the transmission grating element of FIG. 1.

FIG. 36 schematically illustrates a dual pass grating mirror arrangement that is essentially the same as the dual pass grating mirror arrangement illustrated in FIG. 7 with the exception that the FIG. 36 arrangement incorporates a quarterwave (λ/4) retardation plate 472 positioned between the grating element 10 and the mirror element 122. With regard to wavelength dispersion power, device 470 of FIG. 36 functions exactly the same as described for device 130 of FIG. 7, in that the mirror element 122 retroreflects the diffracted beam from grating element 10 back to grating element 10 were it is rediffracted, thereby essentially doubling the wavelength dispersion power of grating element 10 and the device incorporating grating element 10.

As depicted in FIG. 36, single wavelength incident beam 84 to device 470 is composed of both S and P polarized optical components where the S' component 378' is depicted as a circle with a x through its center while the P component 380 is depicted as a short arrow. As also depicted in FIG. 36, the retrodiffracted beam 134 exiting device 470 is composed of both S and P polarized optical components where the S component 378 is depicted as a circle with a x through its center while the P' component 380' is depicted as a short arrow. Only the S and P polarized components of the beam incident to or exiting device 470 are labeled with their respective numbers. The polarization direction convention used in FIG. 36 is the same as used in FIG. 28.

As depicted in FIG. 36, the dual pass transmission grating device illustrated in this figure not only functions like a reflection grating element operating at the Littrow condition (in that it retrodiffracts the incident beam back on itself), but it also converts the S' incident beam polarization component 378' into the P' retrodiffracted beam polarization component 380' and converts the P incident beam polarization 380 component into the S retrodiffracted beam polarization component 378. This conversion of the polarization states from S' to P' and P to S is performed by the quarterwave plate element 472 in FIG. 36. The quarterwave plate element 472 in FIG. 36 is angularly orientated so that its fast and slow optical axes are aligned at 45 degrees to the incident beam S' and P optical polarization directions. For this quarterwave plate orientation, the incident S' and P polarization components are converted to the corresponding P' and S polarization components because the optical beam propagates twice through quarterwave plate 472 as a result of the dual pass operation of device 470 and, thereby causes quarterwave plate 472 to function like a halfwave (λ/2) retardation plate. Conversion of optical polarization states by use of quarterwave retardation plates is well known to those skilled in the art and are disclosed, e.g., in U.S. Pat. Nos. 5,481,384 and 5,223,956, and the like. The entire disclosure of each of these United States Patents is hereby incorporated by reference into this specification.

Conversion of the optical beam polarization states by quarterwave plate 472 in device 470 of FIG. 36 enables the PDL value of the transmission grating element 10 used in that device to theoretically be completely compensated for so that device 470 has a PDL value of zero. To illustrate how this polarization conversion compensates for the PDL value of grating element 10 used in device 470, we will use Equation (1) to calculate the PDL value for device 470 using the following hypothetical example. For this hypothetical example it will be assumed that the beam incident 84 on device 470 has an intensity that is composed of 1 part each of S' and P polarization components and that the grating element 10 used in device 470 has a 90 percent diffraction efficiency for S polarized light and a 80 percent diffraction efficiency for P polarized light. For single pass operation this hypothetical grating element 10 has a PDL value of −0.51 dB. When this hypothetical grating element 10 is incorporated into device 470, the device theoretically has a PDL value of 0 dB based on the following calculations: When incident beam 84 is diffracted by grating element 10 it generates a diffracted beam composed of 0.90 and 0.80 parts, respectively, of S' and P polarization components. This diffracted beam propagates through quarterwave plate 472 to mirror element 122 that retro-reflects the beam back along the incident beam path through quarterwave plate 472 to grating element 10. As a result of propagating twice through quarterwave plate 472 the retro-reflected beam incident on grating element 10 is composed of 0.90 and 0.80 parts, respectively, of P' and S polarization components. After grating element 10 rediffracts the retro-reflected beam, it generates retro-diffracted beam 134 that propagates back along the incident beam path. This retro-diffracted beam 134 is composed of 0.72 and 0.72 parts, respectively, of P' and S polarization components, which corresponds to a PDL value of 0 dB for the dual pass grating device 470.

An experiment was conducted to determine how well the optical device configuration 470 of FIG. 36 really compensates for the PDL value of the grating element 10 used in this device. For this experiment I used a transmission sinusoidal surface-relief grating element 10 fabricated with photoresist that had a λ/D ratio of about 1.3 for a wavelength of 1550 nm. The PDL value of this grating element 10 was first measured for an element used in single pass operation using an incident beam angle close to the Littrow diffraction condition, similar to the operating condition illustrated in FIG. 5. For single pass operation this transmission grating element 10 had a PDL value of between about 5.14 dB to about 6.32 dB when used over the C plus L Band wavelength range of 1525 nm to 1620 nm. This transmission grating element 10 was first incorporated into an experimental dual pass transmission grating device arrangement, similar to device 130 of FIG. 7, that consisted of grating element 10 and a mirror element 122 positioned behind grating element 10 that retroreflected the diffracted beam from grating element 10 back to grating element 10. This first experimental dual pass transmission grating device did not incorporate a quarterwave plate and, therefore, as expected it had a PDL value essentially double the single pass value of the grating element used in it. This first experimental dual pass transmission grating device had a PDL value of between about 10.26 dB to about 13.21 dB when used over the C plus L Band wavelength range of 1525 nm to 1620 nm.

This first experimental dual pass transmission grating device was modified by positioning a quarterwave plate in the air gap between the grating element 10 and the mirror element 122 so that this modified experimental dual pass transmission grating device had an arrangement similar to device 470 of FIG. 36. This quarterwave plate was angularly orientated so that its fast and ilk slow optical axes were aligned at 45 degrees to the incident optical beam S and P polarization directions. Two types of quarterwave plates were used to construct the second experimental embodiment of the dual pass transmission grating device. One was a commercially available optical cemented zeroth-order quarterwave plate, and the other was a commercially available multi-order quartz quarterwave plate. Both of these quarterwave plates were designed to have a center wavelength value of about 1550 nm.

When the zeroth-order quarterwave plate was used to construct the second experimental embodiment of the dual pass transmission grating device, this device had a maximum PDL value of about 0.24 dB when operated over the C plus L Band wavelength range of 1525 nm to 1620 nm. When the multi-order quarterwave plate was used to construct the second experimental embodiment of the dual pass transmission grating device, this device had a maximum PDL value of about 2.3 dB when operated only over the C Band wavelength range of 1525 nm to 1565 nm. It is evident from these experimental results that incorporation of either a zeroth-order or a multi-order quarterwave plate into the dual pass transmission grating device significantly improves the PDL performance of this device. It is also evident from these experimental results that that significantly better PDL performance is achieved by using a zeroth-order quarterwave plate verses using a multi-order quarterwave plate. It is estimated that the measurement error associated with measuring the PDL performance of the second experimental embodiments of the dual pass transmission grating device was in the range of ±0.05 dB and, therefore, the embodiment incorporating the zeroth plate may have achieved the goal of having a PDL value of less than 0.2 dB.

All quarterwave and halfwave retardation plates only achieve their stated retardation value at the design center wavelength value of the plate and have a retardation deviation error that increases at some functional rate as the wavelength shifts from the design center wavelength value. The difference between a multi-order retardation plate, a zeroth-order retardation plate, and an achromatic design retardation plate is not only the method used to fabricate the retardation plate but the functional rate at which the retardation deviation error increases as the wavelength shifts from the design center wavelength value. This functional rate increase in retardation deviation error is significantly faster for a multi-order retardation plate than a corresponding zeroth-order retardation plate, and this rate increase is higher in a zeroth-order plate than a corresponding achromatic designed retardation plate. Therefore, a multi-order retardation plate does not provide optimum performance with regard to building the grating-based devices illustrated in FIGS. 27A, 27B, 28, 31, 32, 33 and 36 when these devices are designed to function over either the C Band, L Band or combined C and L Band wavelength range. A zeroth-order retardation plate as shown by the experimental results provides significantly better performance with regard to building grating-based devices designed to function over either the C or L Band wavelength range while an achromatic designed retardation plate would provide even better performance than a zeroth-order quarterwave plate with regard to building grating devices designed to function over the combined C and L Band wavelength range.

Referring again to FIG. 36, one can as described for device 130 of FIG. 7 change the wavelength of the beam 134 retrodiffracted back on itself, and thus change the wavelength tuning parameters of device 470, by rotating the mirror element 122 in the direction of arrow 138 and/or arrow 140 by conventional means. One can use this wavelength tuning method to construct an OCM device that utilizes a single PIN InGaAs photodetector element in place of an InGaAs photodetector array and thereby significantly reduce the cost of the device. One can rotate the mirror element in FIG. 36 by known means, such as a piezoelectric activated mirror element, a silicon micromirror (MEMs) based mirror element, or a flexure based rotating mirror element.

One of the advantages of rotating mirror element 122 positioned behind transmission grating element 10, as illustrated in FIGS. 7 and 36, versus performing the wavelength selection function by rotating a mirror element positioned before element 10, is that a mirror element positioned behind grating element 10 only has to rotate through half of the angular sweep that a mirror element positioned before grating element 10 must perform to achieve the same wavelength tuning range. Reducing the mirror element rotation angle by half facilitates the use of a piezoelectric activated mirror element, a MEMs mirror element, or a flexure based mirror element for this wavelength selection application. Any moving mirror element chosen for this application should have a relatively low cost and be able to perform millions of rotation cycles without failing.

Figure 37:
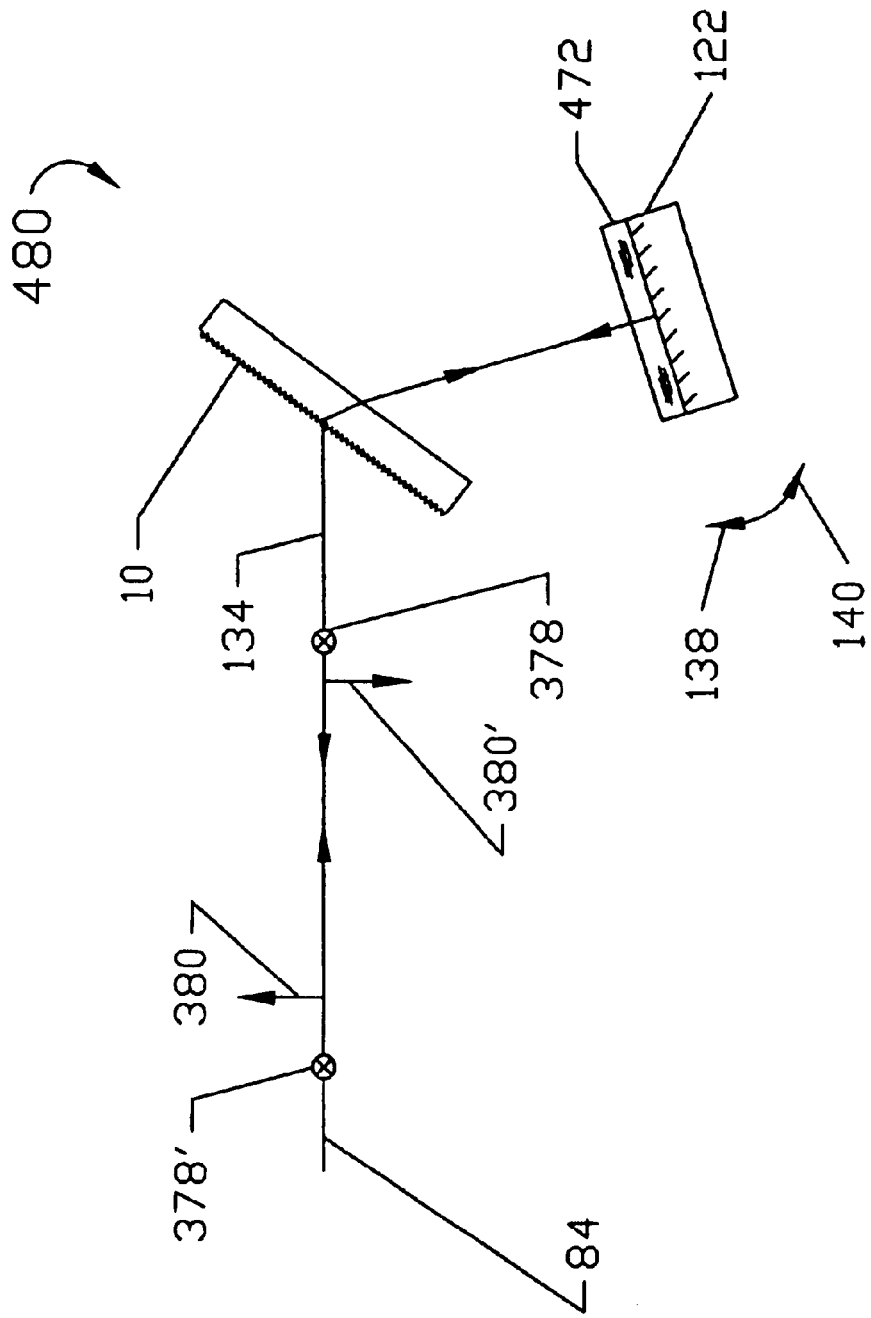

Schematically illustrated in FIG. 37 is dual pass grating device 480 that has essentially the same optical arrangement and operating properties as described for device 470 of FIG. 36 with the exception that quarterwave plate element 472 is mechanically attached to mirror element 122 in device 480. Attaching quarterwave plate element 472 to mirror element 122 improves the performance of device 480 when rotation of mirror 122 in the direction of arrow 138 and/or arrow 140 is used to tune the wavelength of retrodiffracted beam 134. The retardation value of quarterwave plate 472 changes as a function of the beam propagation angle through the plate. Having quarterwave plate 472 be mechanically attached to mirror element 122 insures that the beam incident to and reflected from mirror 122 has the same the propagation angle through quarterwave plate 472 as mirror element 122 is rotated to select the wavelength of retrodiffracted beam 134. Under these conditions, quarterwave plate 472 has a more constant retardation value as the wavelength of retrodiffracted beam 134 is changed.

Figure 38A:
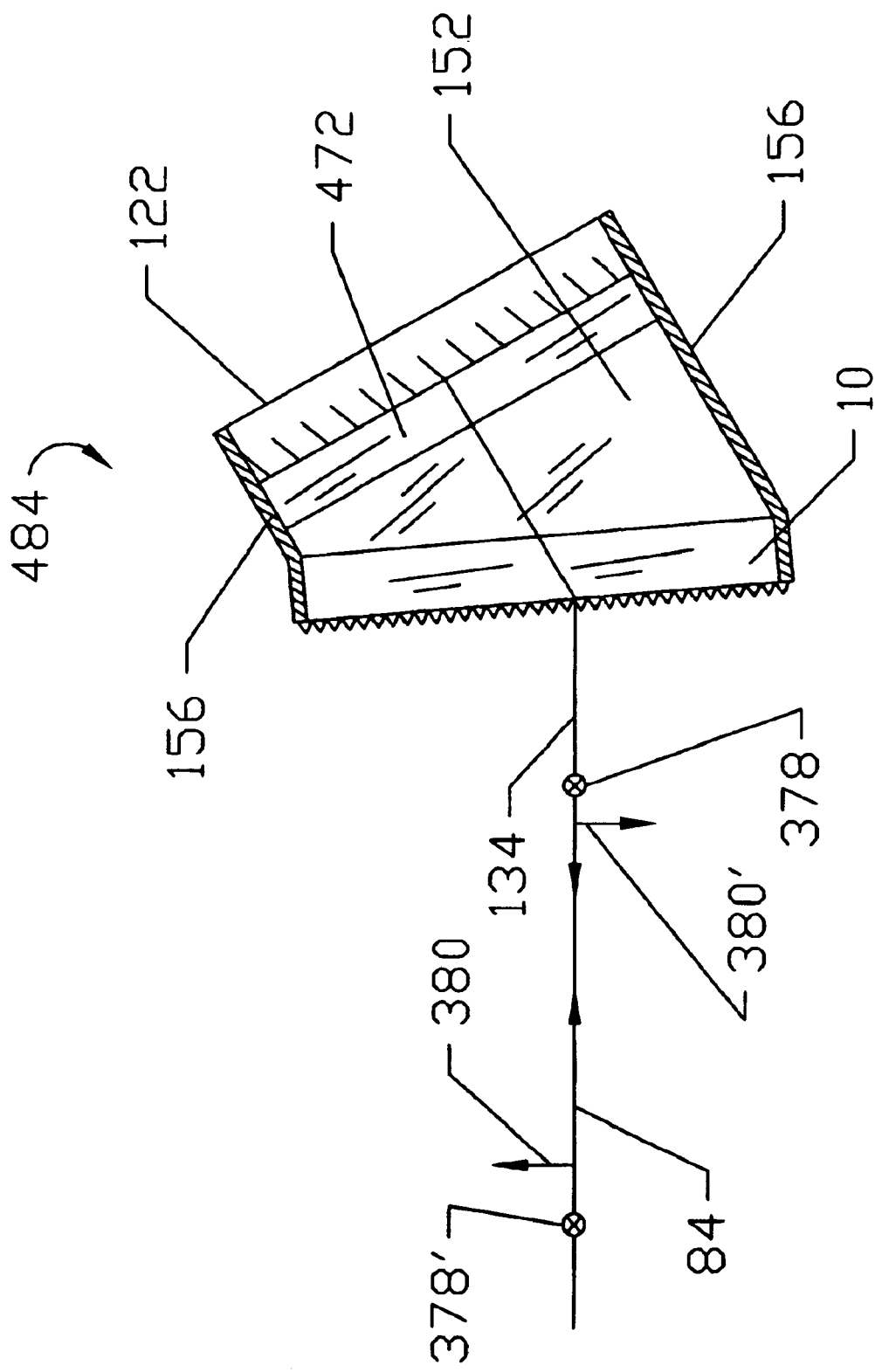

The dual pass transmission grating arrangements in FIGS. 36 and 37 are accomplished by using separately a grating element 10, a quarterwave plate 472 and a mirror element 122. By comparison, and as illustrated in FIG. 38A, a dual pass transmission grating device incorporating quarterwave plate 472 can be fabricated as an integral structure, similar to dual pass grating device 150 of FIG. 8. As illustrated in FIG. 38A, the integrated dual pass transmission grating device 484 is composed of the following optical elements: transmission grating element 10, non-parallel sided glass block element 152, quarterwave plate 472, and mirror element 122. The optical elements comprising integrated device 484 are optically cemented together to form a monolithic optical element. As part of the cementing process, the optical elements comprising integrated device 484 are aligned relative to each other such that the optical beam propagating through the device follows a predetermined path. As depicted in FIG. 38A, the non-optical transmitting and reflecting surfaces of the optical elements comprising integrated device 484 have been coated with an optical absorption coating 156 that is designed to absorb the non-diffracted zeroth order beam energy and other scattered light which may occur within device 484.

The integrated device 484 of FIG. 38A functions as described for the device 470 in FIG. 36. As depicted in FIG. 38A, a single wavelength beam 84 is incident on the integrated device 484 at the Littrow diffraction condition for the dual pass arrangement depicted in device 484 and is retrodiffracted back along the incident beam path 84 as beam 134. As depicted in FIG. 38A, integrated device 184 converts the S' incident beam polarization component 378' into the P' retrodiffracted beam polarization component 380' and converts the P incident beam polarization component 380 into the S retrodiffracted beam polarization component 378. This conversion of the polarization states from S' to P' and P to S is performed by quarterwave plate 472 in device 484. Conversion of the optical beam polarization states by quarterwave plate 472 in device 484 enables the PDL value of the transmission grating element 10 used in that device to theoretically be completely compensated for so that device 484 has a PDL value of zero.

Figure 38B:
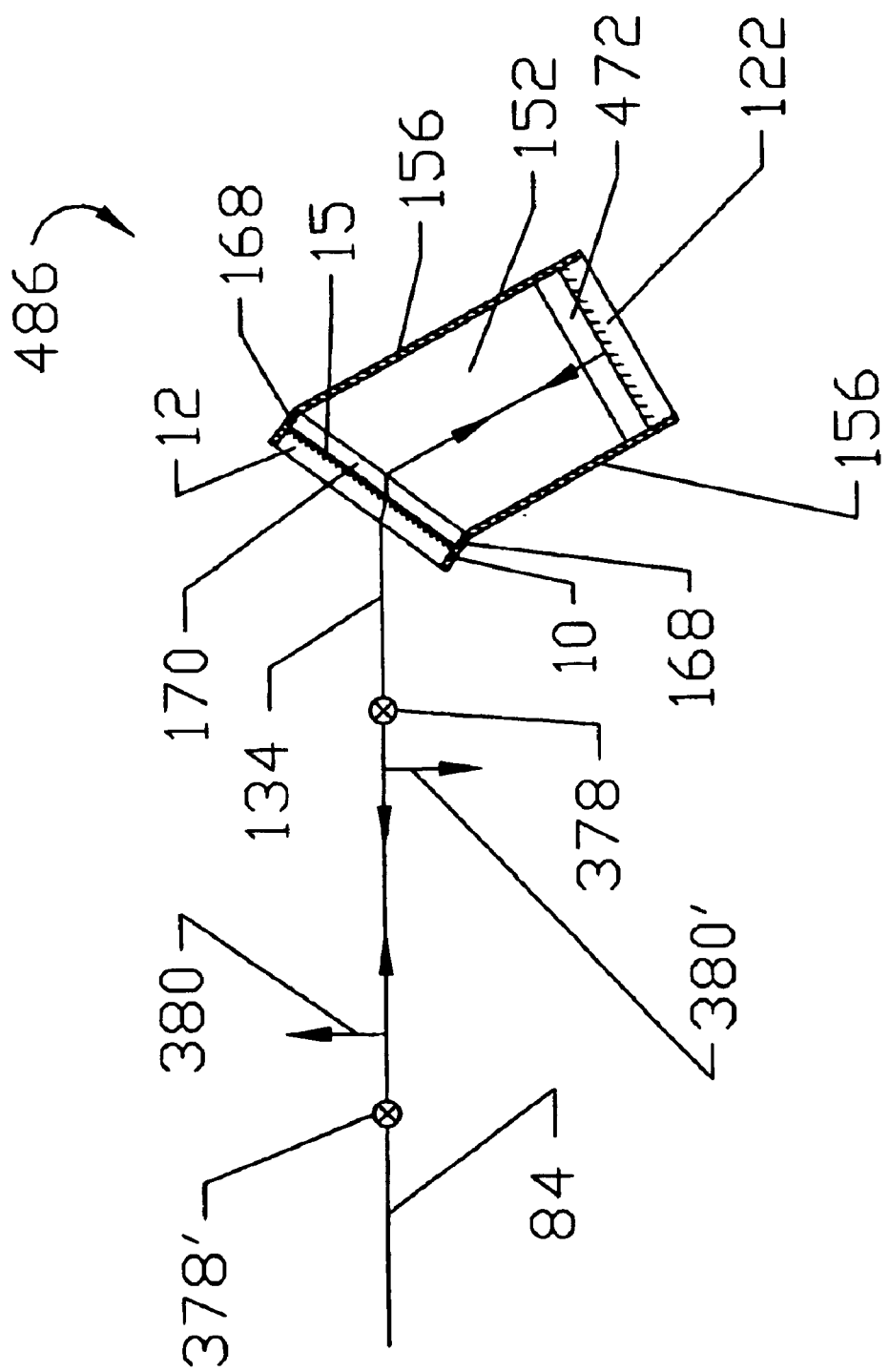

FIG. 38B schematically illustrates how the dual pass integrated device 484 of FIG. 38A can be fabricated using a structural configuration similar to the dual pass grating device 160 of FIG. 9. Dual pass integrated device 486 of FIG. 38B is composed of the following optical elements: transmission grating element 10, non-parallel sided glass block element 152, quarterwave plate 472, and mirror element 122. As depicted in FIG. 38B, integrated device 486 is fabricated so that grating surface 15 of grating element 10 is encapsulated between the substrate 12 of grating element 10 and the input optical transmitting surface to the glass block element 152. A sealing element 168, such as epoxy, is used in device 486 to encapsulate the air gap layer 170 that exists between the surface-relief transmission grating surface 15 and the input optical transmitting surface of glass block element 152.

The main function of the sealing element 168 is to prevent contaminants, liquids or solvent vapors that could damage the grating surface from entering the air gap layer 170. The encapsulated grating surface configuration of device 486 also protects the grating surface from being damaged due to handling and cleaning of device 486. The input optical transmitting surfaces of both the grating substrate 12 and the glass block 152 are antireflection coated to minimize optical reflection losses at these surfaces. As depicted in FIG. 38B, the non-optical transmitting and reflecting surfaces of the optical elements comprising device 486 have been coated with an optical absorption coating 156 that is designed to absorb the nondiffracted zeroth order beam energy and other scattered light which may occur within device 486. It is evident that the glass block elements depicted in FIGS. 38A and 38B can be made longer or shorter than what is depicted in these figures.

The integrated device 486 of FIG. 38B functions as described for the device 470 in FIG. 36. As depicted in FIG. 38B, a single wavelength beam 84 is incident on the integrated device 486 at the Littrow diffraction condition for the dual pass arrangement depicted in device 486 and is retrodiffracted back along the incident beam path 84 as beam 134. As depicted in FIG. 388B, device 486 converts the S' incident beam polarization component 378' into the P' retrodiffracted beam polarization component 380' and converts the P incident beam polarization component 380 into the S retrodiffracted beam polarization component 378. This conversion of the polarization states from S' to P' and P to S is performed by quarterwave plate 472 in device 486. Conversion of the optical beam polarization states by quarterwave plate 472 in device 486 enables the PDL value of the transmission grating element 10 used in that device to theoretically be completely compensated for so that device 486 has a PDL value of zero.

Figure 39:
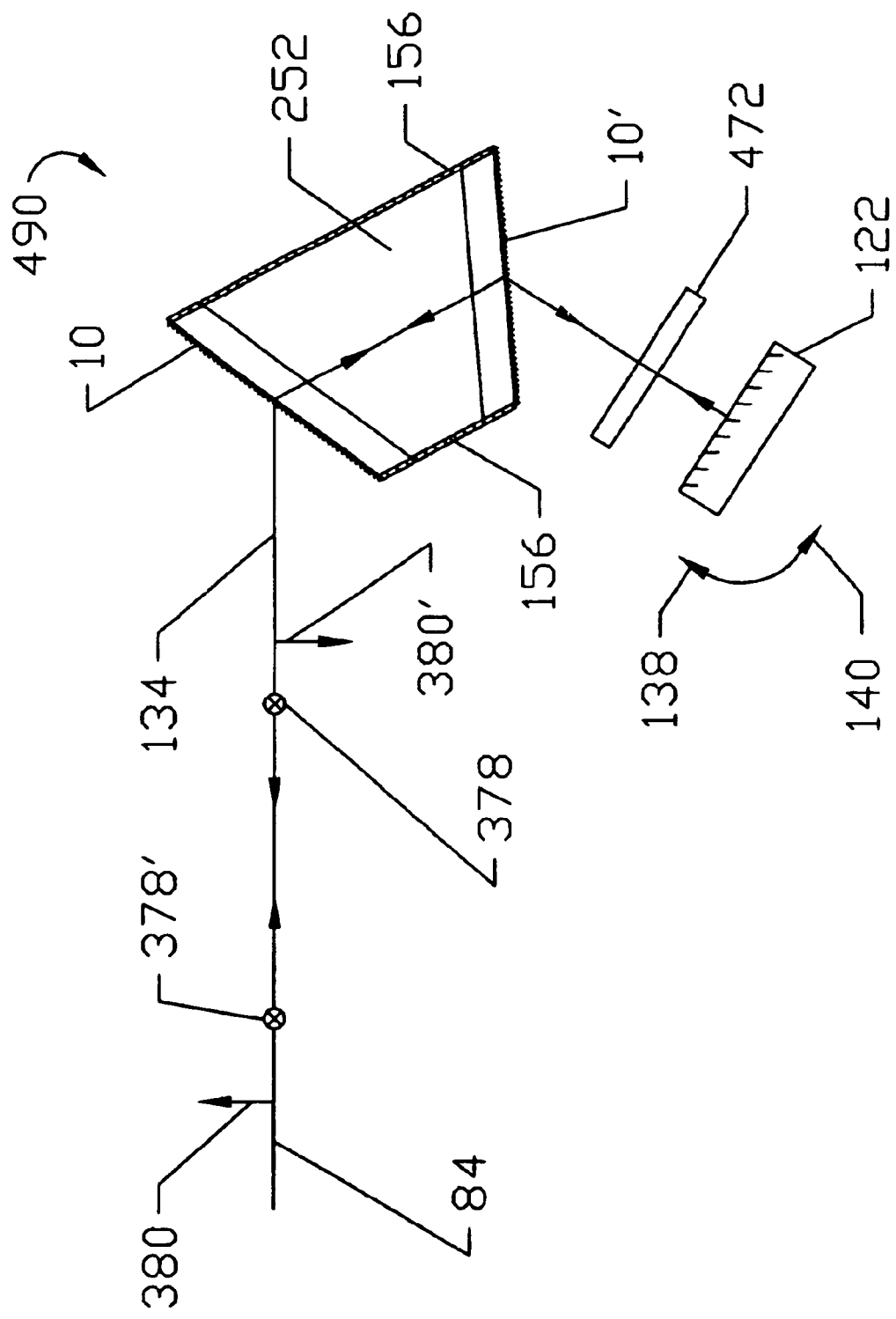

The dual pass, dual cascaded transmission grating device 490 schematically illustrated in FIG. 39 is similar to the dual pass, dual cascaded transmission grating device 280 of FIG. 21. Device 490 differs from device 280 in that it incorporates quarterwave plate 472 positioned between grating element 10' and mirror element 122 and, unlike device 280, the grating elements 10 and 10' of device 490 are optically cemented to the glass block element 252 without having an encapsulated air layer between grating elements 10 and 10' and the optical transmitting surfaces of glass block element 252. As depicted in FIG. 39, the non-optical transmitting surfaces of glass block element 152 have been coated with an optical absorption coating 156 that is designed to absorb the nondiffracted zeroth order beam energy and other scattered light that may occur within this glass block element. With regard to wavelength dispersion power, device 490 functions exactly the same as described for device 280, in that the wavelength dispersion power of device 490 is essentially double the sum of the wavelength dispersion power of grating elements 10 and 10' used the device as a result of the dual pass operation of the device.

As depicted in FIG. 39, a single wavelength beam 84 is incident on device 490 at the Littrow diffraction condition for the dual pass arrangement depicted in device 490 and is retrodiffracted back along the incident beam path 84 as beam 134. As depicted in FIG. 39, device 490 converts the S' incident beam polarization component 378' into the P' retrodiffracted beam polarization component 380' and converts the P incident beam polarization component 380 into the S retrodiffracted beam polarization component 378. This conversion of the polarization states from S' to P' and P to S is performed by quarterwave plate 472 in device 490. Conversion of the optical beam polarization states by quarterwave plate 472 in device 490 enables the PDL value of the transmission grating elements 10 and 10' used in that device to theoretically be completely compensated for so that device 490 has a PDL value of zero.

Referring again to FIG. 39, one can, as described for device 470 of FIG. 36, change the wavelength of the beam 134 retrodiffracted back on itself, and thus change the wavelength tuning parameters of device 490, by rotating the mirror element 122 in the direction of arrow 138 and/or arrow 140 by conventional means.

Figure 40:
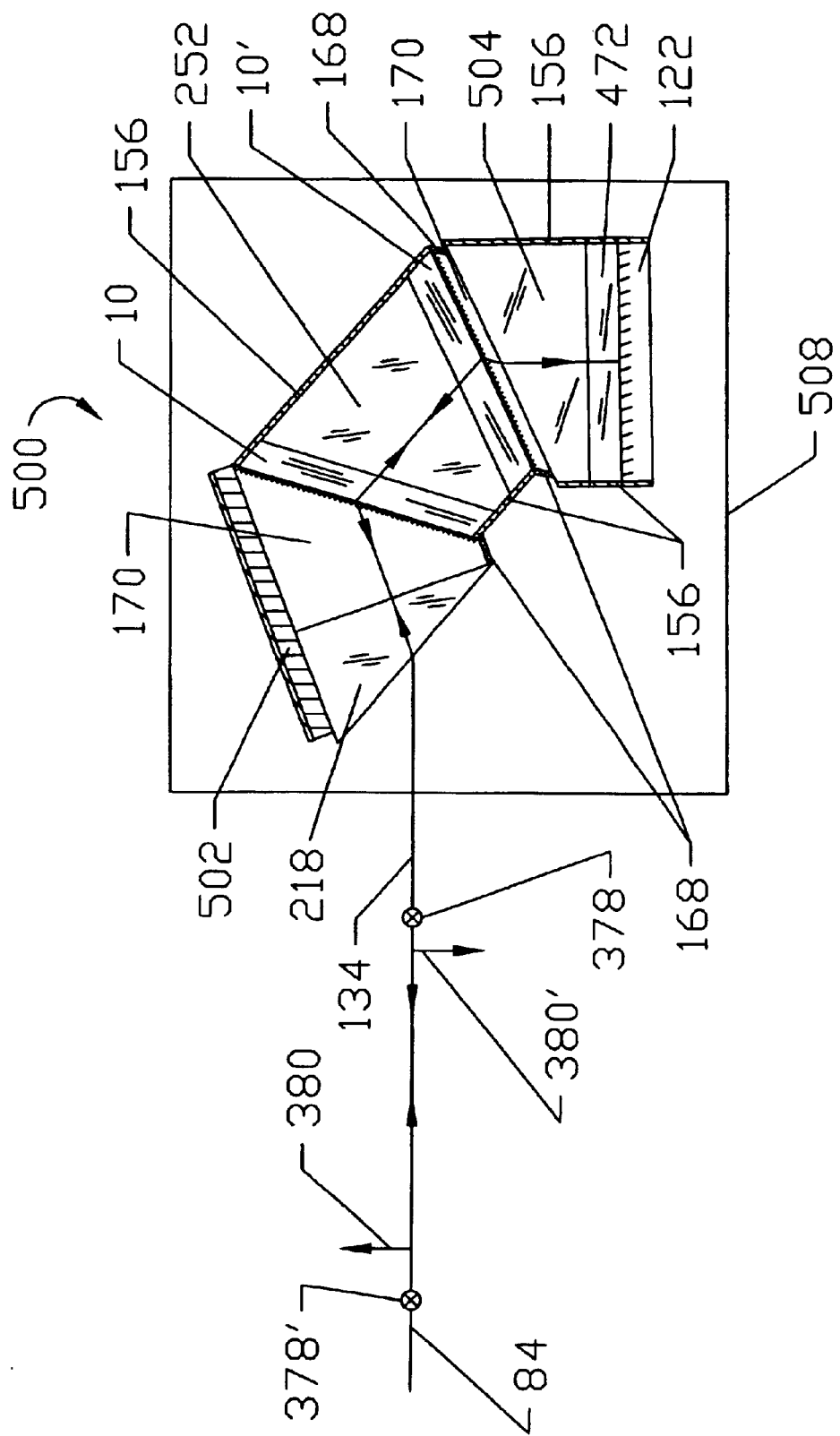

The dual pass, dual cascaded trans mission grating device 490 in FIG. 39 is accomplished by using separately a glass block element with attached grating elements 10 and 10', a quarterwave plate 472 and a mirror element 122. By comparison, and as illustrated in FIG. 40, a dual pass, dual cascaded transmission grating device incorporating quarterwave plate 472 can be fabricated as an integral structure. As illustrated in FIG. 40, the integrated dual pass, dual cascaded transmission grating device 500 is composed of th e following optical elements: beam expansion and linearizing prism element 218, transmission grating element 10, nonparallel sided glass block element 152, transmission grating element 10', non-parallel sided glass block element 504, quarterwave plate 472, and mirror element 122. The optical elements comprising integrated device 500 are mounted to the top surface of a rectangular glass mounting plate 508. An optical alignment beam is propagated through the optical elements comprising device 500 as part of the procedure for mounting these optical elements to glass plate 508. These optical elements are aligned relative to each other and plate 508 so that the alignment beam follows a predetermined path through the elements and with respect to both the top surface of plate 508 and with at least one of the side reference surfaces of plate 508. As depicted in FIG. 40, the non-optical transmitting and reflecting surfaces of the optical elements comprising integrated device 500 have been coated with an optical absorption coating 156 that is designed to absorb the nondiffracted zeroth order beam energy and other scattered light which may occur within device 500.

As depicted in FIG. 40, the air space 170 between prism element 218 and grating element 10, which is optically cemented to glass block 252, is enclosed by plate element 502 and sealing element 168. While not shown in FIG. 40, the air space between prism element 218 and grating element 10 can be completely encapsulated by attaching a plate element similar to plate element 502 to the top surfaces of prism 218 and glass block 252. As is also depicted in FIG. 40, the air space between glass block element 504 and grating element 10', which is optically cemented to glass block 252, is encapsulated using sealing element 168. The main reason for encapsulating the air spaces 170 of device 500 is to prevent contaminants, liquids or solvent vapors that could damage the grating surfaces of grating elements 10 and 10' from entering these air spaces. The encapsulated grating surface configuration of device 500 also protects the grating surface from being damaged due to handling and cleaning of the device. The optical surfaces of prism element 218 and the input optical surface of glass block 504 are antireflection coated to minimize optical reflection losses at these surfaces.

The integrated device 500 of FIG. 40 functions as described for the device 490 in FIG. 39 with the exception that the wavelength dispersion power of device 500 is increased by the beam expanding and linearizing prism element 218. As described for device 210 of FIG. 12, the beam expanding and linearizing prism element 218 increases the wavelength dispersion power of device 500 by the E magnification factor for this prism element and improves the linearity of the spacing of the spatially separated focused wavelength channel signal beams at the focal plane of a device that incorporates device 500 as a component.

As depicted in FIG. 40, a single wavelength beam 84 is incident on the integrated device 500 at the Littrow diffraction condition for the dual pass arrangement depicted in device 500 and is retrodiffracted back along the incident beam path 84 as beam 134. As depicted in FIG. 40, integrated device 500 converts the S' incident beam polarization component 378' into the P' retrodiffracted beam polarization component 380' and converts the P incident beam polarization component 380 into the S retrodiffracted beam polarization component 378. This conversion of the polarization states from S' to P' and P to S is performed by quarterwave plate 472 in device 500. Conversion of the optical beam polarization states by quarterwave plate 472 in device 500 enables the PDL value of both prism element 218 and of the transmission grating elements 10 and 10' used in that device to theoretically be completely compensated for so that device 500 has a PDL value of zero.

Figure 41:
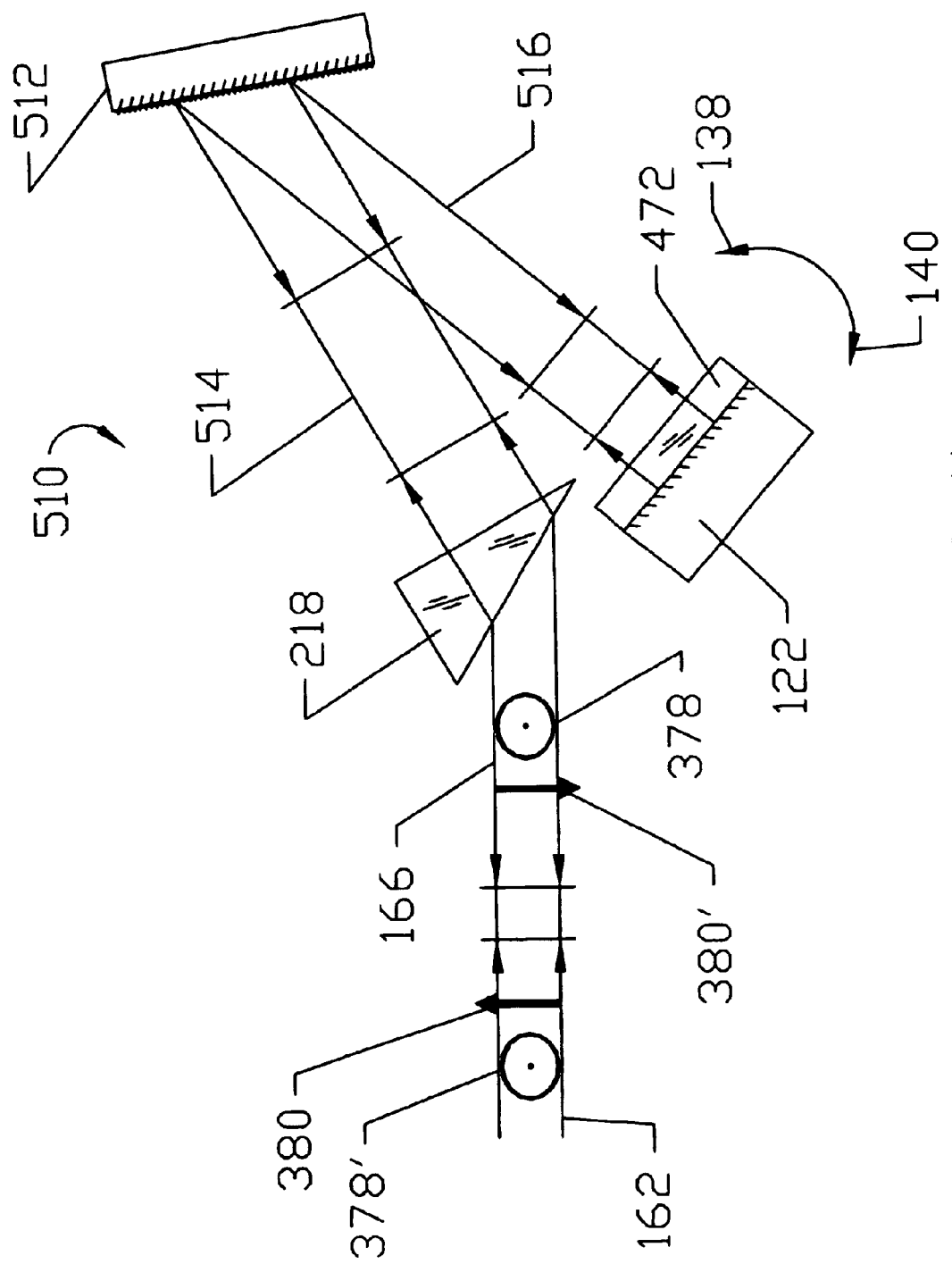
FIG. 41 is a schematic of a dual pass grating-based wavelength section unit utilizing a reflection grating element.

FIG. 41 schematically illustrates a dual pass reflection surface-relief grating-based device 510 that incorporates quarterwave plate 472 to improve the PDL performance of device 510. Device 510 is comprised of the following optical elements: beam expanding and linearizing in prism element 218, reflection surface-relief grating element 512, quarterwave plate 472, and mirror element 122. The operation of device 41 is similar to that described for devices 470 and 480 of FIGS. 36 and 37 with the exception that device 510 incorporates prism element 218 and reflection grating element 512 versus the transmission grating elements used in devices 470 and 480.

As depicted in FIG. 41, single wavelength incident collimated beam 162 to device 510 is composed of both S and P polarized optical components where the S' component 378' is depicted as a circle with a dot at its center while the P component 380 is depicted as a bold arrow. As also depicted in FIG. 41, the retrodiffracted beam 166 exiting device 510 is composed of both S and P polarized optical components where the S component 378 is depicted as a circle with a dot at its center while the P' component 380' is depicted as a bold arrow. Only the S and P polarized components of the beam incident to and exiting device 510 are labeled with their respective numbers. The polarization direction convention used in FIG. 41 is the same as used in FIG. 28.

As depicted in FIG. 41, collimated beam 162 is incident on device 510 at the Littrow diffraction condition for the dual pass arrangement depicted in device 510 and is retrodiffracted back along the incident beam path 162 as collimated beam 378. As depicted in FIG. 41, device 510 converts the S' incident beam polarization component 378' into the P' retrodiffracted beam polarization component 380' and converts the P incident beam polarization component 380 into the S retrodiffracted beam polarization component 378. This conversion of the polarization states from S' to P' and P to S is performed by quarterwave plate 472 in device 510. Conversion of the optical beam polarization states by quarterwave plate 472 in device 510 enables the PDL value of both prism element 218 and of the reflection grating element 512 used in that device to theoretically be completely compensated for so that device 510 has a PDL value of zero.

As illustrated in FIG. 41, beam 162 is incident on prism element 218, which refracts the beam and directs it to grating element 512 as beam 514. Beam 514 is diffracted by grating element 512 as beam 516 that propagates through quarterwave plate 472 to mirror element 122 that retroreflects beam 516 back on itself Retroreflected beam 516 propagates back through quarterwave plate 472 to grating element 512, where it is retrodiffracted back along beam path 514. Retrodiffracted beam 514 is refracted by prism element 218 and exits prism 218 as retrodiffracted beam 166. The wavelength dispersion power of grating element 512 in device 510 is essentially doubled due to the dual pass operation properties of device 510. As described for device 210 of FIG. 12, the beam expanding and linearizing prism element 218 increases the wavelength dispersion power of device 510 by the E magnification factor for this prism element and improves the linearity of the spacing of the spatially separated focused wavelength channel signal beams at the focal plane of a device that incorporates device 510 as a component.

As depicted in FIG. 41, quarterwave plate element 472 is mechanically attached to mirror element 122 in device 510. As described for device 480 of FIG. 37, attaching quarterwave plate element 472 to mirror element 122 improves the performance of device 510 when rotation of mirror 122 by known means in the direction of arrow 138 and/or arrow 140 is used to tune the wavelength of retrodiffracted beam 166.

Figure 42:
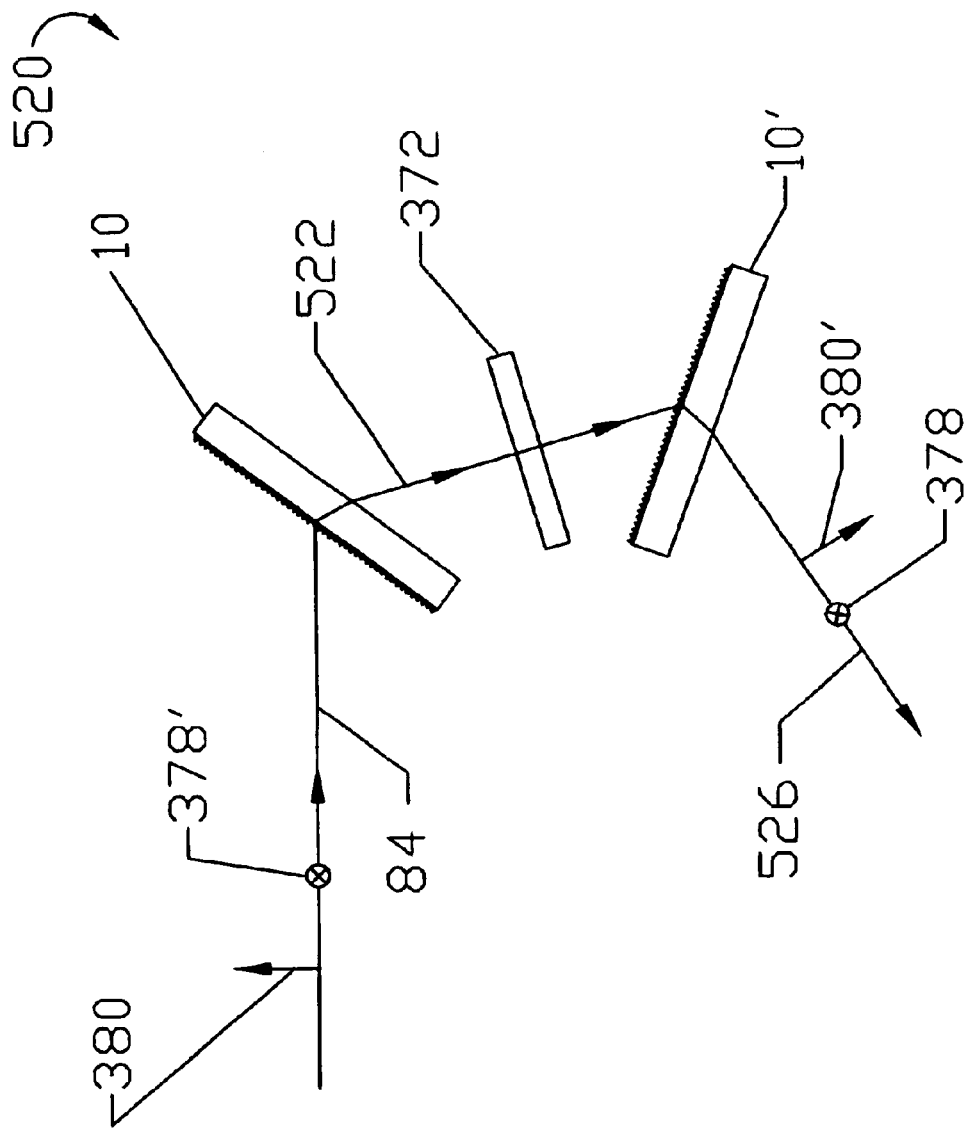
FIGS. 42 and 43 are schematics of single pass grating-based wavelength section unit in utilizing the transmission grating element of FIG. 1.

The single pass, dual cascaded transmission grating device 520 schematically illustrated in FIG. 42 is similar to the single pass, dual cascaded transmission grating device 250 of FIG. 18. Device 520 differs from device 250 in that it incorporates halfwave retardation plate 372 positioned between grating elements 10 and 10' and, unlike device 250, the grating elements 10 and 10' of device 520 are not incorporated as part of a glass block element but are individual elements spaced from the other elements of device 520. With regard to wavelength dispersion power, device 520 functions exactly the same as described for device 250, in that the wavelength dispersion power of device 520 is approximately equal to the sum of the wavelength dispersion powers of grating elements 10 and 10' incorporated in this device.

As depicted in FIG. 42, single wavelength incident beam 84 to device 470 is composed of both S and P polarized optical components where the S' component 378' is depicted as a circle with a x through its center while the P component 380 is depicted as a short arrow. As also depicted in FIG. 36, the diffracted beam 526 exiting device 520 is composed of both S and P polarized optical components where the S component 378 is depicted as a circle with a x through its center while the P' component 380' is depicted as a short arrow. Only the S and P polarized components of the beam incident to or exiting device 520 are labeled with their respective numbers. The polarization direction convention used in FIG. 42 is the same as used in FIG. 28.

As illustrated in FIG. 42, beam 84 is incident on grating element 10 and is diffracted as beam 522. Beam 522 propagates through halfwave plate 372 to grating element 10' where it is diffracted as beam 526. As depicted in FIG. 42, device 520 converts the S' incident beam polarization component 378' into the P' polarization component 380' of diffracted beam 526 and converts the P incident beam polarization component 380 into the S polarization component 378 of diffracted beam 526. This conversion of the polarization states from S' to P' and P to S is performed by halfwave plate 372 in device 520. Conversion of the optical beam polarization states by halfwave plate 372 in device 520 enables the PDL value of grating elements 10 and 10' used in that device to theoretically be completely compensated for when these grating elements have the same PDL performance properties, thereby enabling device 520 to have a PDL value of zero.

For the dual pass devices 470, 480, 484, 486, 490, 500, and 510 of FIGS. 36, 37, 38A, 38B, 39, 40 and 41, conversion of the polarization states from S' to P' and P to S by the quarterwave plates in these devices automatically enable these devices to achieve a PDL value of zero since the PDL values of the elements comprising these devices are compensated for by having the beam first propagate through these elements with the initial polarization state and than re-propagate through these elements with the converted polarization state. Conversion of the polarization states from S' to P' and P to S by the halfwave plates 372 in device 520 does not automatically enable this device to theoretically achieve a PDL value of zero since the PDL values of the elements comprising this device are not automatically compensated for since the beam only propagates once through these elements. Device 520 only theoretically achieves a PDL value of zero when grating elements 10 and 10' have the same PDL performance properties, thereby enabling the PDL value of grating element 10 to be compensated for by the PDL value of grating element 10'. If other optical components are incorporated into device 520, as illustrated in device 530 of FIG. 43, device 520 will only achieve a PDL value of zero if these optical elements have a PDL value of zero or the PDL value of these elements are compensated for by corresponding elements positioned in the beam path on the opposite side of the halfwave plate 372 in device 520.

Figure 43:
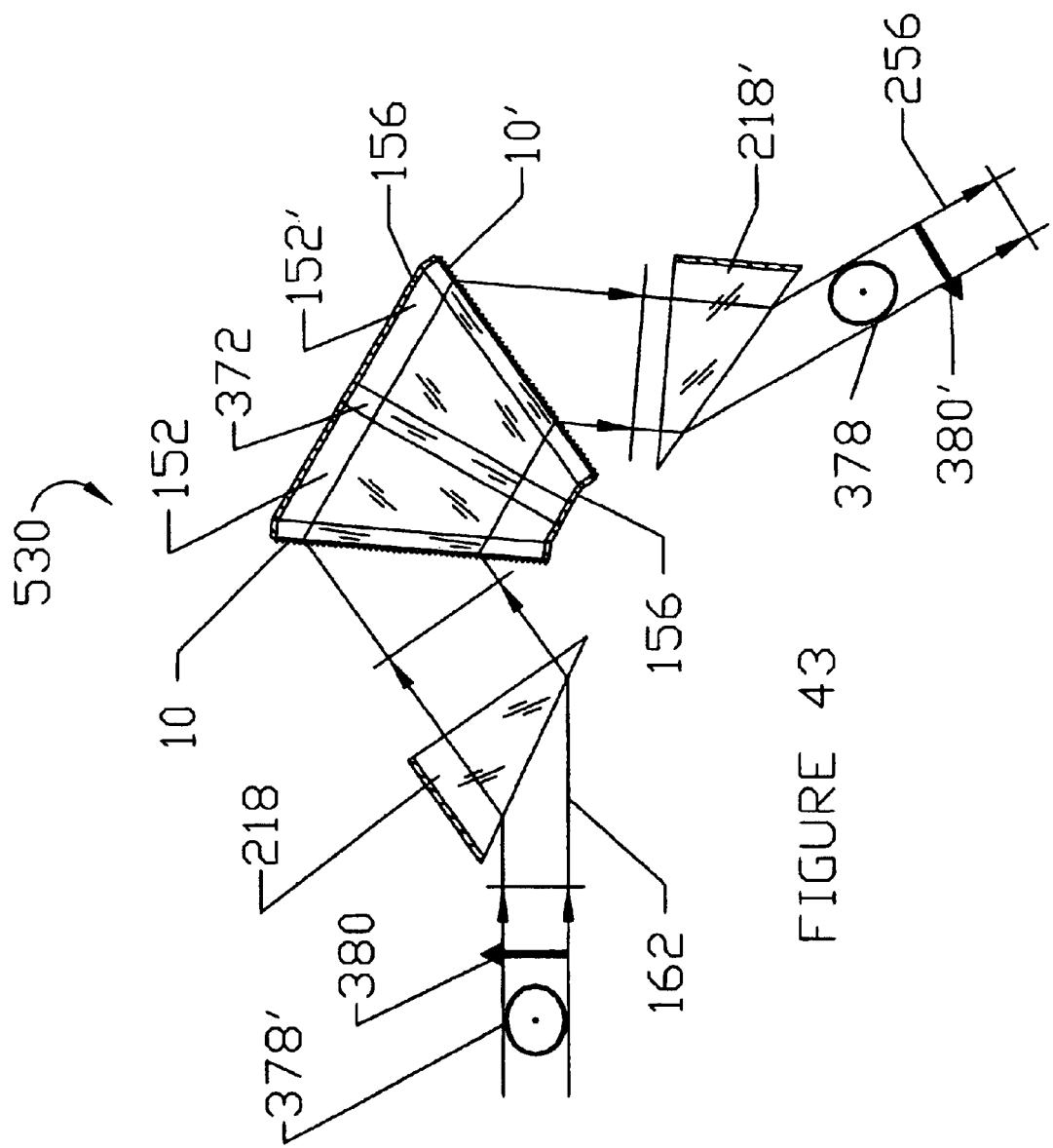

The single pass, dual cascaded transmission grating device 530 schematically illustrated in FIG. 43 is similar to device 520 of FIG. 42. Device 530 differs from device 520 in that it incorporates beam expanding and linearizing prism elements 218 and 218', and the grating elements 10 and 10' and halfwave plate element 372 are integrated as part of a composite glass block element having a physical shape similar to the glass block element 252 of the single pass, dual cascaded transmission grating device 250 of FIG. 18. As illustrated in FIG. 43, device 530 is comprised of the following optical components: a composite glass block element incorporating grating element 10 which is optically cemented to prism element 152, halfwave plate 372 which is optically cemented between prism elements 152 and 152' and grating element 10' which is optically cemented to prism element 152', and beam expanding and linearizing prism elements 218 and 218' which are, respectively, positioned in the beam incident to and exiting the composite glass block element. As depicted in FIG. 43, the non-optical transmitting surfaces of the composite glass block element in device 530 have been coated with an optical absorption coating 156 that is designed to absorb the nondiffracted zeroth order beam energy and other scattered light that may occur within this block element.

As depicted in FIG. 43, single wavelength incident collimated beam 162 to device 530 is composed of both S and P polarized optical components where the S' component 378' is depicted as a circle with a dot at its center while the P component 380 is depicted as a bold arrow. As also depicted in FIG. 43, the diffracted beam 256 exiting device 530 is composed of both S and P polarized optical components where the S component 378 is depicted as a circle with a dot at its center while the P' component 380' is depicted as a bold arrow. Only the S and P polarized components of the beam incident to and exiting device 530 are labeled with their respective numbers. The polarization direction convention used in FIG. 41 is the same as used in FIG. 28.

As illustrated in FIG. 43, beam 162 is incident on prism element 218 which refracts the beam and directs it to grating element 10 where it is diffracted. The diffracted beam from grating element 10 propagates through prism element 152, halfwave plate 372 and prism element 512' before being incident on grating element 10' where it is diffracted. The diffracted beam from grating element 10' is directed to prism element 218' where it is refracted as diffracted beam 256. As depicted in FIG. 43, device 530 converts the S' incident beam polarization component 378' into the P' polarization component 380' of diffracted beam 256 and converts the P incident beam polarization component 380 into the S polarization component 378 of diffracted beam 256. This conversion of the polarization states from S' to P' and P to S is performed by halfwave plate 372 in device 530. As described for device 520 of FIG. 42, conversion of the optical beam polarization states by halfwave plate 372 in device 530 enables the PDL value of grating elements 10 and 10', prism elements 218 and 218' and prism elements 152 and 152' used in that device to be completely compensated for when the corresponding parts of these optical elements have the same PDL performance properties, thereby enabling device 530 to have a PDL value of zero.

With regard to wavelength dispersion power, device 530 functions exactly the same as described for device 250 of FIG. 18, with the exception that the wavelength dispersion power of device 530 is increased, as described for device 210 of FIG. 12, by the E magnification factor for the beam expanding and linearizing prism element 218'. Prism element 218' also improves the linearity of the spacing of the spatially separated focused wavelength channel signal beams at the focal plane of a device that incorporates device 530 as a component. Prism element 218 does not affect either the wavelength dispersion power of device 530 or the linearizing of the spacing between the wavelength channel beam spot at the focal plane of the device that would incorporate device 530 as a component. Therefore, with regard to these operating parameters, device 530 need not incorporate prism element 218. Prism element 218 is incorporated in device 530 because it enables this device to achieve essentially a circular beam spot size at the focal plane of the device that would incorporate device 530 as a component.

As illustrated in FIG. 43, after incident beam 162 propagates through prism element 218 its diameter in the plane in which FIG. 43 resides is increased in size by an amount equal to the E magnification factor for prism element 218, which is depicted in FIG. 43 to be about 2 times. While not illustrated in FIG. 43, the diameter of the beam propagating through device 530 is unchanged in the plane that is perpendicular to the plane in which FIG. 43 resides. As depicted in FIG. 43, the diffracted beam incident on prism element 218' is reduced in size after propagating through this element by the same amount that incident beam was expanded by prism element 218 because these prism elements have essentially the same shape and operating properties and function in a reversible manner. Therefore, diffracted beam 256 exiting prism element 218' has the same diameter that incident beam 162 had prior to being incident on prism element 218. If device 530 did not incorporate prism element 218, the beam spot at the focal plane of the device incorporating device 530 as a component would have an elliptical profile having a major axis diameter that is larger than the minor axis diameter by approximately the E magnification factor for prism element 218'.

Figure 44:
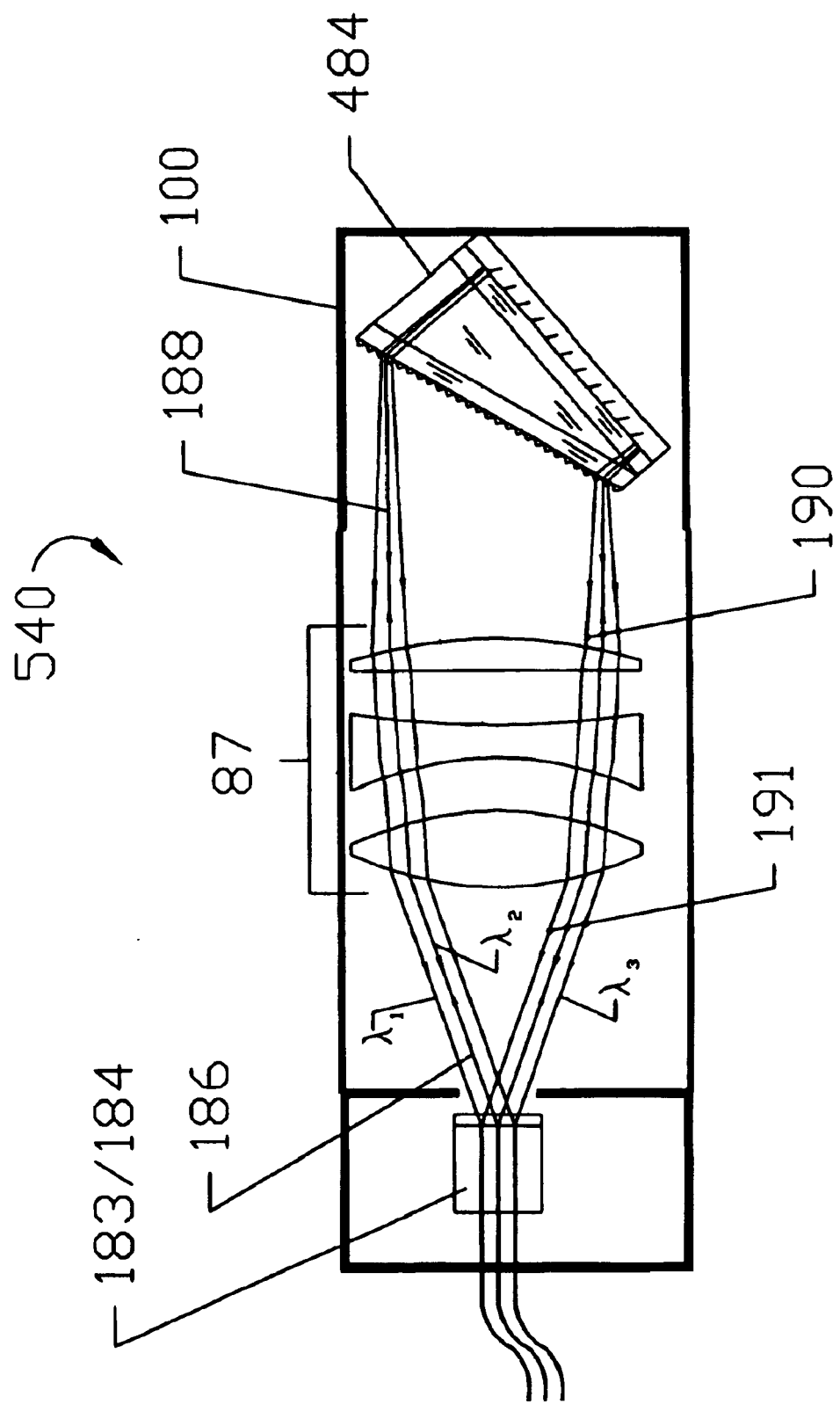
FIG. 44 is a schematic of a multiplexer device utilizing the transmission grating assembly of FIG. 38A.

FIG. 44 schematically illustrates how grating-based component 484 of FIG. 38A can be incorporated in a Mux/Demux device 540 used in a fiber-optic WDM system. Device 540 functions as described for the Mux/Demux device 180 in FIGS. 10A, 10B, and 10C. Device 540 differs from device 180 in that it incorporates grating-based component 484 in place of the grating-based component 150 used in device 180. Device 540 should have better PDL performance than device 180 since grating-based component 484 incorporates quarterwave plate element 472, whereas grating-based component 150 does not include a retardation plate element.

Figure 45:
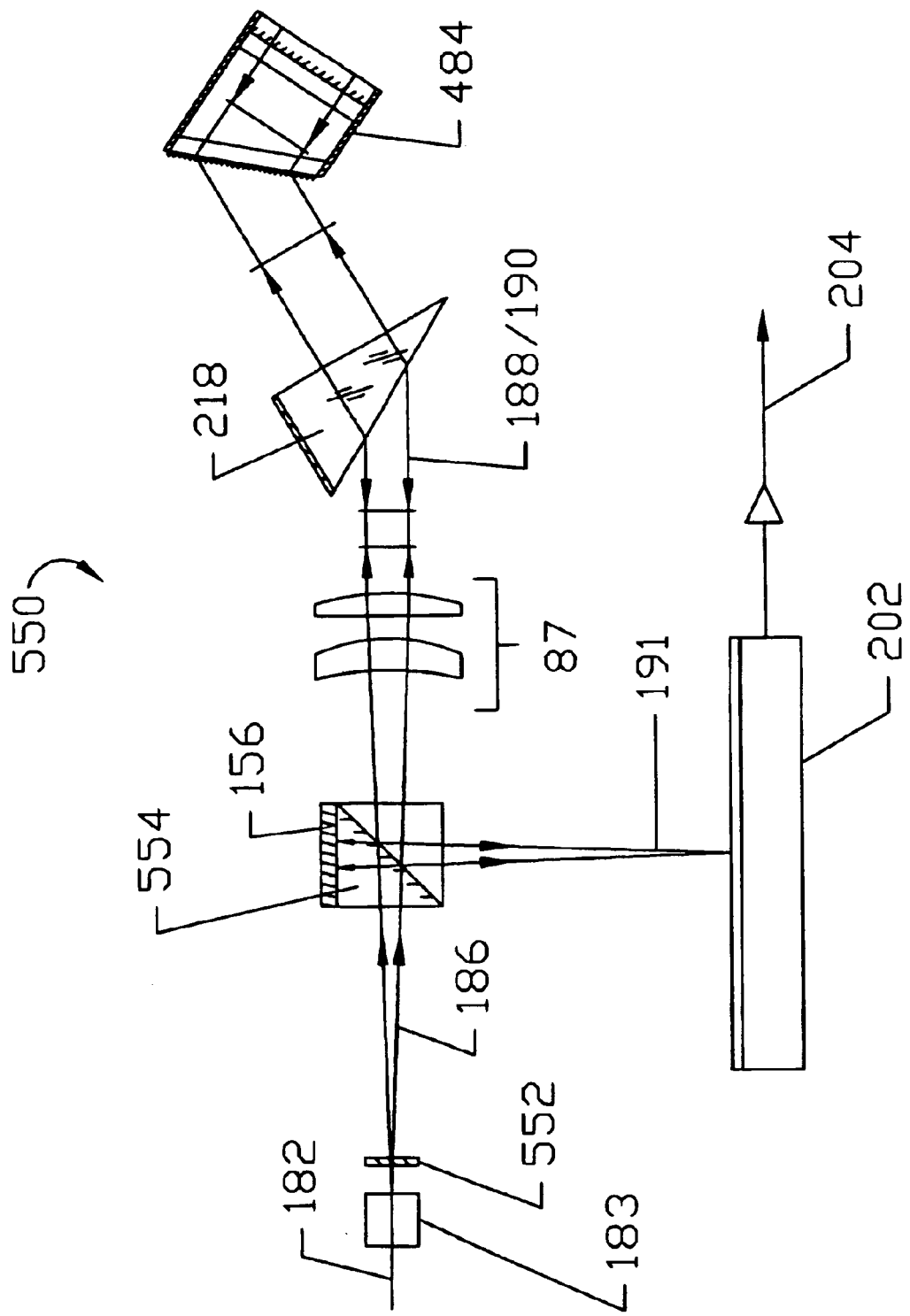
FIG. 45 is a schematic of a monitor device utilizing the transmission grating assembly of FIG. 38A.

FIG. 45 schematically illustrates how grating-based component 484 of FIG. 38A can be incorporated into spectrophotometer based OCM device 550 used in a fiber-optic WDM system. Device 540 functions as described for the OCM device 200 in FIGS. 11A, 11B, and 11C. Device 540 differs from device 200 in that it incorporates grating-based component 484 in place of the grating-based component 150 used in device 200, and device 550 incorporates the additional optical elements: micro-lens element 552, amplitude beam splitter element 554, and beam expanding and linearizing prism element 218. Device 550 should have better PDL performance than device 200 since grating-based component 484 incorporates quarterwave plate element 472, whereas grating-based component 150 does not include a retardation plate element.

As depicted in FIG. 45, the input fiber 182 to device 550 transmits a single wavelength channel beam which, when exiting from fiber 182, forms a divergent optical ray bundle having a cone angle determined by the numerical aperture (NA) of the input fiber. A micro-lens element 552 positioned a small distance after the end of input fiber 183 reduces the divergent cone angle of the ray bundle exiting the fiber. The amplitude beam splitter element 554 in device 550 receives the ray bundle 186 diverging from the output surface of micro-lens element 552. As depicted in FIG. 45, beam splitter 554 transmits a portion of the intensity of beam 186 to collimating/focusing lens assembly 87 and reflects a portion of the intensity of beam 186 to the top surface of element 554 that is coated with an optical absorption coating 156 that is designed to absorb the reflected portion of beam 186. The collimating/focusing lens assembly 87 in device 550 receives the transmitted portion of ray bundle 186 from the output surface of beam splitter element 554 and converts it into collimated beam 188 that is incident on the beam expanding/linearizing prism element 218. After the incident collimated beam 188 propagates through prism element 218, its diameter in the plane in which FIG. 45 resides is increased in size by an amount equal to the E magnification factor for prism element 218, which as depicted in FIG. 45, is about 1.6 times.

As depicted in FIG. 45, the beam from prism element 218 is incident on the integrated dual pass grating component 484 at the Littrow diffraction condition for the depicted wavelength beam and is retrodiffracted back along the incident beam path. The retrodiffracted beam from component 484 propagates back through the beam expanding/linearizing prism element 218 and is reduced in size by the same amount that the incident beam 188 was expanded by prism element 218 because this prism element functions in a reversible manner. Therefore, the retrodiffracted beam 190 exiting prism element 218 has the same diameter that the incident beam 188 had prior to being incident on prism element 218. As described for device 210 of FIG. 12, associated with the reduction in size of the retrodiffracted beam 190 by the prism element 218 is a corresponding increase in the wavelength dispersion power of component 484 and, therefore, of device 550, by the E magnification factor for prism element 218. Prism element 218 also improves the linearity of the spacing of the spatially separated focused wavelength channel signal beams at the focal plane of device 550.

As depicted in FIG. 45, the collimating/focusing lens assembly 87 receives the collimated retrodiffracted beam 190 from prism element 218 and converts it into a converging beam that is incident on beam splitter element 554. Beam splitter 554 transmits a portion of the intensity of beam 190 back toward the direction of the input fiber 182 and reflects a portion of the intensity of beam 190 toward photodetector array unit 202, where it comes to focus on the surface of the photosensitive element (not shown) contained in photodetector array unit 202. When device 550 contains multi-wavelength channel beams, these wavelength channel beams are focused to spatially separated spots that are incident on different photosensitive elements in photodetector array unit 202 and, thereby, generate an independent electrical signal 204 for each wavelength channel beam.

Because amplitude beam splitter element 554 is used in a double pass mode in device 550, the maximum intensity of beam 191 incident on photodetector array 202 would be about 20 percent of the intensity of beam 186 that is incident to beam splitter element 554. If dual pass grating component 484 has a radiometric efficiency of only 20 percent, then beam 191 will have a maximum intensity relative to beam 186 of about 4 percent. This relatively low radiometric throughput efficiency for device 550 does not cause a problem because commercially available InGaAs photodetector array units that are used in OCM devices, like device 550, have very high sensitivity and, therefore, the intensity of the optical beam transmitted to OCM devices is usually attenuated by a factor of 50 to 200 times.

Figure 46A:
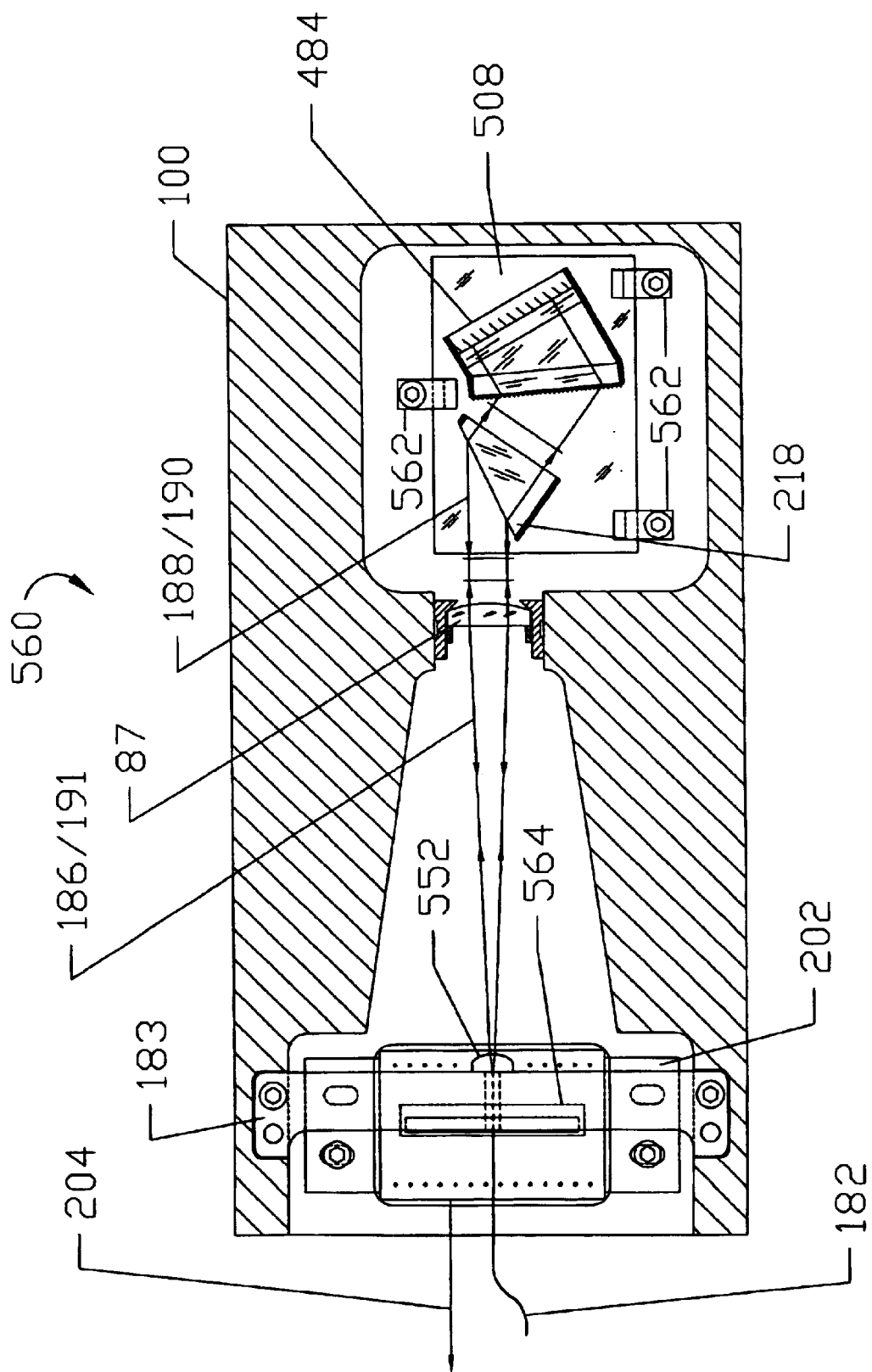

FIGS. 46A and 46B present sectional side and top views, respectively, that illustrate another embodiment of how the dual pass grating component 484 of FIG. 38A can be incorporated into the spectrophotometer based OCM device 560 used in a fiber-optic WDM system. Device 560 functions as described for the OCM device 200 in FIGS. 11A, 11B, and 11C. Device 560 differs from device 200 in that it incorporates grating-based component 484 in place of the grating-based component 150 used in device 200, and device 560 incorporates the additional optical elements: micro-lens element 552, beam expanding and linearizing prism element 218, and prism reflector element 564. Device 560 should have better PDL performance than device 200 since grating-based component 484 incorporates quarterwave plate element 472, whereas grating-based component 150 does not include a retardation plate element.

As depicted in FIGS. 46A and 46B, the input fiber 182 to device 560 transmits a single wavelength channel beam which, when exiting from fiber 182, forms a divergent optical ray bundle having a cone angle determined by the numerical aperture (NA) of the input fiber. A micro-lens element 552 attached to the end of input fiber 183 reduces the divergent cone angle of the ray bundle exiting the fiber. The collimating/focusing lens assembly 87 in device 550 receives the ray bundle 186 diverging from the output surface of micro-lens element 552 and converts it into collimated beam 188 that is incident on the beam expanding/linearizing prism element 218. After the incident collimated beam 188 propagates through prism element 218, its diameter in the plane in which FIG. 46A resides is increased in size by an amount equal to the E magnification factor for prism element 218 (which is depicted in FIG. 46A to be about 1.6 times) whereas the diameter of the beam in the plane in which FIG. 46B resides is essentially unchanged.

As depicted in FIG. 46A, the beam from prism element 218 is incident on the integrated dual pass grating component 484 at the Littrow diffraction condition for the depicted wavelength beam and is retrodiffracted back along the incident beam path. The retrodiffracted beam from component 484 propagates back through the beam expanding/linearizing prism element 218 and is reduced in size by the same amount that the incident beam 188 was expanded by prism element 218 because this prism element functions in a reversible manner. Therefore, the retrodiffracted beam 190 exiting prism element 218 has the diameter that the incident beam 188 had prior to being incident on prism element 218. As described for device 210 of FIG. 12, associated with the reduction in size of the retrodiffracted beam 190 by the prism element 218 is a corresponding increase in the wavelength dispersion power of component 484 and, therefore, of device 560, by the E magnification factor for prism element 218. Prism element 218 also improves the linearity of the spacing of the spatially separated focused wavelength channel signal beams at the focal plane of a device 560.

As depicted in FIGS. 46A and 46B, collimating/focusing lens assembly 87 receives the collimated retrodiffracted beam 190 from prism element 218 and converts it into converging beam 191 which comes to focus on the surface of the photosensitive element (not shown) contained in the photodetector array unit 202. As illustrated in FIGS. 46A and 46B, the converging retrodiffracted beam 191 from collimating focusing lens assembly 87 is directed onto the photosensitive element in photodetector array unit 202 by a prism reflector element 564 that is positioned on the input surface of photodetector array unit 202. When OCM device 560 contains multi-wavelength channel beams, these wavelength channel beams are focused to spatially separated spots that are incident on different photosensitive elements in photodetector array unit 202 and, thereby, generate an independent electrical signal 204 for each wavelength channel beam. As depicted in FIG. 46B, the electrical connecting pins on the back of the array unit 202 are directly soldered to a circuit board 566 which outputs electrical signal 204.

As illustrated in FIGS. 46A and 46B, the dual pass transmission grating component 484 and the beam expanding/linearizing prism element 218 are mounted to the top surface of a rectangular glass mounting plate 508 that is attached to the structural support housing 100 of device 560 by the 3 clamp elements 562. An optical alignment beam is propagated through grating-based component 484 and prism element 218 as part of the procedure for mounting these optical elements to the glass plate 508. These optical elements are aligned relative to each other and plate 508 so that the alignment beam follows a predetermined path through the elements and with respect to both the top surface of the mounting plate 508 and with at least one of the side reference surfaces of plate 508.

The dual pass grating-based OCM device 560 illustrated in FIGS. 46A and 46B incorporates a micro-lens element 552 after the input fiber 182 because the beam 186 incident on and the beam 191 exiting from the collimating/focusing lens assembly 87 in this device have the same ray cone angle. This ray cone angle (NA) determines the spot size of the spatially separated wavelength channel beams at the device focal plane. The micro-lens element 552 in device 560 reduces the divergent cone angle of the ray bundle exiting the input fiber 182 by the ratio of the beam spot size at the focal plane of device 560 divided by the beam mode diameter in the input fiber 182. For example, if the input fiber 182 is a single mode fiber having a $1/e^2$ intensity beam mode diameter of 10 $\mu$m and device 560 is designed to generate a 70 $\mu$m $1/e^2$ intensity beam spot size at the device focal plane, micro-lens 552 has to reduce the divergence of the ray bundle exiting the input fiber 182 by the ratio of 70/10=7. Most single mode fibers operating in the 1550 nm wavelength range have a NA of about 0.1 and, therefore, for this example, the ray bundle exiting from the micro-lens element 552 should have a NA of about 0.014, which corresponds to a beam cone angle of ±0.82 degrees.

In the OCM device 560 illustrated in FIGS. 46A and 46B, micro-lens element 552 is depicted as a barrel lens element. The micro-lens element 552 used for the OCM device 560 illustrated in FIGS. 46A and 46B can be fabricated as either a ball lens element, a barrel lens element, a gradient index-based lens element, such as a SELFOC lens element, or as a diffractive optical element, such as depicted in FIG. 45. Computer analysis has shown that very good optical performance is achieved for device 560 by using either a ball micro-lens element, a barrel micro-lens element or a SELFOC micro-lens element that provides a 7-times reduction in the NA of the beam cone angle exiting from a 1550 nm single mode fiber. For these computer calculations, the ball and barrel micro-lens elements had a refractive index in the range of about 1.7 to about 1.8 for the 1550 nm wavelength range. These ball and barrel micro-lens elements should be fabricated so that their input surface can be optically cemented to the end of the input fiber 182 and, thereby, reduce both the reflection coupling losses and the intensity of the beam reflected back into fiber 182. The SELFOC micro-lens element used for these computer calculations was a SLW-200 type rod element sold by NSG America, Inc., that has both flat input and output surfaces. This SELFOC micro-lens element can also be optically cemented to the end of input fiber 182 and, thereby, reduce both the reflection coupling losses and the intensity of the beam reflected back into fiber 182.

The collimating/focusing lens assembly 87 in the OCM device 560 illustrated in FIGS. 46A and 46B is depicted as consisting of a plano-convex singlet lens element. Computer analysis has shown that the optical configuration depicted in device 560 achieves diffraction limited optical performance when the following device conditions are achieved: 1) the plano-convex singlet collimating/focusing lens element is fabricated with an optical glass having an index of refraction of about 1.7 to about 1.8 for the 1550 nm wavelength range; 2) the plano-convex singlet collimating/focusing lens element has a focal length longer than about 75 mm; 3) device 560 is designed to have a $1/e^2$ intensity beam diameter spot size of larger than about 35 $\mu$m at the focal plane of the device; and 4) device 560 is designed to measure the performance of either 40 C or 40 L Band wavelength channel beams that have a mean separation of 0.3 mm between adjacent wavelength channel beam spots at the device focal plane.

The focal length of the collimating/focusing lens assembly 87 used in OCM device 560 illustrated in FIGS. 46A and 46B can be calculated with the aid of Equations (4) and (5). For these calculations the following assumptions are made: 1) the spatially separated focused wavelength channel beam spots at the focal plane of device 560 have a mean separation of 0.3 mm between adjacent channel beam spots for a frequency channel spacing of 100 GHz, corresponding to a mean wavelength channel spacing of 0.8 nm for the C Band; 2) device 560 incorporates a transmission grating element 10 having a $\lambda/D$ ratio of 1.3 for a wavelength of 1550 nm; 3) the dual pass transmission grating component 484 in device 560 is fabricated so that it achieves a wavelength dispersion power of about 0.125 deg/nm for a wavelength of 1550 nm; and 4) the beam expanding and linearizing prism element 218 incorporated in device 560 has an E magnification factor of about 1.6. Based on these assumptions, device 560 has a wavelength dispersion power of about 0.20 deg/nm for a wavelength of 1550 nm. Therefore, device 560 must incorporate a collimating/focusing lens assembly 87 having a focal length of about 105 mm to achieve the desired 0.3 mm separation between adjacent focused wavelength channel beam spots when used for C Band operation.

Embedded OCM devices incorporated as part of a fiber-optic network system are often housed in a card rack mounting unit designed to hold devices having a thickness of about 1.0 inch or less and, therefore, a desirable goal when designing an OCM device is to have a device thickness of less than or equal to 1.0 inch. This device thickness goal is one of a number of reasons for angularly orientating the photodetector array unit in the OCM devices illustrated in FIGS. 46A, 46B, 47A, 47B, 48, 49A, 49B and 49C so that the surface of the photosensitive element in the array units in these devices resides in a plane that is perpendicular to the diffraction grating lines of the grating element incorporated in these devices. As illustrated in FIGS. 46A, 46B, 47A, 47B, 48, 49A, 49B and 49C, this angular orientation of the photodetector array unit requires the OCM device to incorporate either a prism reflector element 564 or a beam fold mirror element 572 to direct the converging retrodiffracted beam from the focusing lens element onto the surface of the photosensitive element in the photodetector array unit. Another reason for using this angular orientation for the photodetector array unit is that it enables the array unit to be positioned closer to the support element 183 used to hold the input fiber 182 and micro-lens element 552 in the OCM devices illustrated in FIGS. 46A, 46B, 47A, and 47B, which not only reduces the thickness of the monitor device but also reduces the angle range over which the collimating/focusing lens assembly 87 in the device must operate. A third reason for using this angular orientation for the photodetector array unit is that it enables the electrical connecting pins on the back of the array unit to be directly soldered to a circuit board 566 located behind the array unit, that is, orientated so that its surface is parallel to the support plate to which the optical components in the OCM device are mounted.

One can judge the relative size and spacing of the components used in the OCM devices illustrated in FIGS. 46A, 46B, 47A, 47B, 48, 49A, 49B and 49C since the photodetector array units depicted in these figures is based on commercially available InGaAs array units having either 256 or 512 pixel elements. These commercially available array units have dimensions of approximately 2.55 inches (65 mm) in length including mounting tubs, 1 inch (25.4 mm) in width, and 0.25 inches (6.35 mm) in thickness, not including the electrical connecting pins on the back of the unit. The interrelationship between the size and cone angle of the optical beams depicted in the OCM devices in FIGS. 46A, 46B, 47A, 47B, 48, 49A, 49B and 49C is accurately represented in these figures for OCM devices having the following operating conditions: 1) the device incorporates a collimating/focusing lens assembly 87 or focusing lens assembly 92 having a focal length of about 105 mm; 2) the device is designed to have about a $70\,\mu m$ $1/e^2$ intensity beam diameter spot size at the device focal plane; and 3) the device is designed to have a mean separation of 0.3 mm between adjacent wavelength channel beam spots at the device focal plane for either a C or L Band frequency channel spacing of 100 GHz.

Figure 47A:
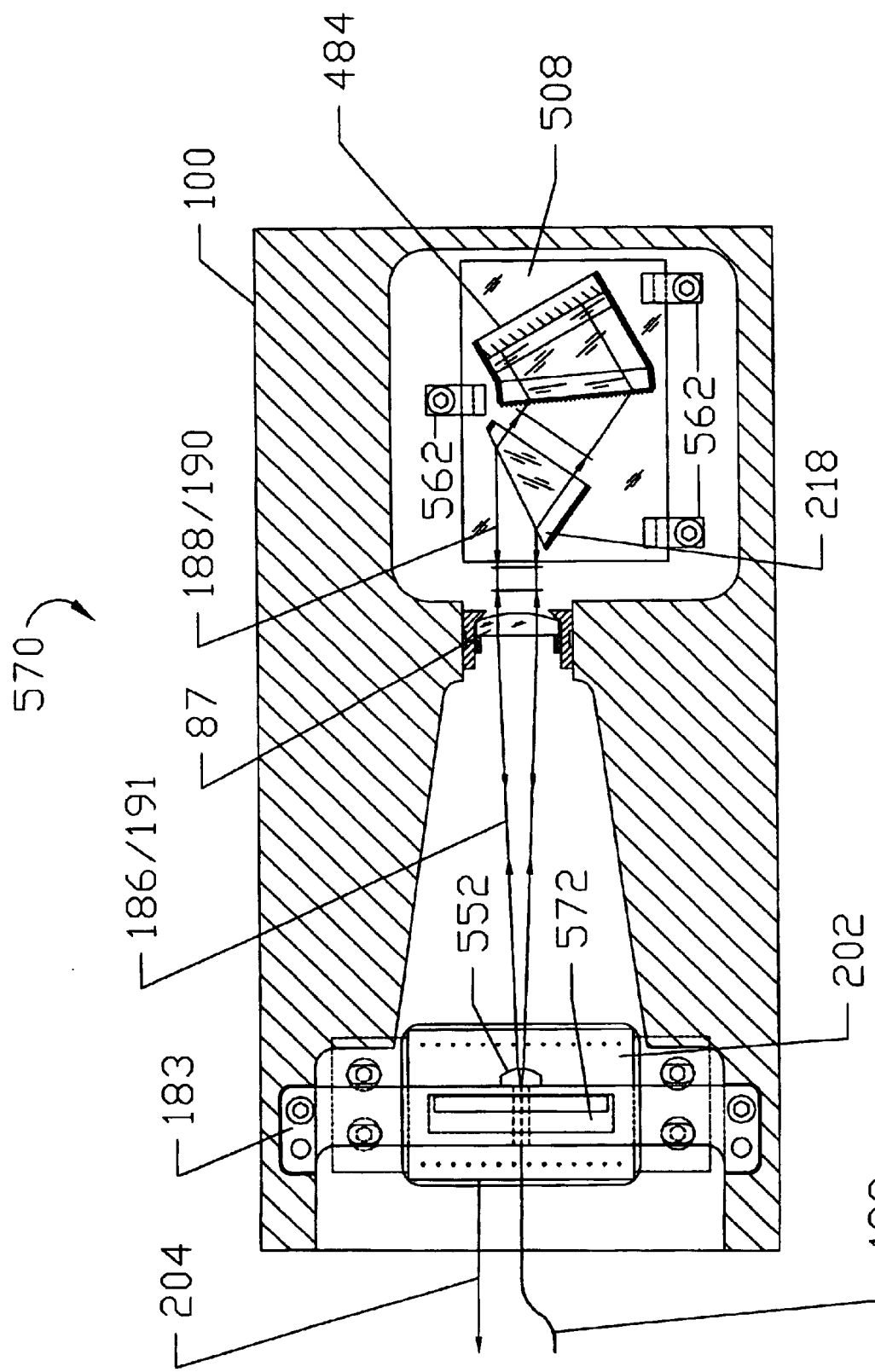
Figure 47B:
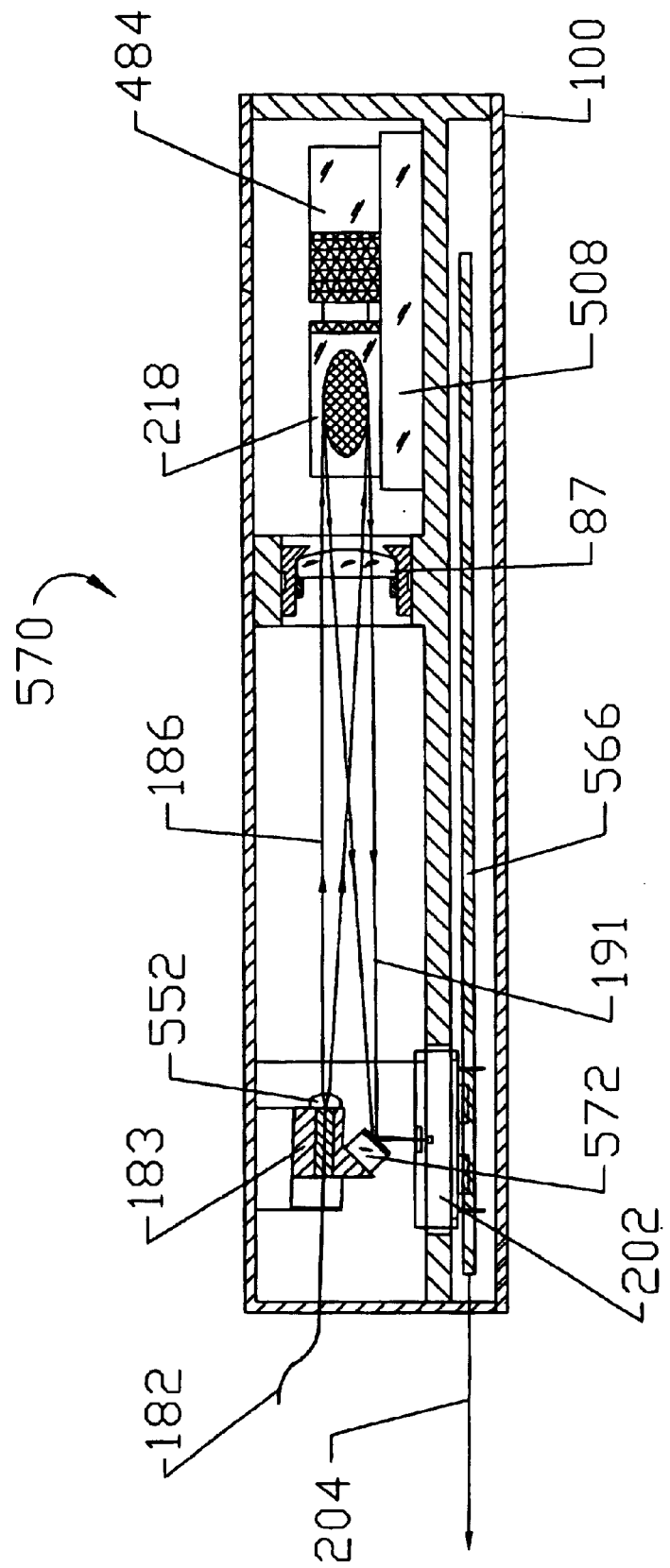
Figure 48:
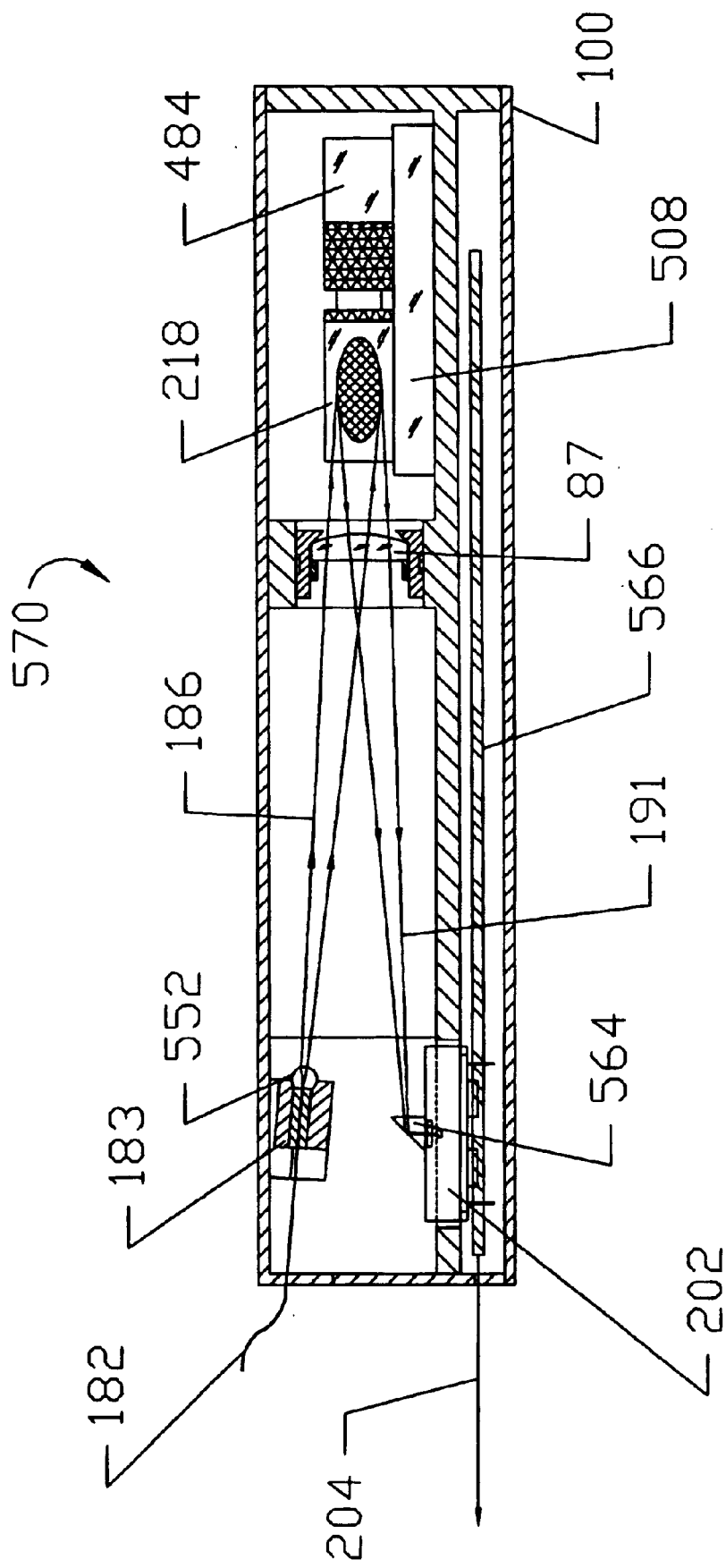

FIGS. 47A and 47B present sectional side and top views, respectively, of OCM device 570 that incorporates grating-based component 484 of FIG. 38A Device 570 has essentially the same design as OCM device 560 illustrated in FIGS. 46A and 46B. Device 570 differs from device 560 in that it incorporates beam fold mirror element 572 in place of prism reflector element 564 of device 560 to direct the converging retrodiffracted beam 191 from the collimating/focusing lens assembly 87 onto the surface of the photosensitive element (not shown) in the photodetector array unit 202 and, therefore, device 570 functions the same as described for device 560. As illustrated in FIG. 47B, beam fold mirror element 572 is attached to the support element 183 used to hold the input fiber 182 and micro-lens element 552 in device 570. FIG. 48 presents a sectional side view of OCM device 580 that incorporates grating-based component 484 of FIG. 38A. Device 580 has essentially the same design as OCM device 560 illustrated in FIGS. 46A and 46B. Device 580 differs from device 560 in that it incorporates ball micro-lens element 552 in place of the barrel micro-lens element 552 of device 560 to reduce the divergent cone angle of the ray bundle exiting the input fiber 182 and, therefore, device 580 functions the same as described for device 560.

Figure 49A:
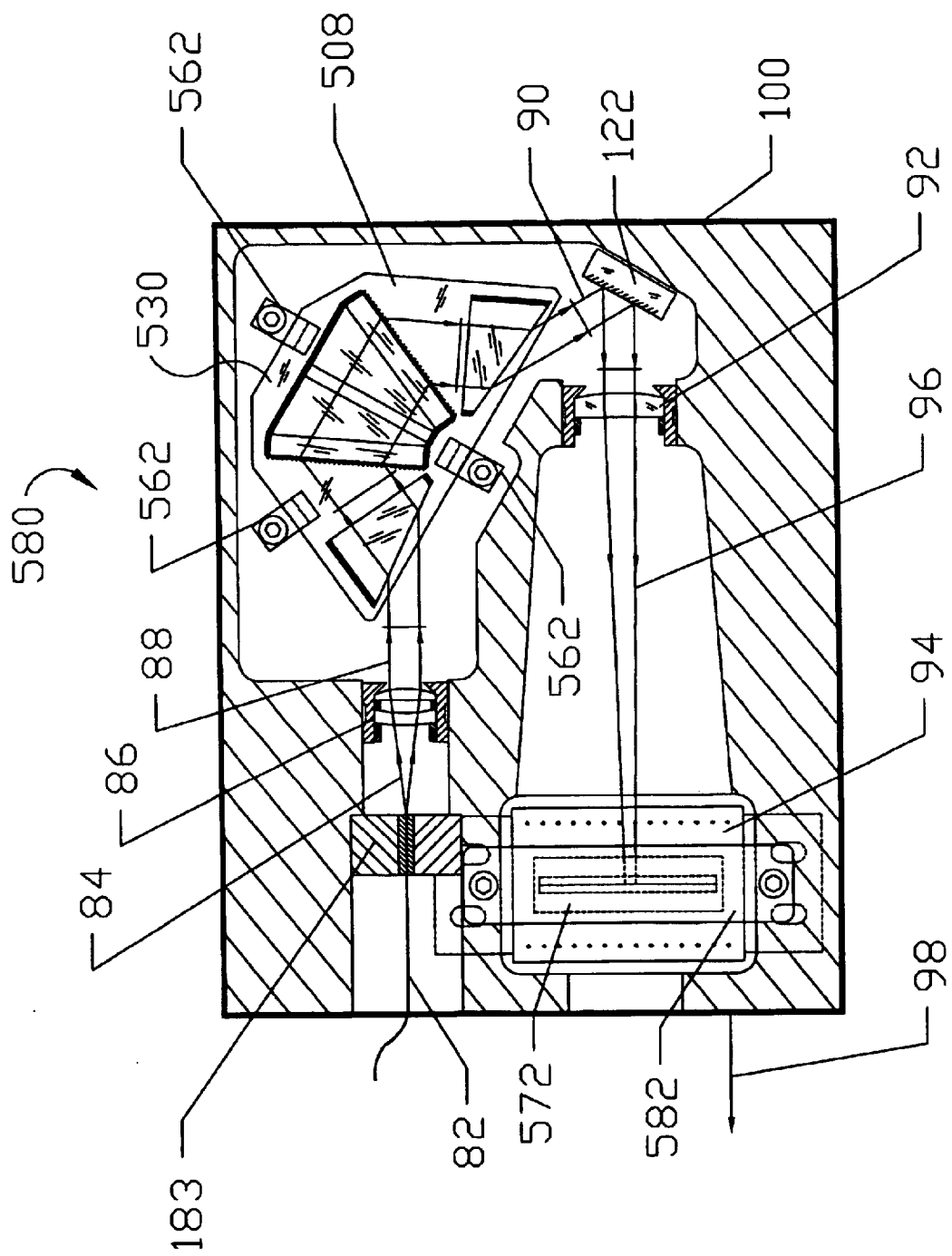
FIGS. 49A, 49B, and 49C are schematics of monitor devices utilizing the single pass grating assembly of FIG. 43.
Figure 49B:
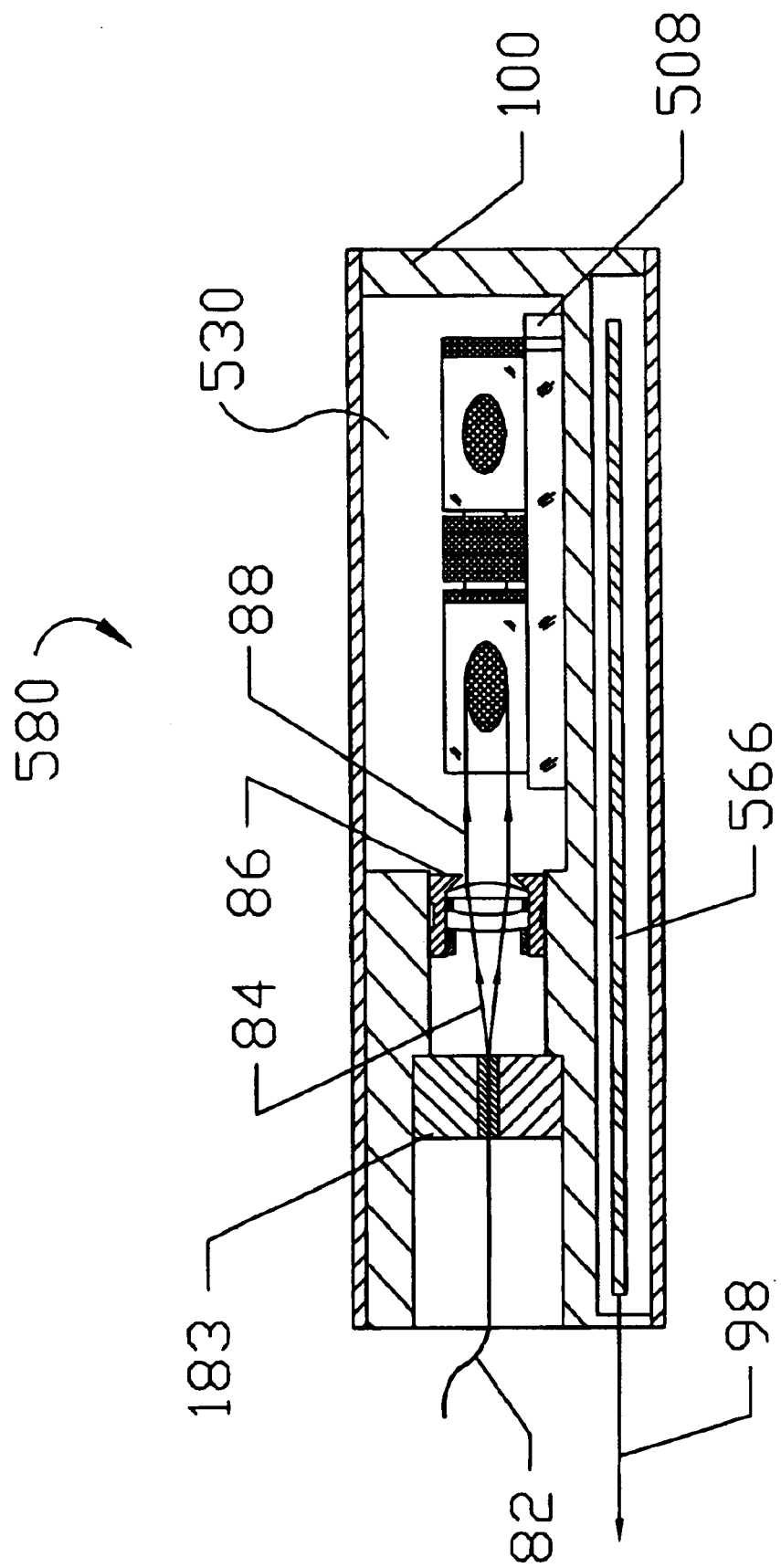
Figure 49C:
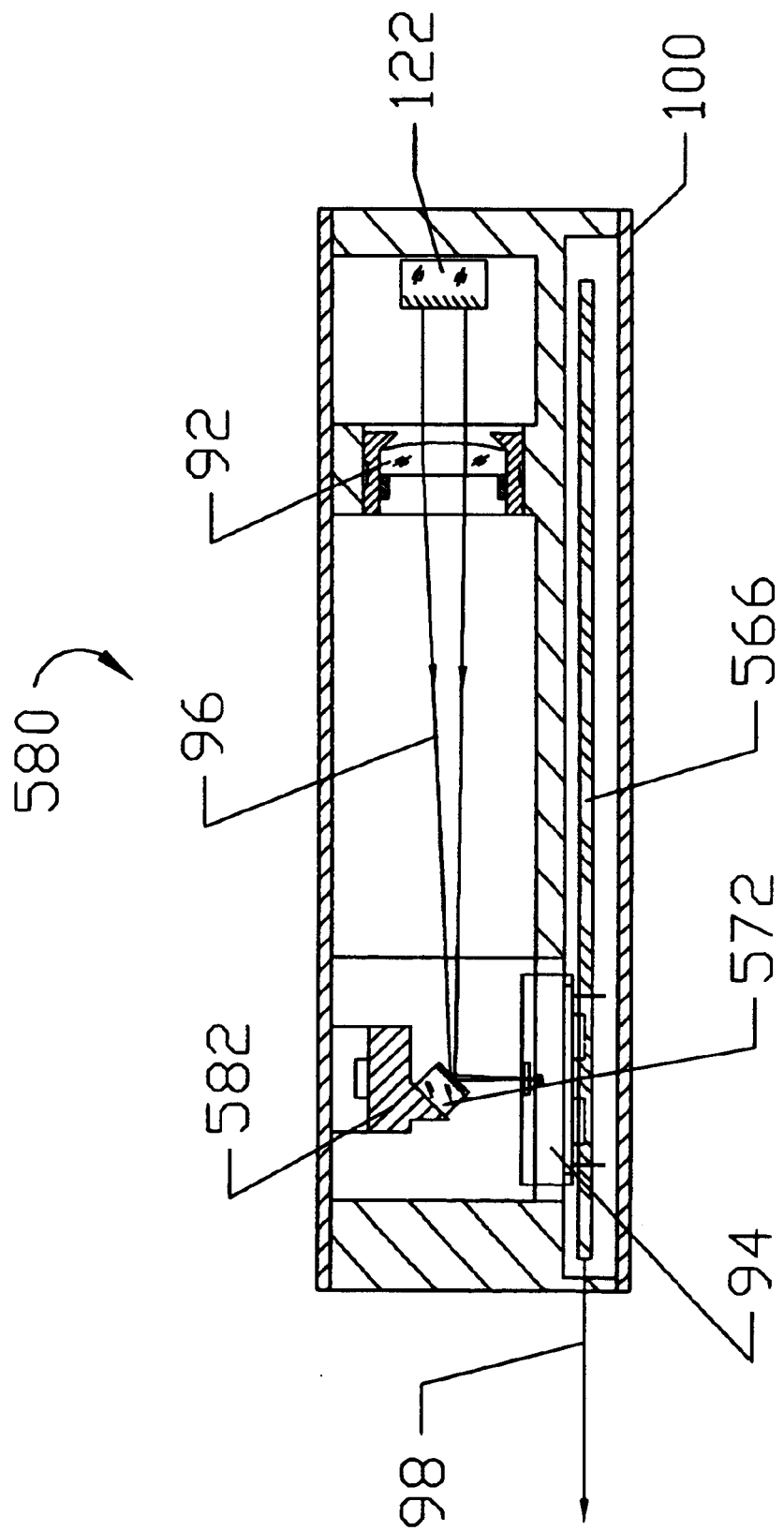

A sectional top view in FIG. 49A and sectional side views in FIGS. 49B and 49C illustrate how the single pass, dual cascaded transmission grating component 530 illustrated in FIG. 43 can be incorporated into spectrophotometer based OCM device 580 used in a fiber-optic WDM system. Device 560 functions as described for the OCM device 260 in FIG. 19. Device 580 differs from device 260 in that it incorporates grating-based component 530 in place of the grating-based component 250 used in device 200, and device 560 incorporates the additional optical elements: beam expanding/linearizing prism element 218, beam expanding/linearizing prism element 218' and beam fold mirror element 122 in place of the integrated mirror/prism element 262 of device 260 and beam fold mirror element 572. Device 580 should have better PDL performance than device 260 since grating-based component 530 incorporates halfwave plate element 372, whereas grating-based component 250 does not include a retardation plate element.

As depicted in FIGS. 49A and 49B, the input fiber 82 to the single pass transmission grating-based OCM device 580 transmits a single wavelength channel beam which, when exiting from fiber 82, forms a divergent optical ray bundle 84 having a cone angle determined by the numerical aperture (NA) of fiber 82. The collimating lens assembly 86 in device 580 receives the ray bundle 84 diverging from the output surface of input fiber 82 and converts it into collimated beam 88 that is incident on grating-based,component 530. The collimated diffracted beam 90 from component 530 is incident on beam fold mirror element 122 that directs this beam to focusing lens assembly 92. As depicted in FIGS. 49A and 49C, focusing lens assembly 92 converts collimated diffracted beam 90 into converging beam 96 which comes to focus on the surface of the photosensitive element (not shown) contained in the photodetector array unit 94. As illustrated in FIGS. 49A and 49C, converging retrodiffracted beam 96 from focusing lens assembly 92 is directed onto the photosensitive element in the photodetector array unit 94 by beam fold mirror element 572 that is attached to the support bar 582. When OCM device 580 contains multi-wavelength channel beams, these wavelength channel beams are focused to spatially separated spots that are incident on different photosensitive elements in the photodetector array unit 94 and, thereby, generate an independent electrical signal 98 for each wavelength channel beam. As depicted in FIG. 49C, the electrical connecting pins on the back of the, array unit 94 are directly soldered to a circuit board 566 which outputs electrical signal 98.

As illustrated in FIGS. 49A and 49B, grating-based component 530 is mounted to the top surface of glass mounting plate 508 that is attached to the structural support housing 100 of device 580 by the 3 clamp elements 562. An optical alignment beam is propagated through grating-based component 530 as part of the procedure for mounting this component to glass plate 508. Component 530 is aligned relative to plate 508 so that the alignment beam follows a predetermined path through component 530 and with respect to both the top surface of the glass mounting plate 508 and with at least one of the side reference surfaces of plate 508.

Figure 50:
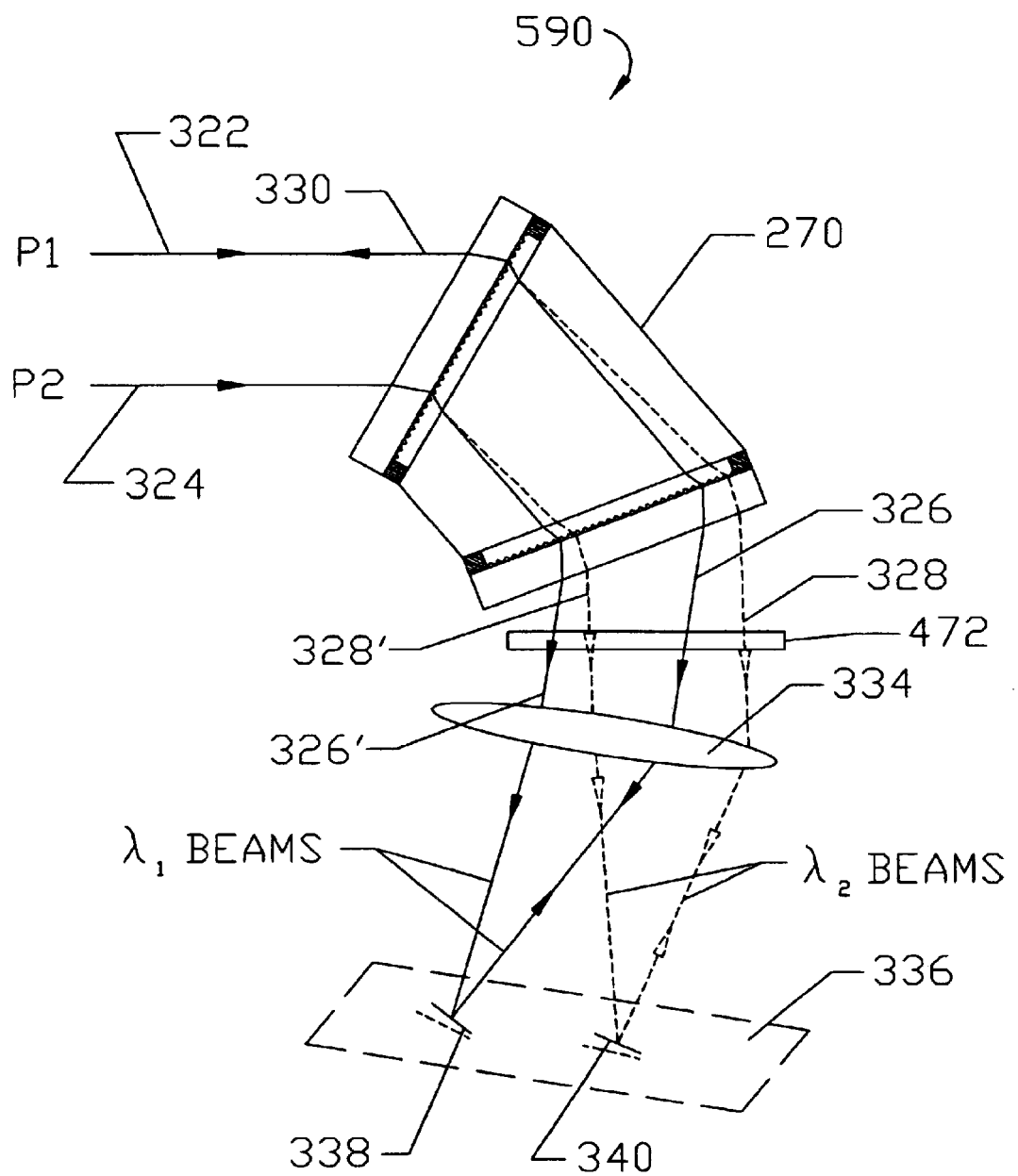
FIGS. 50 and 51 are schematics of a wavelength add-drop device using the grating assembly depicted in FIG. 20.

FIG. 50 schematically illustrates ADWM device 590 that is similar to ADWM device 320 that is illustrated in FIGS. 25A and 25B. Device 590 functions as described for device 320 and differs from device 320 in that it incorporates quarterwave plate 472 positioned between grating-based component 270 and focusing lens element 334. As depicted in FIG. 50, device 590 functions as a dual pass device, in that the optical beams propagate twice through the optical transmission elements comprising device 590 and, therefore, the PDL value of grating-based component 270 should be completely compensated for when quarterwave plate 472 is aligned so that it converts the incident beam S polarization component into the rediffracted beam P polarization component and converts the incident beam P polarization component into the rediffracted beam S polarization component. Under these conditions, device 590 should have better PDL performance than device 320.

Figure 51:
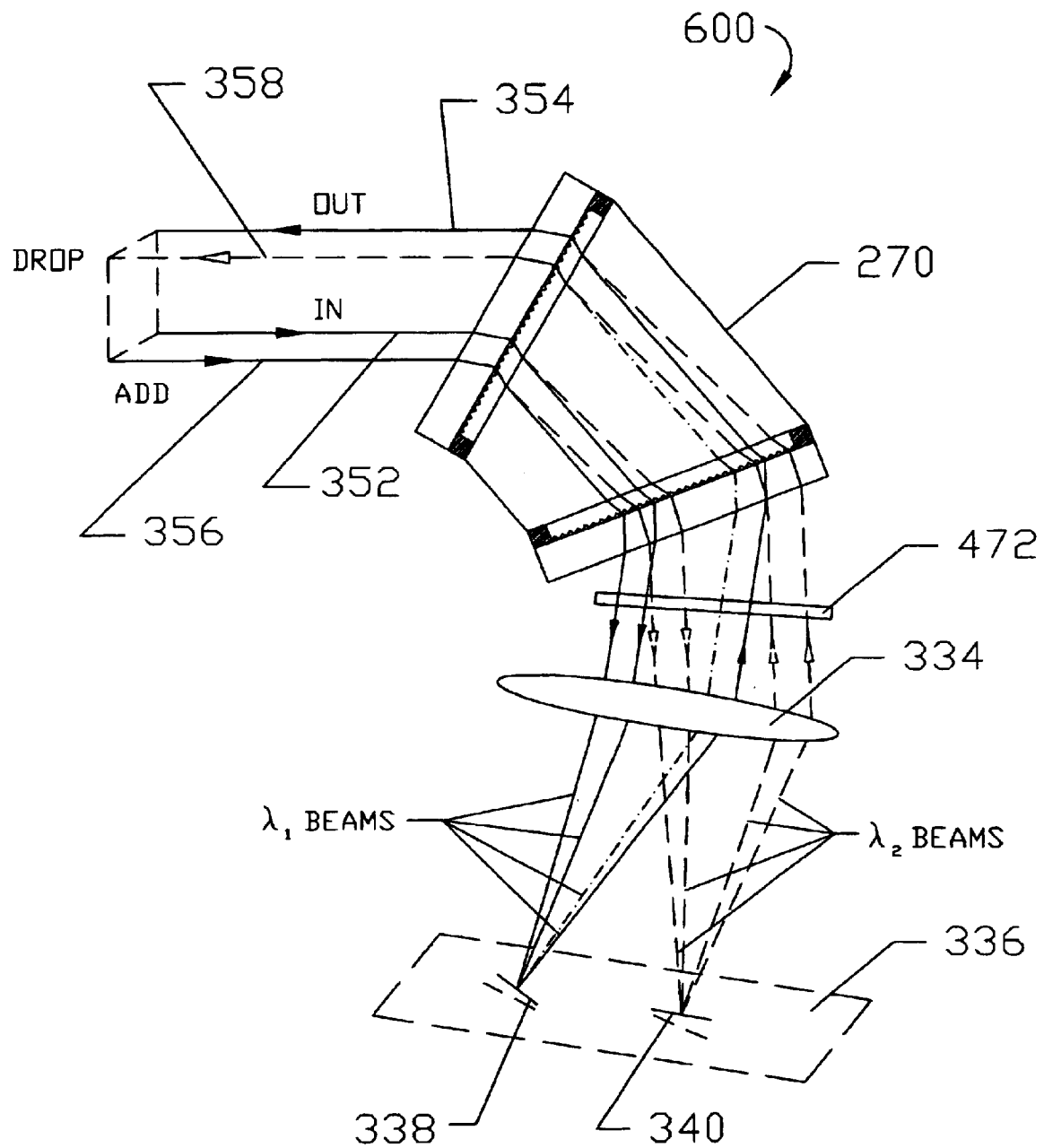

FIG. 51 schematically illustrates ADWM device 600 that is similar to ADWM device 350 that is illustrated in FIG. 26. Device 600 functions as described for device 350 and differs from device 350 in that it incorporates quarterwave plate 472 positioned between grating-based component 270 and focusing lens element 334. As depicted in FIG. 51, device 600 functions as a dual pass device, in that the optical beams propagate twice through the optical transmission elements comprising device 600 and, therefore, the PDL value of grating-based component 270 14 should be completely compensated for when quarterwave plate 472 is aligned so that it converts the incident beam S polarization component into the rediffracted beam P polarization component and converts the incident beam P polarization component into the rediffracted beam S polarization component. Under these conditions, device 600 should have better PDL performance than device 350.

Figure 52:
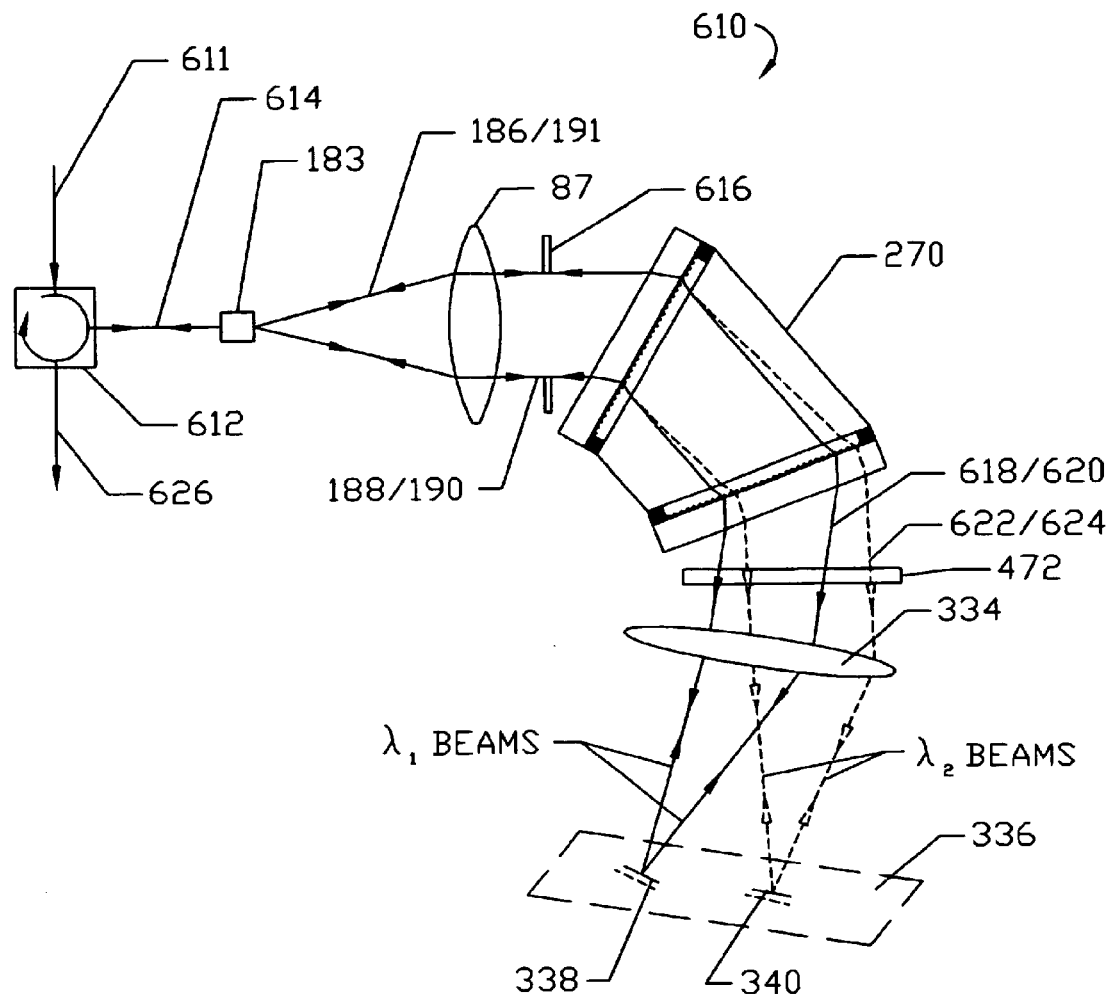
FIG. 52 is a schematic of a wavelength variable attenuator device using the grating assembly depicted in FIG. 20.

FIG. 52 schematically illustrates device 610 that functions as a wavelength variable attenuator (WVA) device that is used to change the intensity of individual wavelength channel beams in a WDM fiber-optic communication network. Comparing FIG. 52 with FIG. 50 reveals that all of the elements to the right of aperture element 616 in device 610 are the same as the elements used in device 590 of FIG. 50 and perform the same functions as described for the like numbered elements of device 590. With reference to FIG. 52, input fiber 611 to circulator element 612 provides a beam containing $\lambda_1$ and $\lambda_2$ wavelength channel signals. Circulator element 612 directs the input beam from fiber 611 to fiber 614 that ends in fiber support element 183. The beam exiting from the end of fiber 614 forms a divergent optical ray bundle 186 having a cone angle determined by the numerical aperture (NA) of fiber 614. The collimating/focusing lens assembly 87 in device 610 receives the ray bundle 186 diverging from fiber 614 and converts it into collimated beam 188 that passes essentially un-attenuated through aperture element 616 and is incident on grating-based component 270. After diffraction from component 270 the incident beam 188 is angularly separated into $\lambda_1$ wavelength beam 618 and $\lambda_2$ wavelength beam 622. The wavelength beams 618 and 622 are, respectively, depicted in FIG. 52 as solid and dashed lines. As illustrated in FIG. 52, the diffracted wavelength beams 618 and 622 angularly separate and propagate through quarterwave plate 472 to collimating/focusing lens 334. Lens 334 focuses the $\lambda_1$ and $\lambda_2$ wavelength beams from element 270 onto a micro-mirror array 336 comprising separately tiltable micro-mirror elements 338 and 340, the $\lambda_1$ wavelength beam being focused to micro-mirror element 338 while the $\lambda_2$ wavelength beam is focused to micro-mirror element 340.

In the first position of the micro-mirror elements 338 and 340, illustrated in FIG. 52 by the solid lines, the mirror elements 338 and 340 retroreflect both wavelength beams back along their respective incident beam paths. That is, in this first position the micro-mirror elements are orientated perpendicular to the central ray of focused beams 618 and 622. For this first mirror position, the retroreflected $\lambda_1$ and $\lambda_2$ wavelength beams propagate back to collimating/focusing lens 334 where they are re-collimated. Retroreflected $\lambda_1$ wavelength beam 620 propagates back along incident beam path 618, and the retroreflected $\lambda_2$ wavelength beam 624 propagates back along incident beam path 622. Wavelength beams 620 and 624 are recombined into retrodiffracted beam 190 by grating-based component 270 since this component functions in a reversible manner. Retrodiffracted beam 190 passes essentially un-attenuated through aperture element 616 and is incident on collimating/focusing lens assembly 87 that focuses this beam onto the end of fiber 614. Most of the intensity of the focused beam 191 that is incident on fiber 614 is coupled into fiber 614 and propagates to circulator element 612. Circulator element 612 directs the output beam from fiber 614 to output fiber 626.

As depicted in FIG. 52, device 610 functions as a dual pass device, in that the optical beams propagate twice through the optical transmission elements comprising device 610 and, therefore, the PDL value of grating-based component 270 should be completely compensated for when quarterwave plate 472 is aligned so that it converts the incident beam S polarization component into the retrodiffracted beam P polarization component and converts the incident beam P polarization component into the retrodiffracted beam S polarization component. Under these conditions, device 610 should achieve a PDL value of less than or equal to 0.2 dB.

Assuming that the optical elements comprising device 610 have the same radiometric throughput efficiency for both the $\lambda_1$ and $\lambda_2$ wavelength components of the incident signal beam to device 610, then device 610, as depicted in FIG. 52, attenuates the $\lambda_1$ and $\lambda_2$ wavelength components of the incident signal beam equally, thereby maintaining the intensity ratio that these wavelength components had prior to device 610. When the micro-mirror elements 338 and 340 of micro-mirror array 336 are tilted so that they are not orientated perpendicular to the central ray of focused beams 326 and 328, as illustrated in FIG. 52 by the dashed lines, the $\lambda_1$ and $\lambda_2$ wavelength beams will not be retroreflected back along their respective incident beam paths. Under these device conditions, the retrodiffracted beam 190 will not pass un-attenuated through aperture 616, as depicted in FIG. 53.

Figure 53:
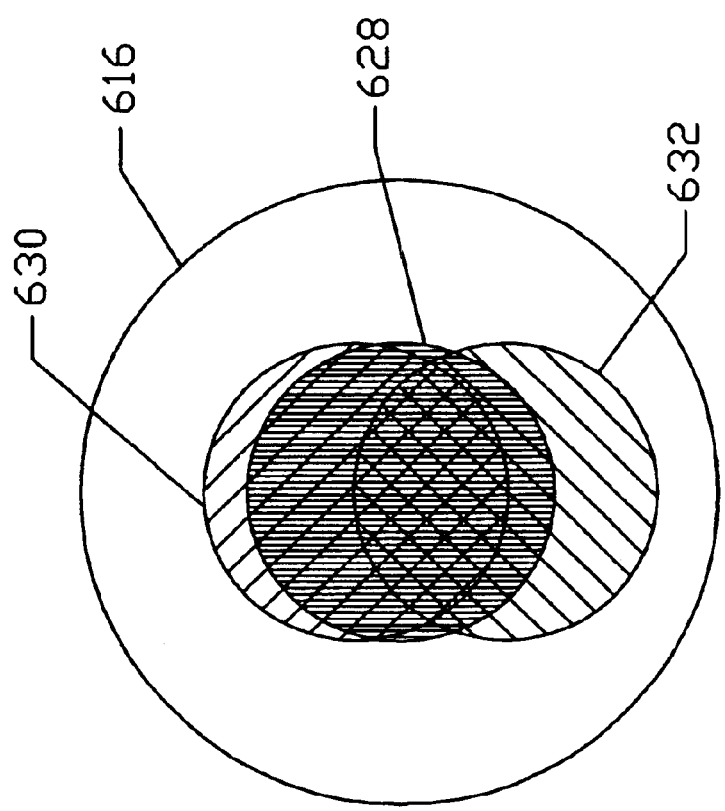
FIG. 53 is an enlarged view of the aperture element of the device of FIG. 52.

FIG. 53 presents an enlarged view of circular aperture element 616 of device 610 as seen from component 270 of device 610. As illustrated in FIG. 53, aperture element 616 has a center circular through-hole opening 620 that is indicated in this figure by the heavy shaded area composed of shading lines that are at 45 degrees to the other shading lines in this figure. As illustrated in FIG. 52, incident beam 188 passes essentially un-attenuated through opening 620 in aperture element 616, and retrodiffracted beam 190 passes essentially un-attenuated through opening 620 in aperture element 616 when the micro-mirror elements 338 and 340 are tilted so that they retroreflect the incident $\lambda_1$ and $\lambda_2$ wavelength beams back along their respective incident beam paths. With reference to FIG. 53, there are two circular shaded profiles labeled 630 and 632 on aperture element 616 that have shading lines that are at 90 degrees to each other. Circular shaded profiles 630 and 632 represent, respectively, the beam profiles for the $\lambda_1$ and $\lambda_2$ wavelength beam components of retrodiffracted beam 190 for the condition where the micro-mirror elements 338 and 340 of device 610 are tilted so that they do not retroreflect the incident $\lambda_1$ and $\lambda_2$ wavelength beams back along their respective incident beam paths.

As depicted in FIG. 53, beam profile 632 is displaced further from through-hole opening 620 than beam profile 630. More of the intensity of retrodiffracted beam 190 of device 610 is blocked by aperture element 616 from being transmitted to output fiber 626 as the beam profile on aperture element 616 is displaced further from the through-hole opening 620. For the conditions depicted in FIG. 53, micro-mirror element 340 of device 610 is tilted further from the retroreflection condition depicted in FIG. 52 than micro-mirror element 338 of device 610 and, therefore, the $\lambda_2$ wavelength signal beam component is attenuated more by device 610 than the $\lambda_1$ wavelength signal beam component. It is evident from the preceding discussion that the amount of attenuation of either of the $\lambda_1$ and $\lambda_2$ wavelength components of the incident signal to device 610 can be continuously changed by device 610 by changing the tilt angle of the micro-mirror elements 338 and 340. It is also evident that micro-mirror array 336 of device 610 can be constructed with many more than two micro-mirror elements that would enable device 610 to change the relative beam intensity attenuation between many more than the two wavelength channel beam signals illustrated in FIG. 52.

Figure 54A:
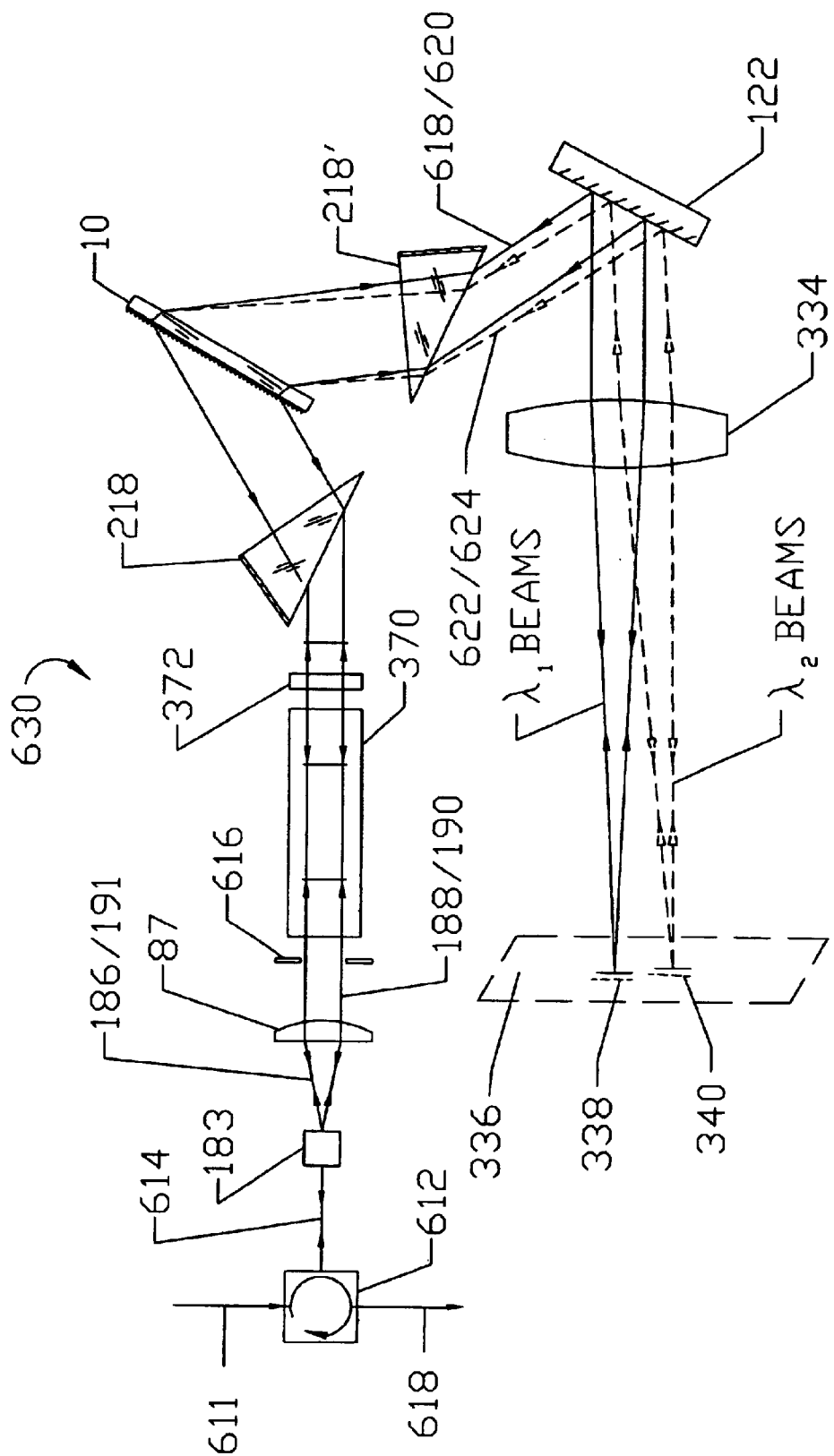
FIGS. 54A, 54B, 54C, 55A, 55B, and 56 are schematics of a wavelength variable attenuator device using the grating assembly depicted in FIG. 1.
Figure 54B:
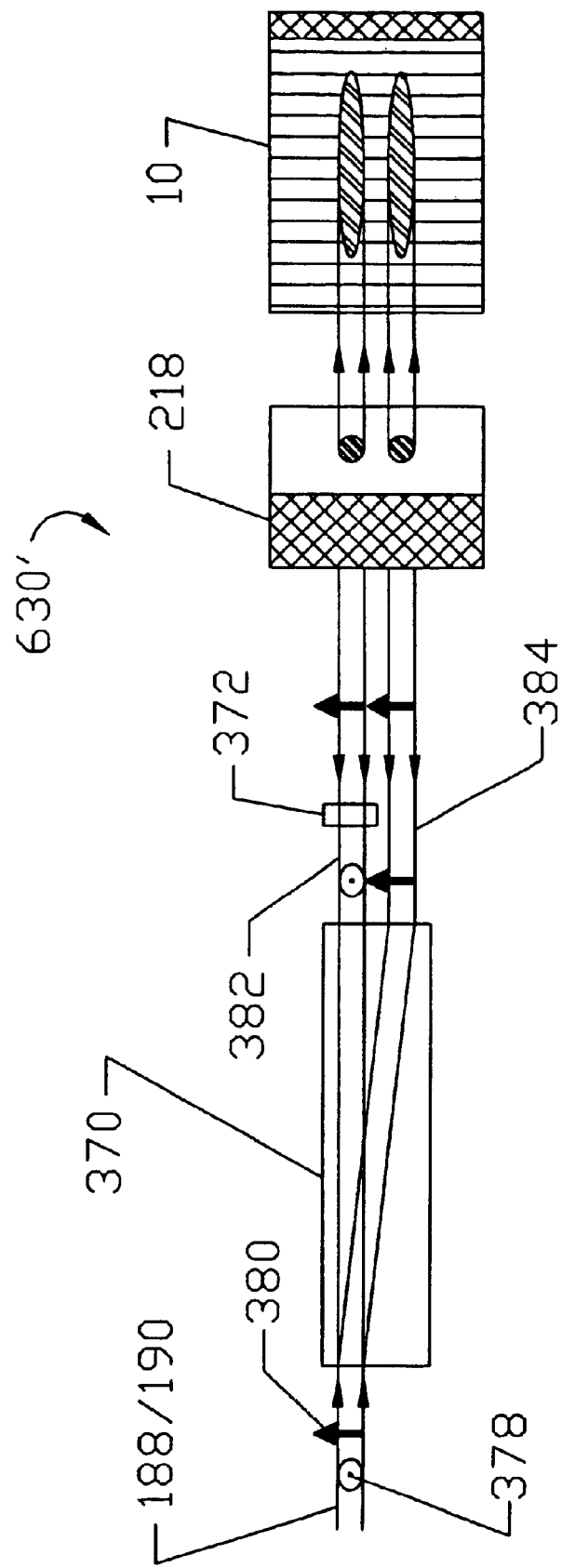
Figure 54C:
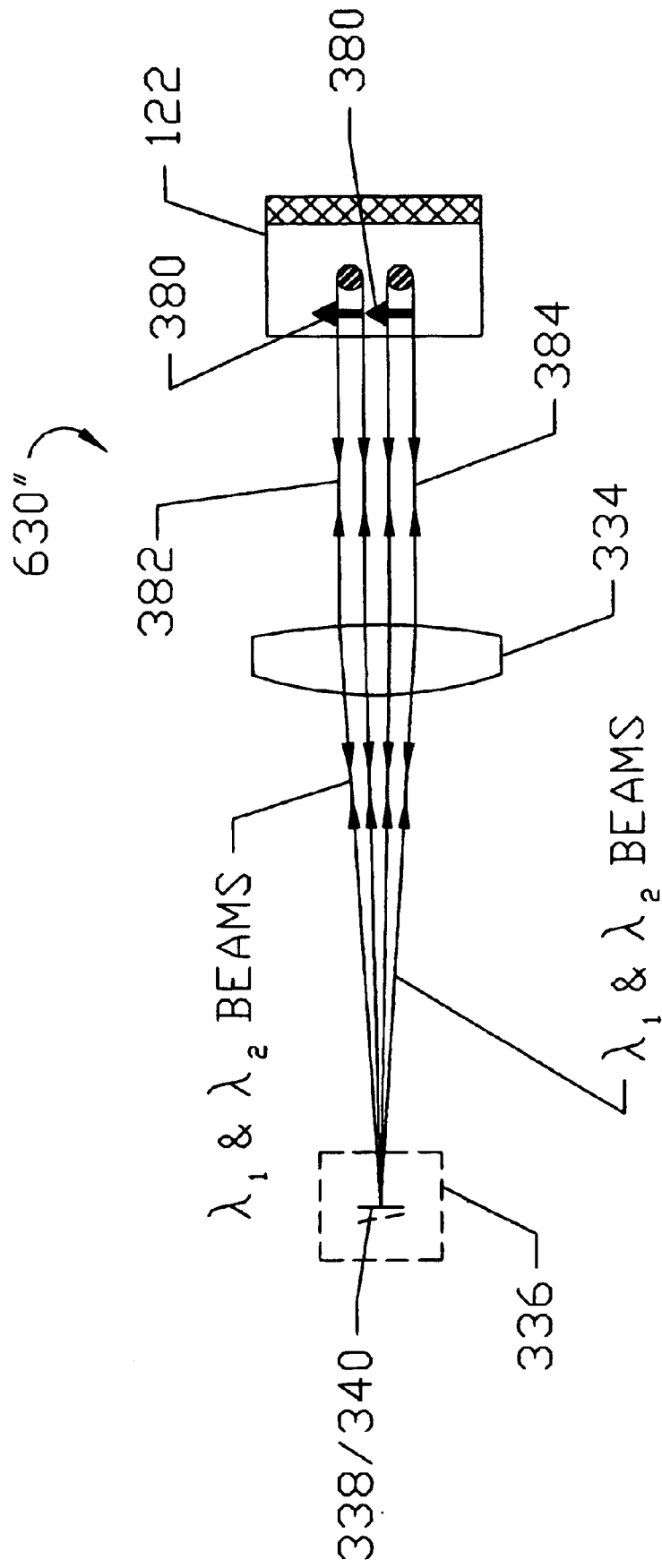

A schematic side view in FIG. 54A and schematic top views in FIGS. 54B and 54C illustrate how a transmission grating element 10 having a relatively high wavelength dispersion power can be incorporated into a wavelength variable attenuator (WVA) device that is used to change the intensity of individual wavelength channel beams in a WDM fiber-optic communication network. Comparing FIG. 54A with FIG. 27A reveals that device 630 of FIG. 54A uses the same polarization control technique as device 360 of FIG. 27A to achieve good PDL performance with transmission grating elements having a λ/D ratio in the range of about 0.8 to about 1.9. As depicted in FIG. 54A, the incident and diffracted beams to grating element 10 in device 630 make an angle of about 65 degrees to the normal to the grating surface corresponding to grating element 10 having a λ/D ratio of about 1.8. As described for device 530 of FIG. 43, device 630 incorporates identical beam expanding/linearizing prism elements 218 and 218' before and after the grating element 10 that increases the wavelength dispersion power of grating element 10, and therefore device 630, by the E magnification factor for these prism elements. The E magnification factor for these prism elements is equal to the beam expanding or reducing factor for these prism elements. As depicted in FIG. 54A, the beam is expanded and/or reduced in size by these prism elements by about 2 times and, therefore, device 630 has a wavelength dispersion power of about 0.31 deg/nm for a wavelength of 1550 nm.

With reference to FIG. 54A, input fiber 611 to circulator element 612 provides a beam containing $\lambda_1$ and $\lambda_2$ wavelength channel signals. Circulator element 612 directs the input beam from fiber 611 to fiber 614 that ends in fiber support element 183. The beam exiting from the end of fiber 614 forms a divergent optical ray bundle 186 having a cone angle determined by the numerical aperture (NA) of fiber 614. The collimating/focusing lens assembly 87 in device 630 receives the ray bundle 186 diverging from fiber 614 and converts it into collimated beam 188 that passes essentially un-attenuated through aperture element 616, birefringent crystal element 370, and halfwave retardation plate 372, to beam expanding/linearizing prism element 218 which refracts the beam and directs it to grating element 10 where it is diffracted. After diffraction from grating element 10 the incident beam 188 is angularly separated into $\lambda_1$ wavelength beam 618 and $\lambda_2$ wavelength beam 622. The wavelength beams 618 and 622 are, respectively, depicted in FIG. 54A as solid and dashed lines. As illustrated in FIG. 54A, the diffracted wavelength beams 618 and 622 angularly separate as they propagate through beam expanding/linearizing prism 218' to beam fold mirror element 122 which directs the beams to collimating/focusing lens 334. Lens 334 focuses the $\lambda_1$ and $\lambda_2$ wavelength beams onto a micro-mirror array 336 comprising separately tidtable micro-mirror elements 338 and 340, the $\lambda_1$ wavelength beam being focused to micro-mirror element 338 while the $\lambda_2$ wavelength beam is focused to micro-mirror element 340.

In the first position of the micro-mirror elements 338 and 340, illustrated in FIG. 54A by the solid lines, the mirror elements 338 and 340 retroreflect both wavelength beams back along their respective incident beam paths. That is, in this first position the micro-mirror elements are orientated perpendicular to the central ray of focused beams 618 and 622. For this first mirror position the retroreflected $\lambda_1$ and $\lambda_2$ wavelength beams propagate back to collimating/focusing lens 334 where they are re-collimated. Retroreflected $\lambda_1$ wavelength beam 620 propagates back along incident beam path 618, and the retroreflected $\lambda_2$ wavelength beam 624 propagates back along incident beam path 622. Wavelength beams 620 and 624 are recombined into retrodiffracted beam 190 by grating element 10 since this element functions in a reversible manner. Retrodiffracted beam 190 passes essentially unattenuated through aperture element 616 and is incident on collimating/focusing lens assembly 87 that focuses this beam onto the end of fiber 614. Most of the intensity of the focused beam 191 that is incident on fiber 614 is coupled into fiber 614 and propagates to circulator element 612. Circulator element 612 directs the output beam from fiber 614 to output fiber 626.

Assuming that the optical elements comprising device 630 have the same radiometric throughput efficiency for both the XI and 2 wavelength components of the incident signal beam to device 630, then device 630, as depicted in FIG. 54A, attenuates the $\lambda_1$ and $\lambda_2$ wavelength components of the incident signal beam equally, thereby maintaining the intensity ratio that these wavelength components had prior to device 630. When the micro-mirror elements 338 and 340 of micro-mirror array 336 are tilted so that they are not orientated perpendicular to the central ray of focused beams 326 and 328, as illustrated in FIG. 54A by the dashed lines, the $\lambda_1$ and $\lambda_2$ wavelength beams will not be retroreflected back along their respective incident beam paths. Under these device conditions, the retrodiffracted beam 190 will not pass unattenuated through aperture 616, as depicted in FIG. 53.

As described in reference to FIG. 53, the amount of attenuation of either the $\lambda_1$ and $\lambda_2$ wavelength components of the incident signal to device 630 can be continuously changed by device 630 by changing the tilt angle of the micro-mirror elements 338 and 340. It is evident that micro-mirror array 336 of device 630 can be constructed with many more than two micro-mirror elements that would enable device 630 to change the relative beam intensity attenuation between many more than the two wavelength channel beam signals illustrated in FIG. 54A. It is also evident that the optical arrangement illustrated in FIGS. 54A, 54B and 54C can be used to build ADWM devices similar to those illustrated in FIGS. 25A, 25B, 26, 50 and 51.

Schematic top views in FIGS. 54B and 54C of a portion of the device 630 more clearly illustrate how the birefringent crystal element 370, halfwave retardation plate 372 and micro-mirror element 366 collectively function together to control the polarization direction of the optical beam incident on grating element 10 and, thereby, enable device 630 to achieve radiometric throughput efficiency values for S and P polarizations that are equal to within about 5 percent of each other. As depicted in FIG. 54A, the incident beam to grating element 10 and the diffracted beam from grating element 10 both make an angle of about 65 degrees with regard to the normal to the surfaces of element 10. Therefore, the grating element 10 in device 630 has $\lambda$/D ratio value of approximately 1.8 which, according to the data in FIG. 4, results in the S polarized optical beam having about 90 percent diffraction efficiency while the P polarized beam has about 8 percent diffraction efficiency. For the configuration depicted in device 630, essentially only the S polarized optical component is diffracted from grating element 10 and, therefore, the optical elements of device 630 collectively function together to ensure that only a S polarized beam is incident on the grating element 10, thereby enabling device 630 to achieve a PDL value equal to or less than 0.2 dB.

With reference to FIG. 54B, the incident beam 188 to the birefringent crystal element 370 is composed of both S and P polarized optical components where the P component 378 is depicted as an ellipse with a dot at its center while the S component 380 is depicted as a bold arrow figure. Only the S and P polarization components to the left of element 370 in FIG. 54B are labeled with their respective numbers 380 and 378. When beam 188 propagates through the birefringent crystal element 370 its S and P optical beam components propagate at an angle with respect to each other. As illustrated in FIG. 54B, the P polarized beam component of beam 188 propagates essentially straight through element 370 while the S polarized beam component of beam 188 is refracted at an angle relative to the P polarization beam direction as it propagates through element 370. The length of the bireflingent crystal element 370 is chosen so that the P polarized beam path 382 exiting the element 370 is spatially separated from the S polarized beam path 384 exiting the element 370, as illustrated in FIG. 54B.

As depicted in FIG. 54B, the beam paths 382 and 384 are parallel and spatially separated as they propagate through prism element 218 and grating element 10, which diffracts these beams toward prism element 218' and reflected from mirror element 122. With reference to FIG. 54B, halfwave plate 372 is positioned in beam path 382, but not in beam path 384. Halfwave retardation plate 372 converts the polarization direction of the oppositely propagating beams in beam path 382 from P polarization to S polarization for the beam propagating from element 370 to element 10 and from S polarization to P polarization for the beam propagating from element 10 to element 370. As depicted in FIG. 54C, the beams 382 and 384 are still S polarized, parallel, and spatially separated as they are directed by mirror element 122 toward collimating/focusing lens 334. As illustrated in FIG. 54C, micro-mirror elements 338 and 340 of micro-mirror array 336 are positioned at the focal plane of lens 334 and, thereby, function as retroreflecting mirror elements that redirect the beam propagating from lens 334 to micro-mirror array 336 along beam path 382 to propagate back to lens 334 along beam path 384 while redirecting the beam that propagates from lens 334 to micro-mirror array along beam path 384 to propagate back to lens 334 along beam path 382. The retroreflected beams from the micro-mirror array propagate back to birefringent crystal element 370. The birefringent crystal element 370 functions in a reversible manner and, thereby, recombines the beams propagating in beam paths 382 and 384 that are incident to element 370 into a single beam 190 that propagates from element 370 to lens 87.

For the optical arrangement illustrated in FIG. 54B, the beams propagating in either direction of beam paths 382 or 384 that are incident on grating element 10 are S polarized and, therefore, have equal diffraction efficiency values which enables the device 360 to achieve radiometric throughput efficiency values for S and P polarized optical components that are equal to within about 5 percent of each other.

Figure 55A:
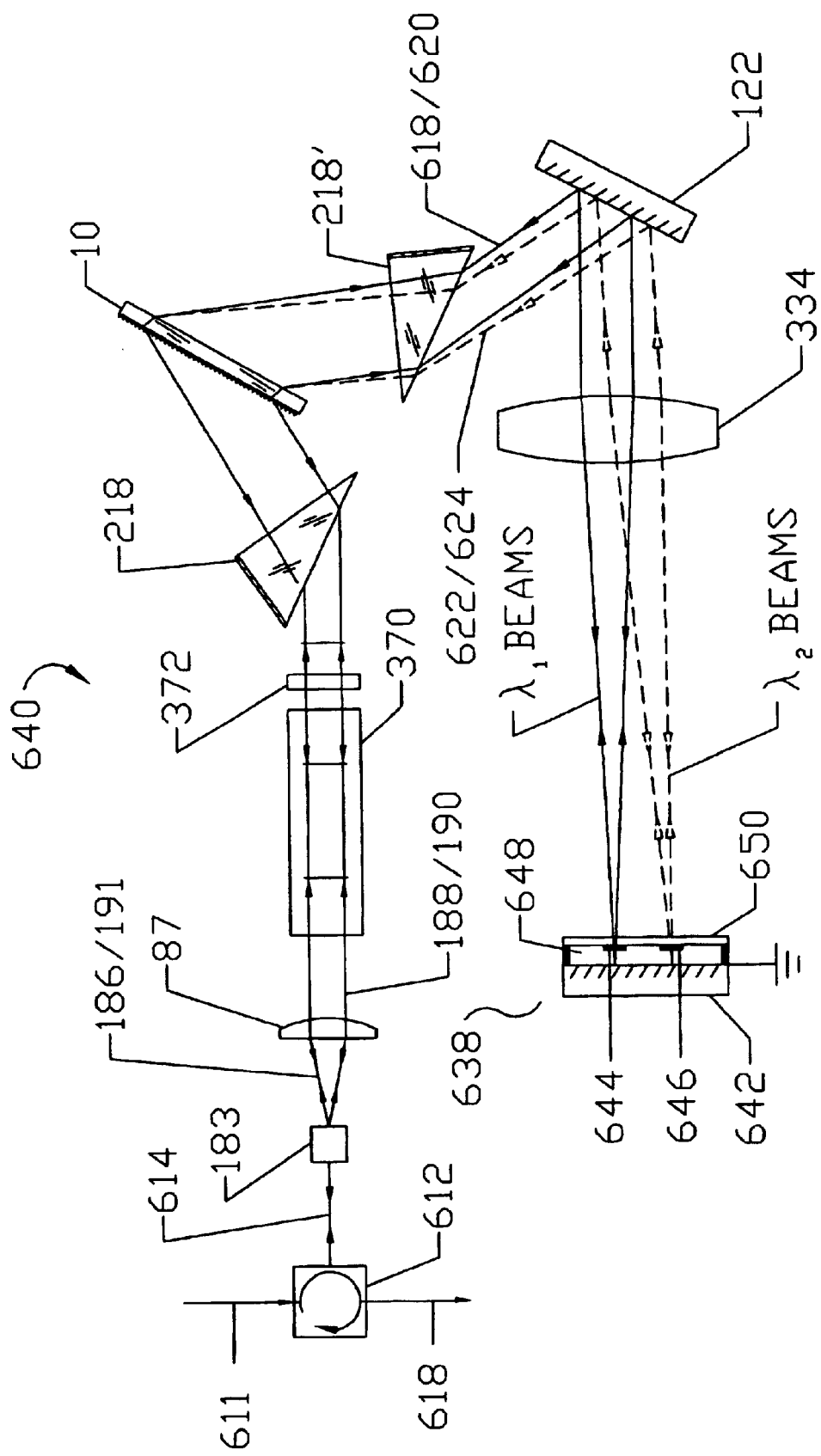
Figure 55B:
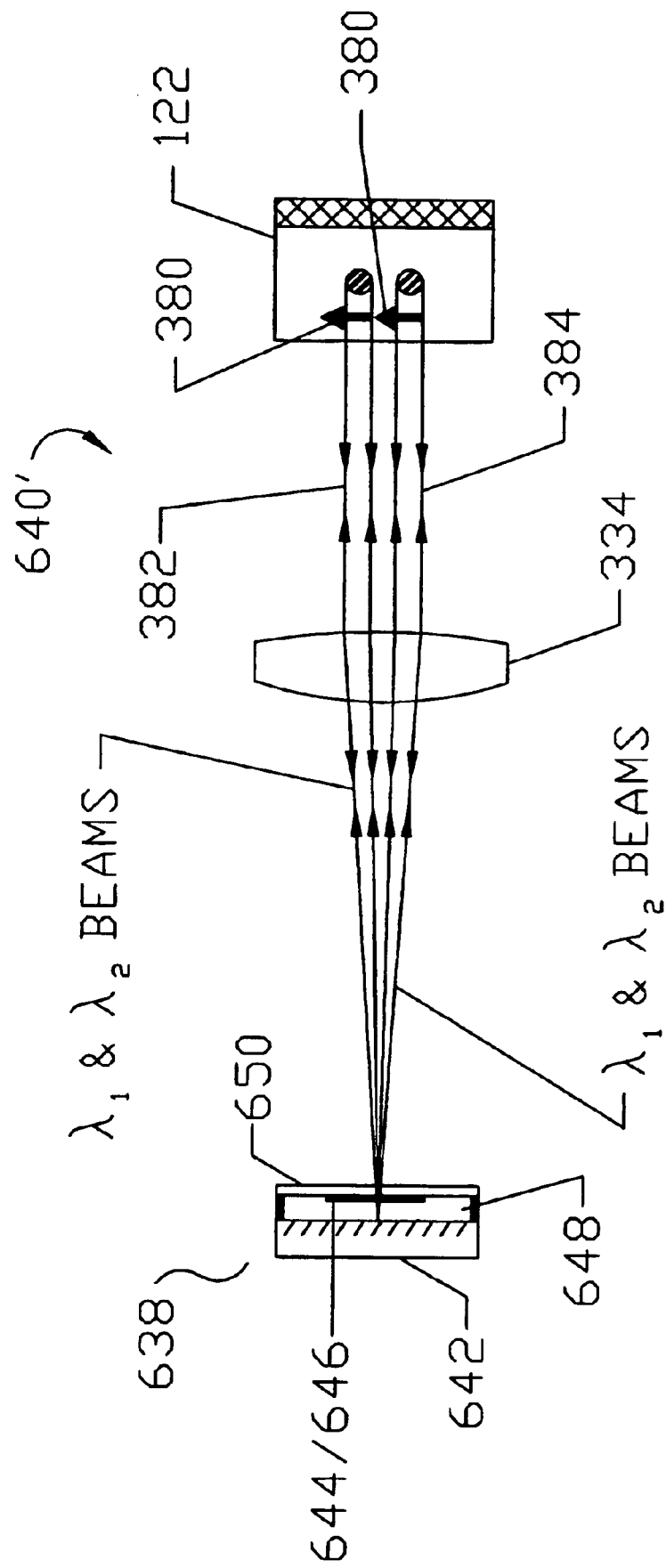

A schematic side view in FIG. 55A and schematic top view in FIG. 55B illustrate another embodiment that uses a transmission grating element 10 having a relatively high wavelength dispersion power to build a wavelength variable attenuator (WVA) device that is used to change the intensity of individual wavelength channel beams in a WDM fiber-optic communication network. Comparing FIG. 55A with FIG. 54A reveals that device 640 of FIG. 55A has essentially the same optical arrangement as device 630 of FIG. 54A. Device 640 differs from device 630 in that it uses a liquid crystal-based spatial light modulator array 638 in place of the micro-mirror array 336 used in device 630 to perform the wavelength channel attenuation function. Since liquid crystal-based spatial array 638 is a polarization rotation device, device 640 does need to incorporate aperture element 166. Except for the stated differences, device 640 functions as described for device 630. Device 640, like device 630, has a wavelength dispersion power of about 0.31 deg/nm for a wavelength of 1550 nm.

With reference to FIG. 55A, input fiber 611 to circulator element 612 provides a beam containing $\lambda_1$ and $\lambda_2$ wavelength channel signals. Circulator element 612 directs the input beam from fiber 611 to fiber 614 that ends in fiber support element 183. The beam exiting from the end of fiber 614 forms a divergent optical ray bundle 186 having a cone angle determined by the numerical aperture (NA) of fiber 614. The collimating/focusing lens assembly 87 in device 640 receives the ray bundle 186 diverging from fiber 614 and converts it into collimated beam 188 that passes essentially unattenuated through aperture element 616, birefringent crystal element 370, and halfwave retardation plate 372, to beam expanding/linearizing prism element 218 which refracts the beam and directs it to grating element 10 where it is diffracted. After diffraction from grating element 10, the incident beam 188 is angularly separated into $\lambda_1$ wavelength beam 618 and $\lambda_2$ wavelength beam 622. The wavelength beams 618 and 622 are, respectively, depicted in FIG. 55A as solid and dashed lines. As illustrated in FIG. 55A, the diffracted wavelength beams 618 and 622 angularly separate as they propagate through beam expanding/linearizing prism 218'to beam fold mirror element 122 which directs the beams to collimating/focusing lens 334. Lens 334 focuses the $\lambda_1$ and $\lambda_2$ wavelength beams onto a liquid crystal-based spatial array 638 comprising separate light modulator elements 644 and 646, the $\lambda_1$ wavelength beam being focused to light modulator element 644 while the $\lambda_2$ wavelength beam is focused to light modulator element 646.

Liquid crystal-based spatial array 638 is comprised of reflective mirror element 642 that also serves as the negative electrode for the array, liquid crystal media 648, which fills the space between mirror element 642 and input window element 650 and the transparent positive electrodes 644 and 646 on window element 650 that are individually activated. Light incident on array 638 is transmitted through window element 650 and liquid crystal media 648 to mirror element 642 where it is reflected back through liquid crystal media 648 and window element 650. The reflected light exiting array 638 is reduced in intensity relative to the incident light by about 1 to 2 dB as a result of absorption within the transparent electrodes on window element 650. The polarization direction of the reflected light exiting array 638 can be rotated relative to the incident light polarization direction depending on whether a voltage is applied to transparent electrodes on window element 650.

As depicted in FIG. 55A, collimating/focusing lens 334 functions as a telecentric lens, in that both the focused $\lambda_1$ and $\lambda_2$ wavelength beams are normally incident on array 638 and have their focal plane on the reflective surface of mirror element 642. For these focusing conditions, array 638 retroreflects the $\lambda_1$ and $\lambda_2$ wavelength beams back along their respective incident beam paths. The retroreflected $\lambda_1$ and $\lambda_2$ wavelength beams propagate back to collimating/focusing lens 334 where they are re-collimated. Retroreflected $\lambda_1$ wavelength beam 620 propagates back along incident beam path 618 and the retroreflected $\lambda_2$ wavelength beam 624 propagates back along incident beam path 622. Wavelength beams 620 and 624 are recombined into retrodiffracted beam 190 by grating element 10 since this element functions in a reversible manner. Retrodiffracted beam 190 is incident on collimating/focusing lens assembly 87 that focuses this beam onto the end of fiber 614. Most of the intensity of the focused beam 191 that is incident on fiber 614 is coupled into fiber 614 and propagates to circulator element 612. Circulator element 612 directs the output beam from fiber 614 to output fiber 626.

As depicted in FIG. 55A, the incident beam to grating element 10 and the diffracted beam from grating element 10 both make an angle of about 65 degrees with regard to the normal to the surfaces of element 10. Therefore, the grating element 10 in device 640 has a $\lambda/D$ ratio value of approximately 1.8 which, according to the data in FIG. 4, results in the S polarized optical beam having about 90 percent diffraction efficiency while the P polarized beam has about 8 percent diffraction efficiency. For the configuration depicted in device 640, essentially only the S polarized optical component is diffracted from grating element 10. As described for device 630 and with reference to, FIG. 54B, the birefringent crystal element 370 and halfwave retardation plate 372 of device 640 collectively function together so that only S polarized light is incident on grating element 10 of device 640 and, thereby, enable device 640 to achieve radiometric throughput efficiency values for S and P polarizations that are equal to within about 5 percent of each other.

As illustrated in FIGS. 55A and 55B, liquid crystal array 638 is positioned at the focal plane of lens 334 and, thereby, functions as a retroreflecting mirror element that retroreflects the incident beams to this array back to fiber 614. Since the retroreflected beams from array 638 are rediffracted by grating element 10 as they propagate back to fiber 614, array 638 can be used to change the polarization direction of the retroreflected beam and thereby change the attenuation of the beam as it propagates through device 540. As depicted in the schematic top view in FIG. 55B, the beams 382 and 384 that are directed by mirror element 122 toward array 638 are S polarized. By selectively applying voltage to either light modulator elements 644 or 646, the polarization direction of either of the retroreflected $\lambda_1$ or $\lambda_2$ wavelength beams from these modulator elements can be rotated in a select amount from S polarization toward P polarization and, thereby, selectively change the attenuation of either of the retroreflected $\lambda_1$ or $\lambda_2$ wavelength beams, since grating element 10 only essentially diffracts S polarized light.

It is evident that liquid crystal-based spatial light modulator array 638 of device 640 can be constructed with many more than two modulator elements that would enable device 640 to change the relative beam intensity attenuation between many more than the two wavelength channel beam signals illustrated in FIG. 55A.

Since the transparent electrodes of a liquid crystal array are normally linearly spaced along the array, lens 334 is also designed as an F-Theta lens since this type of lens improves the linearity performance of device 640. While not previously stated, the linearity performance of devices 320, 350, 590, 600, 610 and 630 of FIGS. 25A, 25B, 26, 50, 51, 52, 54A, 54B, and 54C is improved by using F-Theta telecentric designed lenses in these devices.

Figure 56:
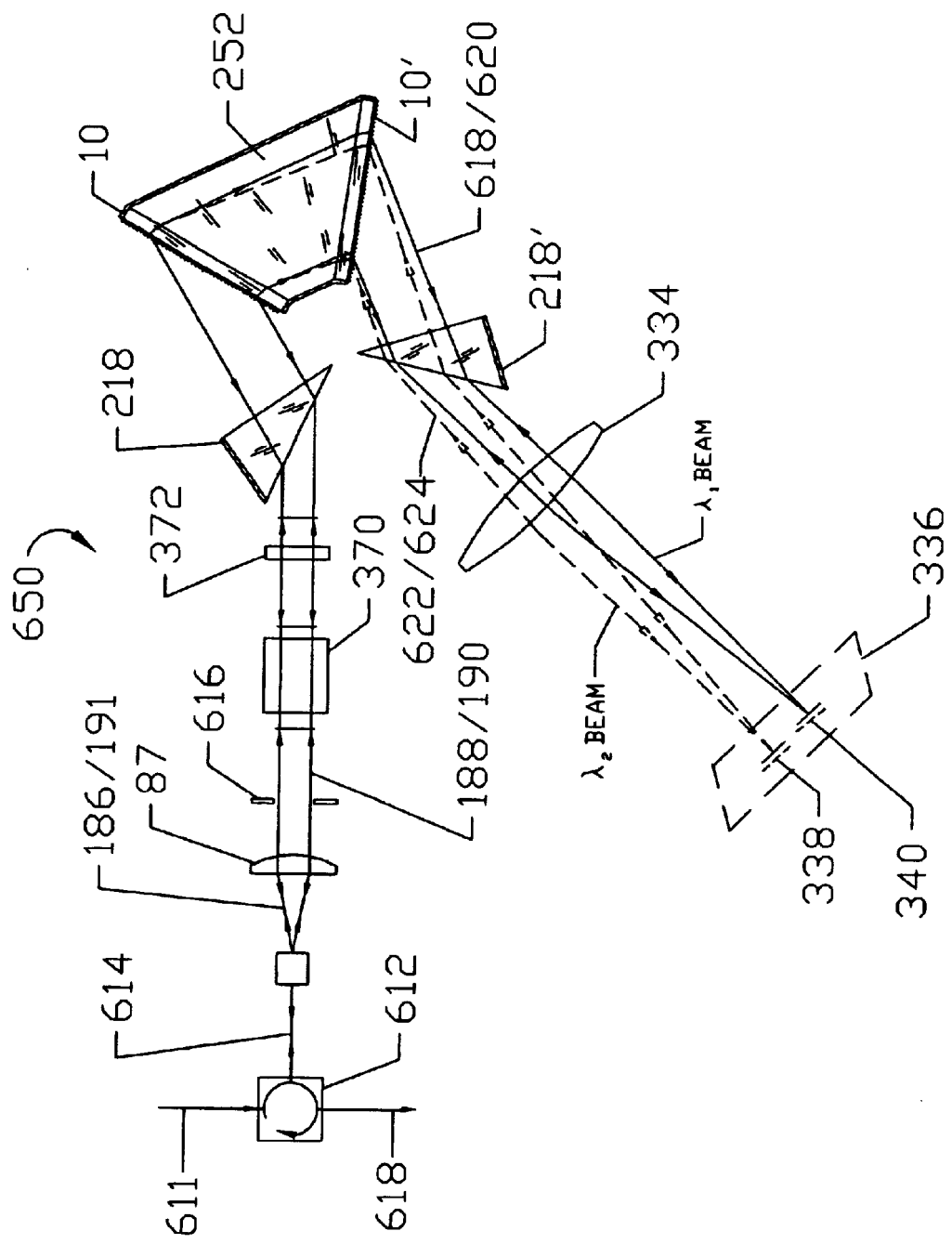

A schematic side view in FIG. 56 illustrates how a dual cascaded transmission grating component having a relatively high wavelength dispersion power can be incorporated into a wavelength variable attenuator (WVA) device that is used to change the intensity of individual wavelength channel beams in a WDM fiber-optic communication network. Comparing FIG. 56 with FIG. 54A reveals that device 650 of FIG. 56 uses the same optical arrangement as device 630 of FIG. 54A with the exception that device 650 uses a dual cascaded grating component in place of the grating element 10 used in device 630. Device 650 functions as described for device 630 with the exception that device 650 can achieve greater wavelength dispersion power than device 630 since it incorporates two cascaded grating elements, as described for device 250 of FIG. 18. As depicted if FIG. 56, the dual cascaded grating component in device 650 is comprised of grating elements 10 and 10' that are optically cemented, respectively, to the input and output transmitting surfaces of non-parallel glass block element 252.

A major objective when designing grating-based devices for fiber-optic communication system applications is to incorporate techniques in the design for passively athermalizing the performance of the devices so that they meet operating specifications when used over the 70 degree centigrade temperature range specified for fiber-optic telecommunication applications without the need for active control. One of the major factors in these design techniques is to fabricate the surface-relief transmission grating element on a low thermal expansion substrate material because the thermal expansion coefficient of the substrate material determines how rapidly the grating line spacing changes as a function of temperature change for surface-relief gratings having a grating forming layer thickness that is extremely small in comparison to the substrate thickness. Change in the grating line spacing of a grating element causes a corresponding change in the angle of the beam diffracted by the element, which results in a positional change of the focused diffracted beam at the focal plane of the Mux/Demux, wavelength channel monitoring or ADWM device incorporating the grating element. These changes in focused beam position give rise to increased optical insertion loss in the device and, if large enough, cause a shifting of data information between adjacent wavelength channels in the device.

The change in diffracted beam angle as a function of change in grating line spacing is calculated by differentiating Equation (2) with respect to dD, which gives:

$$d\theta_d = -\frac{\lambda dD}{D^2 \cos\theta_d}. \tag{8}$$

When the change in the grating line spacing is due to the thermal expansion change of the grating substrate material, $$dD = \alpha D dT, \tag{9}$$

where $\alpha$ is the thermal expansion coefficient of the substrate material and dT is the temperature change. Substituting Equation (9) into Equation (8) gives:

$$d\theta_d = -\frac{\lambda}{D}\frac{\alpha dT}{\cos\theta_d}. \tag{9}$$

Equation (10) is used to calculate how the diffracted beam angle changes as a function of the thermal expansion coefficient of the substrate material used for fabricating photoresist surface-relief transmission grating elements. For these calculations it was assumed that the grating element has a $\lambda/D$ ratio of 1.1 for a wavelength of 1550 nanometers and that $\theta_i = \theta_d = 33.4°$ for a wavelength of 1550 nanometers. Using these assumptions, the change in diffracted beam angle associated with a 70 degree centigrade temperature change and the corresponding spatial positional change at the focal plane caused by this angular change was calculated for a Mux/Demux device incorporating a focusing lens assembly having a focal length of $f_1 = 40$ millimeters and for a wavelength channel monitoring device incorporating a focusing lens assembly having a focal length of $f_2 = 80$ millimeters. Results for these calculations are presented in Table I for different transmission glass types.

TABLE I

| Glass Type | Thermal Expansion Coefficient ($\times 10^{-7}/°$ C.) | Change in Diffraction Angle in Arc Seconds | Change in Spatial Position at Focal Plane in microns for $f_1$ | $f_2$ |
|---|---|---|---|---|
| BK7 | 70 | 133.18 | 25.8 | 51.6 |
| Fused Silica | 5.5 | 10.46 | 2.0 | 4.0 |

TABLE I-continued

| Glass Type | Thermal Expansion Coefficient ($\times 10^{-7}/°$ C.) | Change in Diffraction Angle in Arc Seconds | Change in Spatial Position at Focal Plane in microns for $f_1$ | $f_2$ |
|---|---|---|---|---|
| Ohara Clearceram-Z | 0.8 | 1.52 | 0.30 | 0.60 |
| ULE | 0.15 | 0.28 | 0.06 | 0.12 |

Assuming that the input/output fiber-optic array in the Mux/Demux device has a 25 micron spacing between fiber centers and that the photodetector linear array used in the wavelength channel monitoring device has a 50 micron spacing between photodetector elements, then it is evident from the data presented in Table I that BK7 should not be used as the substrate material for transmission gratings used in these devices unless other means are provided to compensate for the change in diffracted beam angle that occurs with this material as a result of temperature change. It is also evident from the data in Table I that fused silica could be used as the substrate material for the transmission gratings used in these devices but better results would be achieved by using either the Ohara Clearceram-Z material or the ULE glass material.

While the embodiments presented in this specification have focused on different arrangements for using surface-relief transmission grating elements for fabricating Mux/Demux, on-line wavelength channel monitoring, and add/drop devices used in WDM fiber-optic systems, it is evident that these transmission gratings and the different usage arrangements described in this specification can also be used to construct tunable laser sources used in fiber-optic communication systems and to build spectrophotometer instruments used by field and laboratory personnel for measuring the wavelength component properties of WDM fiber-optic systems.

The following examples for the life test results achieved for photoresist surface-relief transmission grating elements are presented to illustrate the claimed invention and are not to be deemed limitative thereof Unless otherwise specified, in all examples, all parts are by weight and all temperatures are in degrees centigrade.

In these life test examples, reference is made to the Bellcore GR1209 and GR1221 reliability guidelines for fiber-optic devices, which require that statistical data be provided based on testing multiple numbers of the same device and that test data be provided for up to 2000 hours of test time. The Bellcore tests require that the item tested, when subject to 85 degrees centigrade and 85% relative humidity, has less than 0.5 decibel optical insertion loss variation after being tested for 500 hours at these conditions.

A change of 0.1 decibel in optical insertion-loss corresponds to a change of 2.276 percent in the radiometric throughput efficiency of the item while a 0.5 decibel change corresponds to a 10.875 percent change in the radiometric throughput efficiency of the item. A change in optical insertion-loss for the tested surface-relief grating elements correlates to a change in the diffraction efficiency of the grating element caused by a change in the depth of the surface-relief grating groove height h. A change in the grating groove height h can occur in photoresist surface-relief gratings under conditions that cause the photoresist to flow.

All of the grating elements used in the life test experiments for the examples presented in this specification had a surface-relief transmission grating fabricated using in Shipley S1813 Photo Resist. All of the example grating elements used in these life test experiments had a grating line spacing equal to the 633 nanometer wavelength light used to measure the diffraction efficiency performance of the examples under life test. The diffraction efficiency for each example grating element was performed using the S polarized optical component at the Littrow diffraction condition, that is, $\theta_i=\theta_d$, which for the gratings in this test corresponded to $\theta_i=\theta_d=30$ degrees. Diffraction efficiency data for each example grating element was taken before the element was tested at the Bellcore test conditions of 85 degrees centigrade and 85 percent relative humidity, and at different time intervals after the element began testing at these Bellcore test conditions. The number of time intervals that each element was tested depended on how long it took the element to fail, if it failed, or the number of hours the element has undergone testing when the data was assembled for the examples reported in this specification.

All of the surface-relief transmission diffraction grating examples for these life test experiments consisted of circular disk substrates having a diameter of either 100 or 120 millimeters. Each disk substrate contained 5 essentially identical plane diffraction grating segments arranged symmetrically around the center of the disk. This type of circular disk grating element is commercially available from Holotek LLC and is sold as a hologon element. Each of the example hologon disks used for these life test experiments was prepared in accordance with the processing procedures described in FIG. 3 of this specification, except for the Comparative Examples 1, 2, and 3. An area of one of the 5 grating segments on each example hologon disk was circled with a permanent marker pen, the circled area being used to measure the diffraction efficiency of that example before and during testing at the Bellcore conditions.

Each of the example hologon disks for these life test experiments was configured as either a bare hologon substrate disk that was uncovered during the life testing by any protective element and hologon disks having a cover glass disk that protected the grating surface, similar to the encapsulated grating surface configuration in FIG. 9 of this specification. Different sealing compounds were used, in the different comparative examples that used this covered hologon disk structure, to bond the cover glass disk to the hologon substrate disk. All covered hologon disk examples in these tests used 0.002 inch shims to space the hologon substrate grating surface from the cover disk surface.

COMPARATIVE EXAMPLE 1

The hologon disks for Example 1 were processed using steps 50 through 60 of FIG. 3 of this specification, but did not include steps 62 and 64 of FIG. 3. After step 60 of FIG. 3, the dried hologon substrate disks and their cleaned matching cover disks were placed in an 82 degrees centigrade oven for 1 hour. After cooling down to room temperature the hologon substrate disks and their cover disks were bonded together using Norland 61 and 68 ultraviolet light curable adhesives. The Norland 61 adhesive was used to seal the center of the hologon assembly which had a through hole, while the Norland 68 adhesive was used to seal the circumference of the hologon disk assembly. The Norland adhesives were cured using a lamp having a ultraviolet spectrum output in the range of 350 to 430 nanometers. As part of the initial sealing process, small vent holes were left in the outer sealing ring on the hologon covered assemblies, and the vented assemblies were placed in a vacuum oven at 70 degrees centigrade for 30 minutes to help remove any residuals associated with the ultraviolet adhesives. After removal from the vacuum oven the hologons were cooled to room temperature and the vent holes sealed.

The Norland Optical Adhesive 61, and the Norland Optical Adhesive 68, were obtained from Norland Products Incorporated of 695 Joyce Kilmer Avenue, New Brunswick, N.J. According to the Material Safety Data Sheets for these products, "The specific chemical identity and concentration is being withheld from this data sheet as a trade secret."

The covered hologon assemblies bonded using the Norland adhesives were subjected to a temperature of 85 degrees centigrade and a relative humidity of 85 percent. In less than 2 hours under these test conditions, both sets of hologons failed completely, that is, the grating surface structure disappeared under these conditions.

COMPARATIVE EXAMPLE 2

The uncovered hologon disk for Example 2 was made substantially in accordance with the procedure used to prepare the Example 1 hologons with the exception that the bare photoresist surface of the hologon substrate disk, after cooling to room temperature following the 1 hour bake at 82 degrees centigrade, was exposed to a lamp for 30 minutes having an ultraviolet spectrum output in the range of 350 to 430 nanometers. The grating surface structure of the uncovered hologon made in accordance with this procedure failed completely in less than two hours when subjected to a temperature of 85 degrees centigrade and a relative humidity of 85 percent.

EXAMPLE 3

The uncovered hologon disk for this example was processed using steps 50 through 60 of FIG. 3 of this specification, but did not include steps 62 and 64 of FIG. 3. After step 60 of FIG. 3, the dried bare photoresist surface of the hologon disk was simultaneously subjected to a temperature of about 110 degrees centigrade while being irradiated with ultraviolet light at a wavelength of 260 nanometers for approximately 20 minutes. It was observed that this post-baked/UV exposure procedure caused the hologon to change from a yellow to a clear to a fight-to-medium brown color. This uncovered bare hologon experienced essentially no change in diffraction grating efficiency after being tested for over 300 hours at the 85 degrees centigrade and 85 percent relative humidity test conditions.

EXAMPLE 4

The uncovered hologon disk for this example was processed using all of the steps of FIG. 3 of this specification. Exposure of the bare photoresist surface of the hologon disk at ambient room temperature and pressure conditions to the 260 nanometer UVC light source in step 62 of FIG. 3 bleached the photoresist layer and, thereby changed the color of the photoresist layer from a yellow color to an substantially optically clear color having no visible observable color tint. The photoresist layer stays substantially optically clear not only after being heated in processing step 64 of FIG. 3 but also after being tested for about 1,000 hours at the aforementioned Bellcore test conditions. After exposure to the WVC light source, the hologon disk was in step 62 of FIG. 3 heated to a temperature of about 110 to 115 degrees centigrade for approximately 30 minutes. The uncovered bare hologon made in accordance with this procedure experienced less than a 0.2 decibel change in its diffraction efficiency performance after being subject to testing at a temperature of 85 degrees centigrade and a relative humidity of 85 percent for inexcess of 1,700 hours and, therefore, meets the aforementioned Bellcore test conditions.

EXAMPLE 5

The uncovered hologon disk for this example was processed using the procedure used to prepare Example 4, with the exception that after the bare photoresist surface of the hologon is exposed to the 260 nanometer radiation for about 10 minutes at ambient room temperature and pressure conditions, the hologon was heated in step 62 of FIG. 3 of this specification to a temperature of about 140 to 150 degrees centigrade for about 30 minutes. As was the case for the procedure used to process Example 4, the hologon for these processing conditions was substantially optically clear with no visible observable color tint. The uncovered bare hologon made in accordance with this procedure experienced less than 0.3 decibel change in its diffraction efficiency performance after being subjected to testing at a temperature of 85 degrees centigrade and a relative humidity of 85 percent for in excess of 1,700 hours and, therefore, meets the aforementioned Bellcore test conditions.

EXAMPLE 6

The hologon substrate disk used for this covered hologon disk example was processed using all of the steps of FIG. 3 of this specification, similar to the procedures used to process Examples 4 and 5. The processing of this hologon substrate differs from the procedure used to process Examples 4 and 5 in that in 64 of FIG. 3 the hologon substrate disk was heated to a temperature of about 130 to 135 degrees centigrade for about 30 minutes. As was the case for the procedures used to process Examples 4 and 5, the hologon for these processing conditions was substantially optically clear with no visible observable color tint.

The hologon substrate for this example was bonded to its clean cover disk using AB 9001 MT Epoxy, manufactured by Fiber Optic Center, Inc. of 23 Centre Street, New Bedford, Mass. The photoresist was removed from the hologon substrate disk in the areas where the epoxy adhesive was to be applied to form the bond. After applying the epoxy to the example, it sat at room temperature for 15 hour s and then was finish-cured in a dry oven at 85 degrees centigrade for 30 minutes, followed by 100 degrees centigrade for 30 minutes.

The bonded hologon of tis example, after being subjected to a temperature of 85 degrees centigrade and a relative humidity of 85 percent for more than 1,000 hours, had an optical insertion loss of less than 0.3 decibels and, therefore, meets the aforementioned Bellcore test conditions.

EXAMPLE 7

The hologon substrate disk used for this covered disk example was processed using the procedure of Example 6. The hologon substrate for this example was bonded to its clean cover disk using EPO-TEK 353ND epoxy, manufactured by Epoxy Technology of 14 Fortune Drive, Billerica, Mass., this adhesive is a two component, 100% solids heat curing epoxy designed for high temperature applications; it is comprised of an acrylonitrile curing agent, and it is also comprised of less than about 75 weight percent of Bisphenol F. The EPO-TEK 353ND epoxy had a low viscosity, and thus it w as mixed by volume in a ratio of approximately 1 part epoxy to 9 parts of fused silica particles sintered together in chain-like formations and sold under the name of "Cab-O-Sil" by the Cabot C orporation of 1020 West Park Avenue, Kokoma, Ind.

The photoresist was removed from the hologon substrate disk in the areas where the epoxy adhesive was to be applied to form the bond. After applying the adhesive to the example, it sat at room temperature for 15 hours and then was finish-cured in a dry oven at 85 degrees centigrade for 30 minutes, followed by 100 degrees centigrade for 30 minutes.

The bonded sealed hologon of this example, after being subjected to a temperature of 85 degrees centigrade and a relative humidity of 85 percent for more than 1,000 hours, had an optical insertion loss of less than 0.3 decibels and, therefore, meets the aforementioned Bellcore test conditions.

COMPARATIVE EXAMPLE 8

The hologon substrate disk used for this covered disk example was processed using the procedure for Example 6. The hologon substrate for this example was bonded to its clean cover if disk using Devcon Aluminum Putty (F) 10610 Epoxy manufactured by ITW Devon of Danvers, Mass.

The photoresist was removed from the hologon substrate disk in the areas where the epoxy adhesive was to be applied to form the bond. After applying the adhesive to the example, it sat at room temperature for 15 hours and then was finish-cured in a dry oven at 85 degrees centigrade for 30 minutes, followed by 100 degrees centigrade for 30 minutes.

The bonded hologon of this example, after being subjected to a temperature of 85 degrees centigrade and a relative humidity of 85 percent for 500 hours, had an optical insertion loss of approximately 0.5 decibels, and after 1,000 hours the optical insertion loss increased to approximately 1.0 decibels. This example just meets the aforementioned Bellcore test conditions of having no more than a 0.5 decibel change in optical insertion loss for 500 hours of test time.

COMPARATIVE EXAMPLE 9

The hologon substrate disk used for this covered disk example was processed using he procedure of Example 6. The hologon substrate for this example was bonded to its clean cover disk using Scotch-Weld Epoxy Adhesive DP-190, which contained epoxy resin, kaolin, aliphatic polymer diamine, and carbon black; this multi-component adhesive was sold by the Minnesota Mining and Manufacturing Corporation of St. Paul, Minn.

The photoresist was removed from the hologon substrate disk in the areas where the epoxy adhesive was to be applied to form the bond. After applying the adhesive to the example, it sat at room temperature for 15 hours and then was finish-cured in a dry oven at 85 degrees centigrade for 30 minutes, followed by 100 degrees centigrade for 30 minutes.

The bonded sealed hologon of this example, after being subjected to a temperature of 85 degrees centigrade and a relative humidity of 85 percent for more 500 hours, had an optical insertion loss of approximately 1.0 decibels, and after 1,000 hours the optical insertion loss increased to approximately 1.6 decibels. This example does not meet the aforementioned Bellcore test conditions.

COMPARATIVE EXAMPLE 10

The hologon substrate disk used for this covered disk example was processed using the procedure of Example 6. The hologon substrate for this example was bonded to its clean cover disk using the same Norland 61 and 68 optical adhesives used to bond the hologon disks in Example 1. The bonding technique used for this example is the same as used for Example 1, in which the adhesives are applied to the hologon substrate disk without removing the photoresist form areas where the adhesives were applied to from the bond.

The bonded sealed hologon of this example, after being subjected to a temperature of 85 degrees centigrade and a relative humidity of 85 percent for more 500 hours, had an optical insertion loss in the range of 3.3 decibels, and after about 900 hours the optical insertion loss increased to about 20 decibels. This example does not meet the aforementioned Bellcore test conditions.

COMPARATIVE EXAMPLE 11

The hologon substrate disk used for this covered disk example was processed using the procedure of Example 6. The hologon substrate for this example was bonded to its clean cover disk using ELC 2728 ultraviolet light curable epoxy manufactured by Electro-Lite Corporation of 43 Miry Brook Road, Danbury, Conn.

The ultraviolet curable epoxy was applied to the hologon substrate disk without removing the photoresist from areas where the epoxy was applied to from the bond. After the epoxy was applied to the example, it was cured using a lamp having an ultraviolet spectrum output in the range of about 350 to 430 nanometers.

The bonded sealed hologon of this example, after being subject to a temperature of 85 degrees centigrade and a relative humidity of 85 percent for about 500 hours, had an optical insertion loss in the range of 4.7 decibels and after about 900 hours the optical insertion loss increased to about 5.3 decibels. This example does not meet the aforementioned Bellcore test conditions.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

I claim:

1. An optical wavelength selection device comprised of an optical beam source, means for collimating said optical beam to produce a collimated optical beam, a diffraction grating assembly for diffracting said collimated optical beam to produce a collimated optical diffracted beam, means for modifying the polarization state of said collimated optical diffracted beam, and means for focusing said collimated optical diffracted beam, wherein said means for modifying the polarization state of said collimated optical diffracted beam is disposed within said diffraction grating assembly, wherein said diffraction grating assembly is comprised a first transmission diffraction grating element, a reflective mirror element disposed behind said first transmission diffraction grating element, and a quarterwave retardation plate disposed between said first transmission diffraction grating element and said reflective mirror element.

2. The optical wavelength selection device as recited in claim 1, wherein said optical beam source comprises a fiber optic cable.

3. The optical wavelength selection device as recited in claim 2, wherein said optical beam source provides light at a wavelength of from about 1280 to about 1640 nanometers.

4. The optical wavelength device as recited in claim 1, wherein said first transmission diffraction grating element is a surface relief transmission diffraction grating.

5. The optical wavelength device as recited in claim 1, wherein said device further comprises a second transmission diffraction grating element disposed between said first transmission diffraction grating element and said quarterwave retardation plate.

6. The optical wavelength device as received in claim 5, wherein each of said first transmission diffraction grating element and said second transmission diffraction grating element is a surface relief transmission diffraction grating element.

* * * * *